US012439817B2

(12) United States Patent
Zheng et al.

(10) Patent No.: US 12,439,817 B2
(45) Date of Patent: Oct. 7, 2025

(54) LONG-LIFETIME ORGANIC ELECTROLUMINESCENT COMPOUND AND ORGANIC ELECTROLUMINESCENT DEVICE COMPRISING THE SAME

(71) Applicant: Shijiazhuang Chengzhi Yonghua Display Material Co., Ltd., Hebei (CN)

(72) Inventors: Zaihao Zheng, Hebei (CN); Pengjun Bu, Hebei (CN); Shiwen Yue, Hebei (CN); Feng Liang, Hebei (CN); Tianyu Wei, Hebei (CN)

(73) Assignee: SHIJIAZHUANG CHENGZHI YONGHUA DISPLAY MATERIAL CO., LTD., Hebei (CN)

( * ) Notice: Subject to any disclaimer, the term of this patent is extended or adjusted under 35 U.S.C. 154(b) by 0 days.

(21) Appl. No.: 18/688,112

(22) PCT Filed: Jan. 31, 2024

(86) PCT No.: PCT/CN2024/074909
§ 371 (c)(1),
(2) Date: Feb. 29, 2024

(65) Prior Publication Data

US 2025/0248299 A1 Jul. 31, 2025

(30) Foreign Application Priority Data

Jan. 16, 2024 (CN) ........................ 202410063441.X

(51) Int. Cl.
*H10K 85/60* (2023.01)
*C09K 11/06* (2006.01)
*H10K 50/11* (2023.01)

(52) U.S. Cl.
CPC ............ *H10K 85/626* (2023.02); *C09K 11/06* (2013.01); *H10K 50/11* (2023.02); *H10K 85/6574* (2023.02); *C09K 2211/1088* (2013.01)

(58) Field of Classification Search
None
See application file for complete search history.

(56) References Cited

FOREIGN PATENT DOCUMENTS

CN 113950754 A 1/2022
CN 113966327 A 1/2022
(Continued)

OTHER PUBLICATIONS

Jul. 19, 2024, Chinese Office Action issued for related CN Application No. 202410063441.X.
(Continued)

*Primary Examiner* — Anthony Ho
(74) *Attorney, Agent, or Firm* — Paratus Law Group, PLLC

(57) ABSTRACT

There is provided a long-lifetime organic electroluminescent compound and an organic electroluminescent device comprising the same. The general structural formula of the organic electroluminescent compound is as shown in Formula I. The organic electroluminescent compound contains a benzonaphthofuran moiety. By means of the benzonaphthofuran structure instead of dibenzofuran, the conjugated length of π electron cloud is prolonged. When the molecule is converted into an anionic state after accepting electrons, the negative charges can be effectively dispersed on the benzonaphthofuran moiety, avoiding excessively high local energy caused by uneven distribution of the negative charges, thus increasing the stability of a material. Furthermore, the benzonaphthofuran moiety has also been found to have a relatively good planarity, and the stability of the material can be significantly improved by means of partial deuteration. In the present invention, by means of deuteration at some sites on the benzonaphthofuran structure, the vibration of carbon-hydrogen bonds can be significantly
(Continued)

reduced, the stability of the benzonaphthofuran can be enhanced, and the deuteration cost can be reduced.

5 Claims, 1 Drawing Sheet

(56) References Cited

FOREIGN PATENT DOCUMENTS

| | | | |
|---|---|---|---|
| CN | 115872874 | A | 3/2023 |
| CN | 116648492 | A | 8/2023 |

OTHER PUBLICATIONS

Aug. 12, 2024, Chinese Office Action issued for related CN Application No. 202410063441.X.

Sep. 9, 2024, Chinese Notification of Granting Patent Right issued for related CN Application No. 202410063441.X.

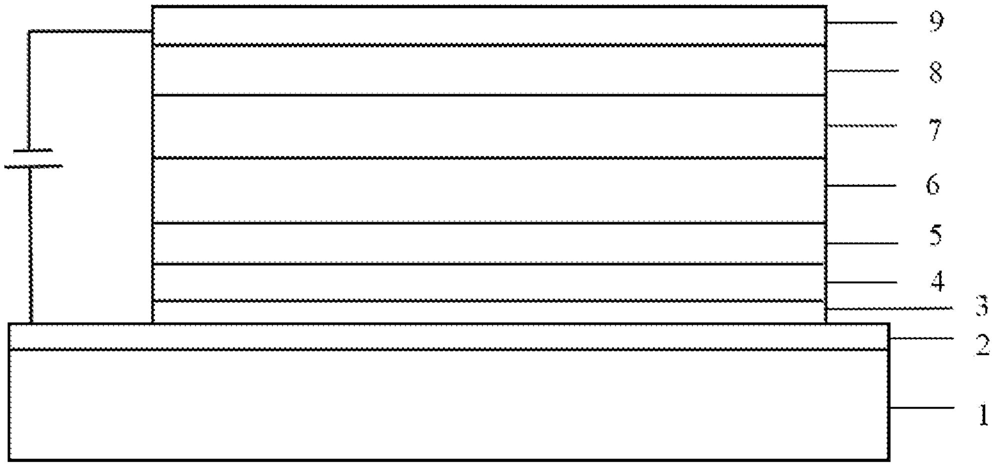
9
8
7
6
5
4
3
2
1

LONG-LIFETIME ORGANIC ELECTROLUMINESCENT COMPOUND AND ORGANIC ELECTROLUMINESCENT DEVICE COMPRISING THE SAME

CROSS REFERENCE TO PRIOR APPLICATION

This application is a National Stage Patent Application of PCT International Patent Application No. PCT/CN2024/074909 (filed on Jan. 31, 2024) under 35 U.S.C. § 371, which claims priority to Chinese Patent Application No. 202410063441.X (filed on Jan. 16, 2024), which are all hereby incorporated by reference in their entirety.

TECHNICAL FIELD

The present invention belongs to the technical field of OLEDs and in particular relates to a long-lifetime organic electroluminescent compound and an organic electroluminescent device comprising the same.

BACKGROUND ART

Organic Light-Emitting Diode (OLED) is a display lighting technology developed gradually in recent years. Especially in the display industry, OLED display has been widely concerned due to its advantages of high response, high contrast, flexibility, etc. At present, pixel units of full-color OLED display screens on the market are all composed of three primary colors, i.e., red, green and blue. According to the trichromatic theory, various colors can be generated by controlling the gray scales of the monochromatic colors red, green and blue of sub-pixel units, thus displaying color pictures. In three-color light-emitting devices, compared with red- and green-light materials, a blue-light material has higher energy and can undergo energy transfer to low-energy organic luminescent materials of green light, yellow light, red light, etc., and according to the trichromatic theory, blue light emission is the basis for realizing white and color display. Moreover, the lifetime of blue OLEDs is still insufficient as compared with that of red- and green-light OLEDs, and recent research (Hwang K M, Kim T, Kang S. A systematic investigation to unravel the primary determinant of the operational stability of blue fluorescent organic light-emitting diodes [J]. Journal of Materials Chemistry C, 2022, 10(27): 10139-10146.) has revealed that in a blue-light OLED device, the bond dissociation energy (BDE) of host molecules in a luminescent layer in the anionic state has a significant impact on the lifetime as compared with other functional layers except the luminescent layer. Although the BDE of the material in other functional layers except the luminescent layer, such as a hole blocking layer, in the anionic state is lower than that of the host material in the anionic state, the electrochemical stability of the host material has the greatest influence on the lifetime of a device.

At present, in almost all luminescent layers in blue organic electroluminescent devices, host-guest doped luminescent systems are used, that is, electroluminescence is realized by doping a host material with a guest doping material. Anthracene-based host materials are mainly used in commonly used blue fluorescent devices. It has been found from research that the efficiency of a blue-light device can be improved by introducing a moiety containing an oxygen atom with large electronegativity, such as dibenzofuran, into the host material; however, the BDE of carbon-oxygen bonds in an anthracene-based host material containing a dibenzofuran moiety in the anionic state is relatively low, i.e., approximately 1.727 eV, which is much lower than that of carbon-carbon bonds in the anionic state (about 3.99-4.11 eV); therefore, the stability of the anthracene-based host material containing the dibenzofuran moiety is relatively poor, causing the lifetime of the organic electroluminescent device to decrease.

Introducing special substituents and deuteration is a way to improve the stability of a material, and introducing an aryl substituent can improve the lifetime of a device; however, aryl substituents usually change the optical properties of the material, causing the efficiency of the device to decrease and change; Deuteration usually affects optical properties to a smaller extent; however, replacing all hydrogen atoms in the molecule with deuterium leads to relatively higher costs, and the effect of partial deuteration results in varying consequences depending on the site of deuteration. Especially when the site of deuteration is not the weakest part of the molecule, it is impossible to meet the market requirements of significantly improving the lifetime of devices, so it is urgent to develop a new long-lifetime luminescent layer host material for an organic electroluminescent device.

SUMMARY OF THE INVENTION

In view of this, the present invention provides a long-lifetime organic electroluminescent compound and an organic electroluminescent device containing the same. The organic electroluminescent compound has a relatively high stability. When the organic electroluminescent compound provided by the present invention is used as a host material in a luminescent layer of a blue organic electroluminescent device, a host material in the luminescent layer can effectively prolong the lifetime of the blue organic electroluminescent device and overcome the defects in the prior art.

In order to achieve the above object of the present invention, the following technical solution is used in the present invention.

In a first aspect of the present invention, there is provided a long-lifetime organic electroluminescent compound, wherein the general structural formula of the organic electroluminescent compound is shown as Formula I:

I

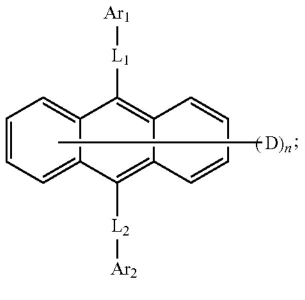

wherein D is deuterium and n is an integer selected from 0 to 8;

$Ar_1$ is selected from any one of a substituted or unsubstituted aryl group with a carbon atom number of 6 to 60, a substituted or unsubstituted fused aryl group with a carbon atom number of 10 to 60, and a substituted or unsubstituted fused heteroaryl group with a carbon atom number of 8 to 30;

$L_1$ and $L_2$ are selected from a single bond and a substituted or unsubstituted arylene group with a carbon atom number of 6 to 30;

when any one of $L_1$, $L_2$, and $Ar_1$ has substituents, the number of the substituents on the $L_1$, $L_2$, and $Ar_1$ may be one or more, and each of the substituents is independently selected from any one of deuterium, an alkyl group with a carbon atom number of 1 to 30, a haloalkyl group with a carbon atom number of 1 to 30, a cycloalkyl group with a carbon atom number of 3 to 30, an aryl group with a carbon atom number of 6 to 30, and a fused aryl group with a carbon atom number of 10 to 30; and $Ar_2$ is selected from any one of structures shown in Formulas II-1 to II-3:

II-1

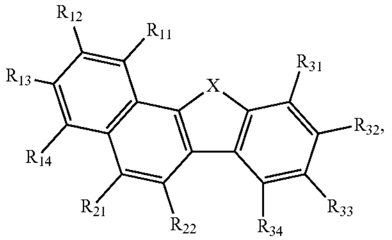

II-2

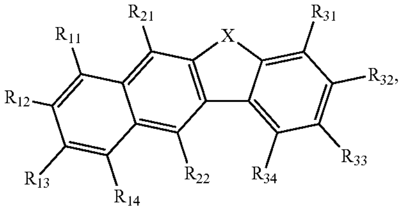

and

II-3

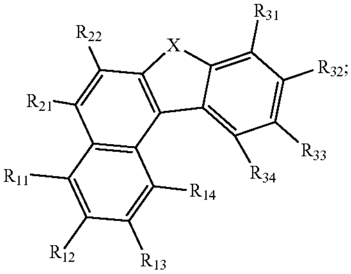

X is selected from O or S;

any one of $R_{11}$ to $R_{14}$, $R_{21}$, $R_{22}$, and $R_{31}$ to $R_{34}$ is bonded to $L_2$ of Formula I;

$R_{11}$ to $R_{14}$, $R_{21}$, $R_{22}$, and $R_{31}$ to $R_{34}$ are each independently selected from any one of hydrogen, deuterium, an alkyl group with a carbon atom number of 1 to 15, an alkenyl group with a carbon atom number of 2 to 20, and an aryl group with a carbon atom number of 6 to 30, wherein adjacent groups can be bonded to each other via a linker group or a single bond to form an aromatic ring or a fused ring; and when any one of $R_{11}$ to $R_{14}$, $R_{21}$, and $R_{22}$ is selected from deuterium, none of $R_{31}$ to $R_{34}$ is selected from deuterium; when none of $R_{11}$ to $R_{14}$, $R_{21}$, and $R_{22}$ is selected from deuterium, at least one of $R_{31}$ to $R_{34}$ is selected from deuterium; and when any one of $R_{11}$ to $R_{14}$, $R_{21}$, $R_{22}$, and $R_{31}$ to $R_{34}$ is selected from deuterium, hydrogens belonging to the same benzene ring as the selected group are all replaced with deuterium.

In the first aspect of the present invention, there is provided an organic electroluminescent compound. The organic electroluminescent compound contains a benzonaphthofuran moiety (in the position of $Ar_2$). In the present invention, by means of the benzonaphthofuran structure instead of dibenzofuran, the conjugated length of π electron cloud is prolonged. When the molecule is converted into an anionic state after accepting electrons, the negative charges can be effectively dispersed on the benzonaphthofuran moiety, avoiding excessively high local energy caused by uneven distribution of the negative charges, thus increasing the stability of a material. Furthermore, the benzonaphthofuran moiety has also been found to have a relatively good planarity, and the stability of the material can be significantly improved by means of partial deuteration. In the present invention, by means of deuteration at some sites on the benzonaphthofuran structure, the vibration of carbon-hydrogen bonds can be significantly reduced, the stability of the benzonaphthofuran can be enhanced, and the deuteration cost can be reduced.

In conjunction with the first aspect, $Ar_2$ is selected from any one of the following structures shown in Formula II-11 to Formula II-34, wherein II-11 to II-15 are a group of general structures, II-21 to II-26 are a group of general structures, and II-31 to II-34 are a group of general structures:

II-11

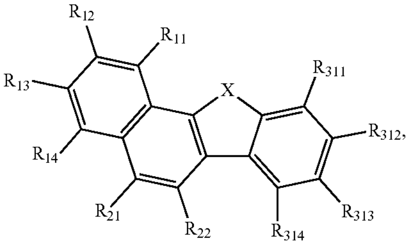

II-12

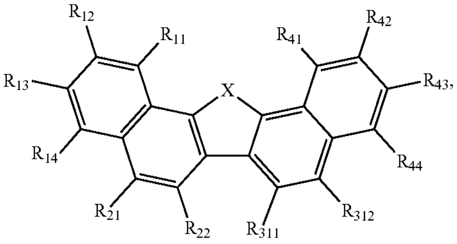

II-13

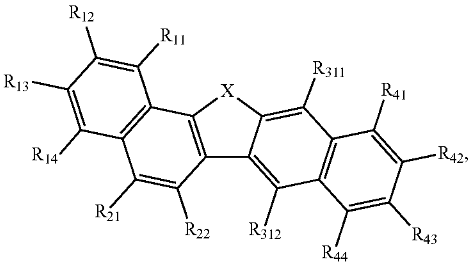

-continued
II-14
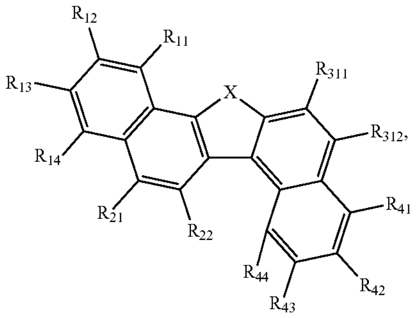
II-15
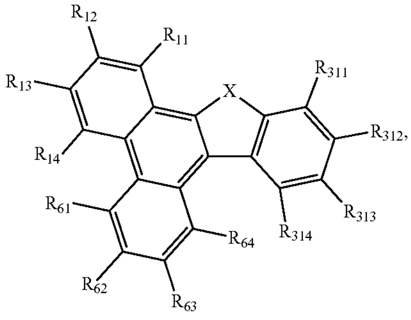
II-21
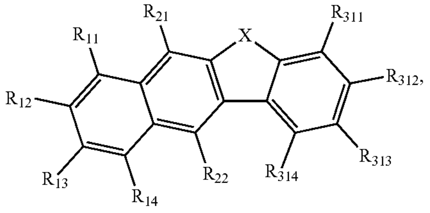
II-22
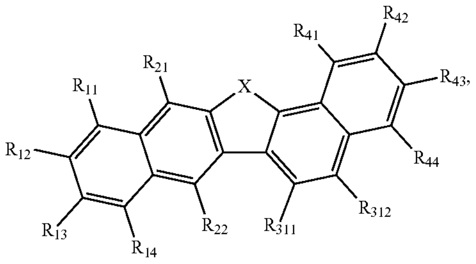
II-23
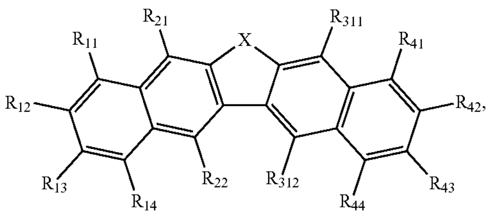
II-24
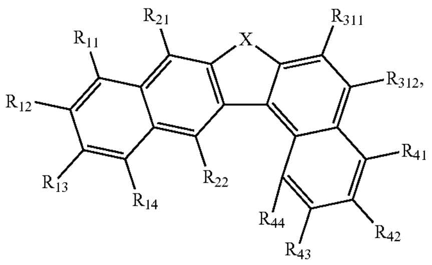
-continued
II-25
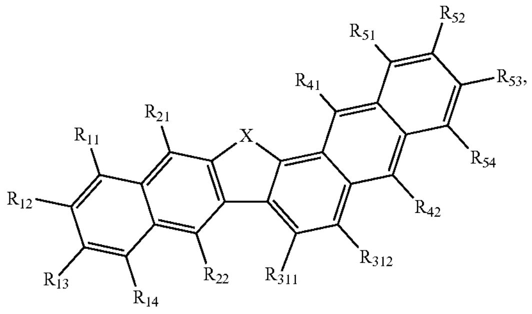
II-26
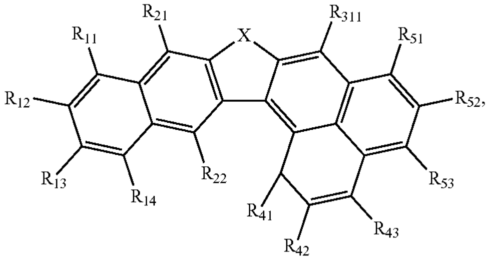
II-31
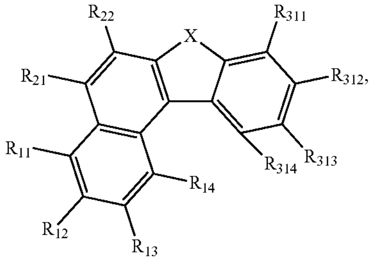
II-32
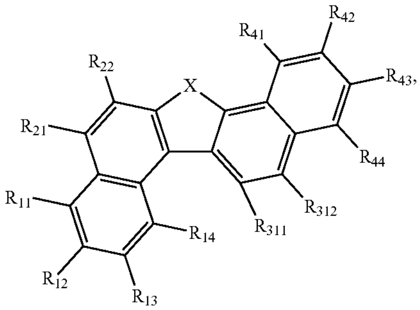
II-33
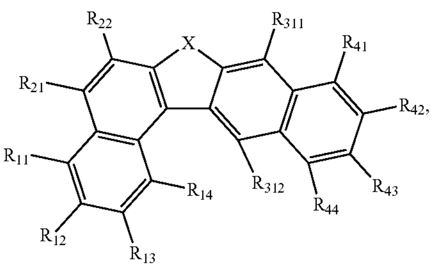
and -continued

II-34

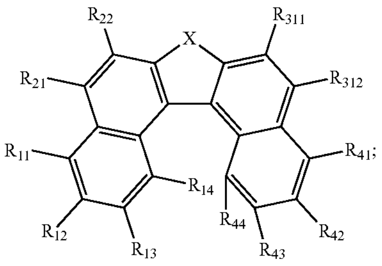

wherein any one of $R_{11}$ to $R_{14}$, $R_{21}$, $R_{22}$, $R_{311}$ to $R_{314}$, $R_{41}$ to $R_{44}$, $R_{51}$ to $R_{54}$, and $R_{61}$ to $R_{64}$ is bonded to $L_2$ of Formula I;

$R_{11}$ to $R_{14}$, $R_{21}$, $R_{22}$, $R_{41}$ to $R_{44}$, $R_{51}$ to $R_{54}$, and $R_{61}$ to $R_{64}$ are selected from hydrogen or deuterium, and $R_{311}$ to $R_{314}$ are selected from hydrogen, deuterium, or an aryl group with a carbon atom number of 6 to 30;

when any one of $R_{11}$ to $R_{14}$, $R_{21}$, $R_{22}$, and $R_{61}$ to $R_{64}$ is selected from deuterium, none of $R_{311}$ to $R_{314}$, $R_{41}$ to $R_{44}$, and $R_{51}$ to $R_{54}$ is selected from deuterium, and when any one of $R_{11}$ to $R_{14}$, $R_{21}$, $R_{22}$, $R_{311}$ to $R_{314}$, $R_{41}$ to $R_{44}$, $R_{51}$ to $R_{54}$, and $R_{61}$ to $R_{64}$ is selected from deuterium, hydrogens belonging to the same benzene ring as the selected group and hydrogens on a group belonging to the same benzene ring as the selected group are all replaced with deuterium; and when none of $R_{11}$ to $R_{14}$, $R_{21}$, $R_{22}$, and $R_{61}$ to $R_{64}$ is selected from deuterium, at least one of $R_{311}$ to $R_{314}$, $R_{41}$ to $R_{44}$, and $R_{51}$ to $R_{54}$ is selected from deuterium, and when any one of $R_{11}$ to $R_{14}$, $R_{21}$, $R_{22}$, $R_{31}$ to $R_{314}$, $R_{41}$ to $R_{44}$, $R_{51}$ to $R_{54}$, and $R_{61}$ to $R_{64}$ is selected from deuterium, hydrogens belonging to the same benzene ring as the selected group and hydrogens on a group belonging to the same benzene ring as the selected group are all replaced with deuterium.

In conjunction with the first aspect, II-11 is selected from any one of the following structures shown in Formulas II-111 to II-114:

II-111

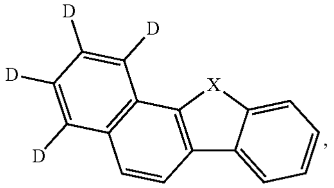

II-112

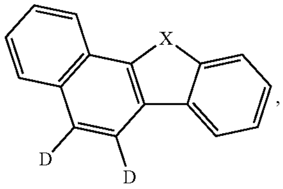

-continued

II-113

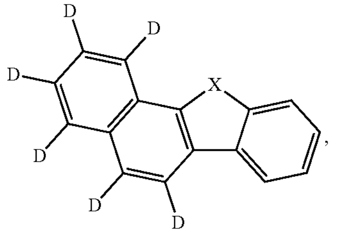

and

II-114

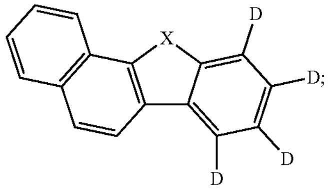

II-21 is selected from any one of the following structures shown in Formulas II-211 to II-214:

II-211

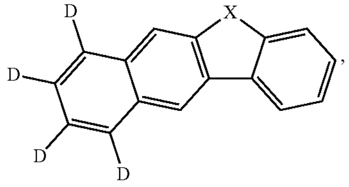

II-212

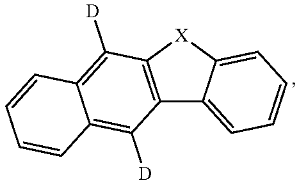

II-213

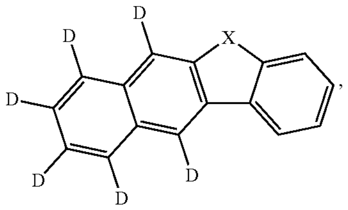

and

II-214

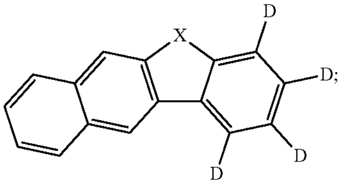

II-31 is selected from any one of the following structures shown in Formulas II-311 to II-314:

II-311

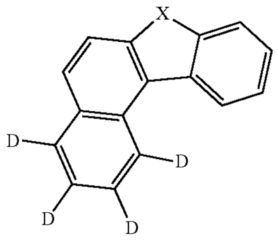

,

II-312

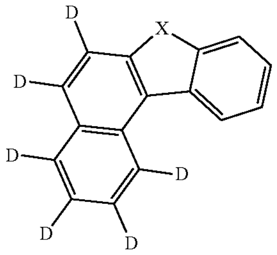

,

II-313

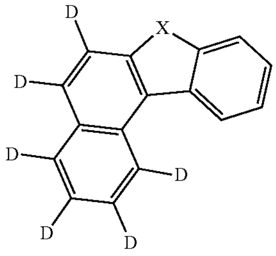

, and

II-314

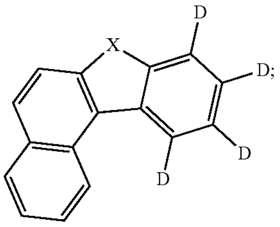

and any site on the structures shown in Formulas II-111 to II-314 can be bonded to $L_2$ of Formula I.

In conjunction with the first aspect, $Ar_1$ is selected from any one of a substituted or unsubstituted phenyl or biphenyl group with a carbon atom number of 6 to 60, a substituted or unsubstituted naphthyl or perinaphthenyl group with a carbon atom number of 10 to 60, and a substituted or unsubstituted benzonaphthofuranyl or dinaphthofuranyl group with a carbon atom number of 8 to 30; and when $Ar_1$ has substituents, the number of the substituents on $Ar_1$ may be one or more, and the substituents are each independently selected from any one of deuterium, methyl, ethyl, isopropyl, tert-butyl, halomethyl, adamantyl, phenyl, biphenyl, and naphthyl.

In conjunction with the first aspect, $L_1$ and $L_2$ are selected from any one of a single bond, deuterated or non-deuterated phenylene, and deuterated or non-deuterated biphenylene.

In conjunction with the first aspect, $L_1$ and $L_2$ are selected from a single bond or phenylene.

In conjunction with the first aspect, X is selected from O.

In conjunction with the first aspect, $Ar_1$ is selected from any one of phenyl, biphenyl, and naphthyl.

In conjunction with the first aspect, the organic electroluminescent compound is selected from any one of the following structures:

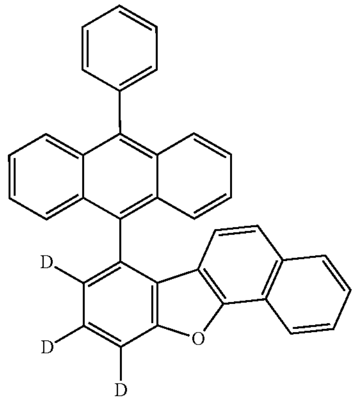

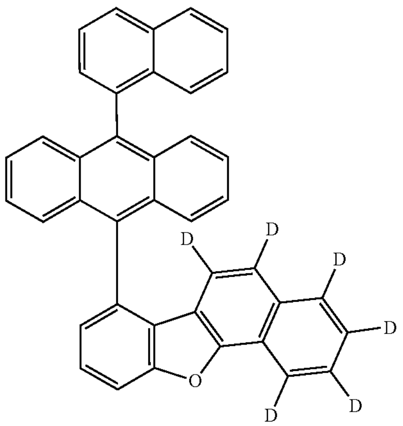

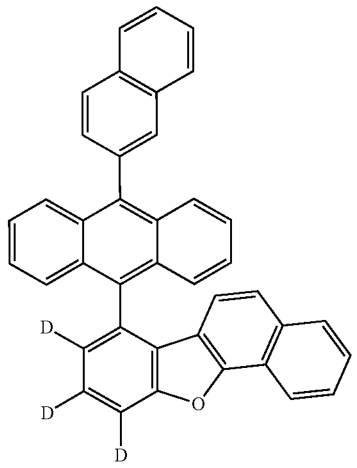

-continued
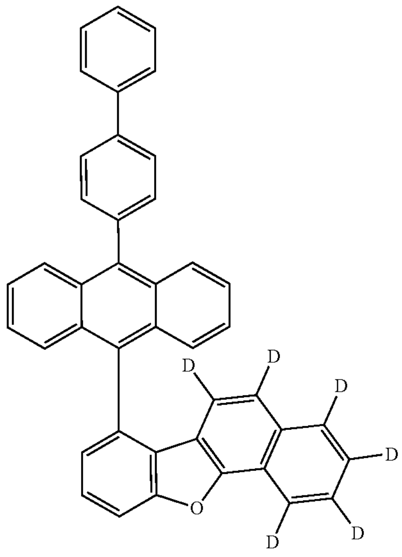
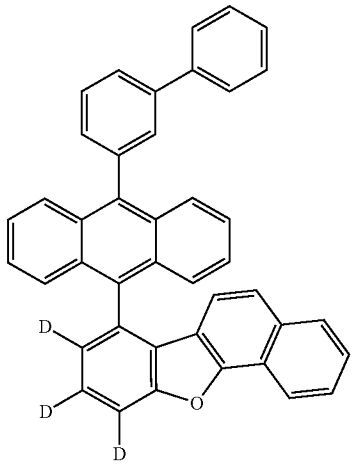
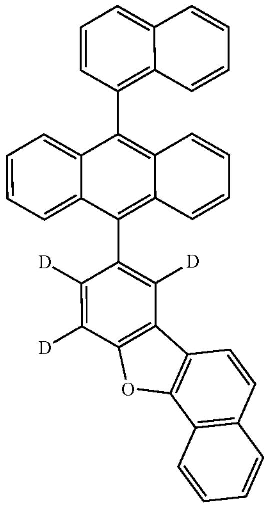
-continued
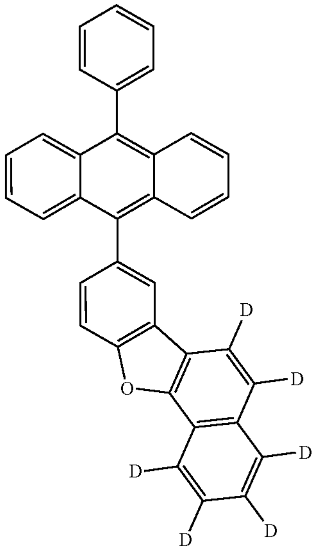
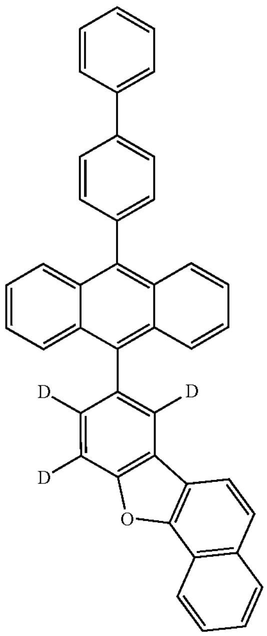

-continued
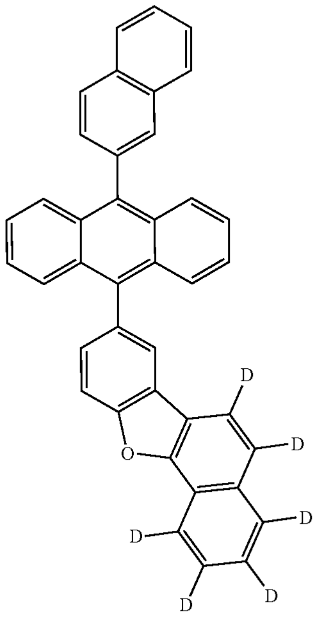
-continued
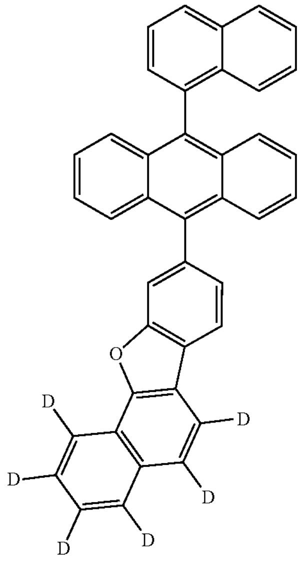
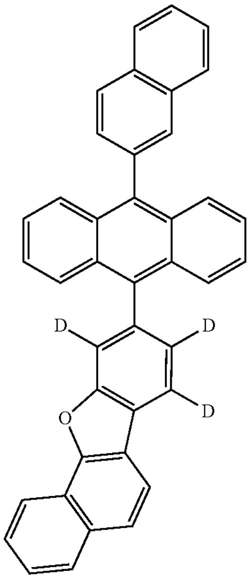
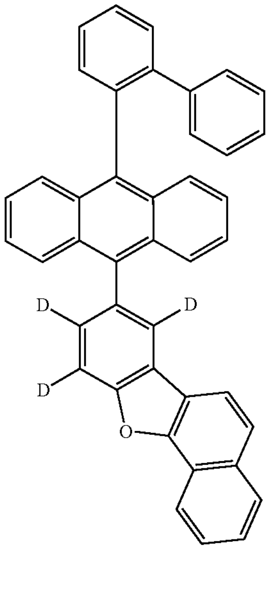
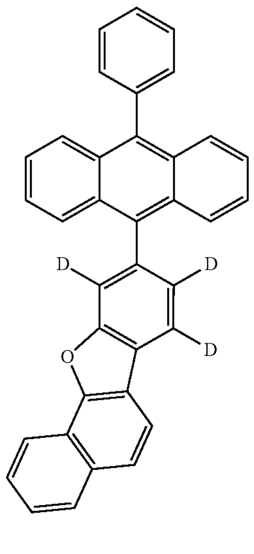
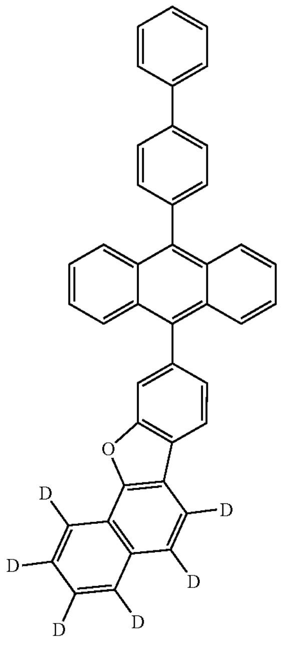

-continued
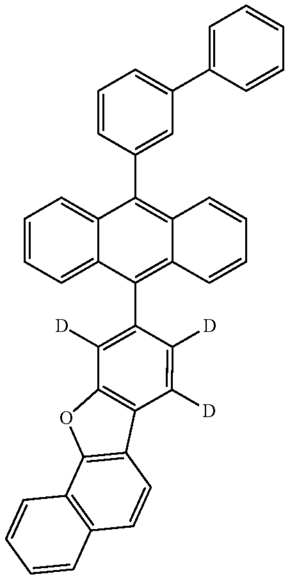
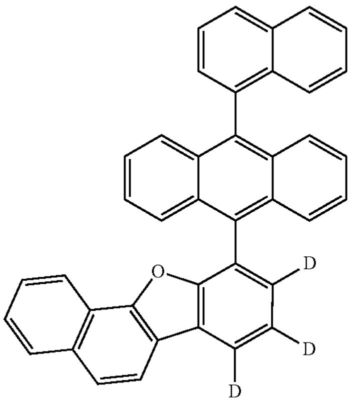
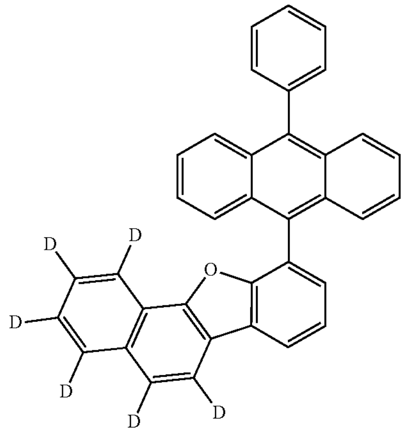
-continued
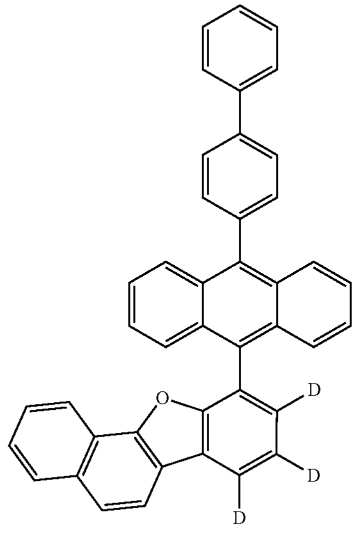
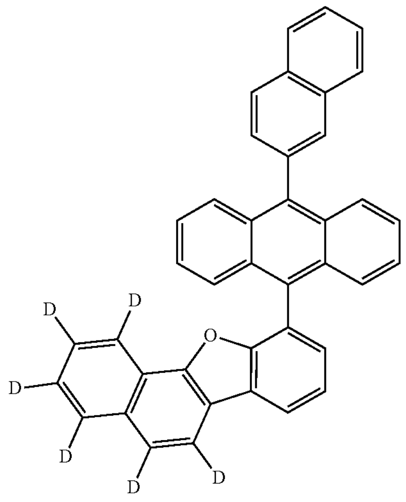
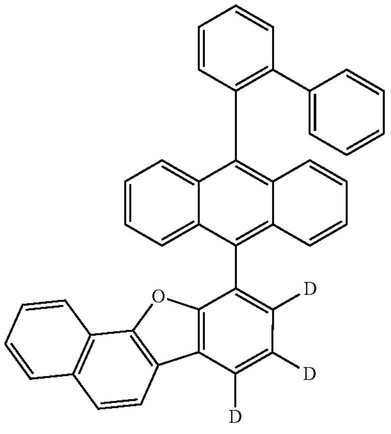

-continued
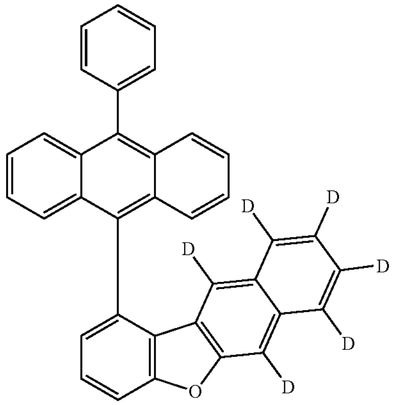
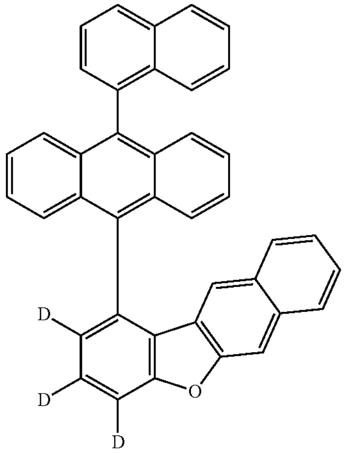
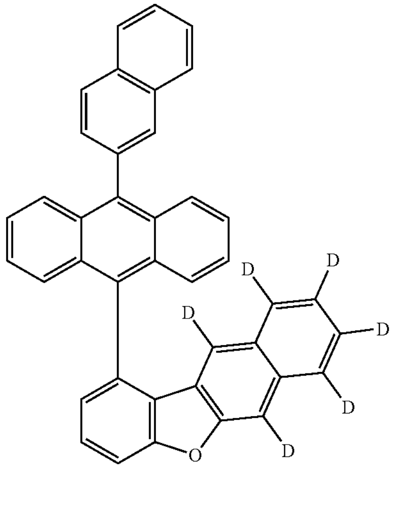
-continued
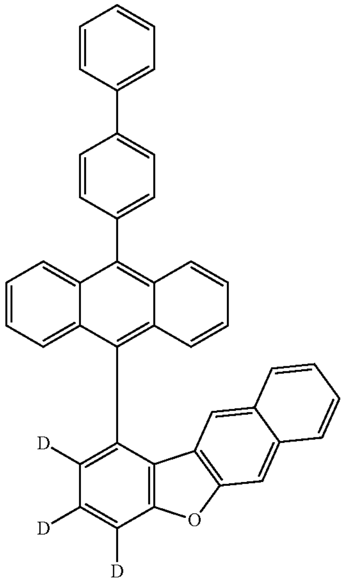
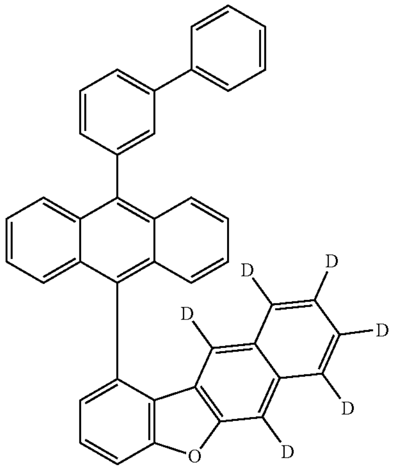
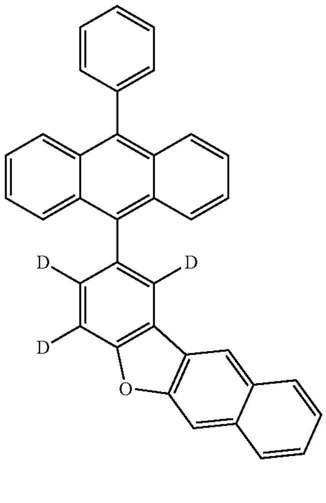

-continued
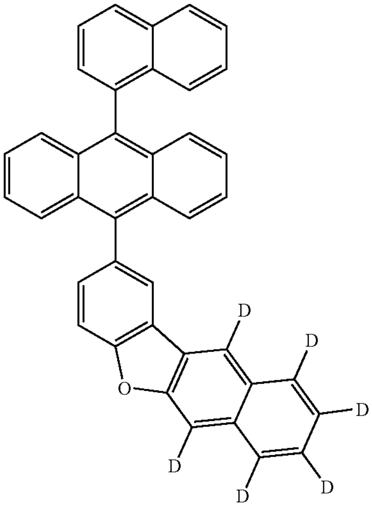
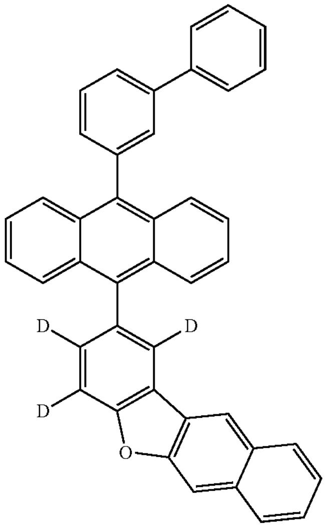
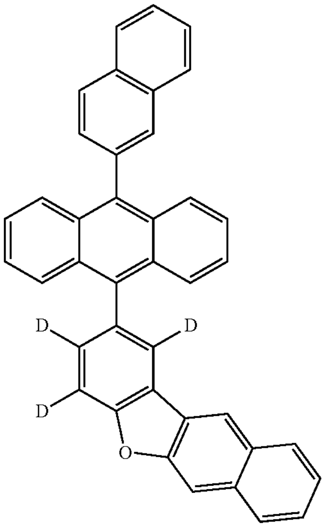
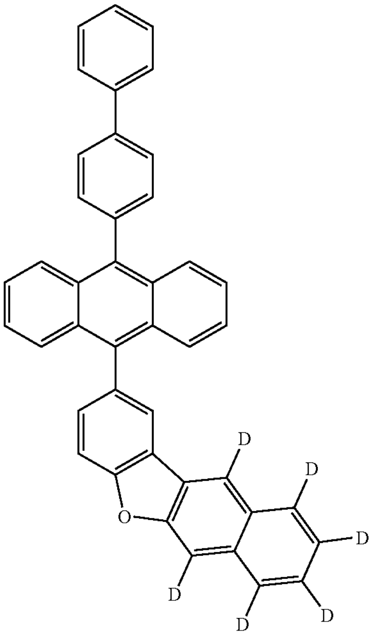
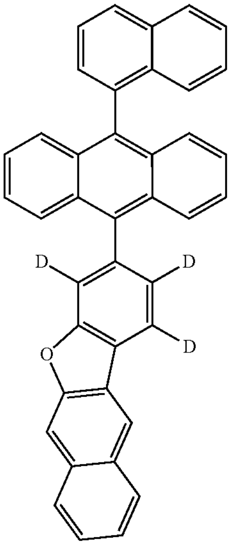
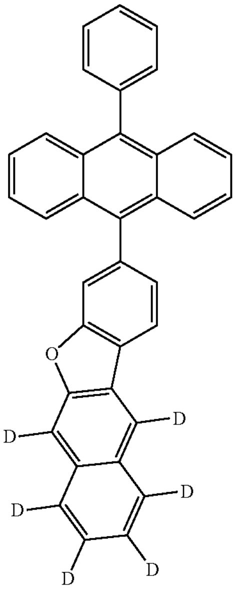

-continued
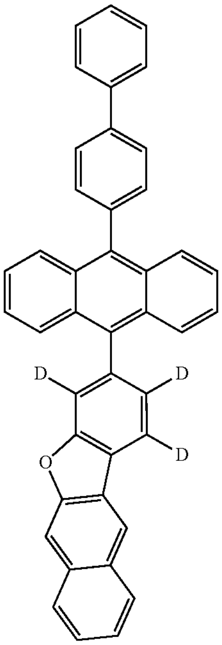
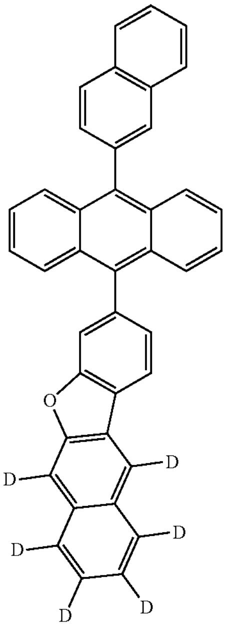
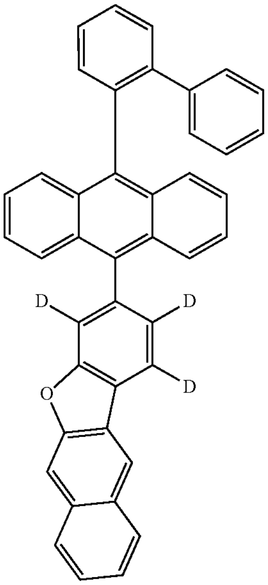
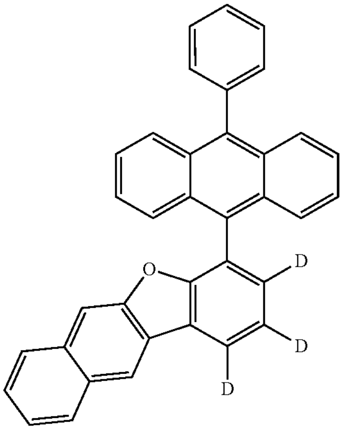
-continued
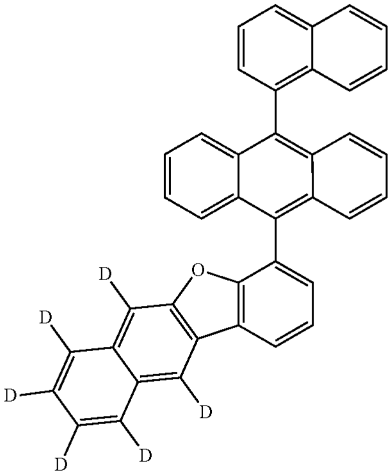
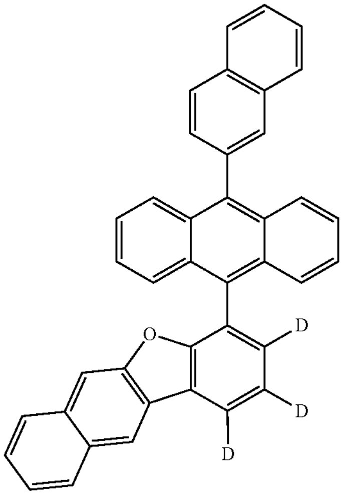
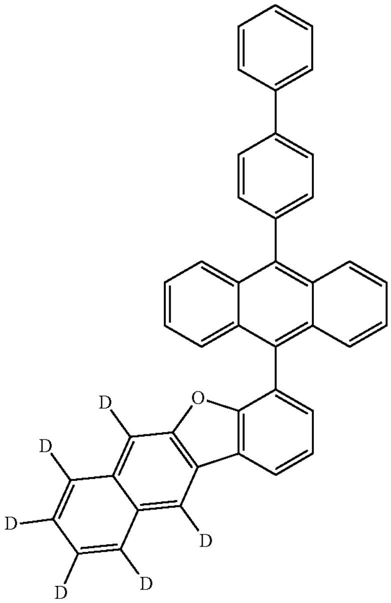

-continued
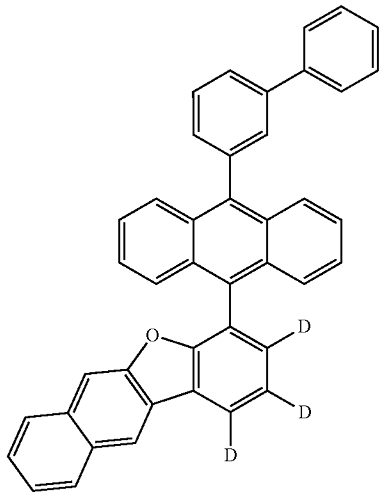
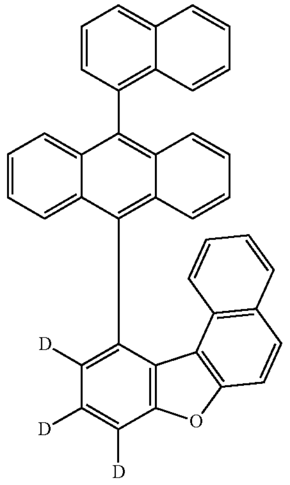
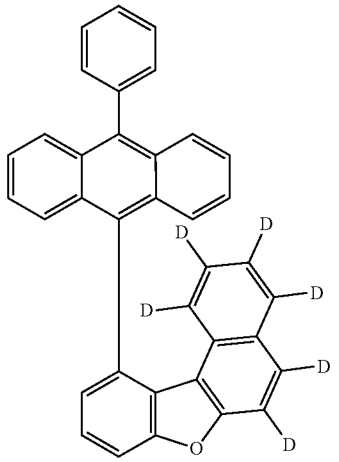
-continued
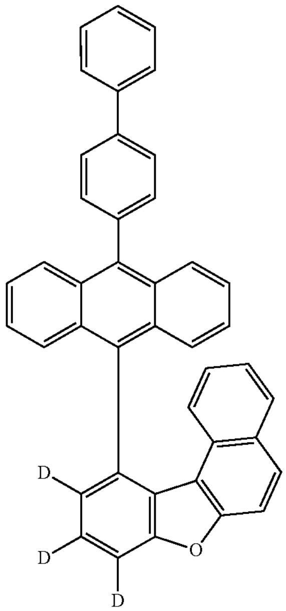
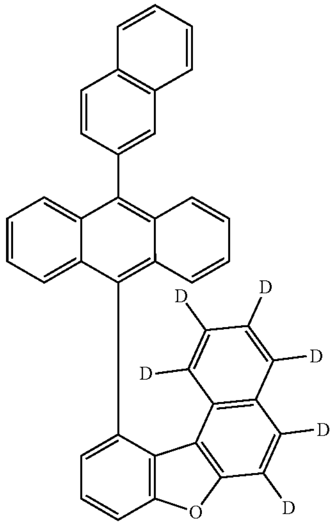
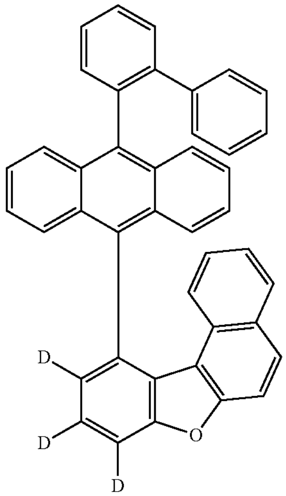

-continued
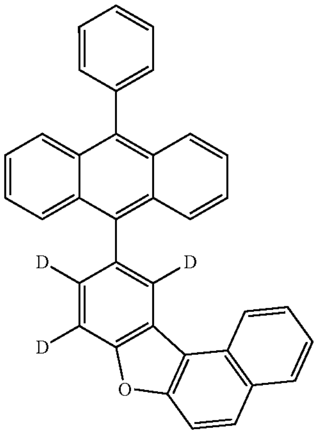
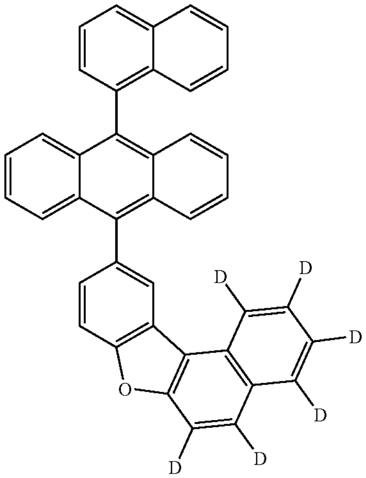
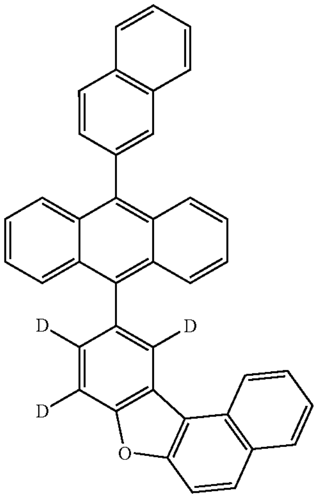
-continued
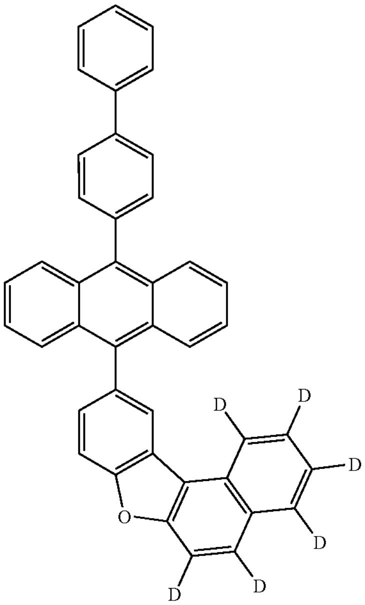
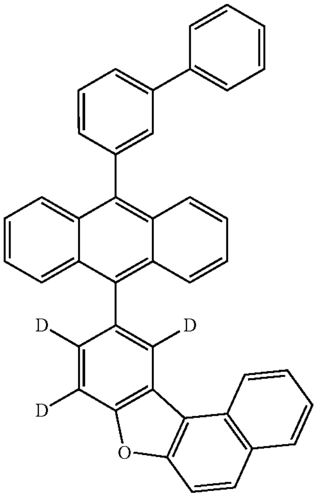
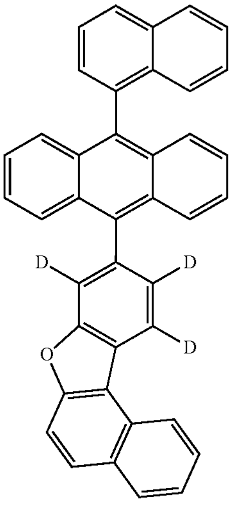
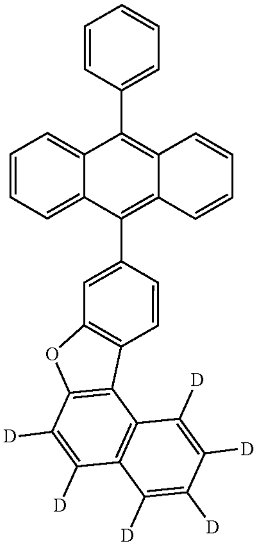

-continued
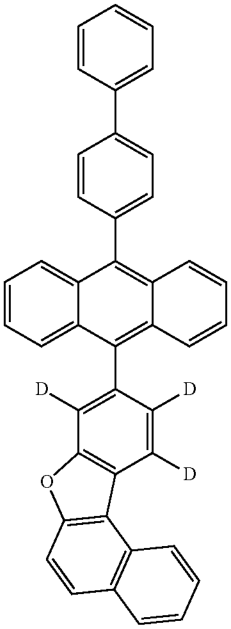
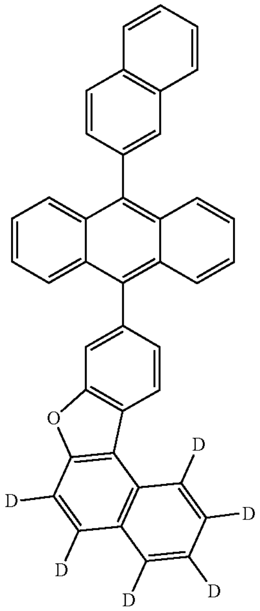
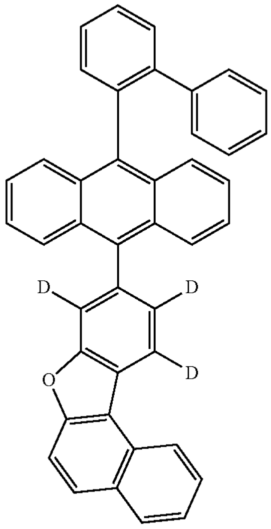
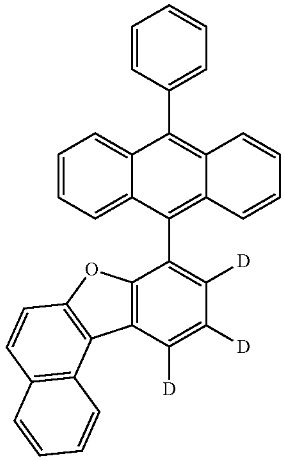
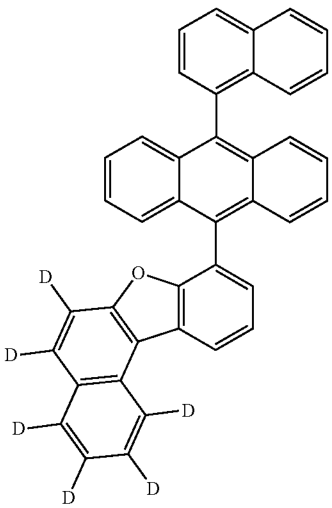
-continued
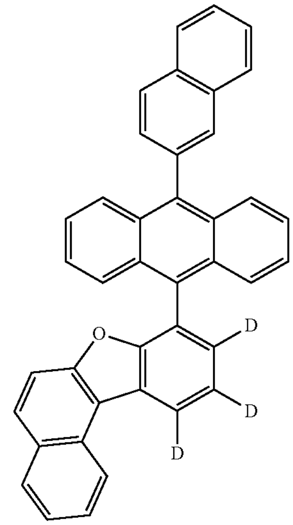
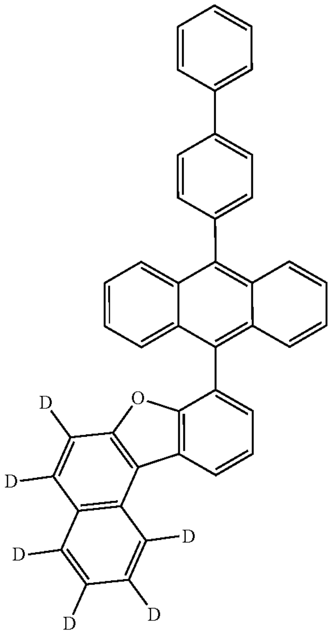
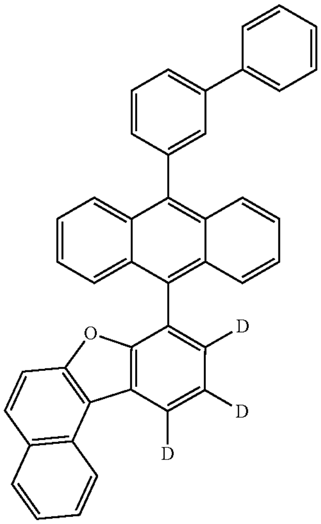

-continued
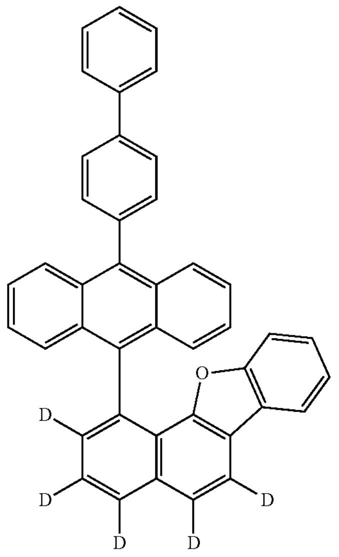
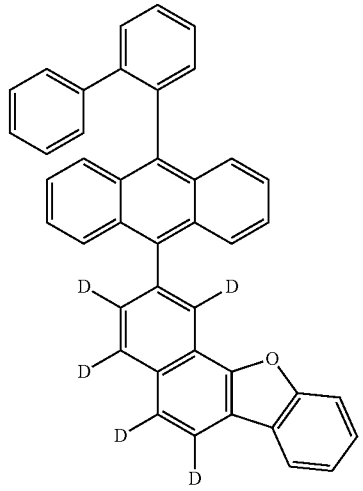
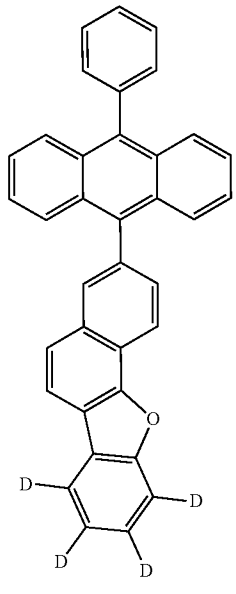
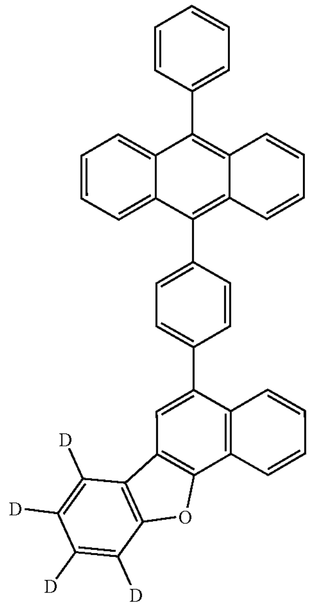
-continued
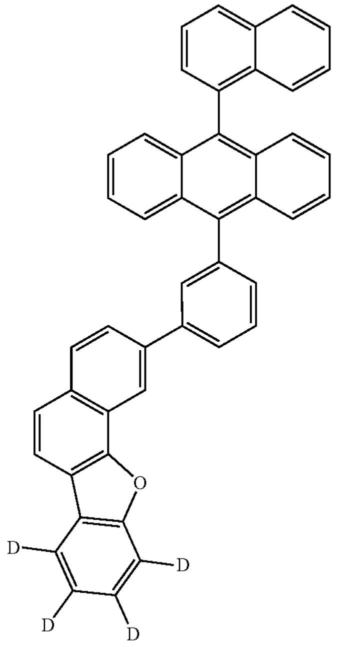
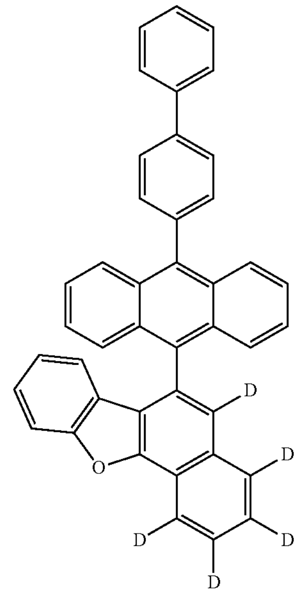
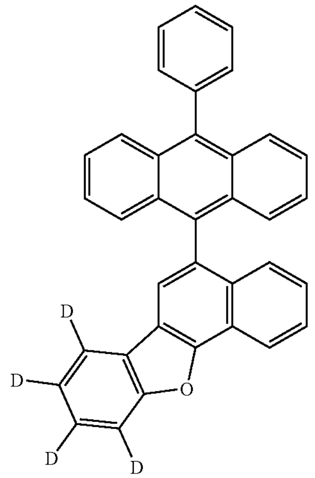

-continued
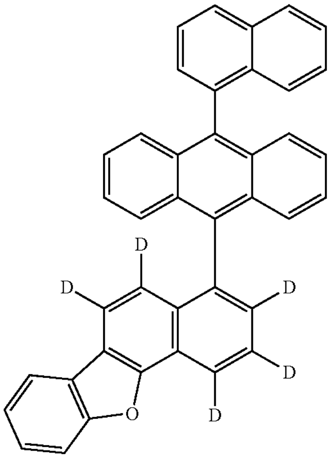
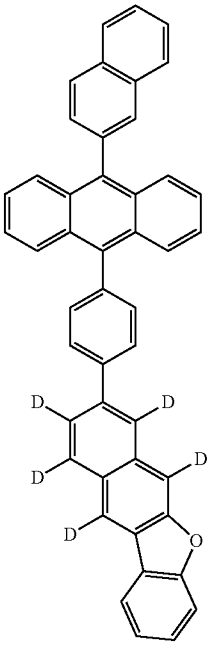
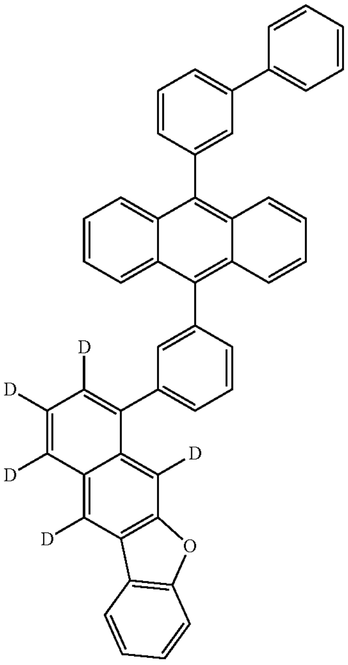
-continued
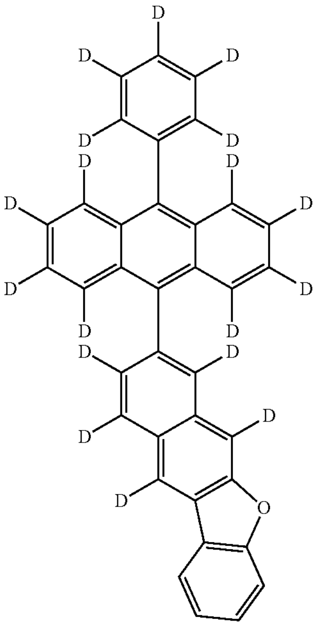
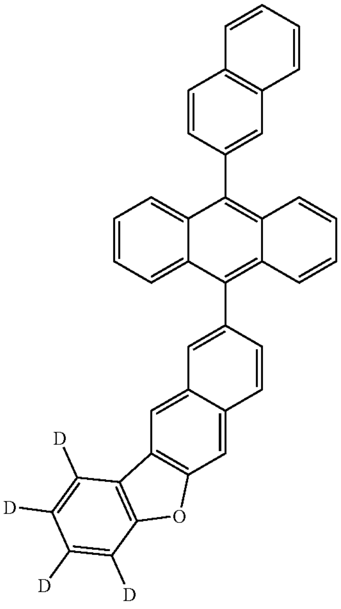

-continued
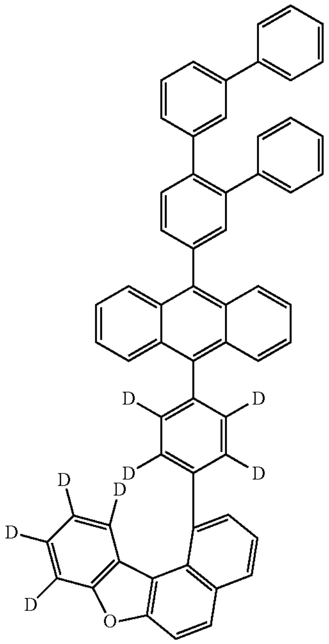
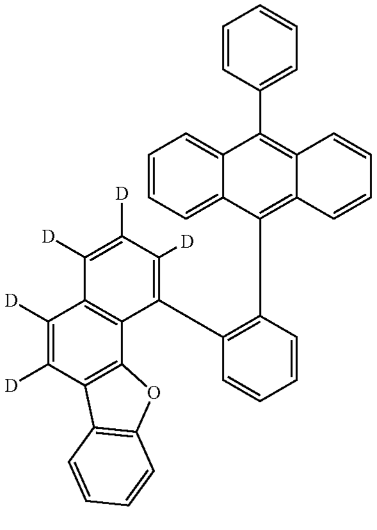
-continued
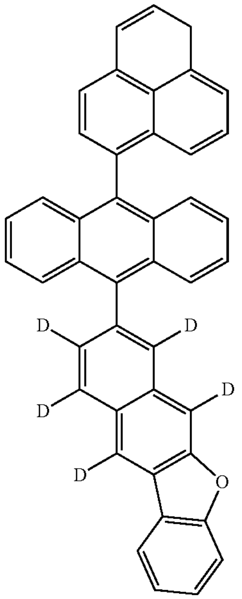
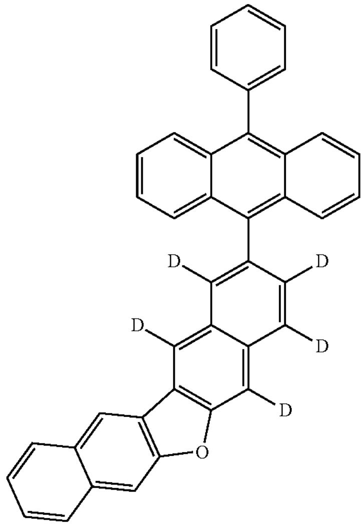
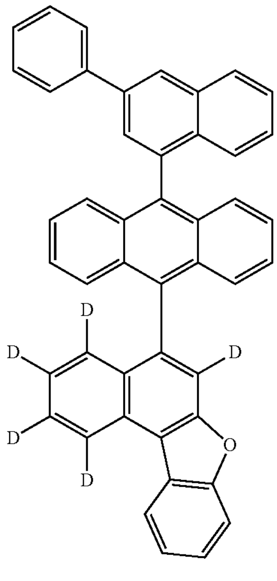

-continued
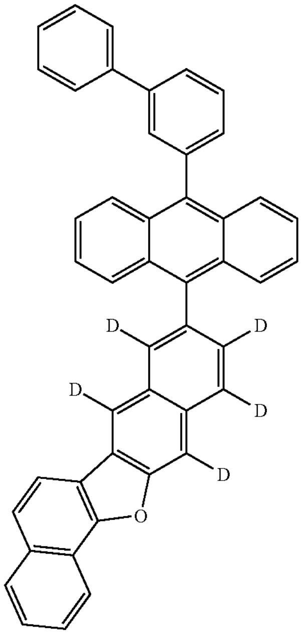
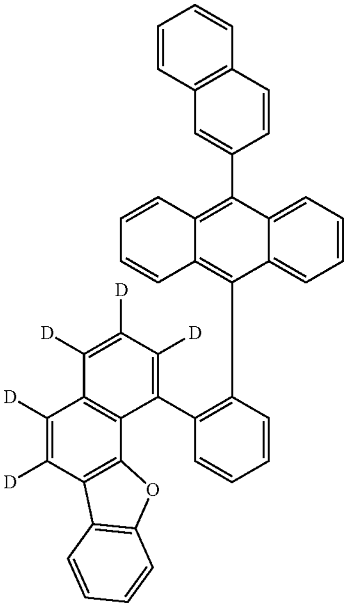
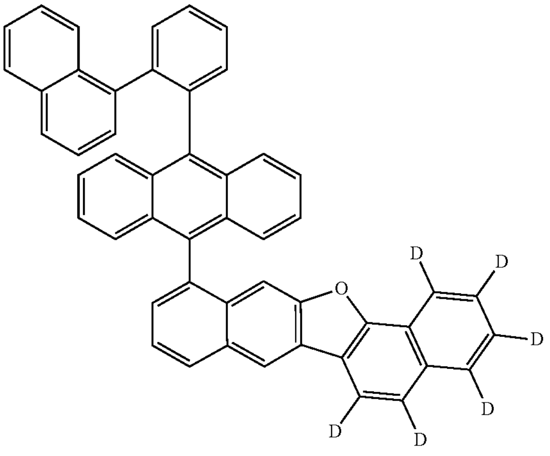
-continued
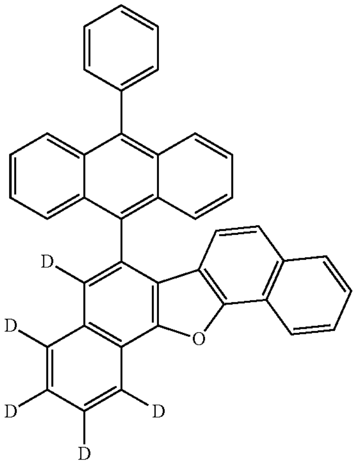
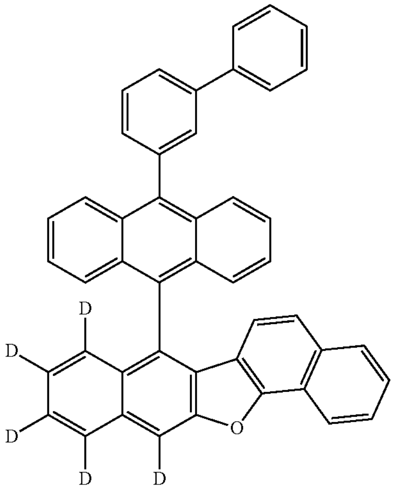
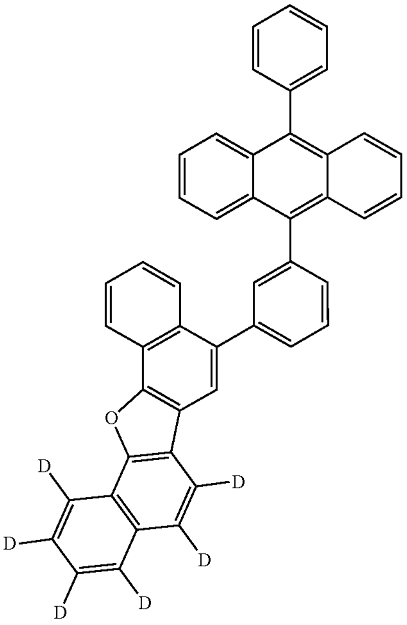

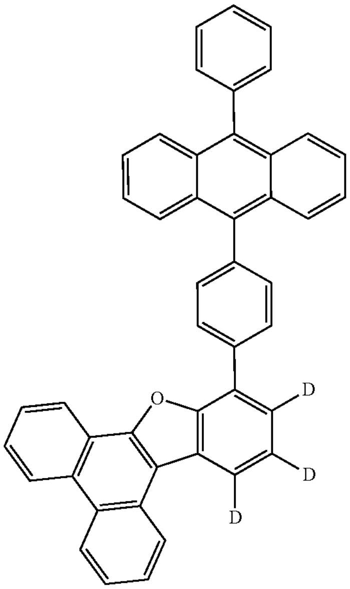
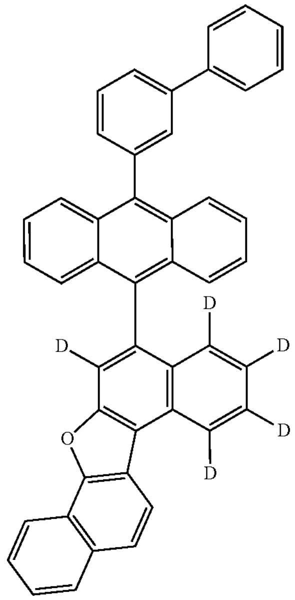
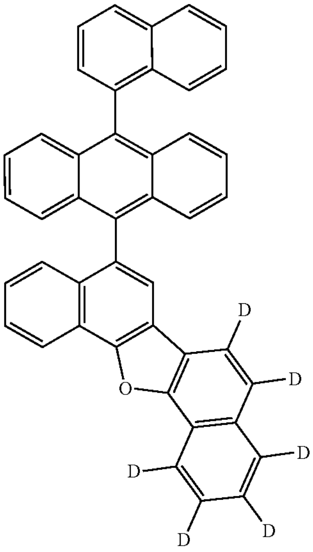
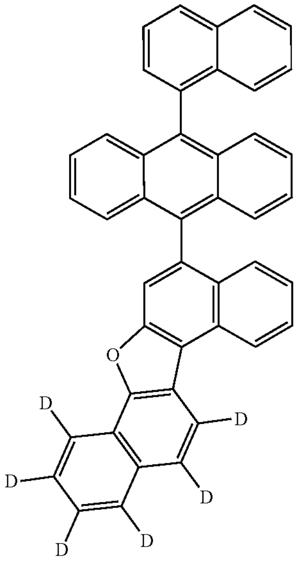

-continued
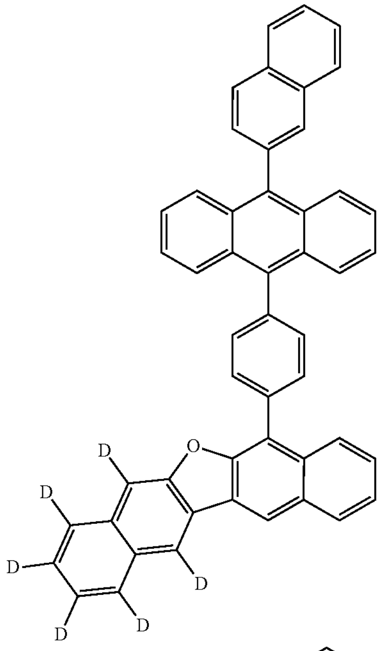
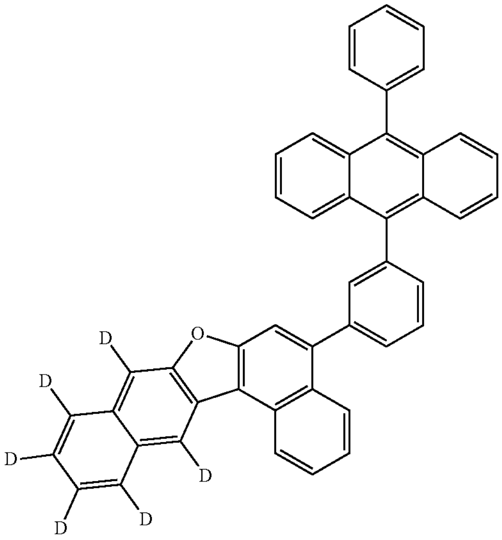
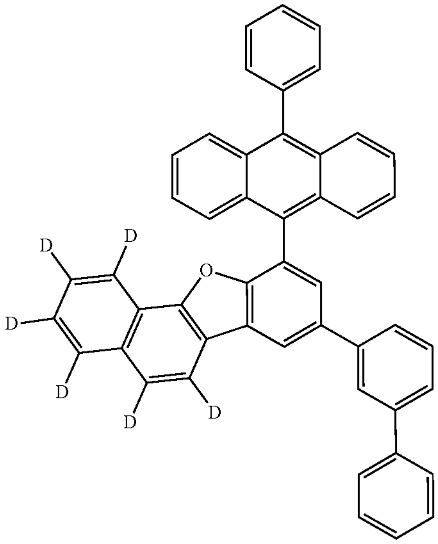
-continued
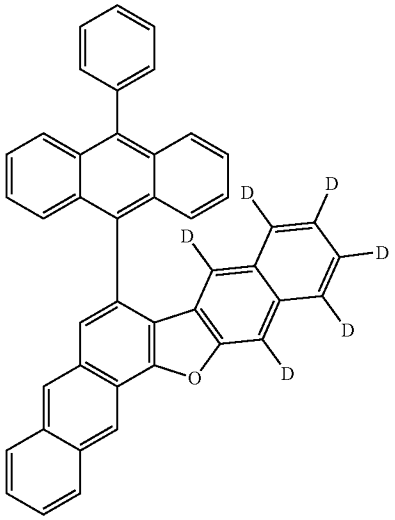
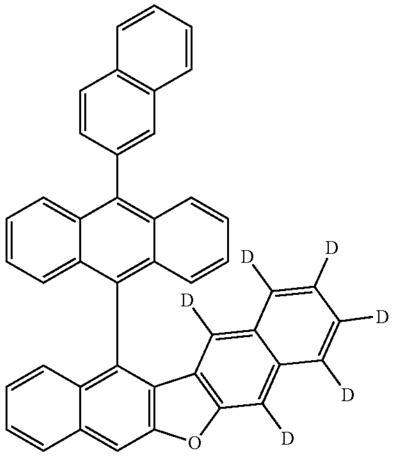
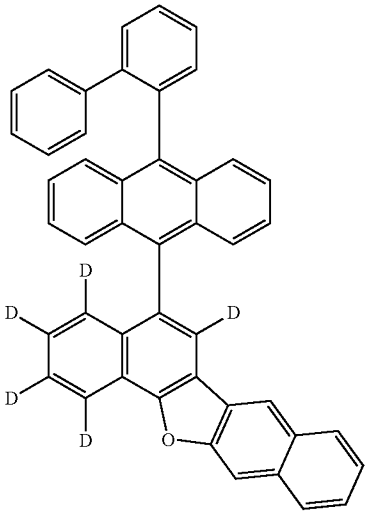

-continued
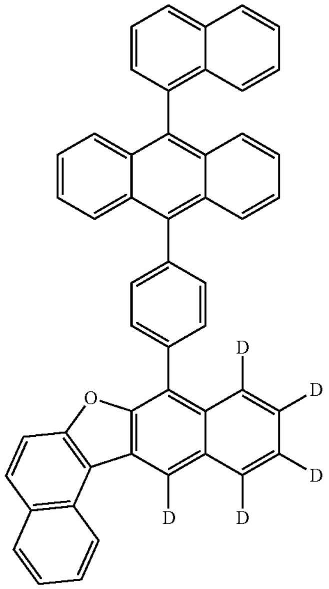
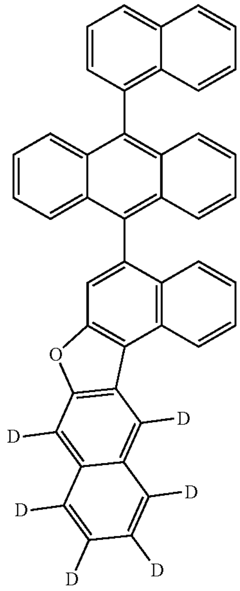
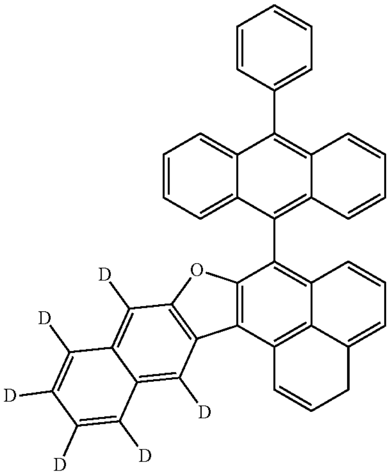
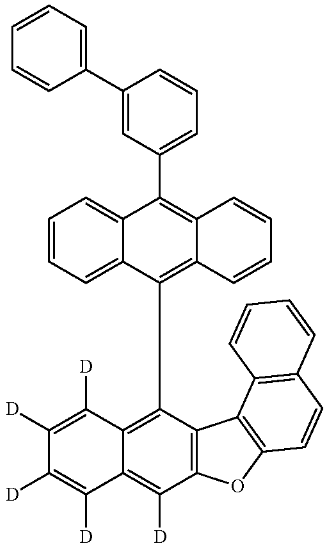
-continued
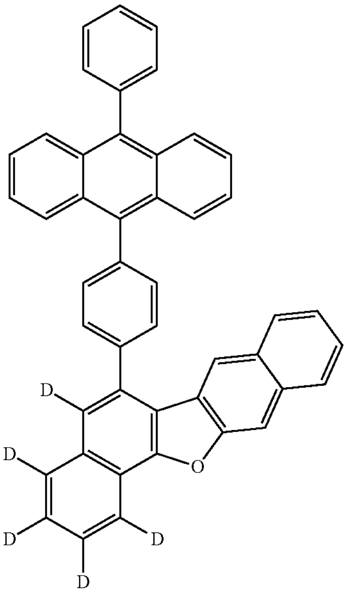
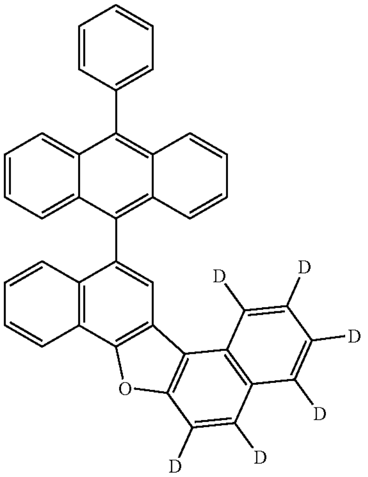
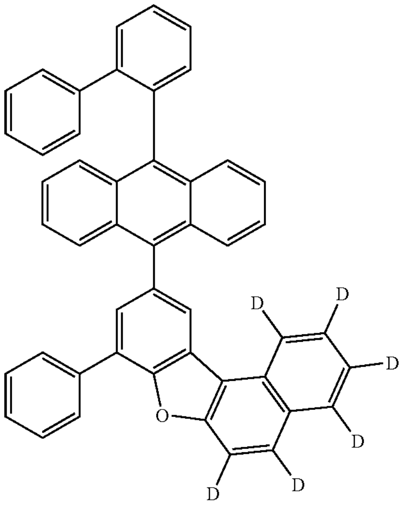

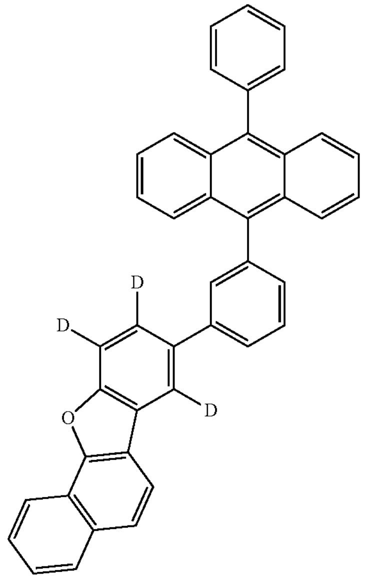
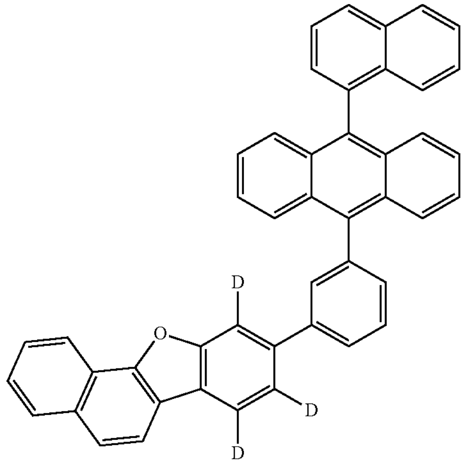
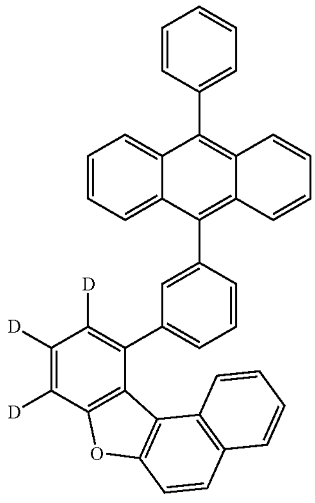
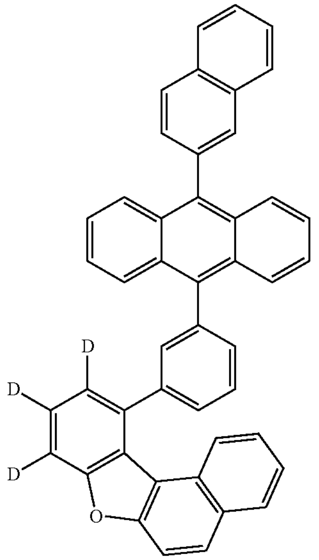
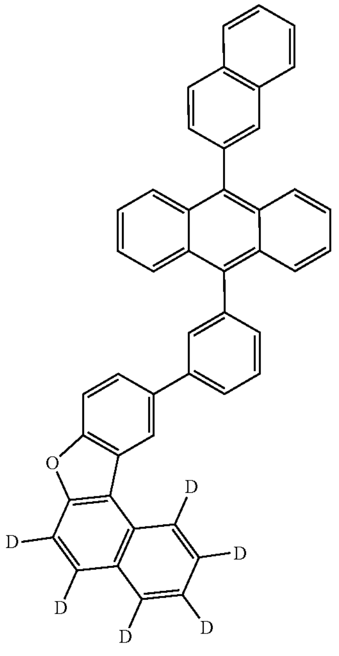

-continued
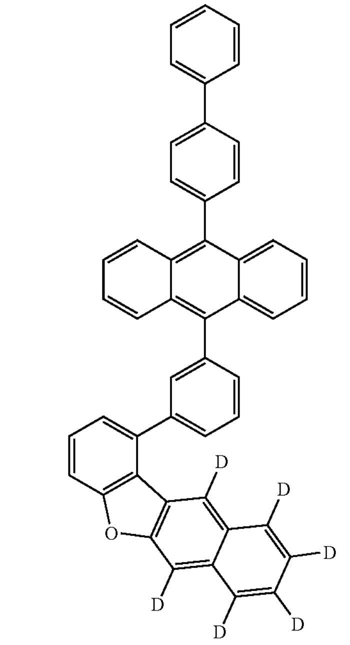
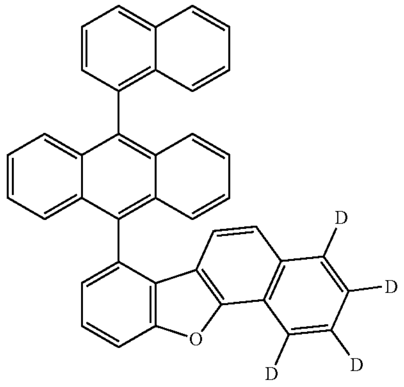
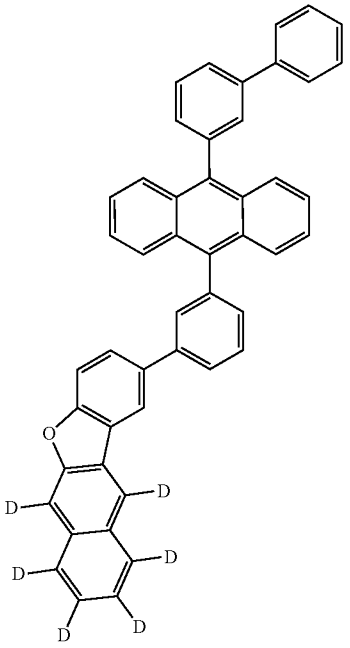
-continued
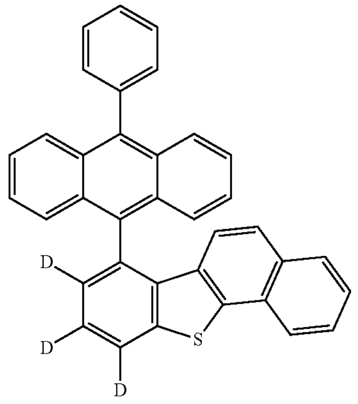
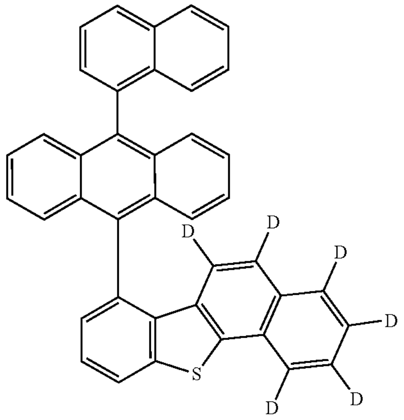
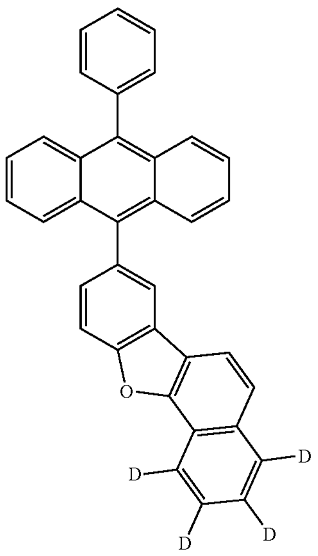

-continued
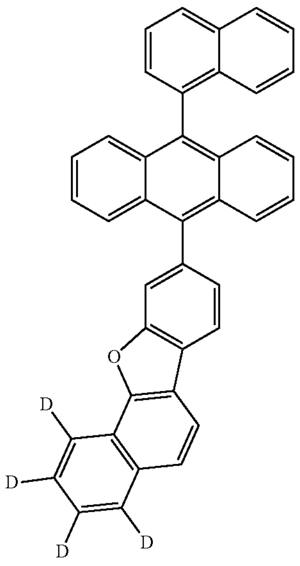
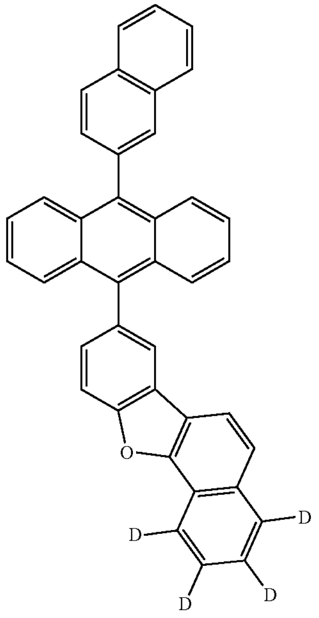
-continued
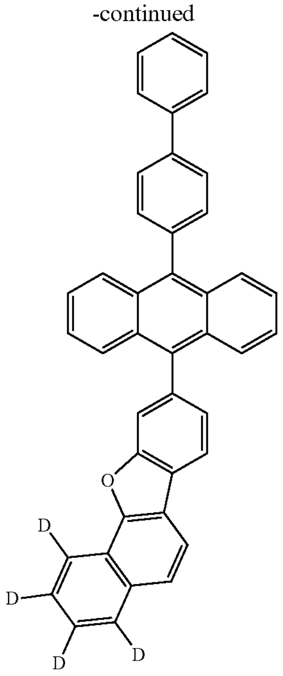
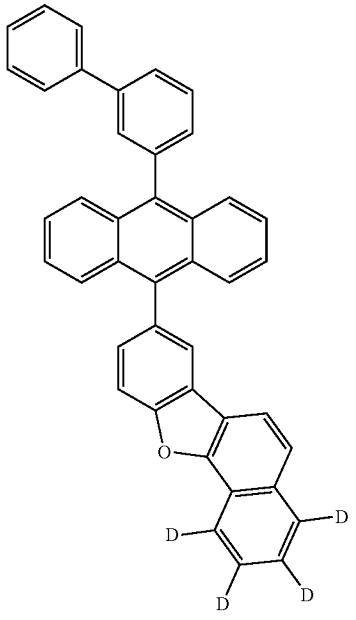
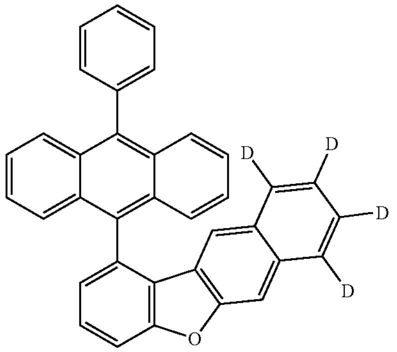

-continued
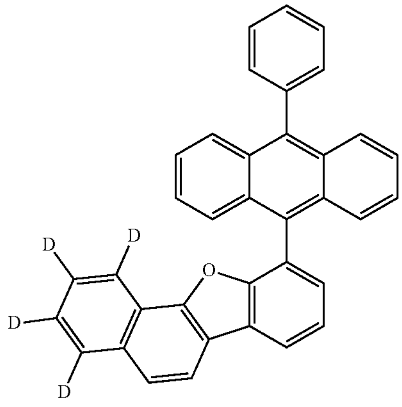
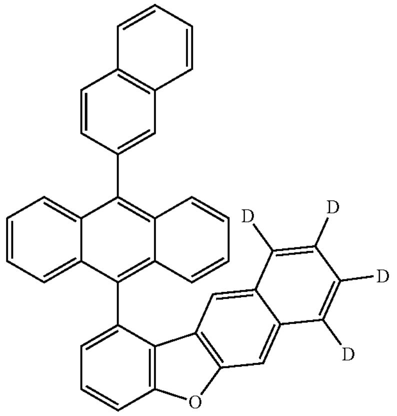
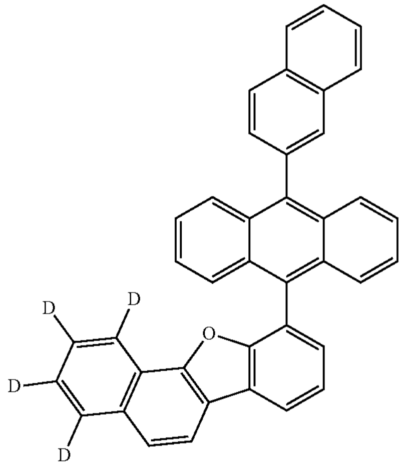
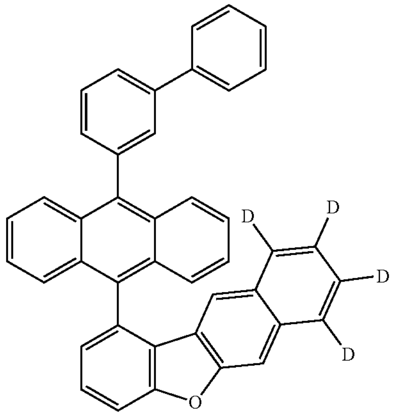
-continued
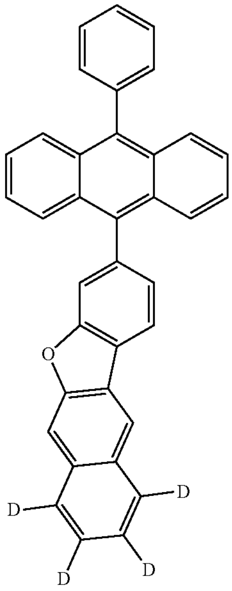
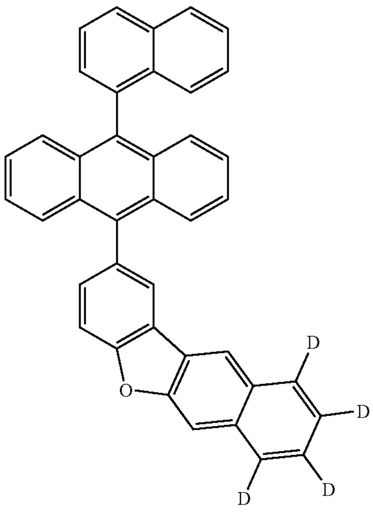

-continued
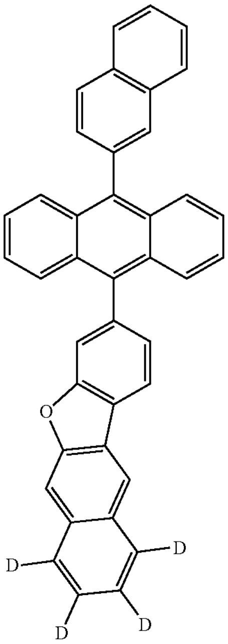
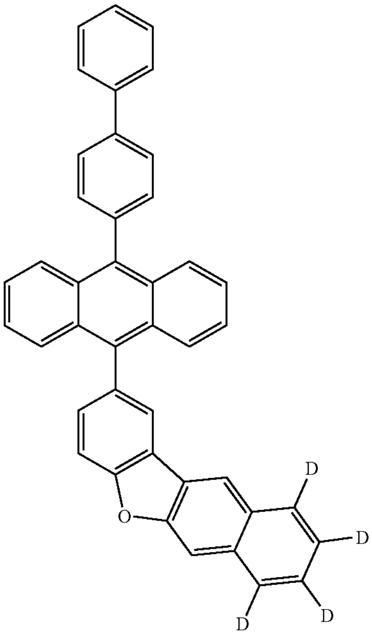
-continued
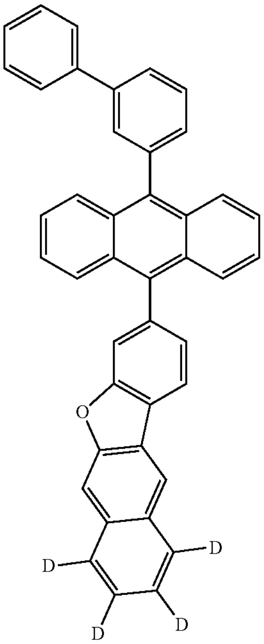
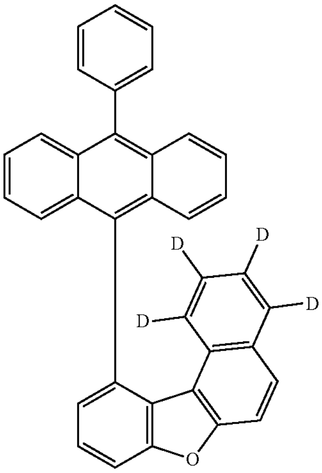
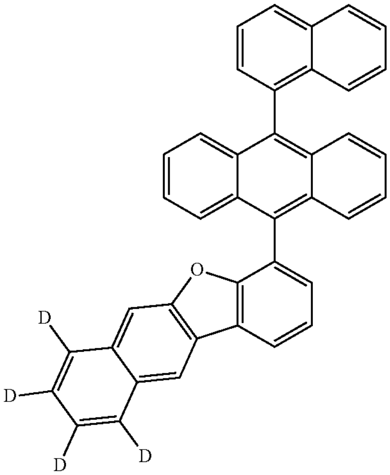

-continued
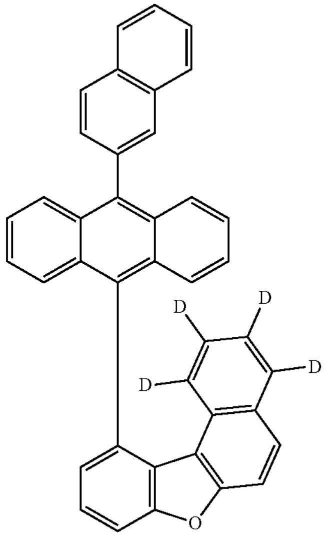
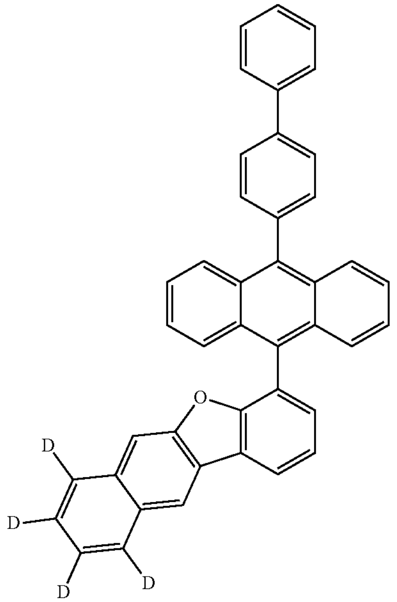
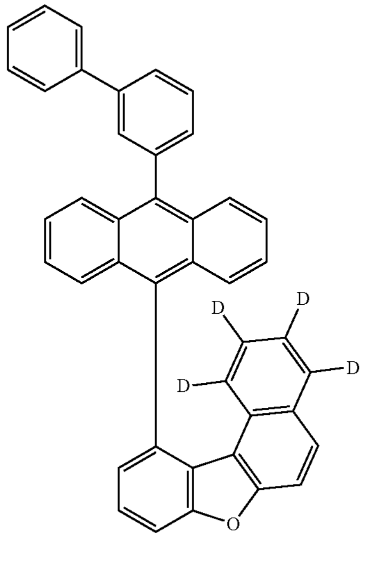
-continued
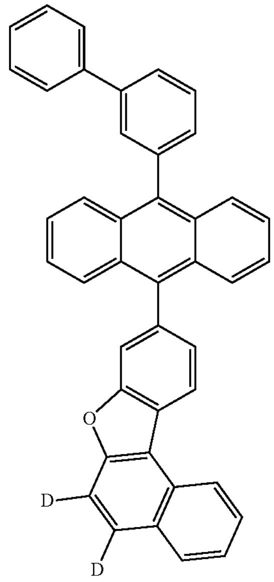
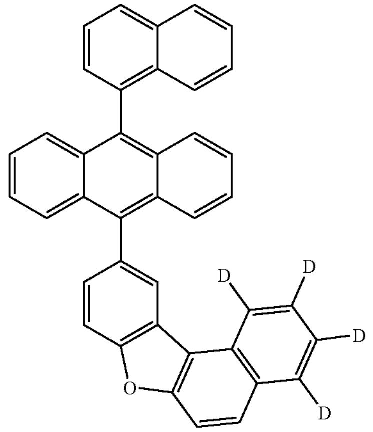
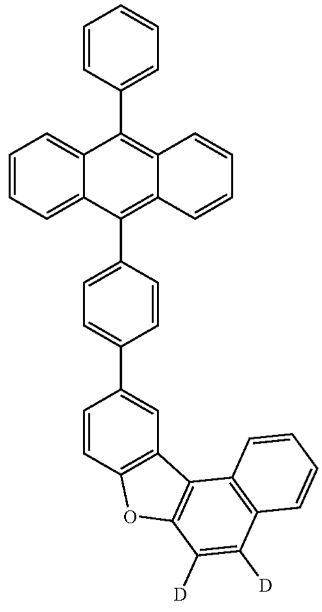

-continued
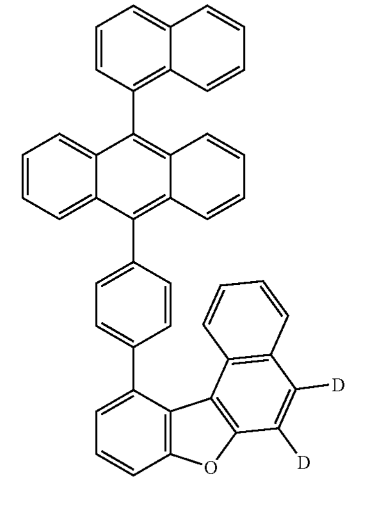
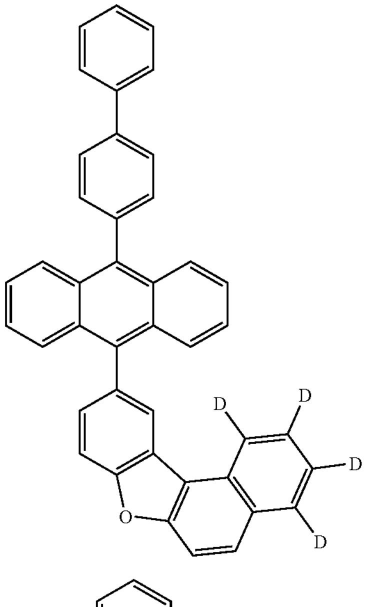
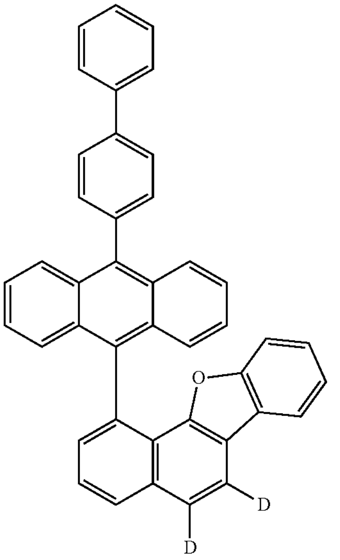
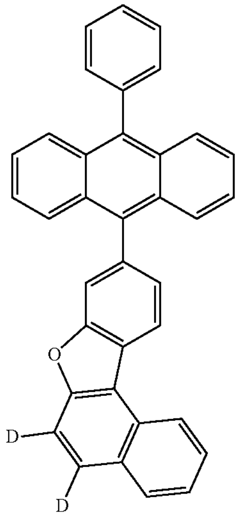
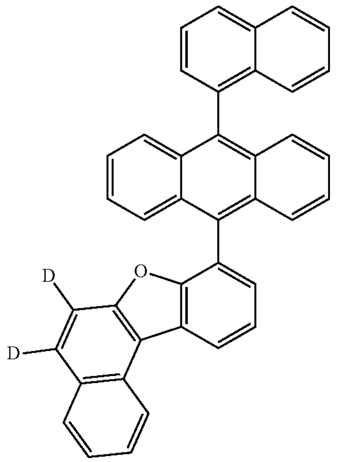
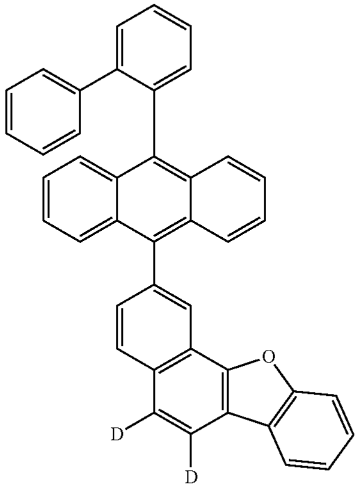

-continued
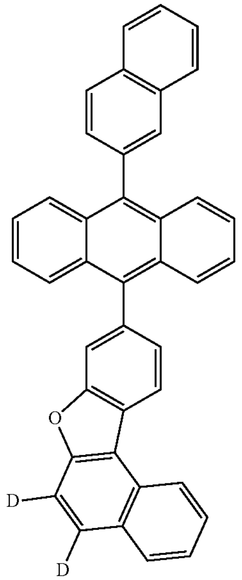
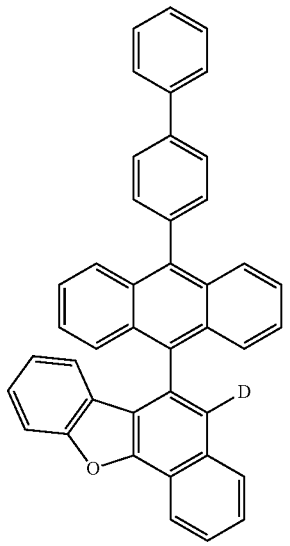
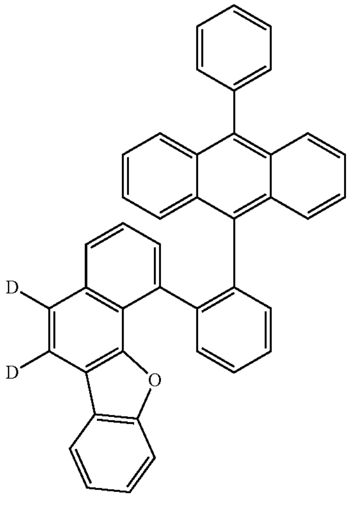
-continued
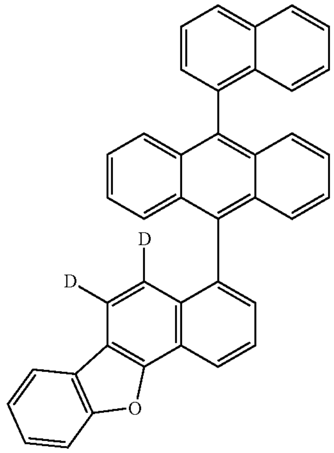
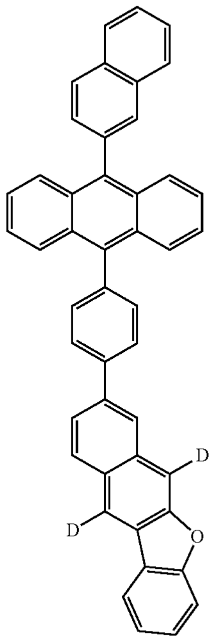
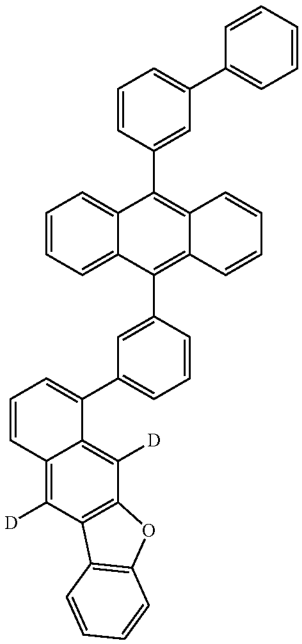
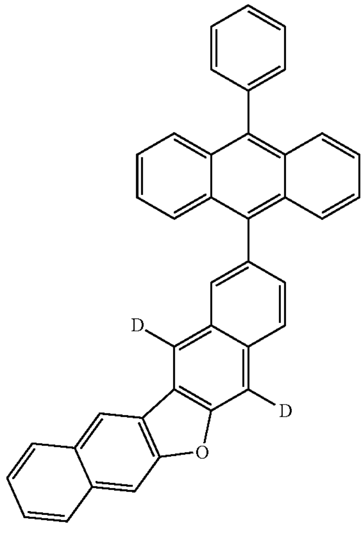

-continued
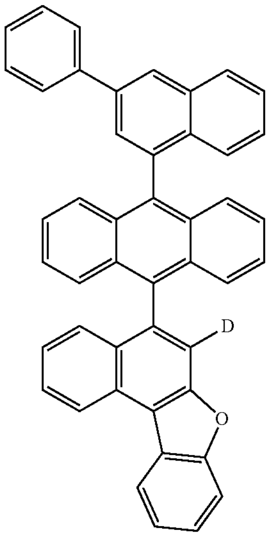
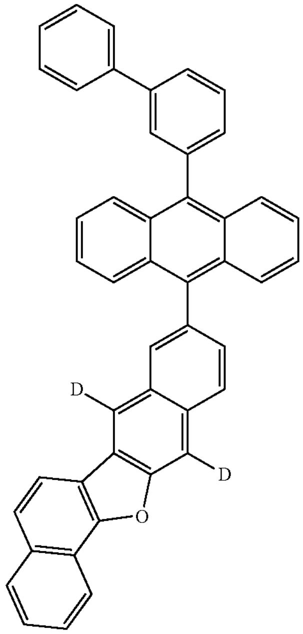
-continued
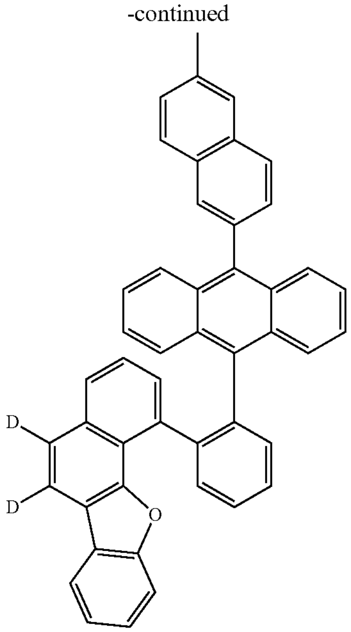
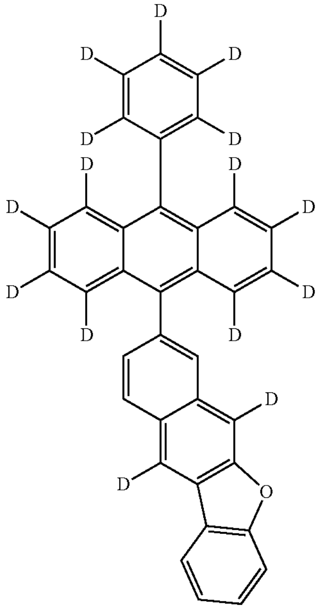
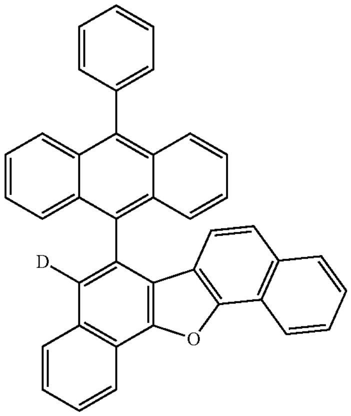

-continued
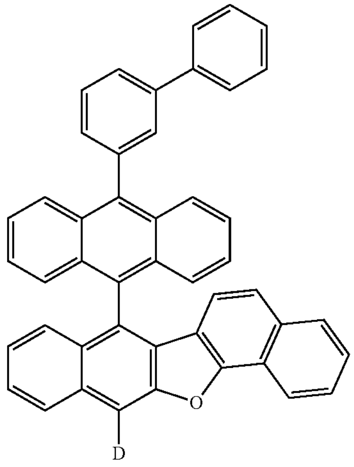
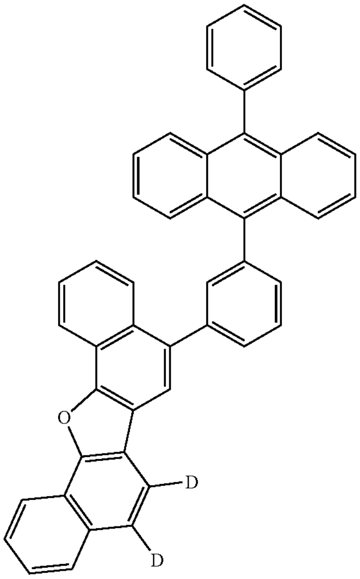
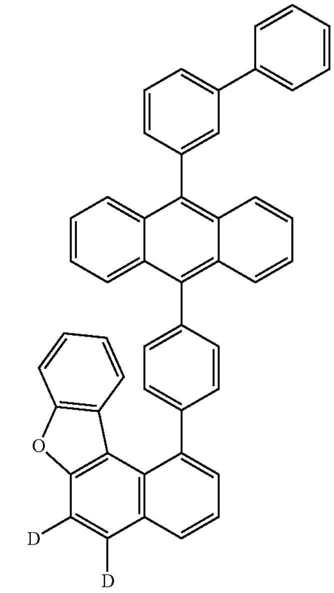
-continued
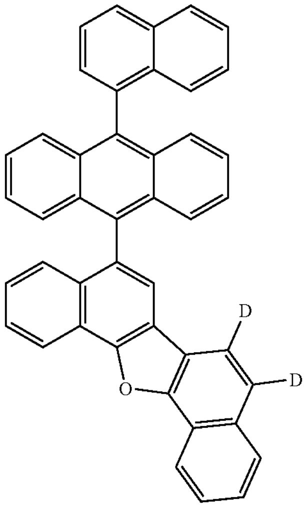
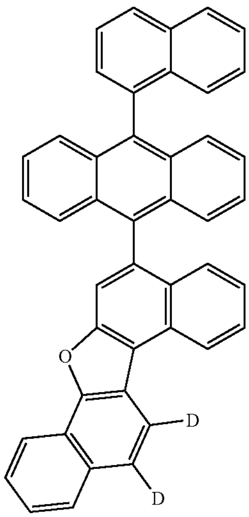
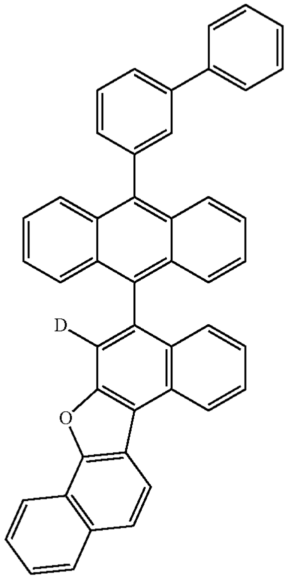

-continued
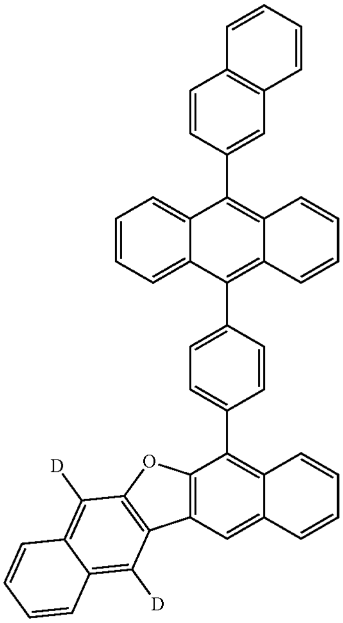
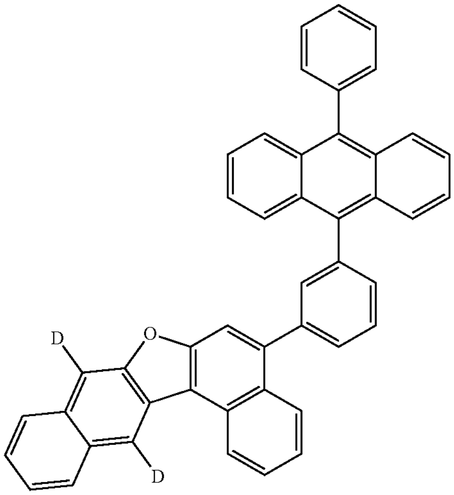
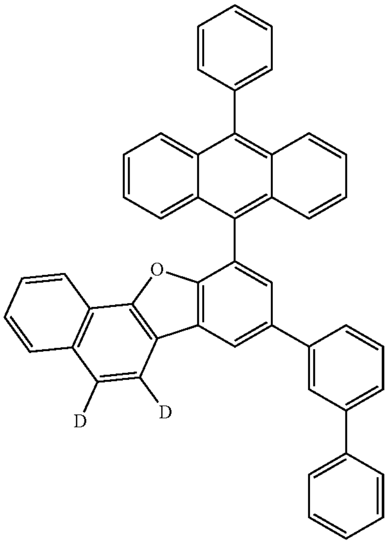
-continued
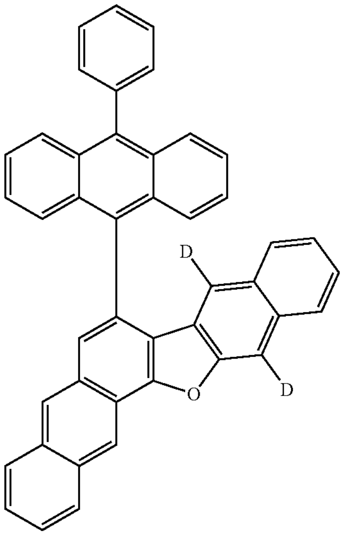
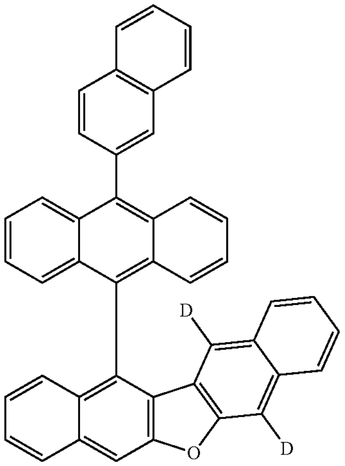
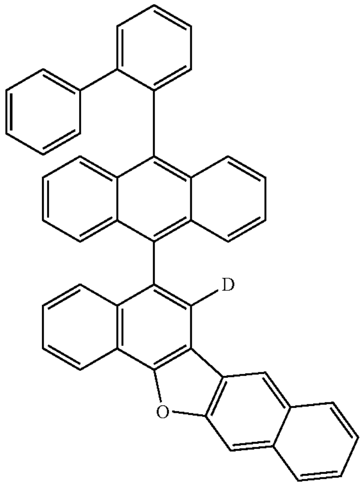

-continued
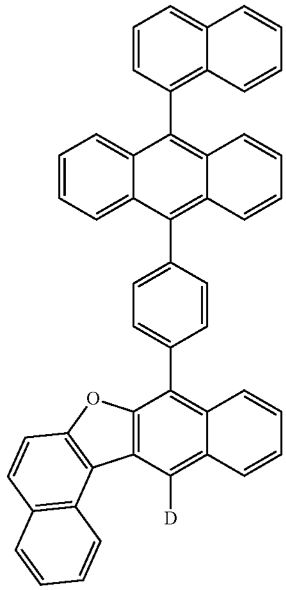
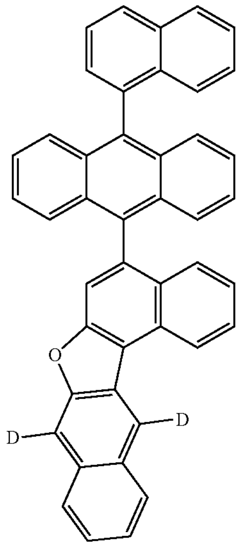
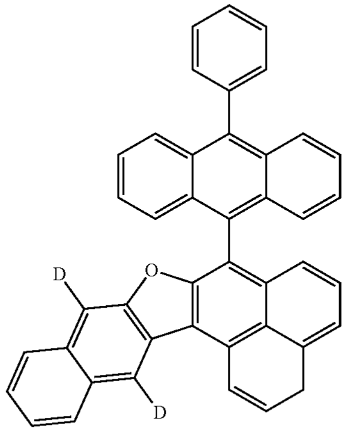
-continued
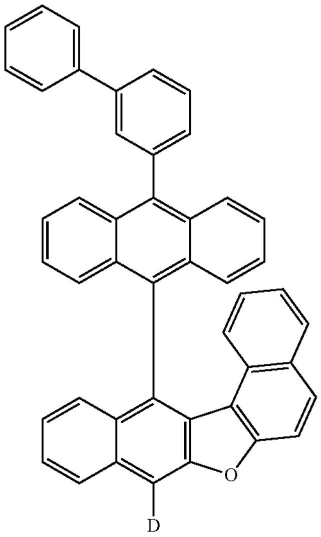
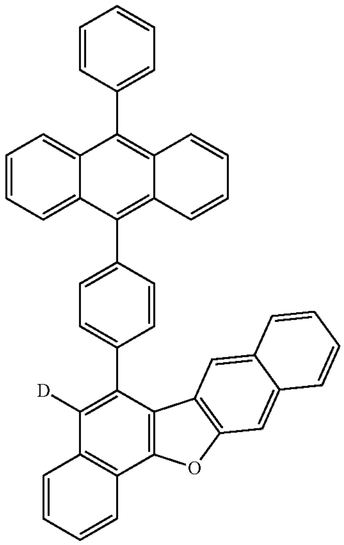
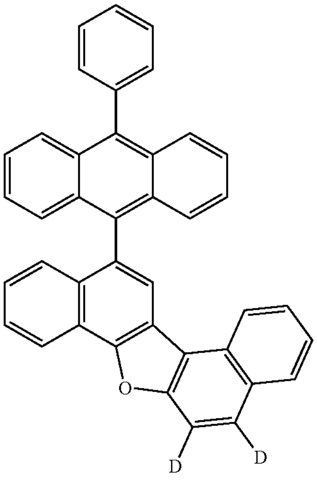

-continued
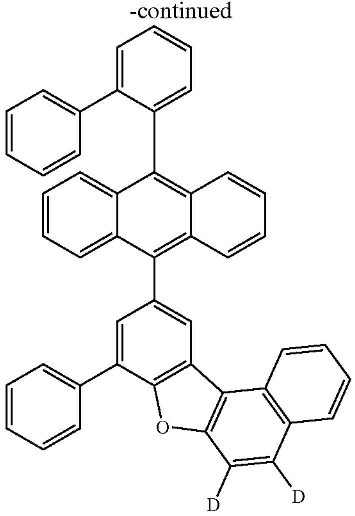
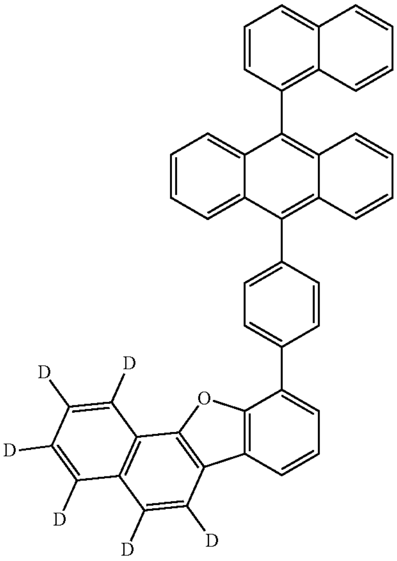
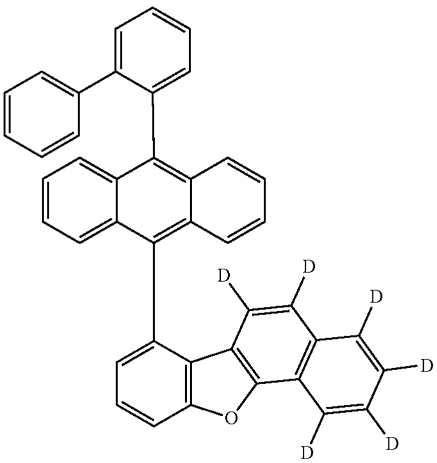
-continued
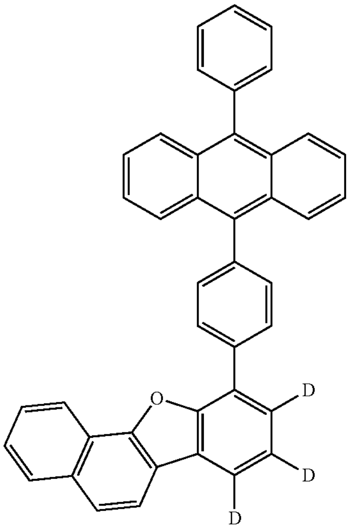
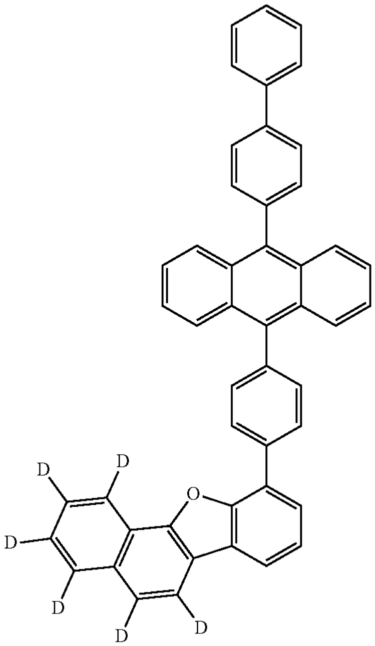

-continued
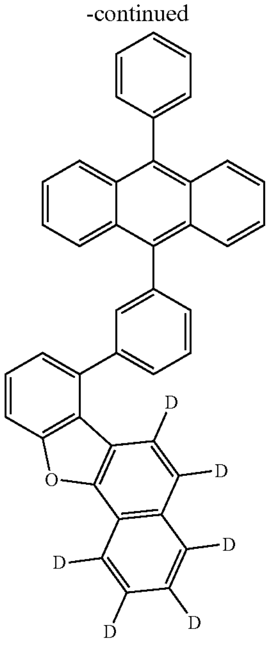
-continued
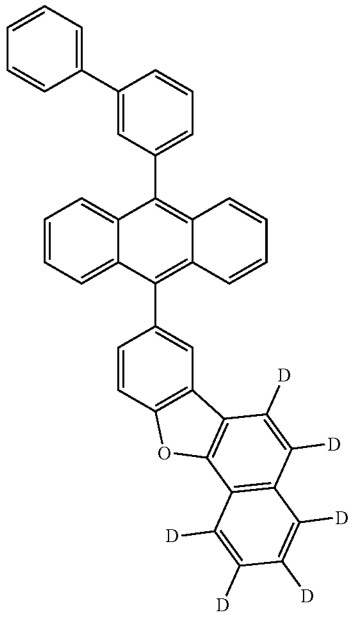
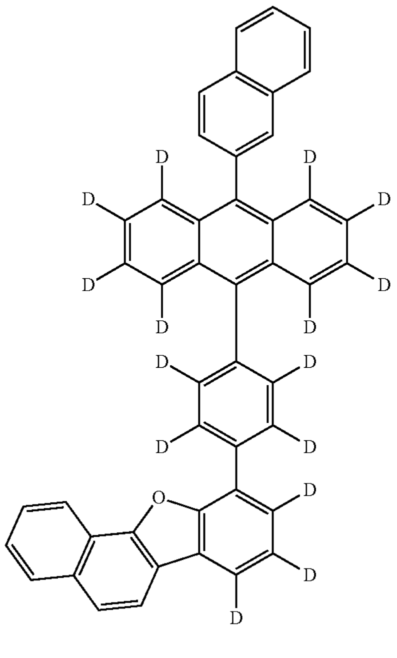
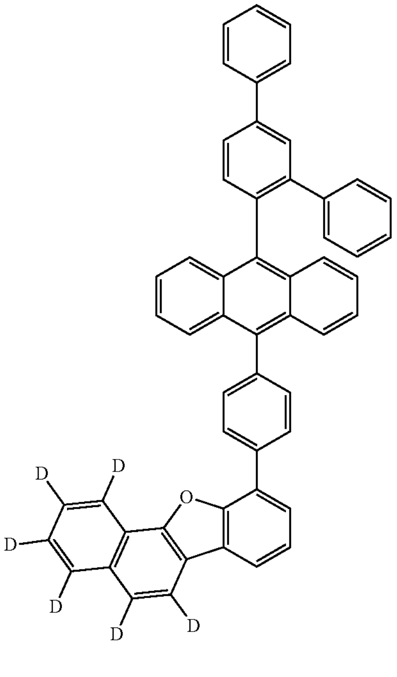

-continued
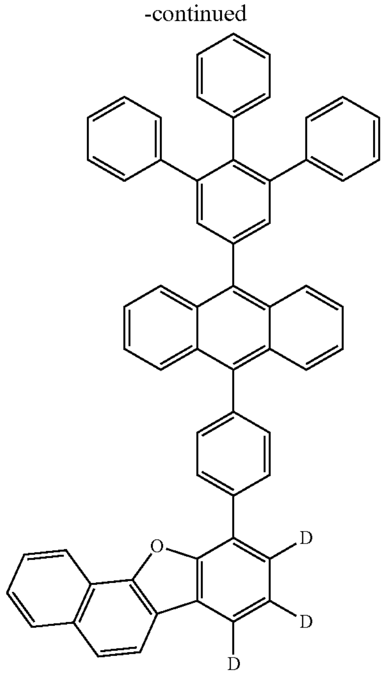
-continued
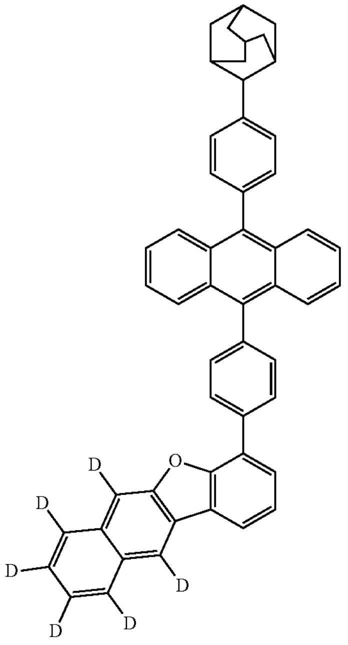
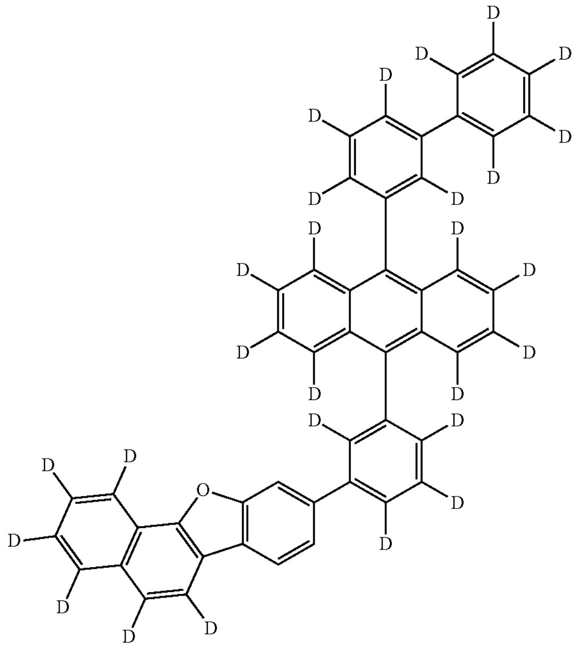
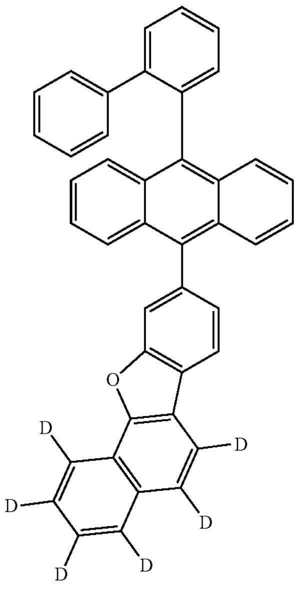

-continued
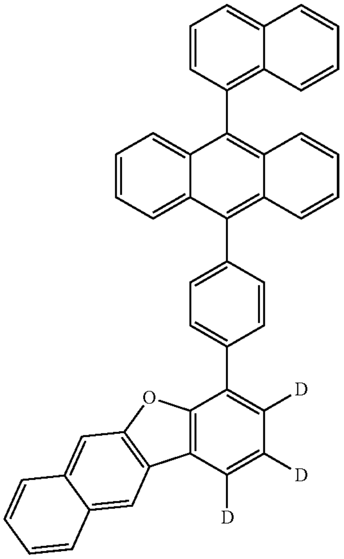
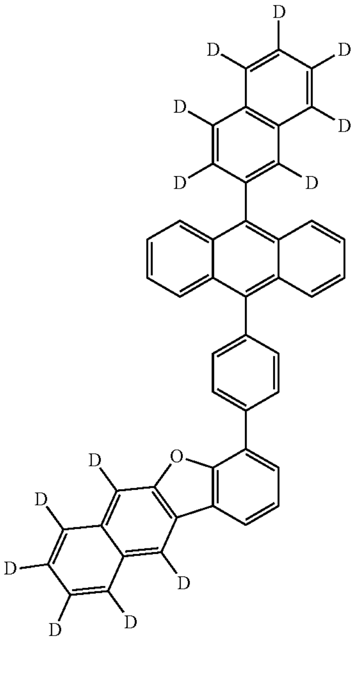
-continued
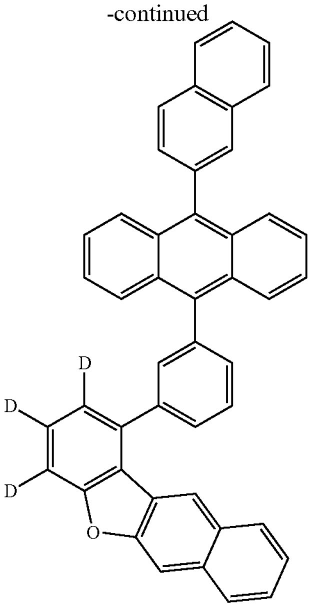
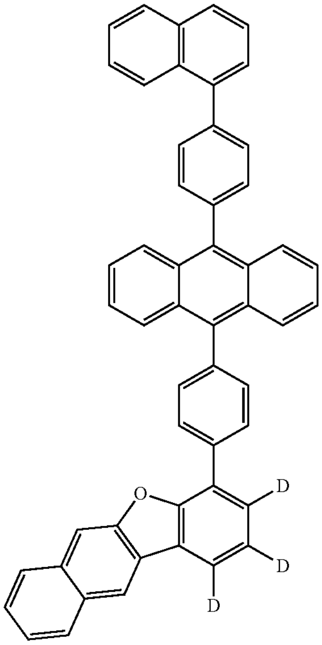
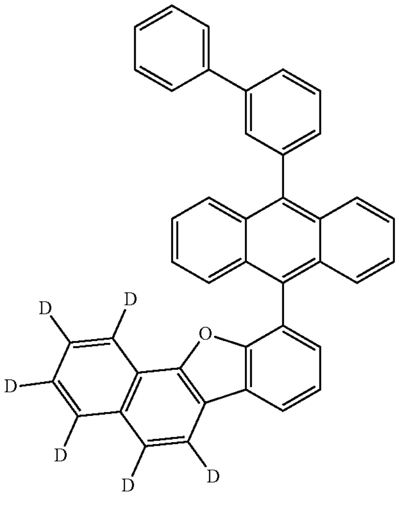

-continued
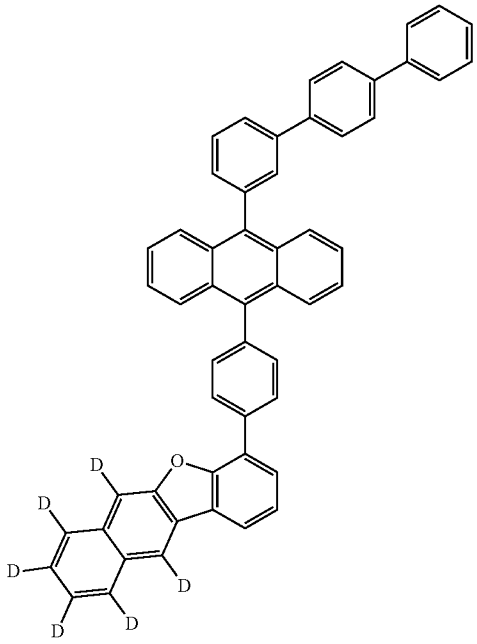
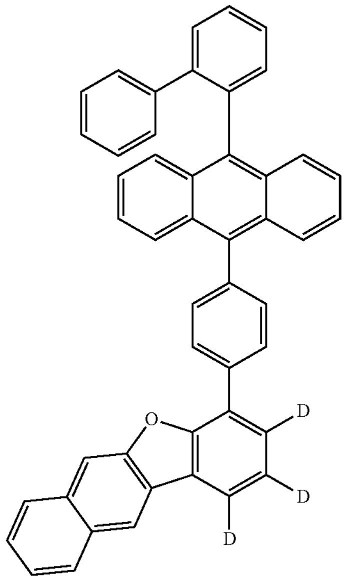
-continued
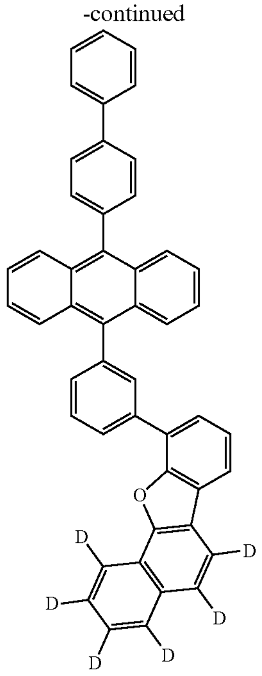
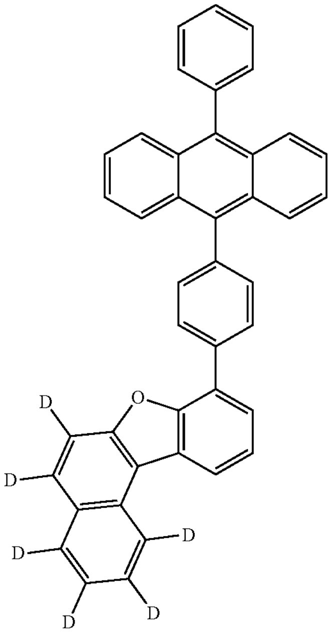
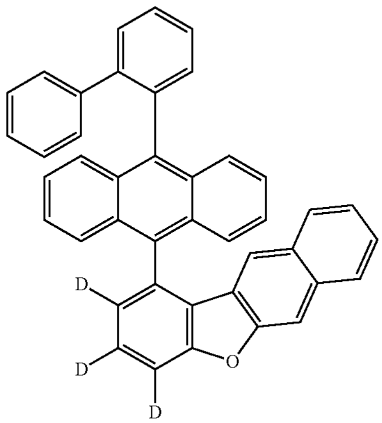

-continued
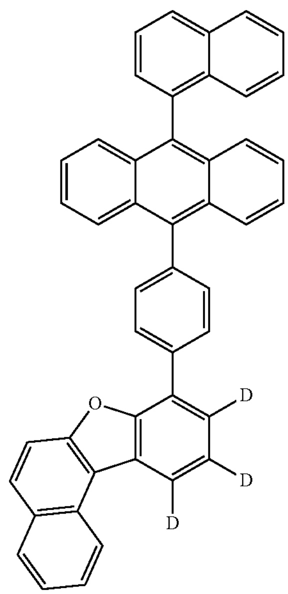
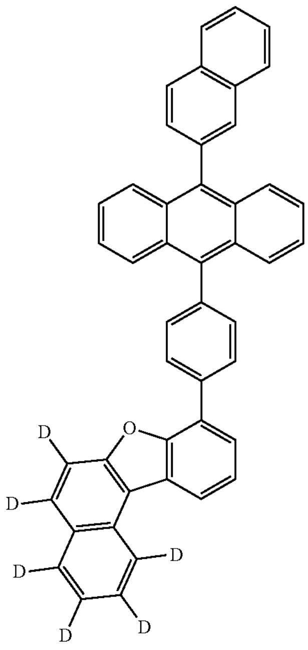
-continued
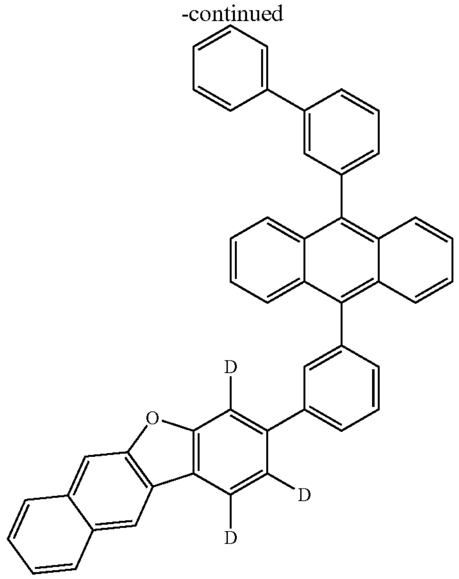
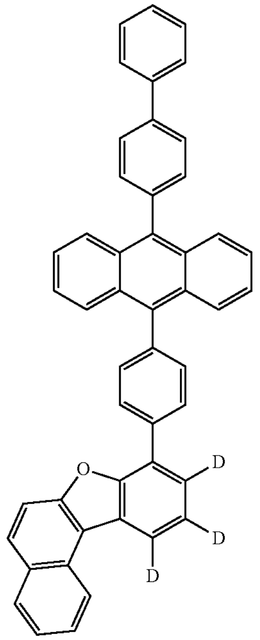
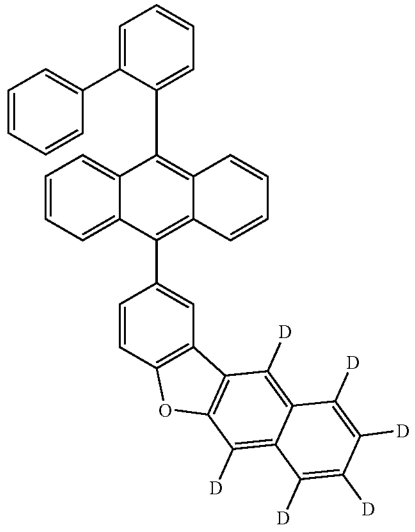

-continued
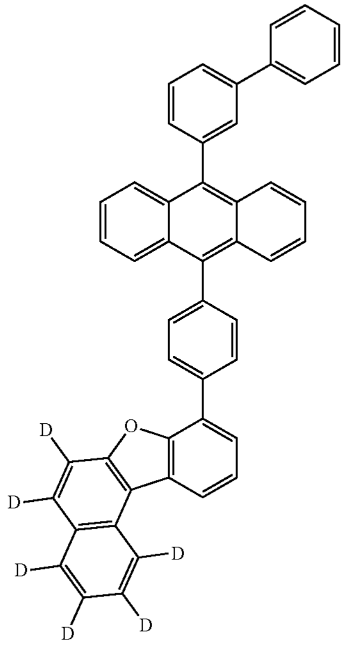
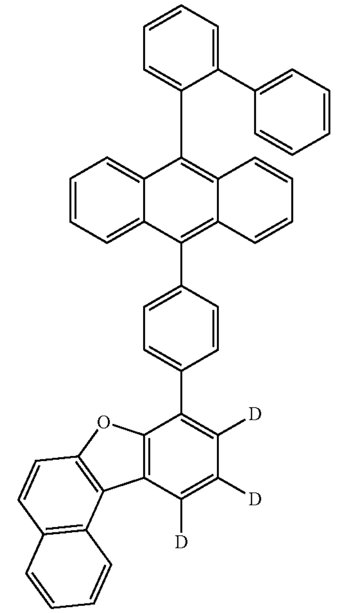
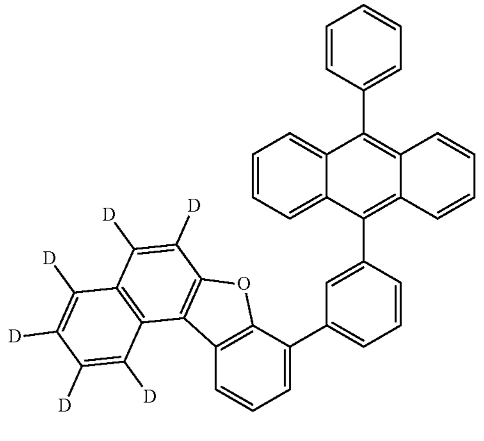
-continued
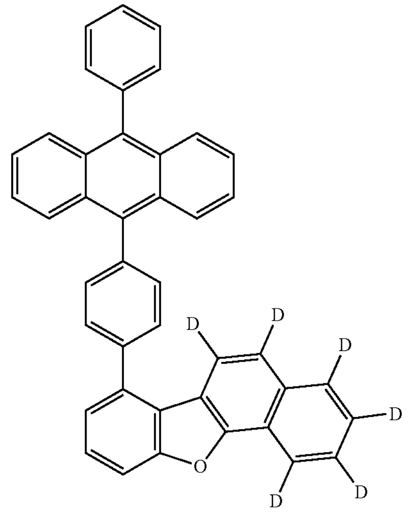
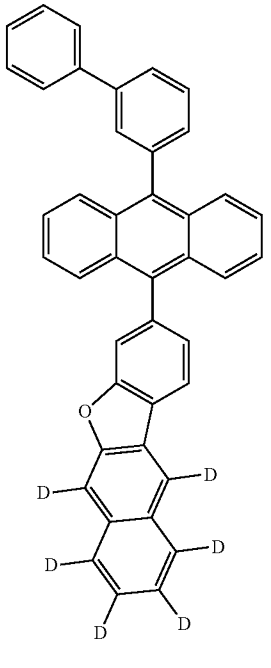

-continued
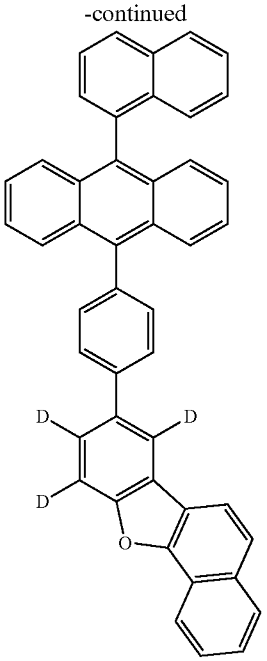
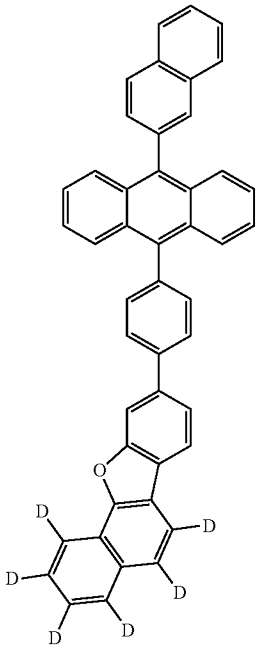
-continued
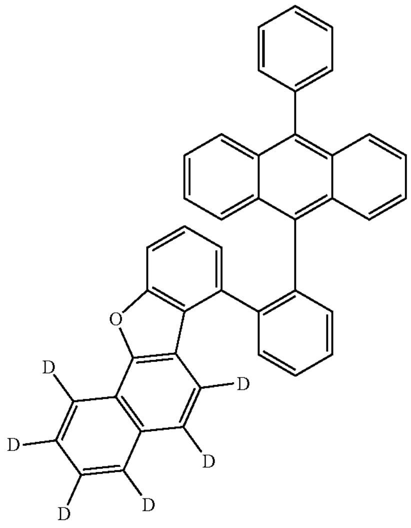
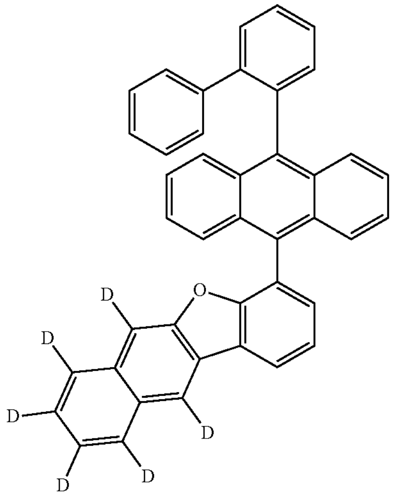
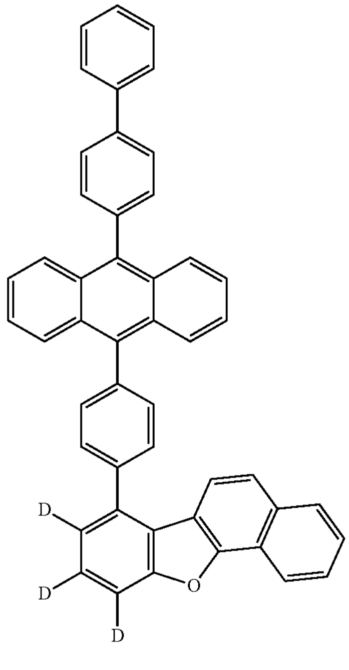

-continued
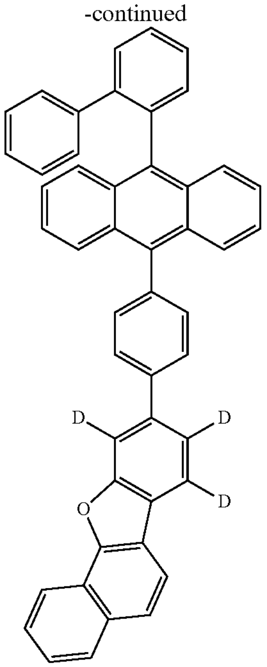
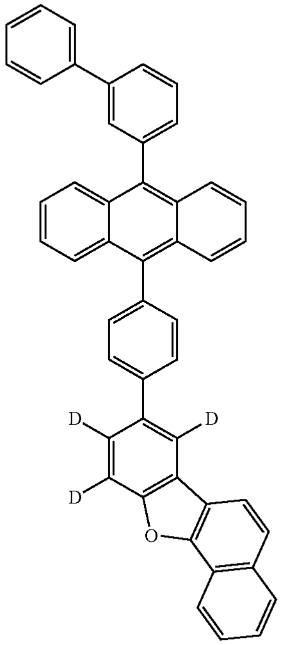
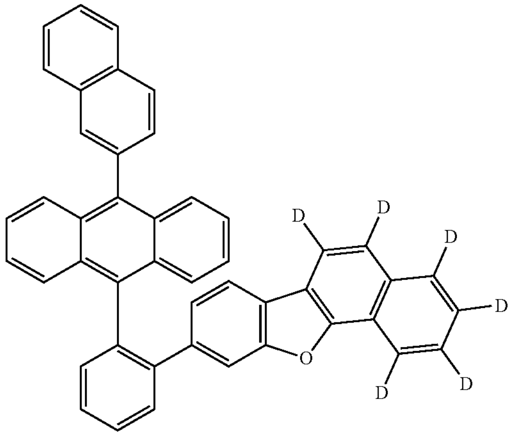
-continued
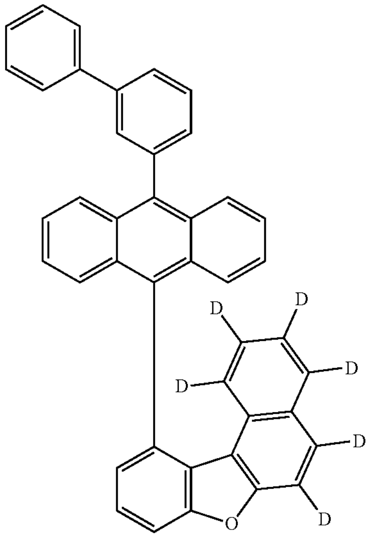
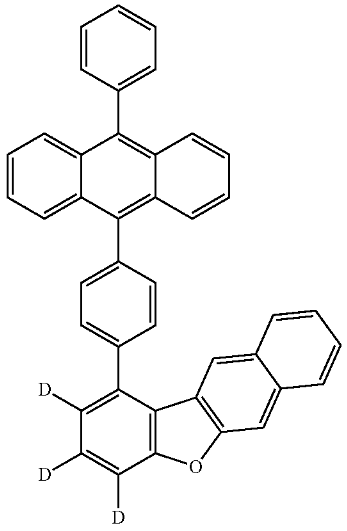
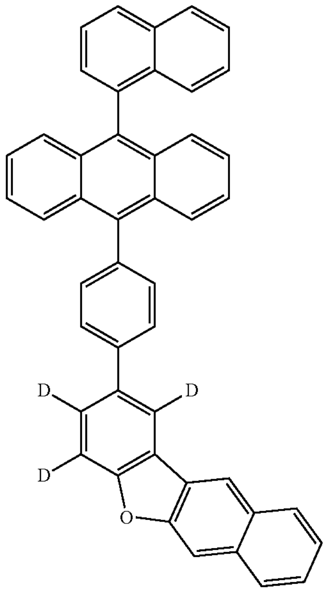

-continued
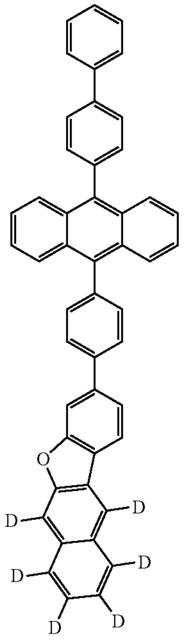
-continued
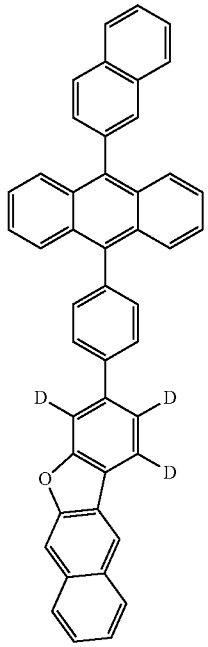
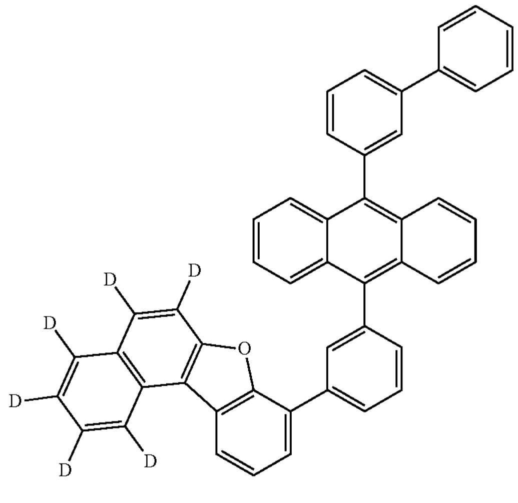
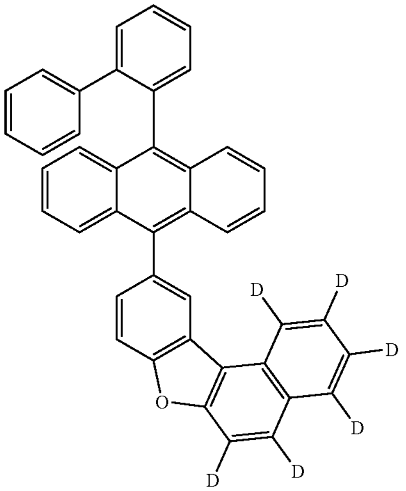

-continued
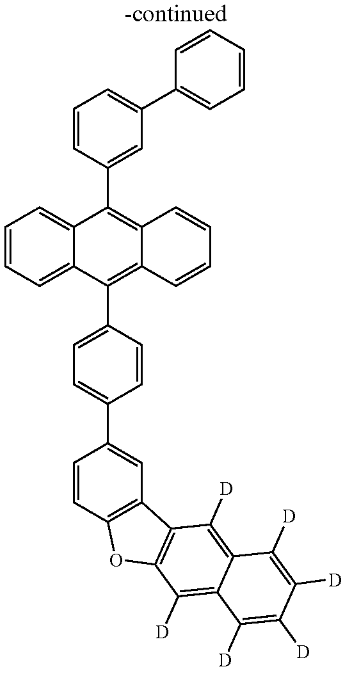
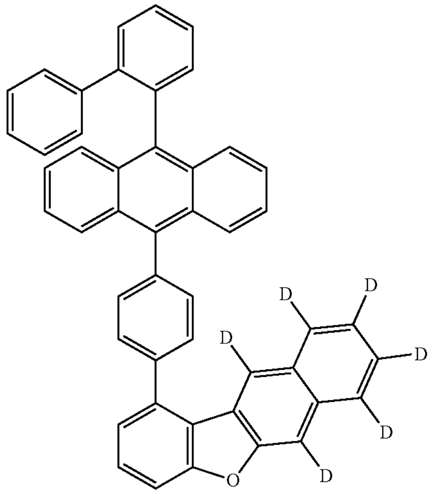
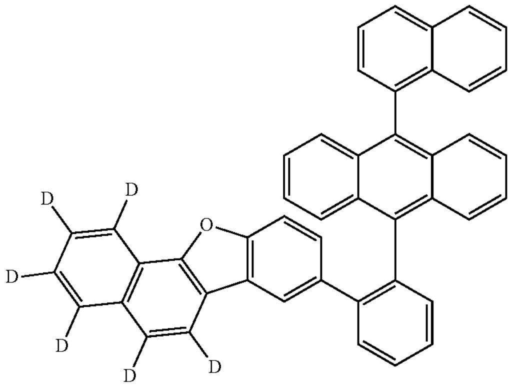
-continued
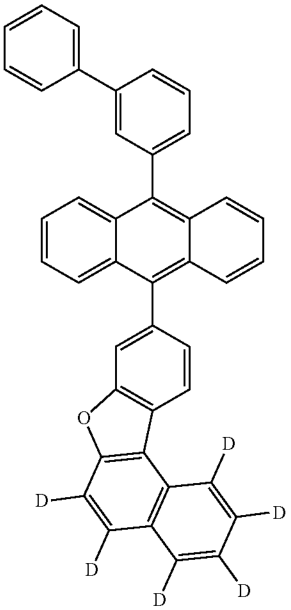
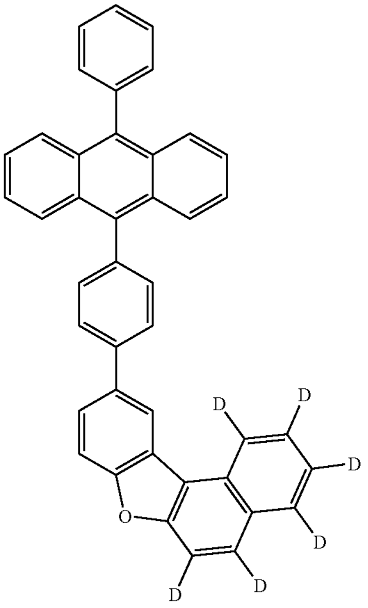

-continued
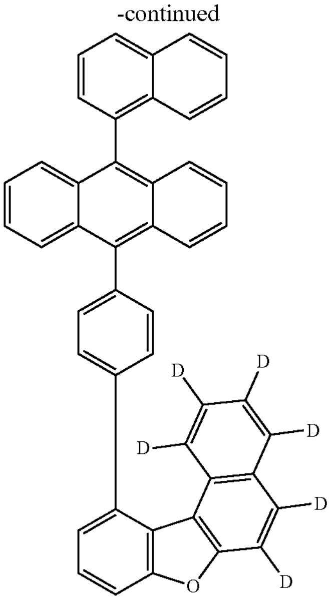
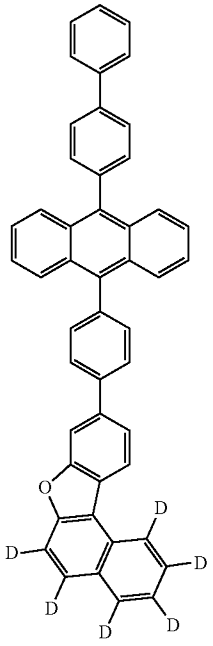
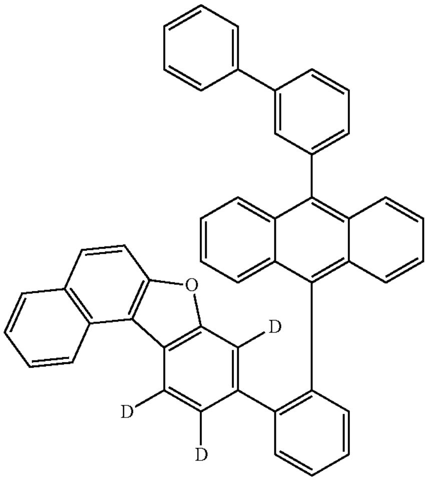
-continued
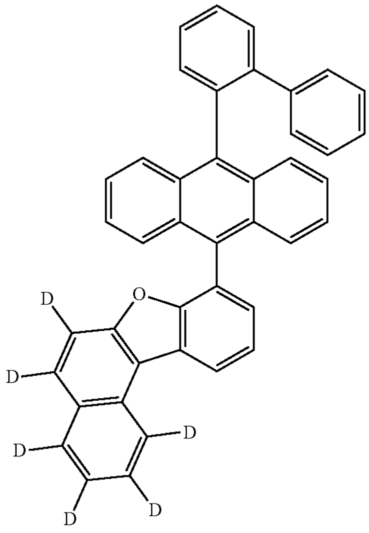
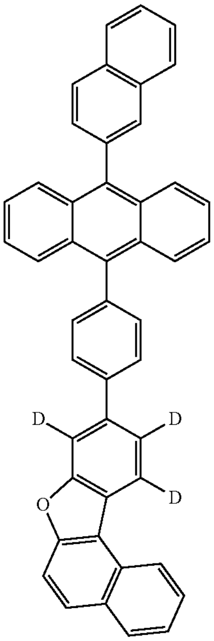

-continued
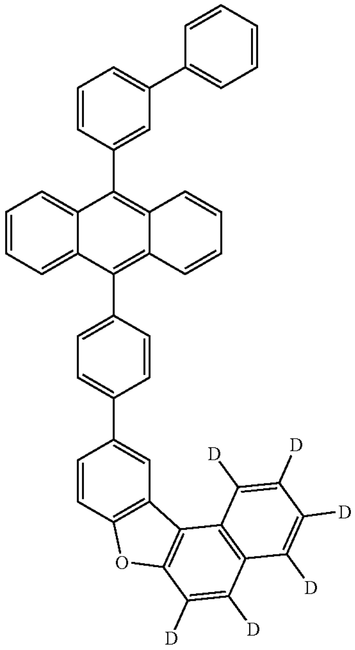
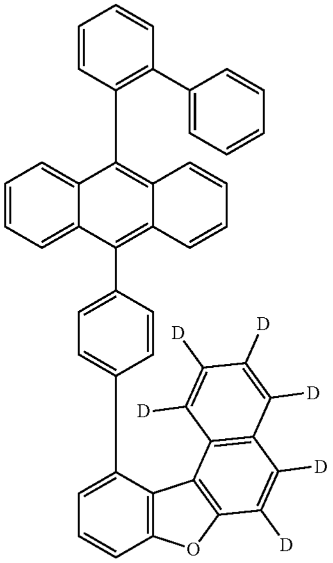
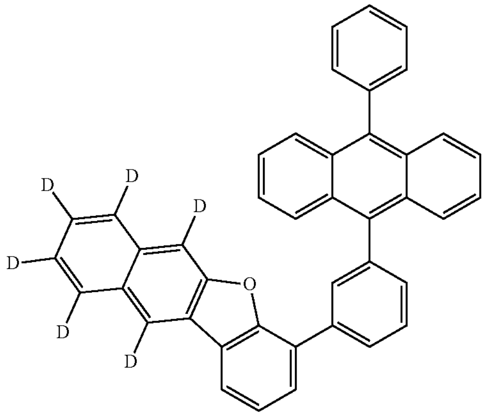
-continued
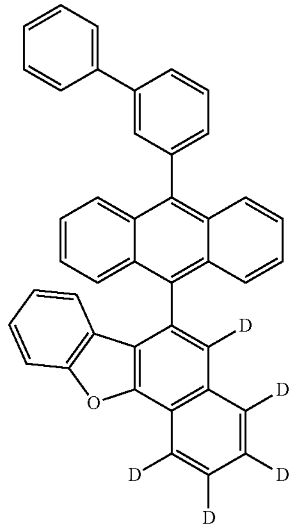
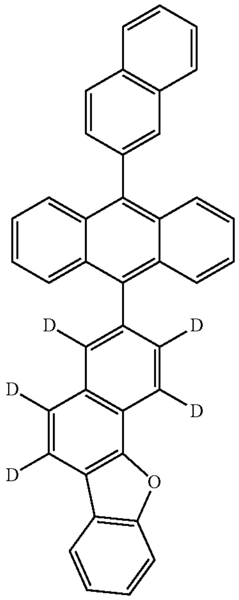
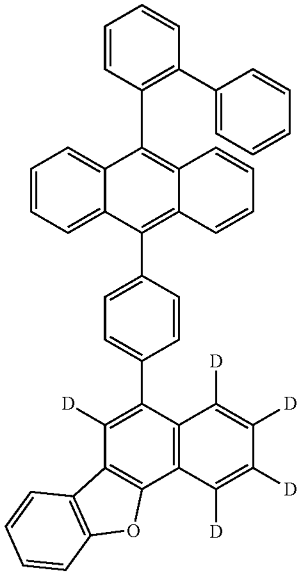

-continued
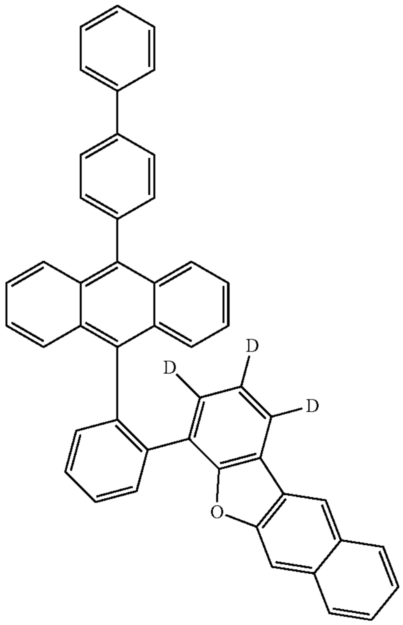
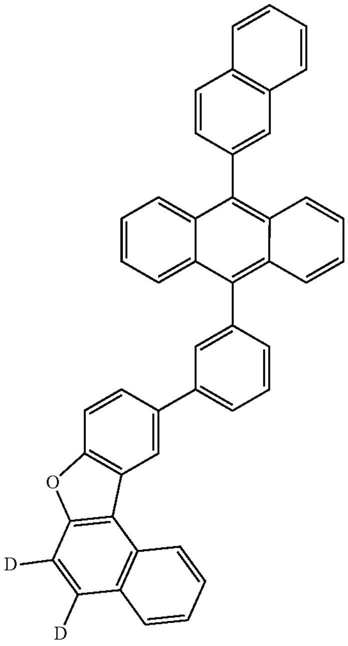
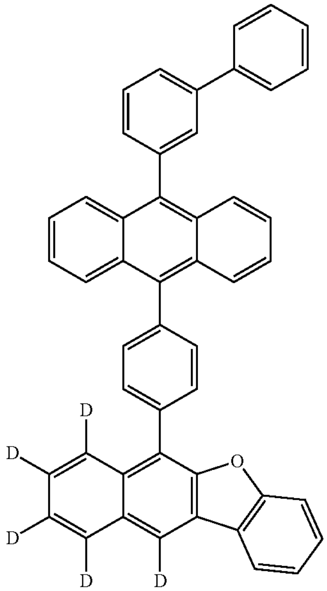
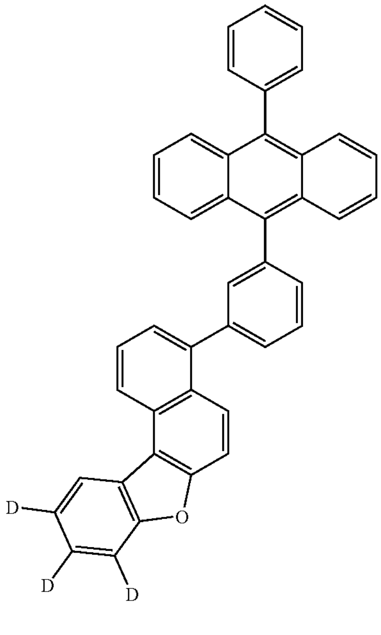
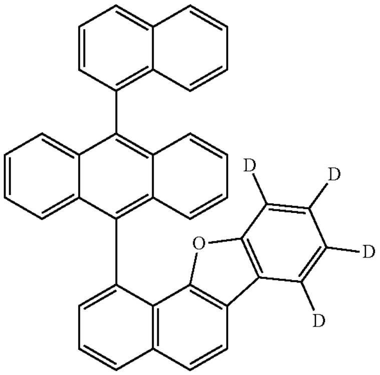

-continued
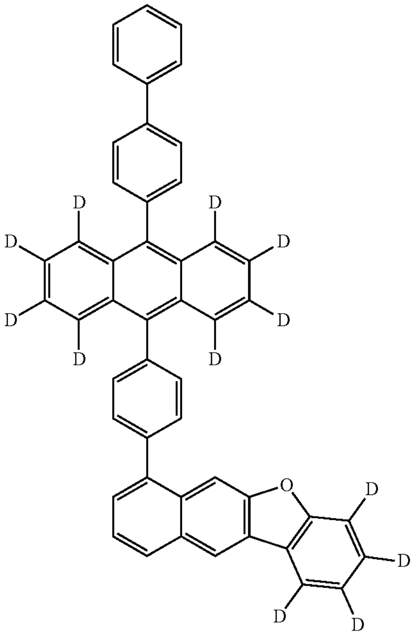
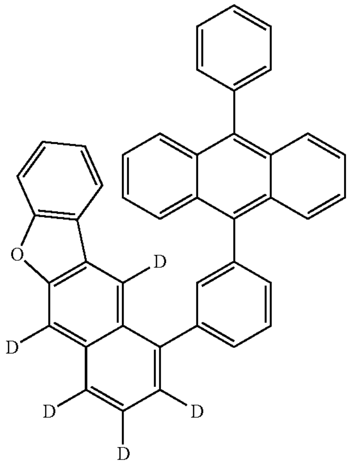
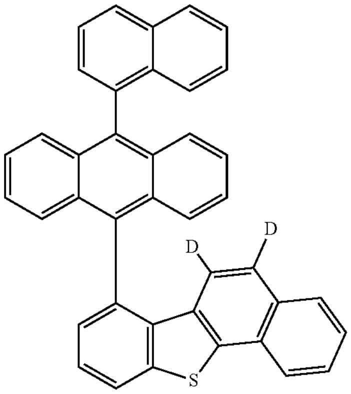
-continued
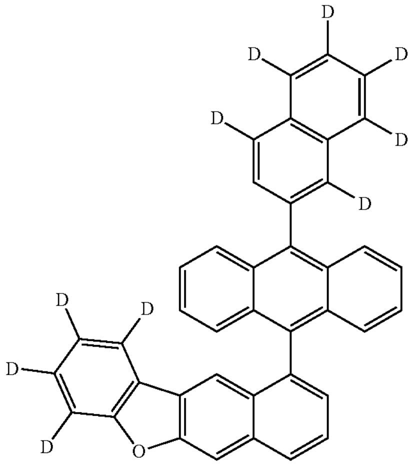
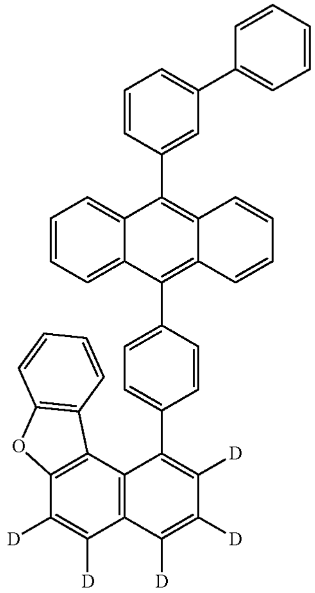
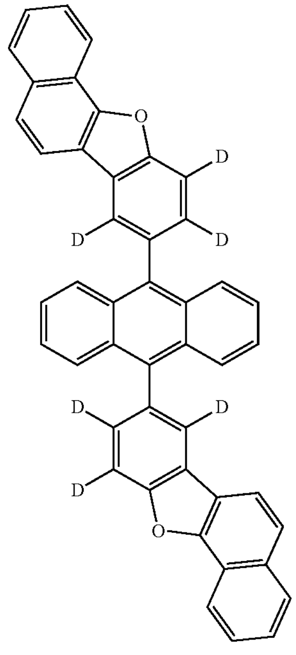
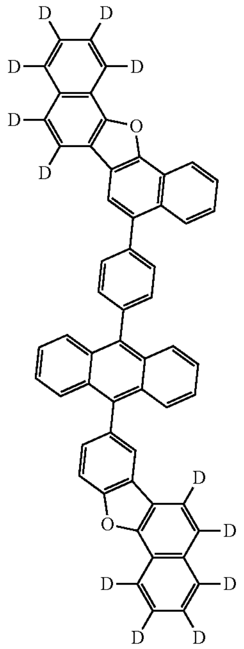

-continued
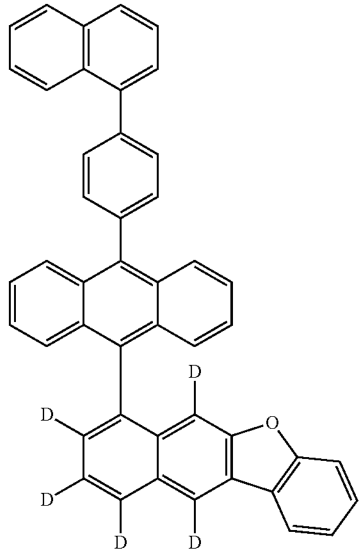
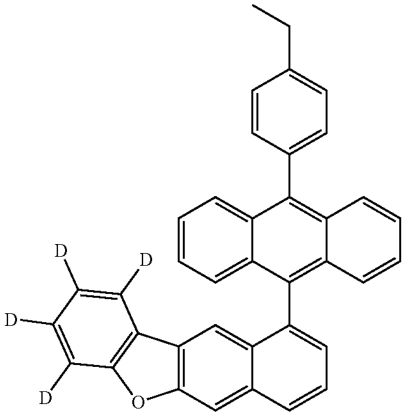
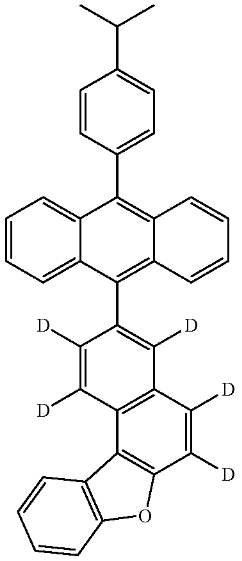
-continued
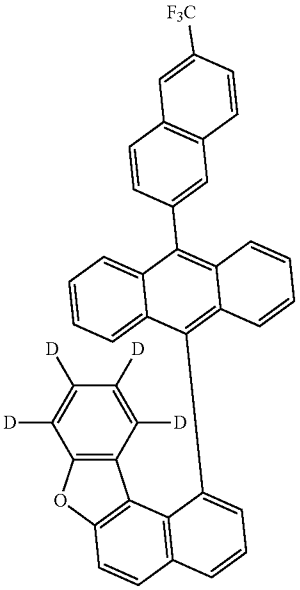
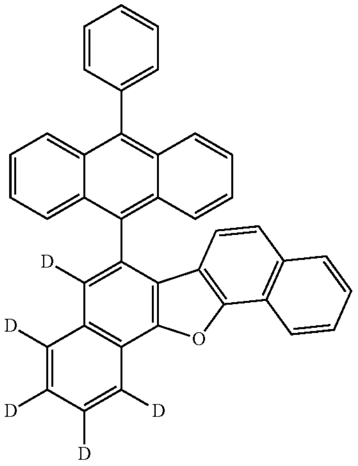
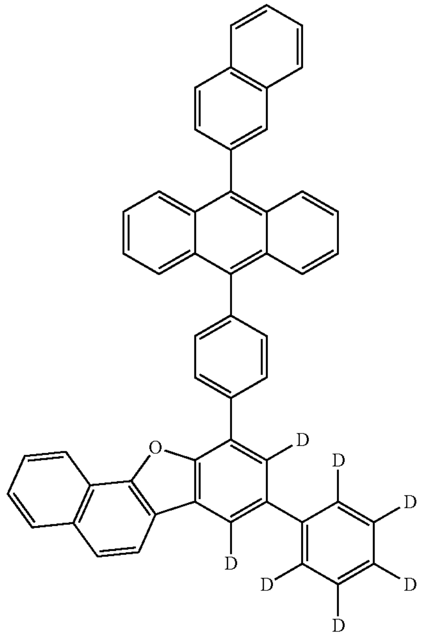

-continued
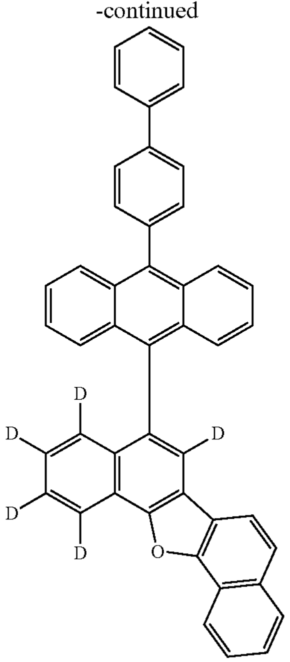
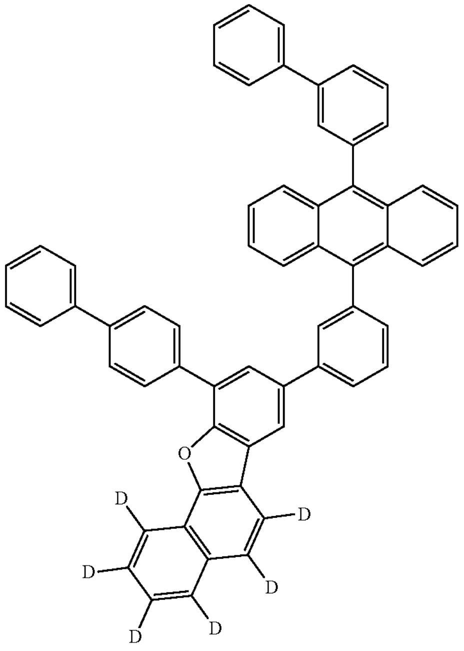
-continued
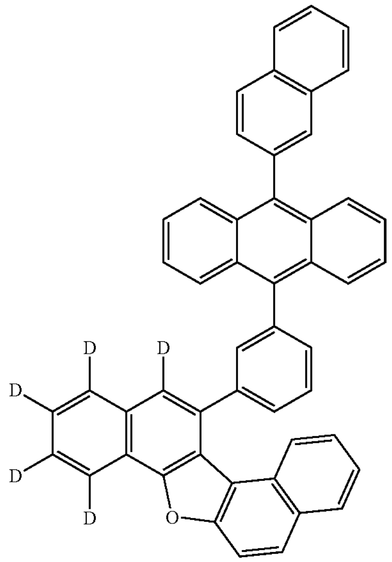
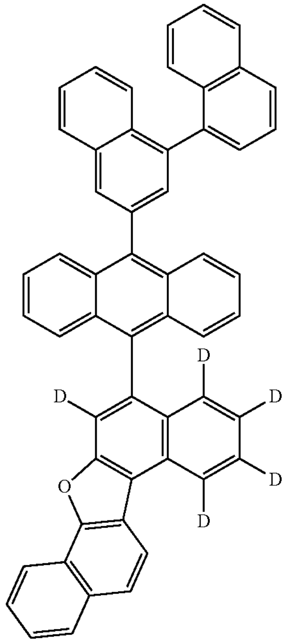

-continued
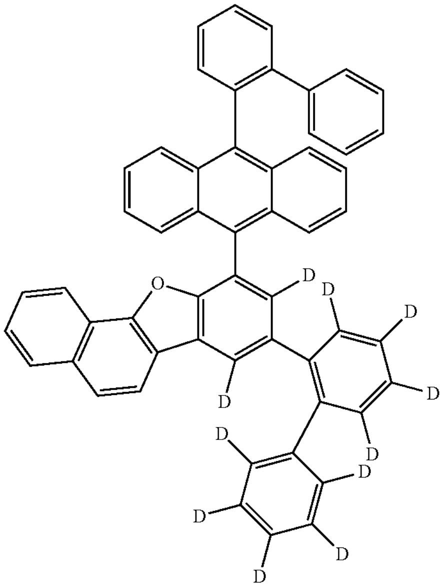
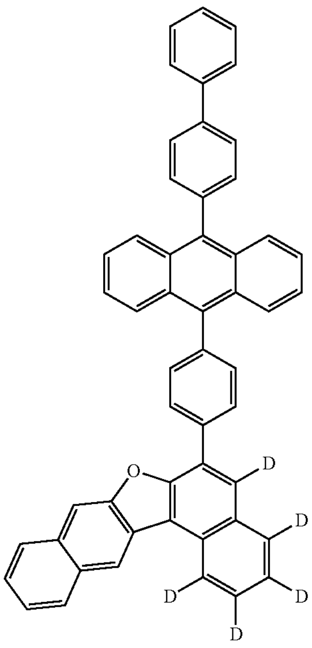
-continued
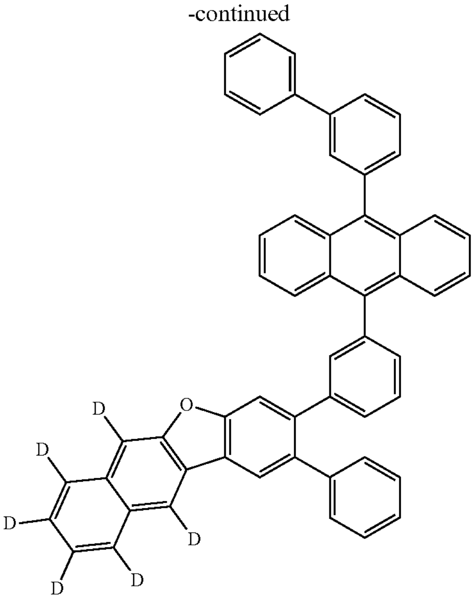
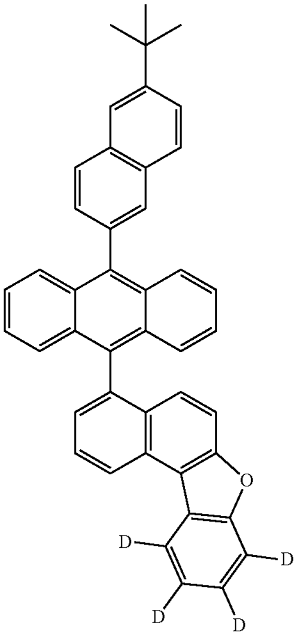

-continued
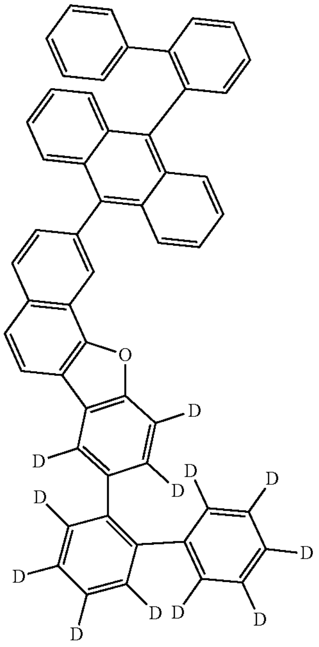
-continued
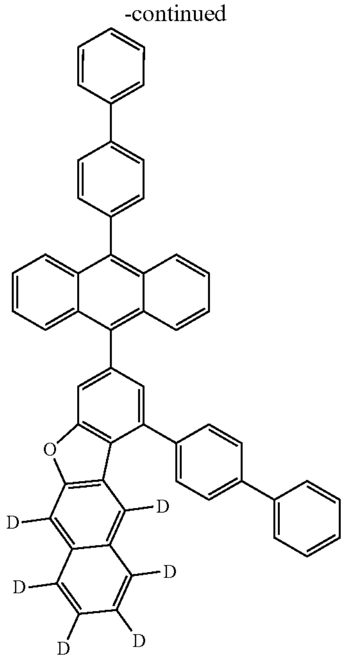
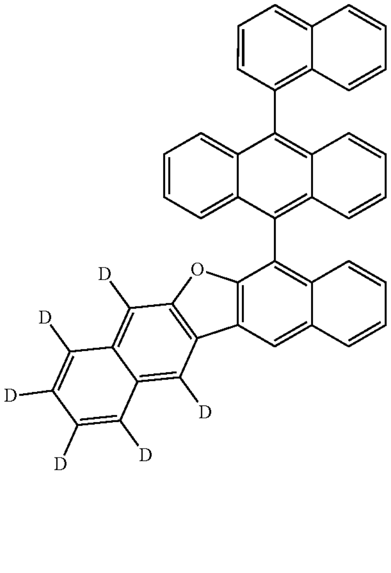
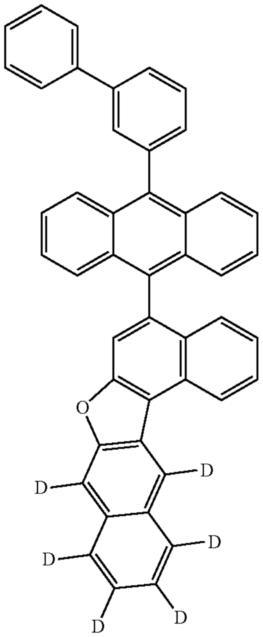

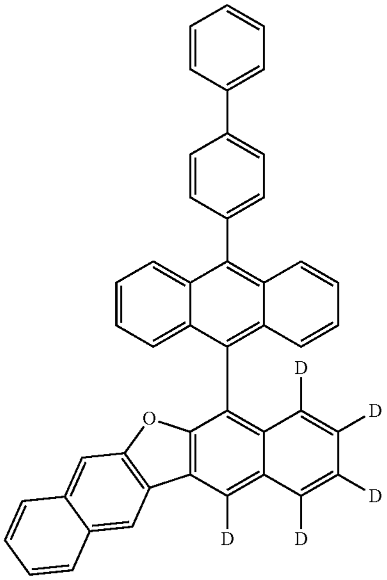
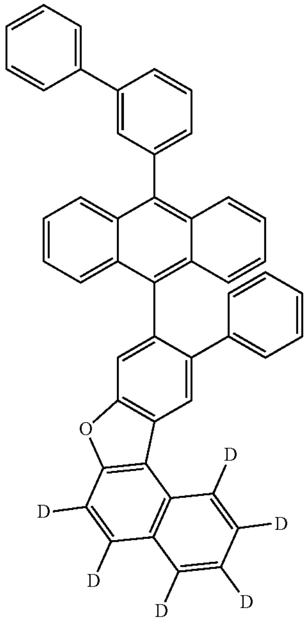
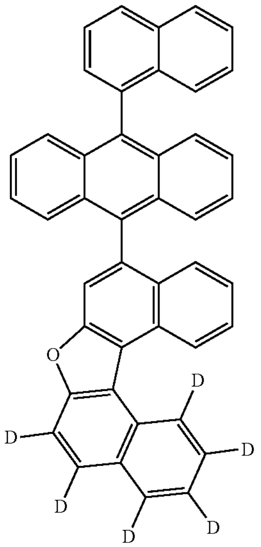
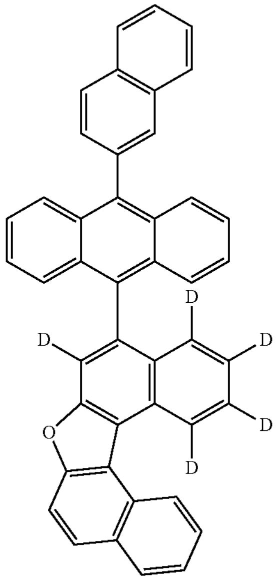

-continued
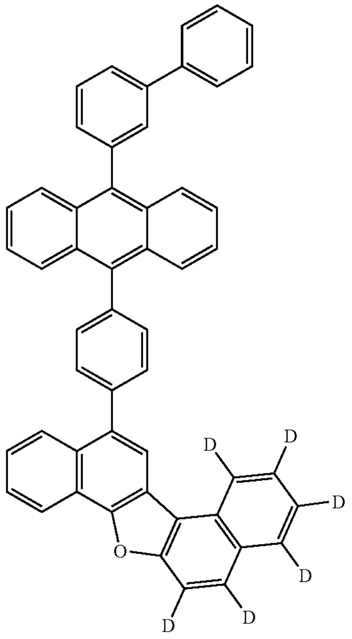
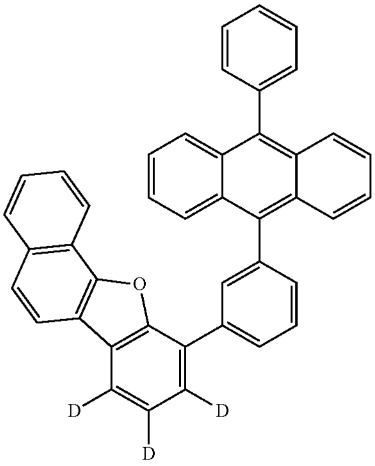
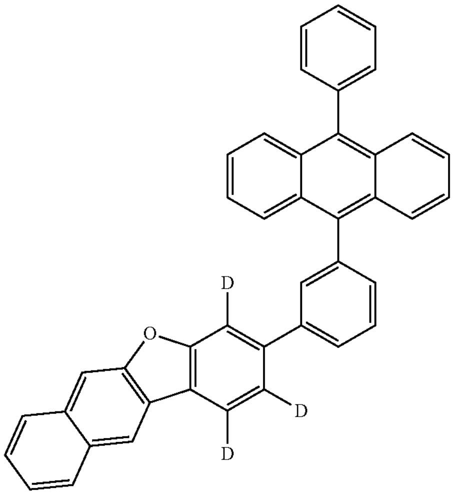
-continued
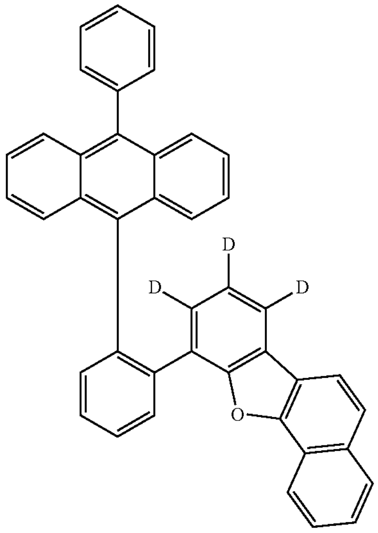
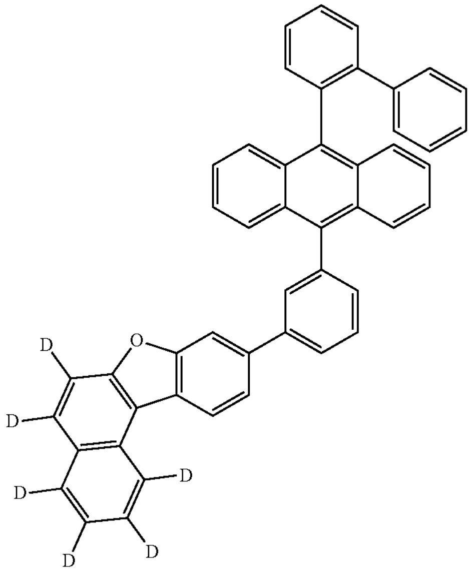
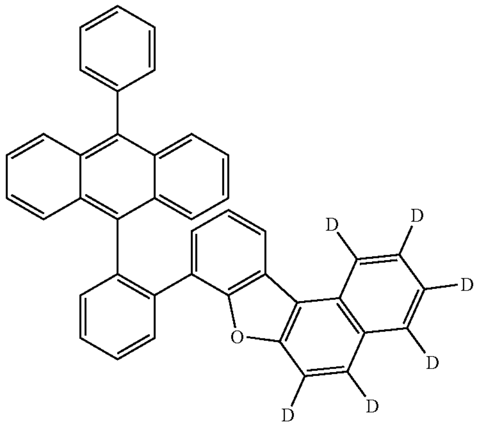

-continued
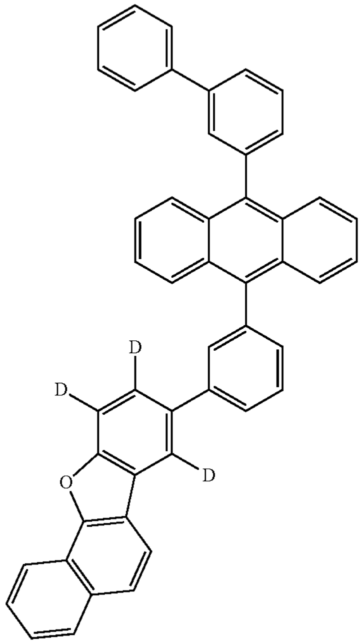
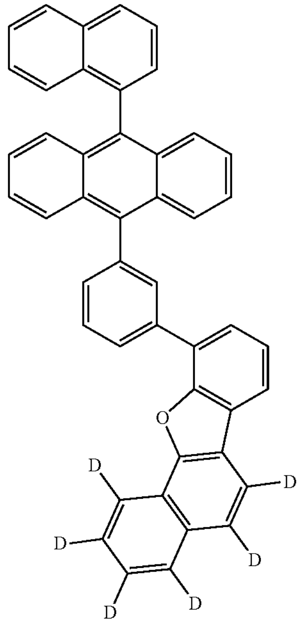
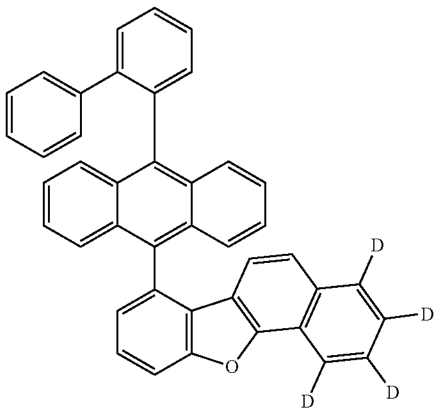
-continued
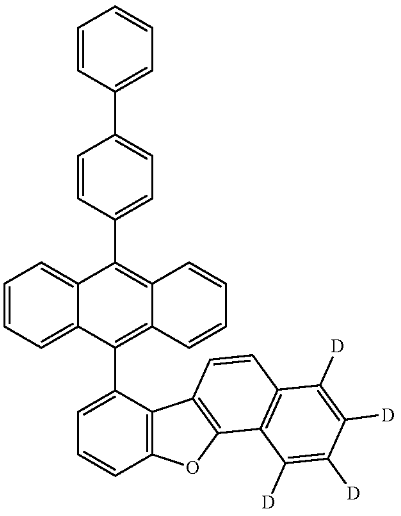
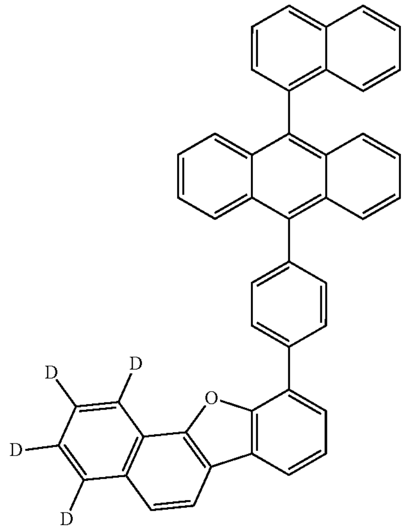
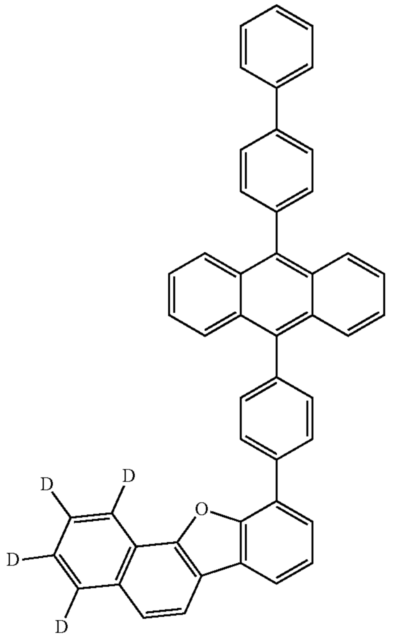

-continued
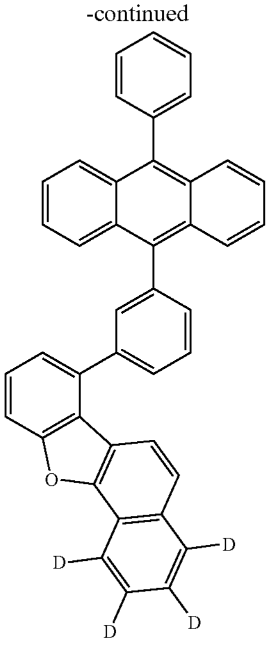
-continued
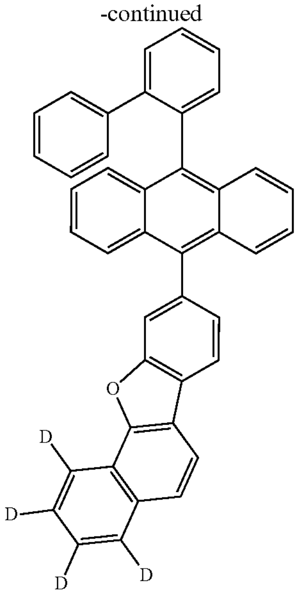
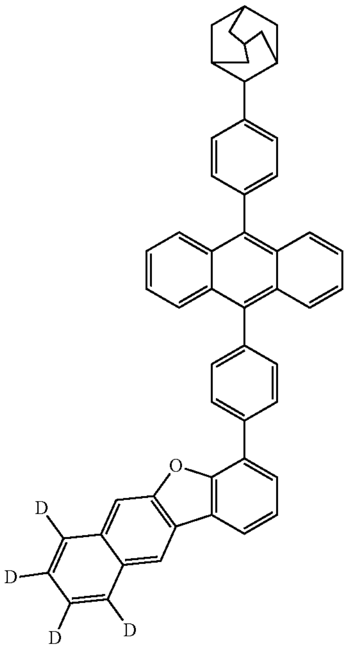
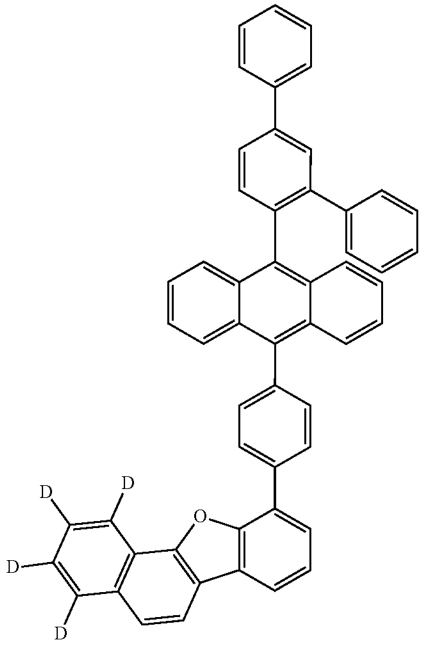

-continued
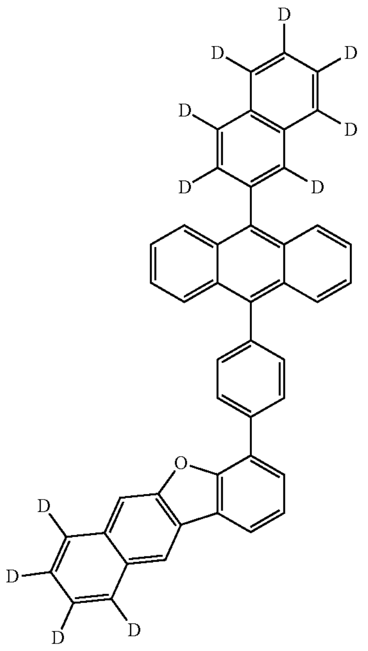
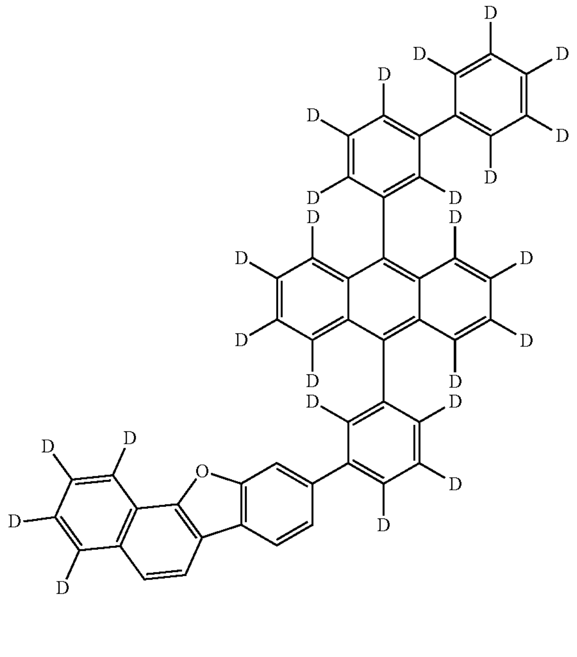
-continued
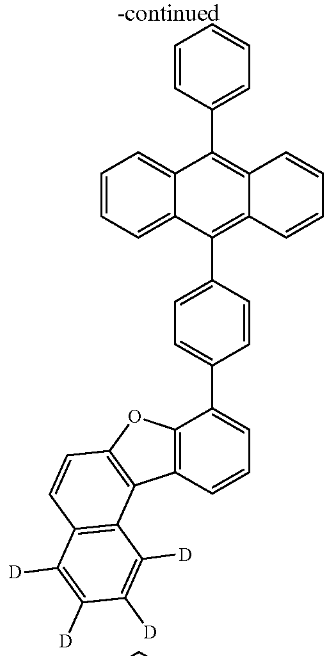
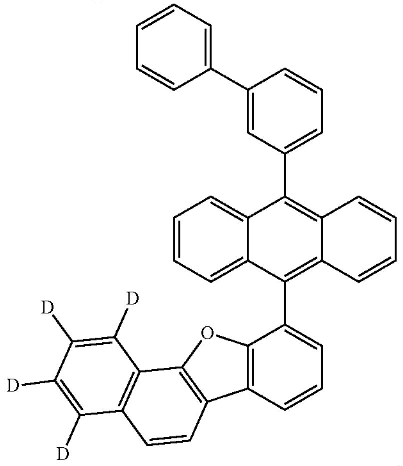
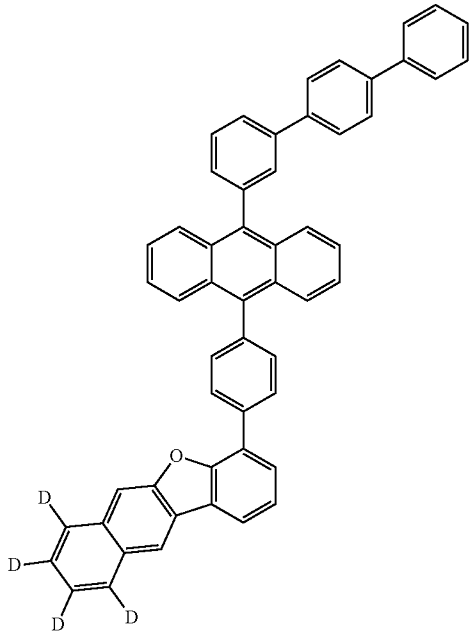

-continued
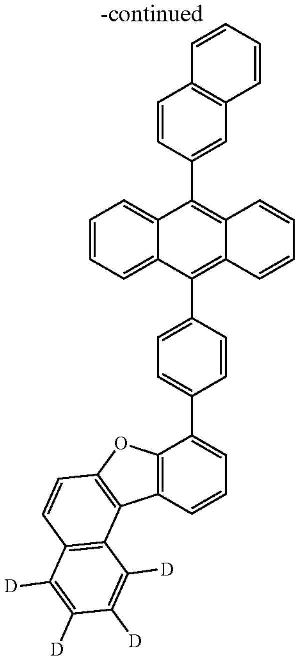
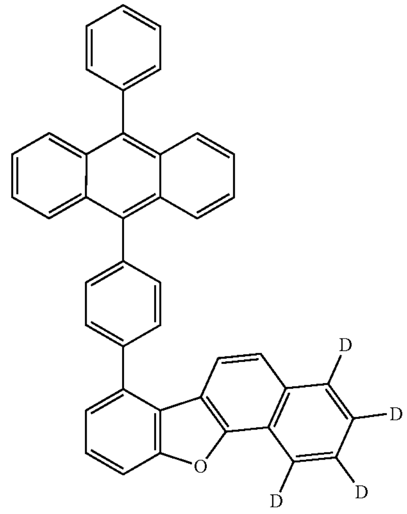
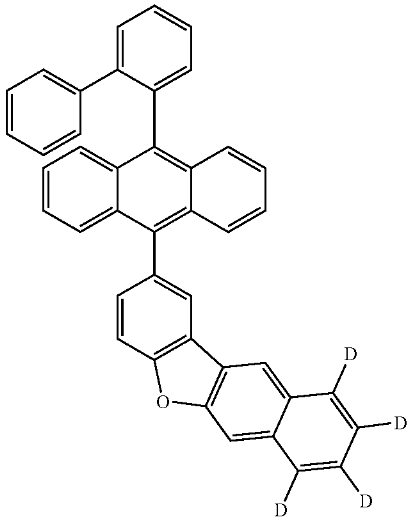
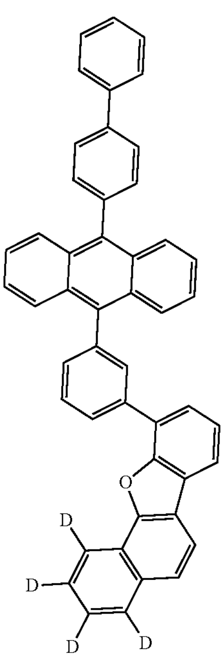
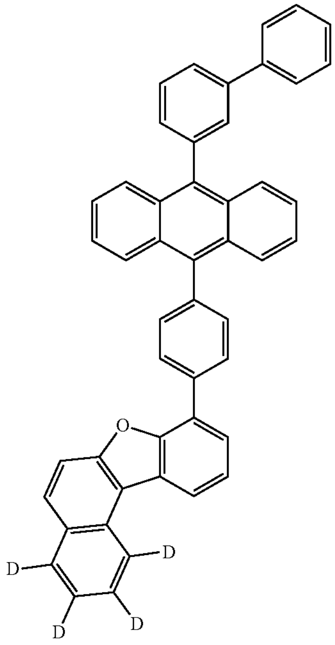
-continued -continued
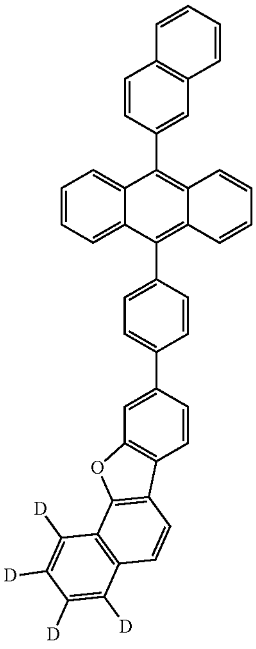
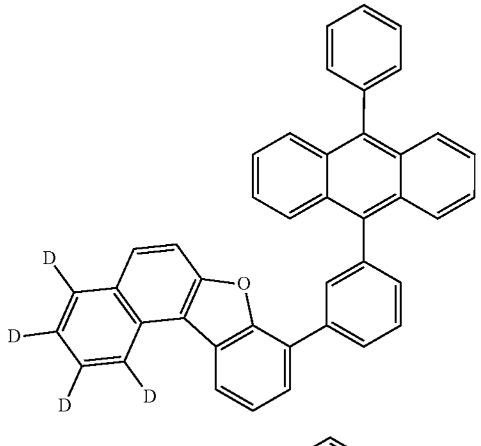
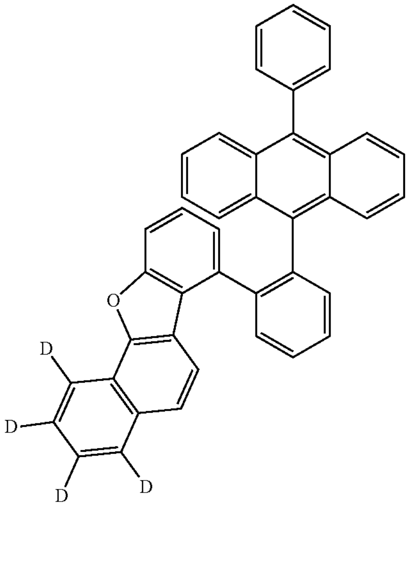
-continued
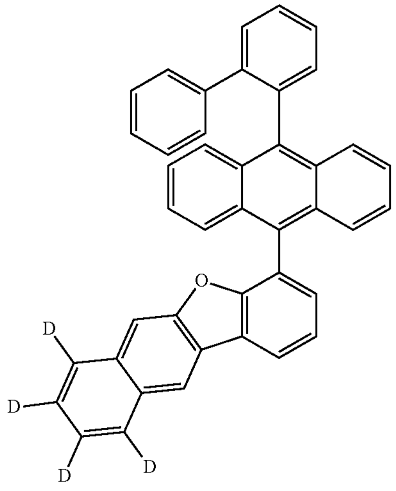
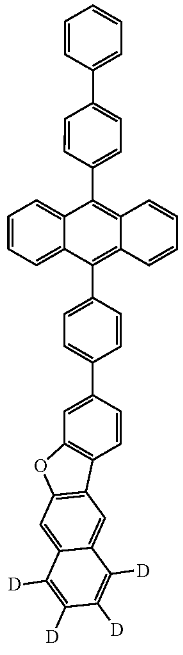
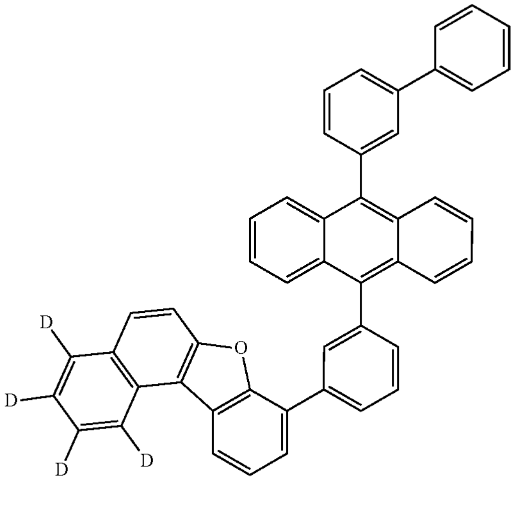

-continued
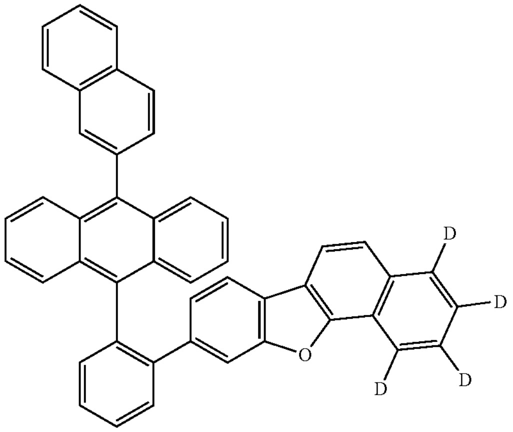
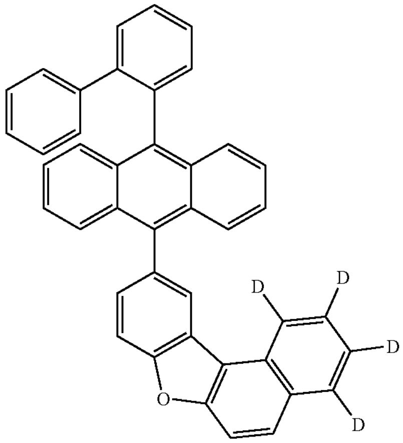
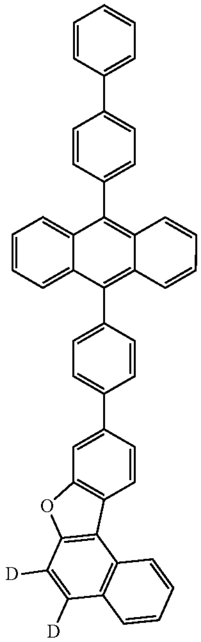
-continued
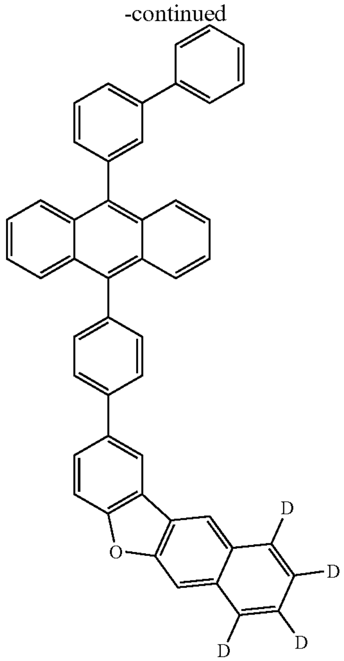
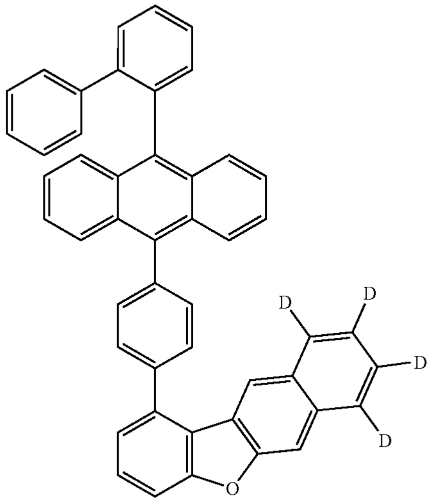
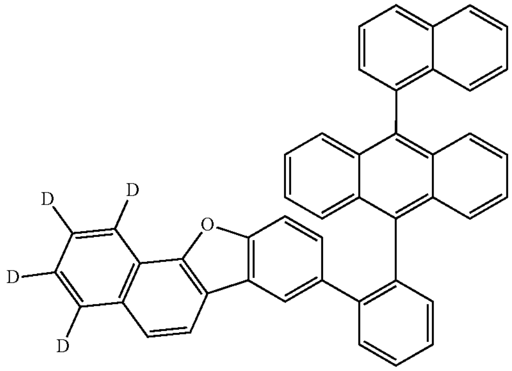

-continued
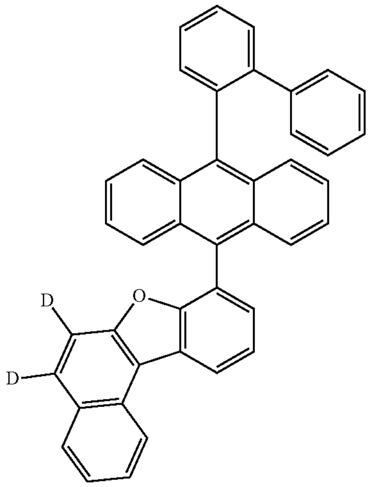
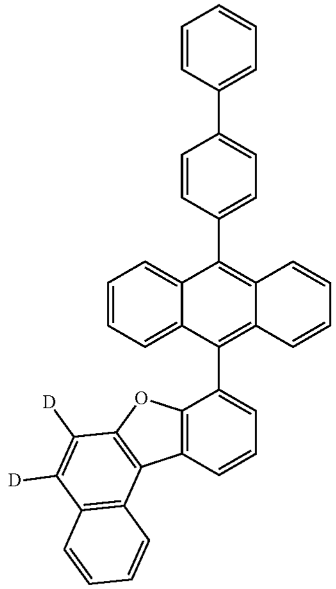
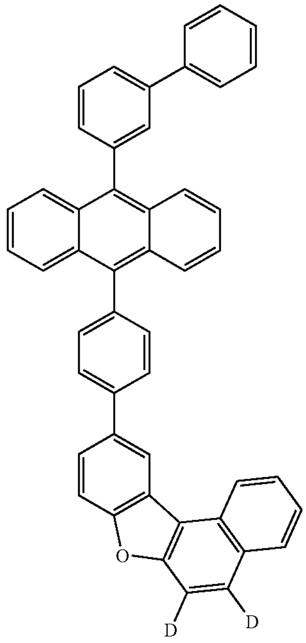
-continued
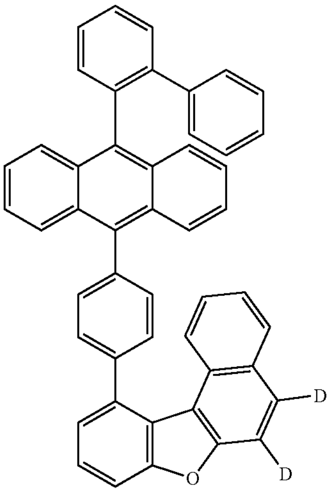
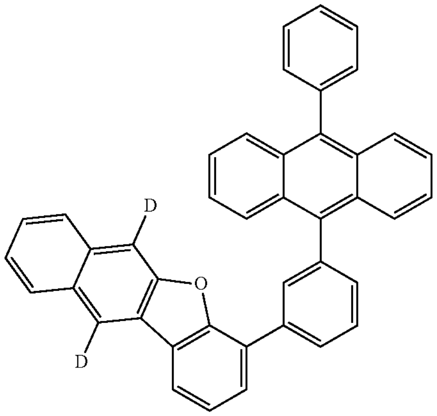
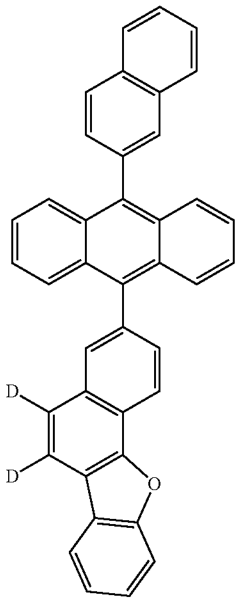

-continued
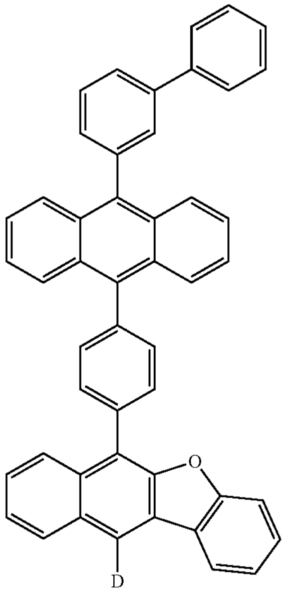
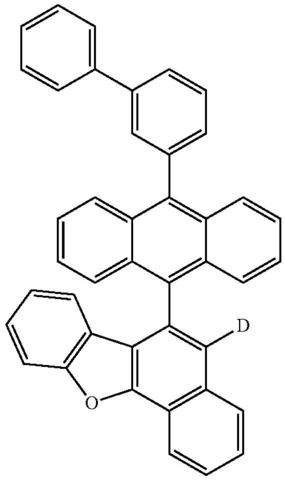
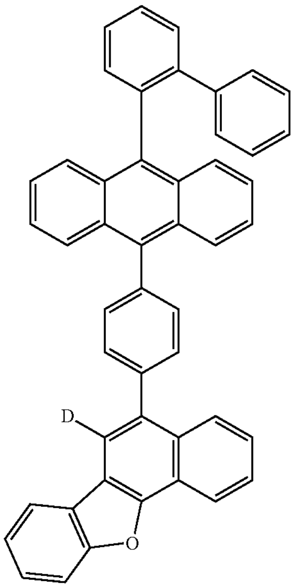
-continued
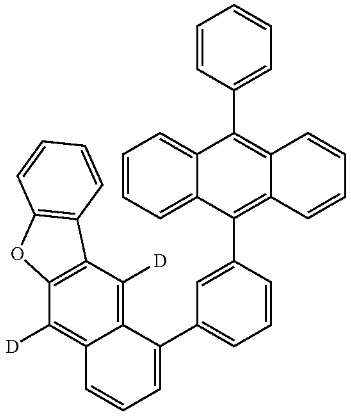
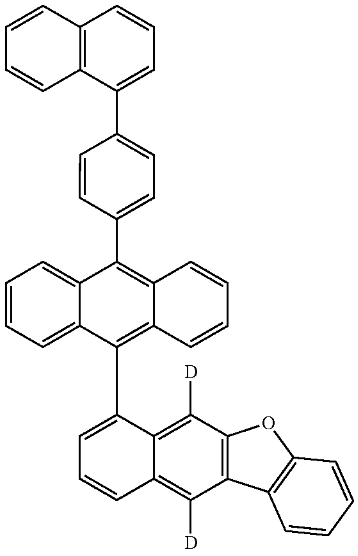
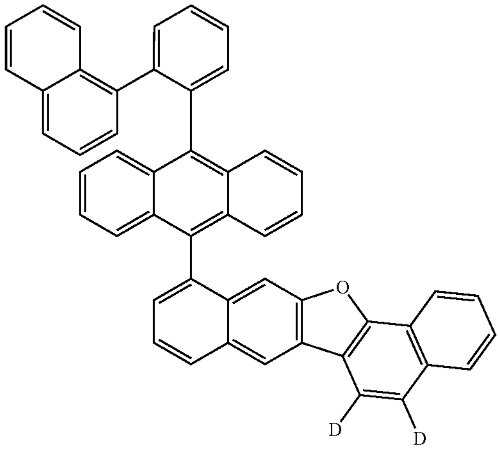

-continued
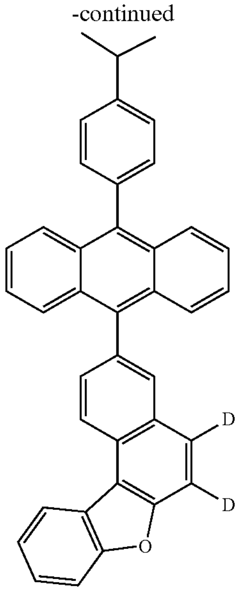
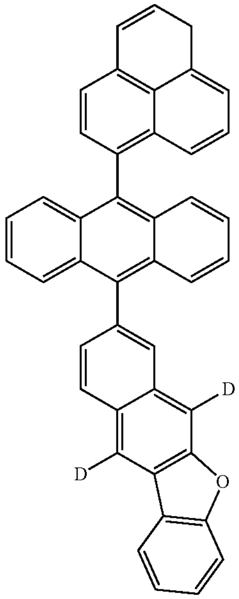
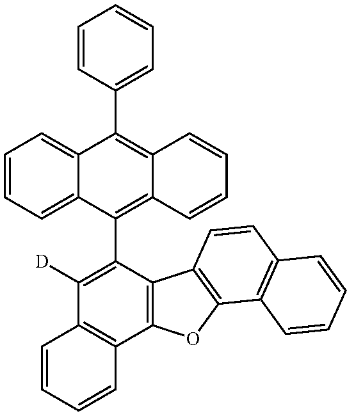
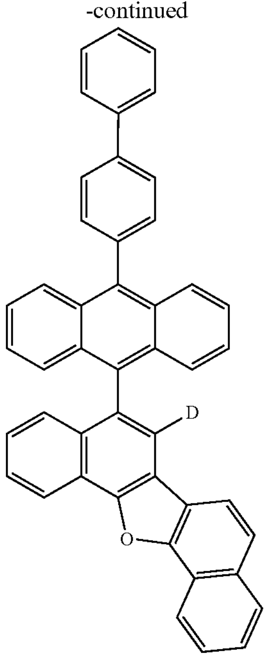
-continued
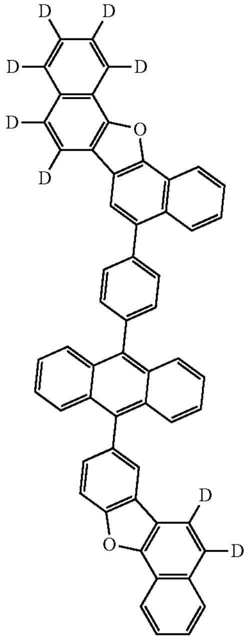

-continued
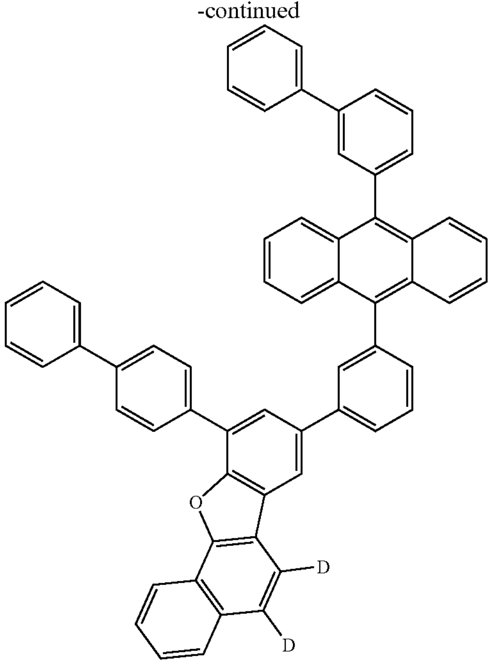
-continued
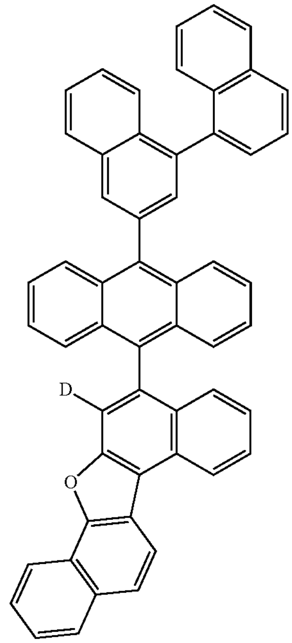
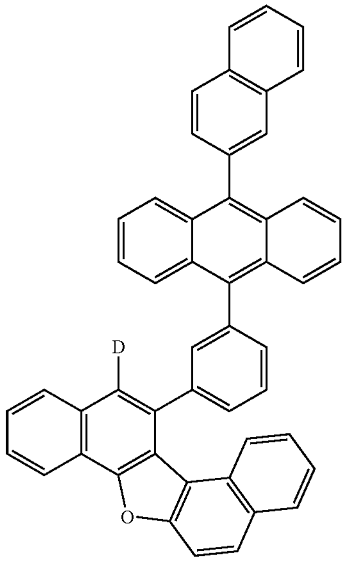
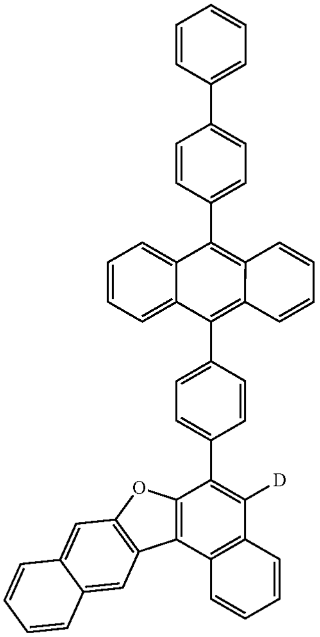

-continued
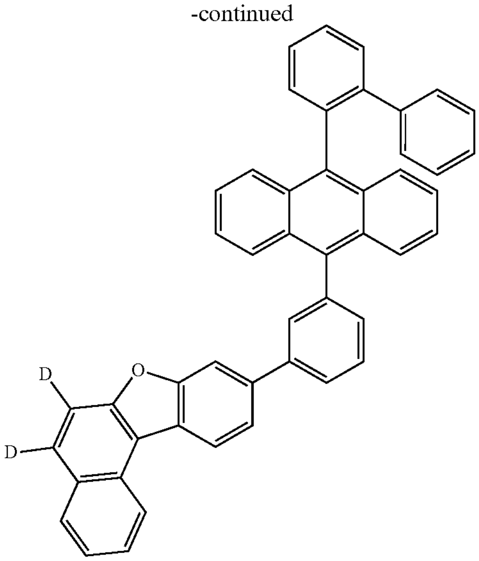
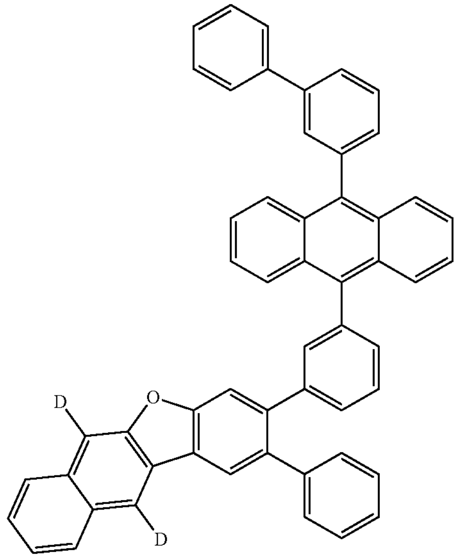
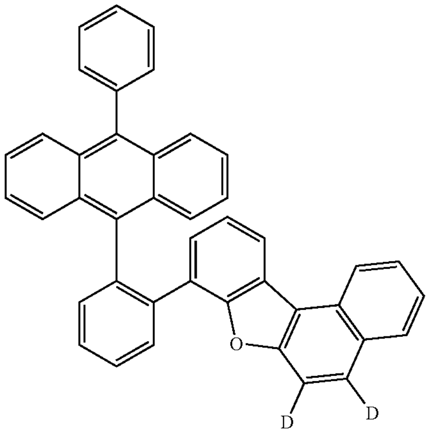
-continued
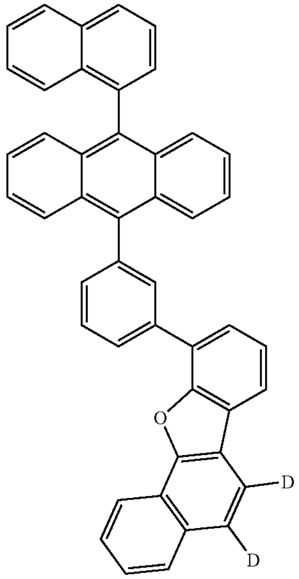
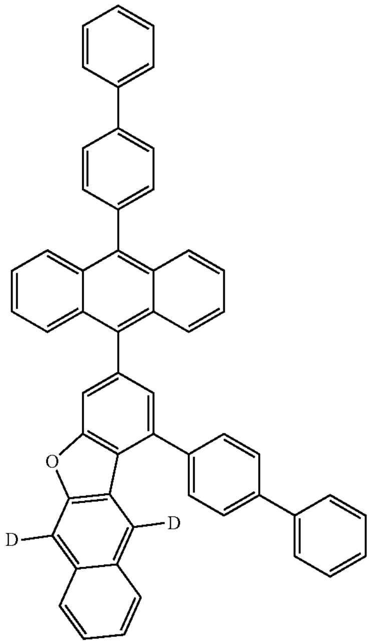
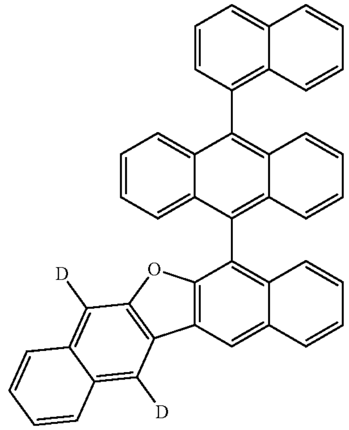

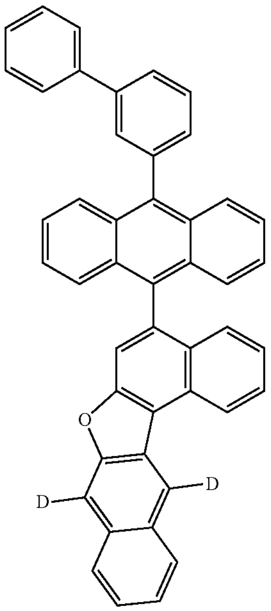
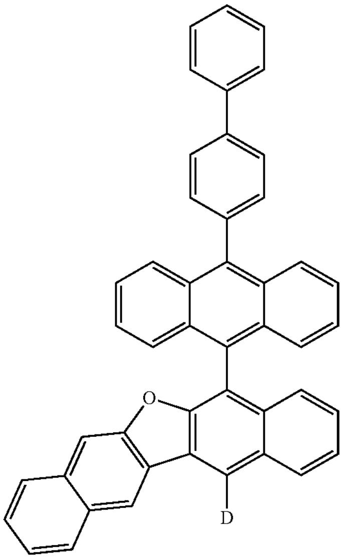
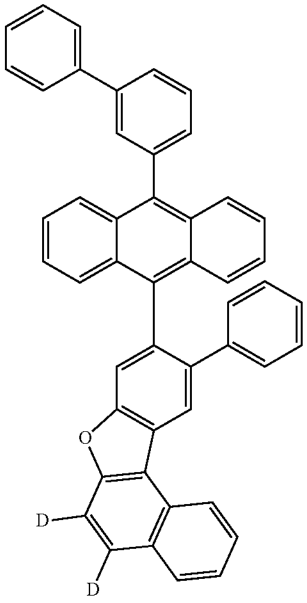
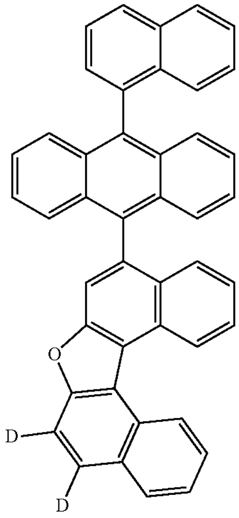
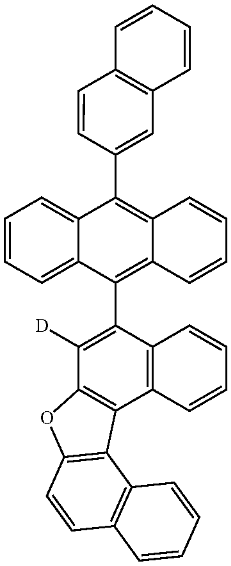

-continued
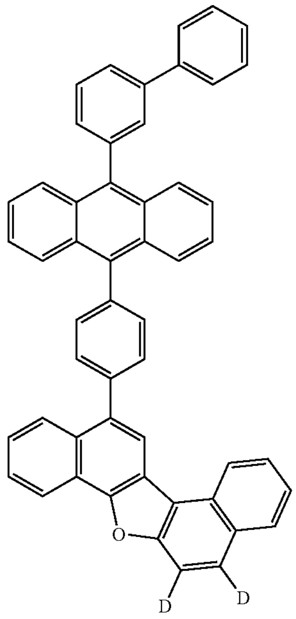
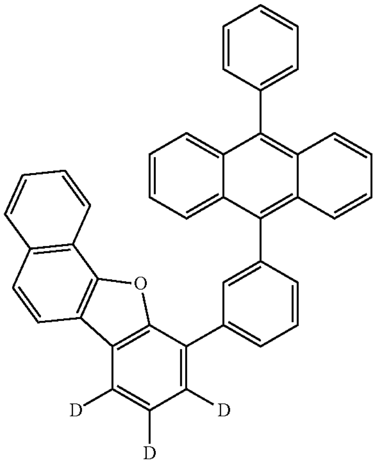
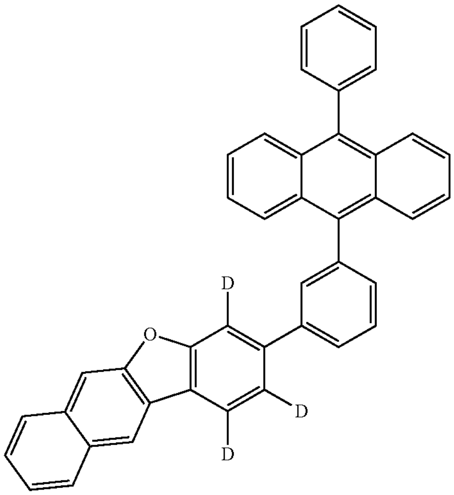
-continued
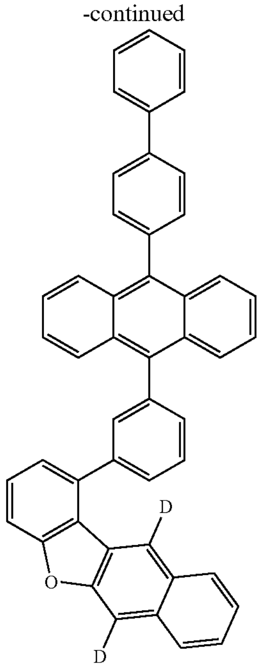
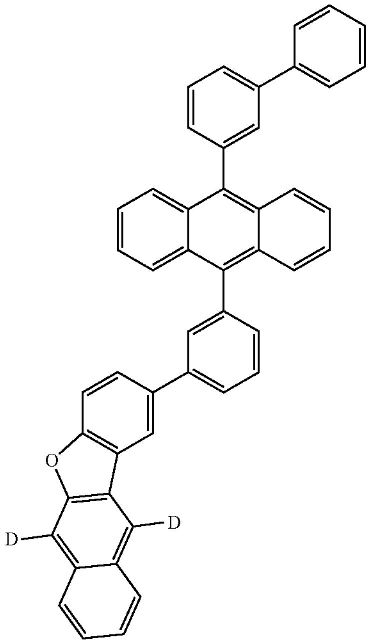

-continued
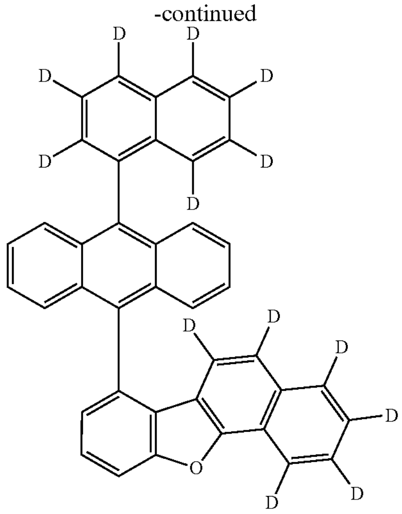
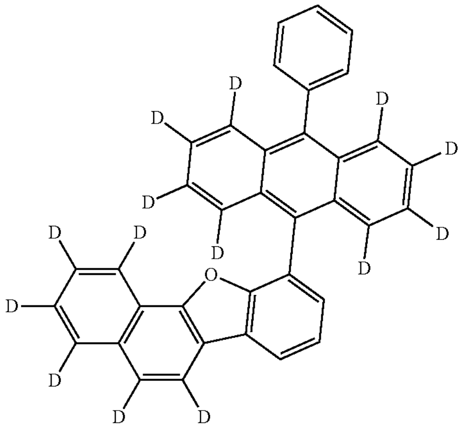
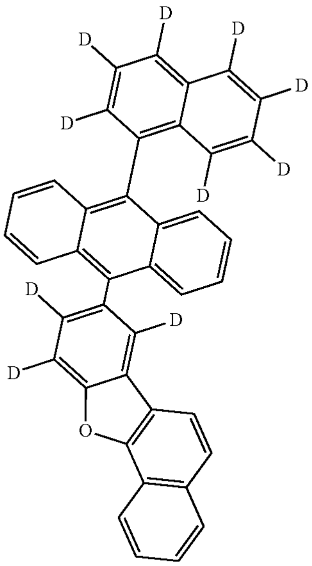
-continued
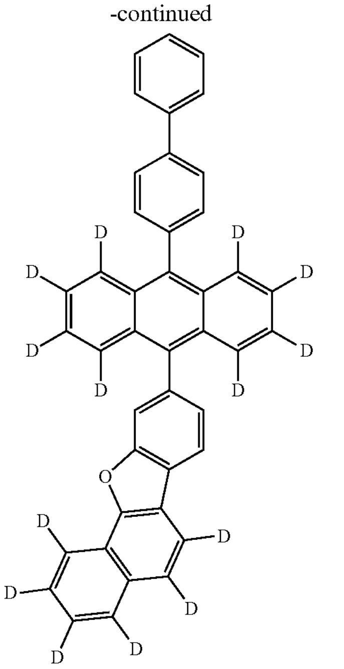
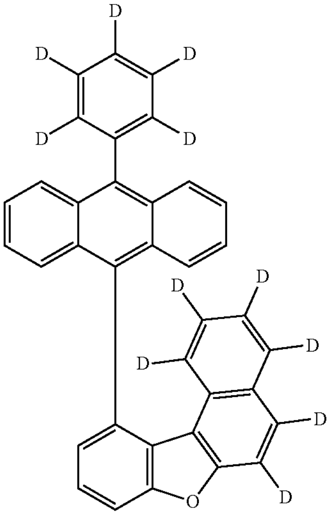

-continued

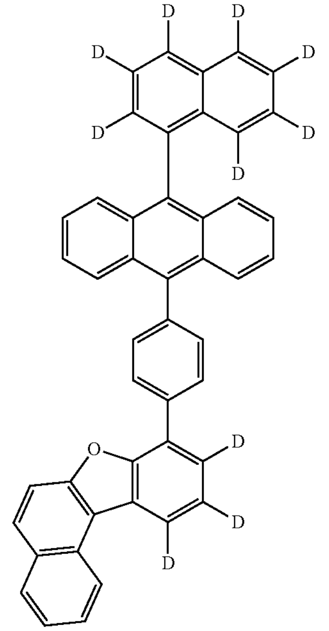

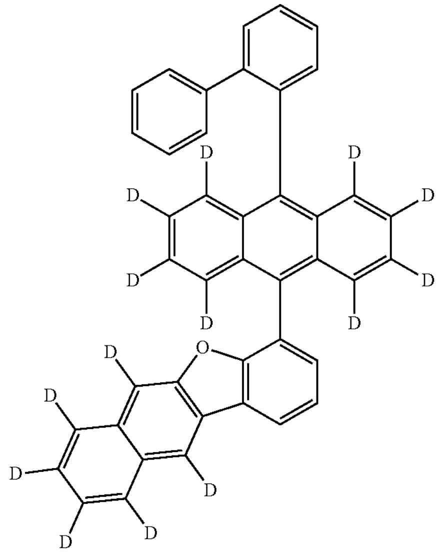

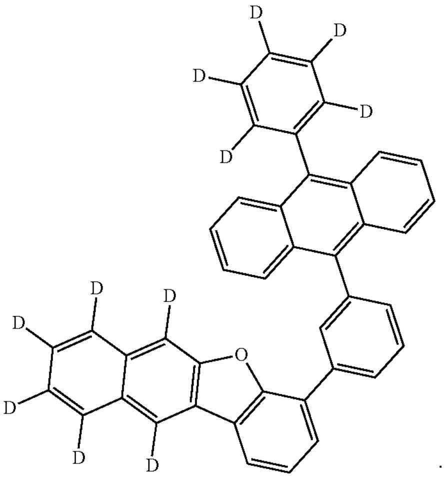

.

In a second aspect of the present invention, there is provided the application of the organic electroluminescent compound of the first aspect to the field of organic electroluminescence.

In a third aspect of the present invention, there is provided an organic electroluminescent device, comprising sequentially a first electrode disposed on a substrate plate, a second electrode disposed opposite to the first electrode, and one or more organic functional layers disposed between the first electrode and the second electrode, wherein the organic functional layer comprises a luminescent layer comprising one or more organic electroluminescent compounds as described above.

In conjunction with the third aspect, the luminescent layer comprises a host material and a doping material, wherein the host material comprises one or more organic electroluminescent compounds as described above.

Beneficial Effects of the Invention

The present invention provides a long-lifetime organic electroluminescent compound. The organic electroluminescent compound contains a benzonaphthofuran moiety. In the present invention, by means of the benzonaphthofuran structure instead of dibenzofuran, the conjugated length of π electron cloud is prolonged. When the molecule is converted into anionic state after accepting electrons, the negative charges can be effectively dispersed on the is benzonaphthofuran moiety, avoiding excessively high local energy caused by uneven distribution of the negative charges, thus increasing the stability of the compound. Furthermore, in the present invention, it has been unexpectedly found during the research that the benzonaphthofuran moiety has a relatively good planarity, and only by means of deuteration at some sites on the benzonaphthofuran structure, the vibration of carbon-hydrogen bonds can be significantly reduced, and the stability of the benzonaphthofuranyl can be enhanced. In the present invention, by means of rational deuteration at some sites on the benzonaphthofuran structure, the bond dissociation energy can be improved in the weakest part, the stability of the compound is significantly improved, and the deuteration cost is reduced. When the organic electroluminescent compound provided by the present invention is used as a host material in a luminescent layer of a blue organic electroluminescent device, the host material in the luminescent layer can effectively prolong the lifetime of the blue organic electroluminescent device and overcome the defects in the prior art.

BRIEF DESCRIPTION OF THE DRAWINGS

The specific embodiments of the present invention will be described in further detail with reference to the accompanying drawings.

FIG. 1 is a schematic structural diagram of an organic electroluminescent device containing the organic electroluminescent compound of the present invention.

In the Brief Description of the Drawings: 1—substrate, 2—anode, 3—hole injection layer, 4—hole transport layer, 5—luminescent auxiliary layer, 6—luminescent layer, 7—electron transport layer, 8—electron injection layer, and 9—cathode.

DETAILED DESCRIPTION OF EMBODIMENTS

In order to explain the present invention more clearly, the present invention will be further explained below in conjunction with preferred examples and the accompanying drawings. A person skilled in the art should understand that the following detailed description is illustrative rather than restrictive, and should not limit the scope of protection of the present invention. The examples and comparative examples in the present description are provided to explain the present description more completely to those skilled in the art. The examples and comparative examples according to the present description can be transformed into various forms, and the scope of protection of the present invention should not be limited to the examples and comparative examples detailed below.

The organic electroluminescent compound of the present invention is suitable for light-emitting elements, display panels, and electronic devices, especially for organic electroluminescent devices. The electronic device of the present invention is a device that comprises a layer of at least one organic compound, and the device may also comprise an inorganic material or a layer formed entirely of an inorganic material. The electronic device is preferably an organic electroluminescent device (OLED), an organic integrated circuit (O-IC), an organic field-effect transistor (O-FET), an organic thin film transistor (O-TFT), an organic light-emitting transistor (O-LET), an organic solar cell (O-SC), an organic dye-sensitized solar cell (O-DSSC), an organic optical detector, an organic photosensor, an organic field-quenching device (O-FQD), a luminescent electrochemical cell (LEC), an organic laser diode (O-laser), and an organic plasma emitting device. The electronic device is preferably an organic electroluminescent device (OLED).

In order to understand the content of the present invention more clearly, the organic electroluminescent compound, the preparation method therefor, and the luminescent characteristics of the device comprising same will be explained in detail in conjunction with examples. Various chemical reactions can be applied to the synthesis method for a compound according to one embodiment of the present invention. However, it should be noted that the synthesis method for the compound according to one embodiment of the present invention is not limited to the synthesis method described below. Unless otherwise specified, the subsequent synthesis is carried out in an anhydrous solvent in a protective gas atmosphere. Solvents and reagents can be purchased from conventional reagent suppliers.

Synthesis of Intermediates for Host Material Compound

The Synthesis Route of Intermediate a was as Follows

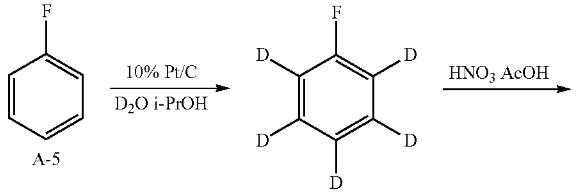

A-5

A-4

-continued

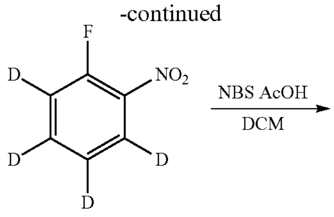

A-3

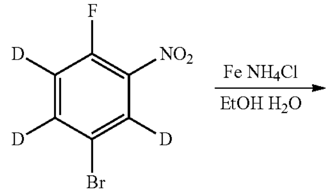

A-2

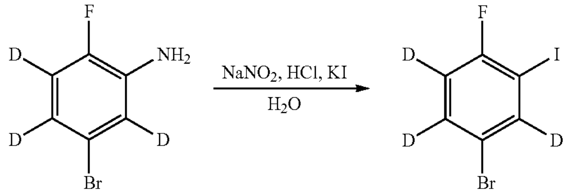

A-1

A

In a 100 mL reaction flask, A-5 (0.96 g, 10 mmol), 10 mL of $D_2O$, and 5 mL of isopropanol were added. In an argon atmosphere, the catalyst Pt/C (0.12 g, 0.06 mmol) was added, and the mixture was warmed to 180° C., reacted for 12 h, and cooled to room temperature, the catalyst Pt/C was removed, and distillation under reduced pressure was carried out to obtain A-4 (0.73 g, 72%).

In a 100 mL reaction flask, A-4 (1.01 g, 10 mmol) and 6 mL of acetic acid were added, the mixture was cooled to −10° C., 3 mL of concentrated nitric acid was slowly added, and the mixture was reacted at 0° C. for 2 h, poured into 30 mL of water, and extracted twice with 20 mL of dichloromethane, and the organic phases were combined, dried, concentrated under reduced pressure, and passed through a silica gel column to obtain A-3 (0.65 g, 45%).

In a 250 mL reaction flask, A-3 (1.45 g, 10 mmol), 20 mL of dichloromethane, and 1 mL of acetic acid were added, N-bromosuccinimide (2.13 g, 12 mmol) was slowly added, and the mixture was reacted at room temperature for 12 h, 20 mL of water was added, the mixture was stirred and separated, and the organic phase was spun dry and recrystallized to obtain A-2 (1.61 g, 72%).

In a 250 mL reaction flask, A-2 (2.23 g, 10 mmol), 20 mL of water, 20 mL of ethanol, ammonium chloride (1.60 g, 30 mmol), and reduced iron powder (1.68 g, 30 mmol) were added, the mixture was reacted under reflux for 8 h, cooled to room temperature, filtered, and extracted twice by adding 40 mL of water and 40 mL of dichloromethane, and the organic phases were combined, dried, and concentrated under reduced pressure to obtain A-1 (1.31 g, 68%).

In a 100 mL reaction flask, A-1 (2.66 g, 10 mmol) and 3 mL of concentrated hydrochloric acid were added at 0° C., $NaNO_2$ (1.03 g, 15 mmol) was then added to the mixed solution, and the mixed solution was reacted for 1 h. A saturated solution of KI (2.49 g, 15 mmol) was slowly added under controlled temperature, and the mixture was stirred for 1 h, then warmed to room temperature, and reacted for 1 d. Then, the reaction solution was poured into 50 mL of a saturated sodium thiosulfate solution, and the aqueous phase was extracted twice with 50 mL of dichloromethane.

The organic phases were combined, dried, concentrated, and passed through a silica gel column to obtain Intermediate A (1.21 g, 40%).

The Synthesis Route of Intermediate B was as Follows

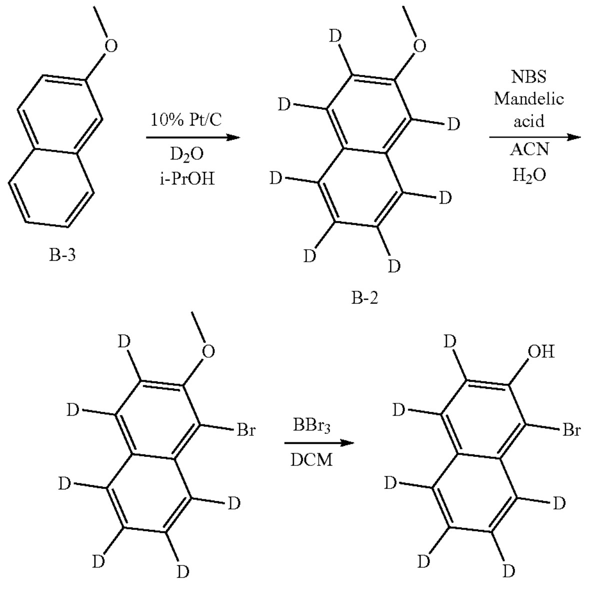

B-3 B-2 B-1 B

In a 100 mL reaction flask, Compound B-3 (1.58 g, 10 mmol), 10 mL of $D_2O$, and 5 mL of isopropanol were added. In an argon atmosphere, the catalyst Pt/C (0.12 g, 0.06 mmol) was added thereto, and the mixture was warmed to 180° C., reacted for 12 h, and cooled to room temperature, the catalyst Pt/C was filtered off, and distillation under reduced pressure was carried out to obtain B-2 (1.14 g, 69%).

In a 250 mL reaction flask, B-2 (1.65 g, 10 mmol), 10 mL of acetonitrile, 10 mL of water, and mandelic acid (3.04 g, 2 mmol) were added, N-bromosuccinimide (2.13 g, 12 mmol) was slowly added, and the mixture was reacted at room temperature for 36 h. 20 mL of ethyl acetate was added and the mixture was poured into 30 mL of a saturated $NaHCO_3$ solution. After stirring and leaving to stand for liquid separation, the organic phase was taken, and the aqueous phase was extracted with ethyl acetate (2×20 mL). The organic phases were combined, dried with sodium sulfate, concentrated under reduced pressure, and passed through a silica gel column to obtain B-1 (1.60 g, 66%).

In a 250 mL reaction flask, B-1 (2.43 g, 10 mmol) and 25 mL of dichloromethane were added under nitrogen protection, the mixture was cooled to −78° C., and $BBr_3$ (10.02 g, 40 mmol) was slowly added. The mixture was slowly warmed to room temperature and reacted for 2 h, and a saturated $NaHCO_3$ solution was then added to terminate the reaction. The pH was adjusted to about 7.20 mL of water was added, the mixture was stirred, left to stand, and separated. The organic phase was taken. The aqueous phase was extracted with dichloromethane (2×30 mL), the organic phases were combined, dried with sodium sulfate and filtered, the solvent was removed under reduced pressure, and the product was passed through a silica gel column to obtain B (1.79 g, 78%).

The Synthesis Route of Intermediate C was as Follows

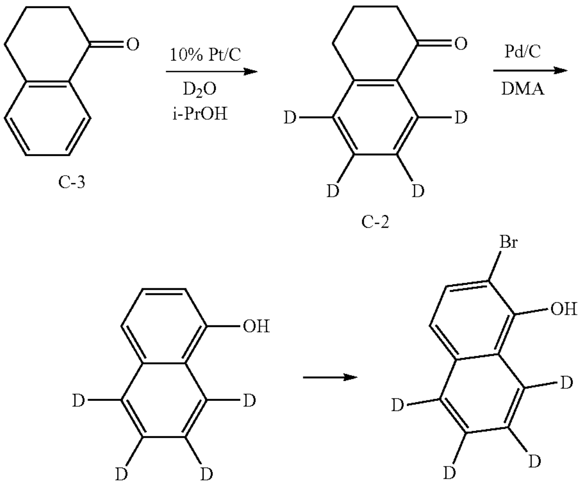

C-3 C-2 C-1 C

Reference can be made to the synthesis method for B-2, except that Intermediate B-3 was replaced with C-3 (1.46 g, 10 mmol) to finally obtain Compound C-2 (0.97 g, 65%).

C-2 (0.75 g, 5 mmol), $K_2CO_3$ (0.14 g, 1 mmol), Pd/C (0.25 g, 0.25 mmol Pd), and dichloromethane (10 mL) were added to a two-necked flask fitted with a stirring bar. Firstly, the flask was degassed and sealed with a balloon of a gas mixture (the gas mixture was made up of 0.2 atm hydrogen and 0.8 atm nitrogen, with the volume ratio of hydrogen to nitrogen being 3:7). The reaction was heated to 150° C. in an oil bath and stirred vigorously for 17 h. After the reaction was completed, Pd/C was filtered off, 20 ml of water was added to the filtrate, and a certain amount of dilute hydrochloric acid was added to adjust the pH to neutral. The filtrate was extracted with ethyl acetate (3×30 mL), the organic layers were combined and dried with anhydrous $Na_2SO_4$. The solvent was evaporated under reduced pressure to obtain a crude product, which was purified by column chromatography to obtain C-1 (0.59 g, 80%).

In a 250 mL reaction flask, C-1 (1.48 g, 10 mmol), diisopropylamine (0.10 g, 1 mmol), and 30 mL of dichloromethane were added, N-bromosuccinimide (2.13 g, 12 mmol) was slowly added, and the mixture was warmed to 40° C., reacted for 12 h, and cooled to room temperature. The pH of the system was adjusted to 5 with a 1 mol/L hydrochloric acid solution. 20 mL of water was added, and the mixture was stirred and left to stand for liquid separation. The organic phase was taken. The aqueous phase was extracted with 20 mL of dichloromethane, and the organic phases were combined, dried with anhydrous sodium sulfate, concentrated under reduced pressure, and passed through a silica gel column to obtain C (1.14 g, 50%).

SYNTHESIS EXAMPLES

Example 1

This example provided Compound H-1, and the synthesis route therefor was as follows:

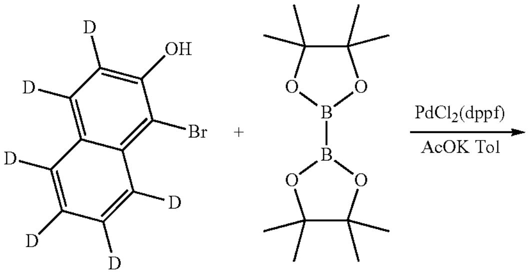
B 1-j
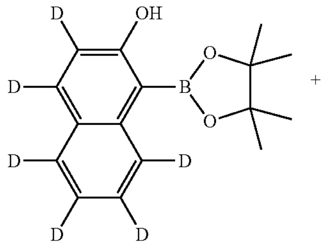
1-i
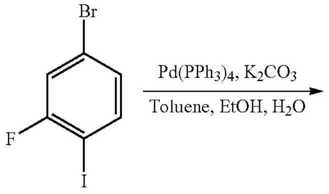
1-h
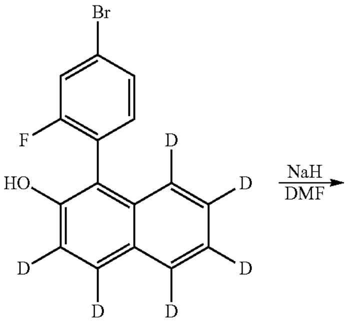
1-g
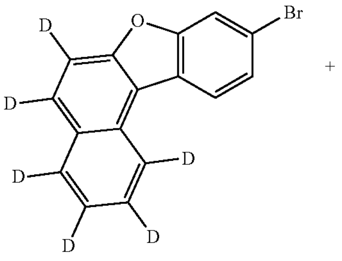
1-f
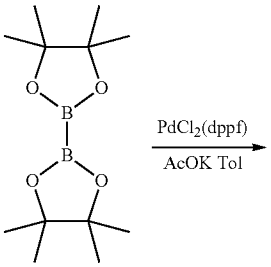
-continued
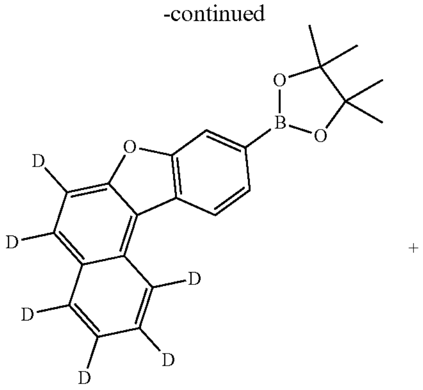
1-e
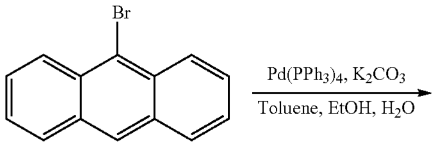
1-d
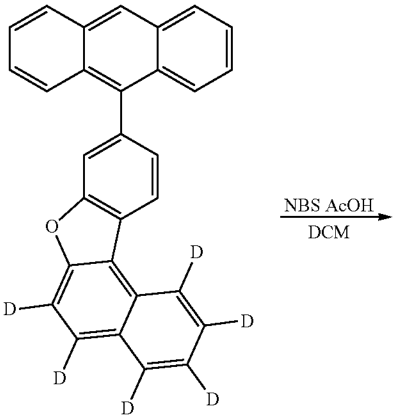
1-c
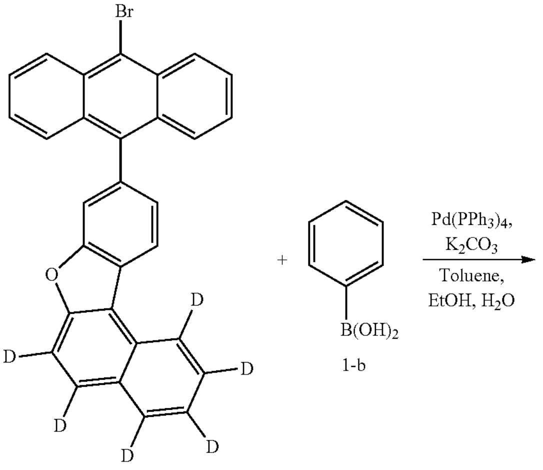
1-b
1-a -continued

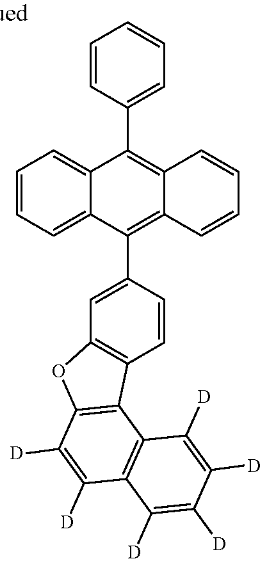

H-1

In a 250 ml reaction flask, 35 mL of toluene, potassium acetate (1.96 g, 20 mmol), Intermediate B (2.29 g, 10 mmol), 1-j (3.05 g, 12 mmol), and palladium dichloride (0.07 g, 0.1 mmol) were added under nitrogen protection, warmed to reflux, reacted for 8 h, and then cooled to room temperature. 20 mL of water was added, the mixture was stirred and left to stand for layering, and the organic phase was taken, evaporated to dryness under reduced pressure, and passed through a silica gel column to obtain 1-i (1.96 g, 71%).

In a 250 mL three-necked flask, 30 mL of toluene, 15 mL of ethanol, and 15 mL of water were added under nitrogen protection, and 1-i (2.76 g, 10 mmol), Compound 1-h (3.01 g, 10 mmol), potassium carbonate (4.15 g, 30 mmol), and tetrakis(triphenylphosphine)palladium (0.35 g, 0.3 mmol) were then added. The mixture was heated to 80° C., reacted for 12 h, and cooled to room temperature, 15 mL of water was added, and the mixture was stirred and left to stand for layering. The organic phase was taken, evaporated to dryness under reduced pressure, and passed through a silica gel column to obtain 1-g (2.33 g, 72%).

In a 250 mL reaction flask, 35 mL of dimethylformamide and 1-g (3.23 g, 10 mmol) was added, NaH with a mass percentage concentration of 60% (1 g, 25 mmol) was slowly added, the mixture was warmed to 140° C. and reacted for 8 h, the reaction product was cooled to room temperature, poured into ice water, filtered, and passed through a silica gel column to obtain 1-f (1.30 g, 43%).

Referring to the synthesis method for 1-i, Intermediate B was replaced with 1-f (3.03 g, 10 mmol) to obtain 1-e (2.45 g, 70%).

Referring to the synthesis method for 1-g, 1-i was replaced with 1-e (3.50 g, 10 mmol) and 1-h with 1-d (2.57 g, 10 mmol) to obtain 1-c (2.92 g, 73%).

In a 250 mL reaction flask, Compound 1-c (4.01 g, 10 mmol), 50 mL of dichloromethane, and 1 mL of acetic acid were added, N-bromosuccinimide (2.13 g, 12 mmol) was slowly added, and the mixture was reacted at room temperature overnight, 50 mL of water was added, the mixture was stirred and separated, and the organic phase was taken, spun dry and recrystallized to obtain 1-a (3.69 g, 79%).

In a 250 mL three-necked flask, 50 mL of toluene, 25 mL of ethanol, and 25 mL of water were added under nitrogen protection, and 1-a (4.79 g, 10 mmol), 1-b (1.22 g, 10 mmol), potassium carbonate (4.15 g, 30 mmol), and tetrakis(triphenylphosphine)palladium (0.35 g, 0.3 mmol) were then added. The mixture was heated to 80° C., reacted for 12 h, cooled to room temperature, and filtered. The filter cake was hot dissolved in toluene and then filtered to remove solid insolubles, and the filtrate was then recrystallized to obtain Compound H-1 (3.00 g, 63%), MS: m/z 476.20 [M+].

Example 2

This example provided Compound H-2, and the synthesis route therefor was as follows:

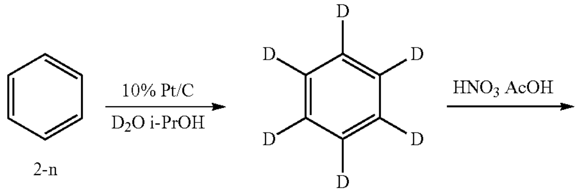

2-n 2-m

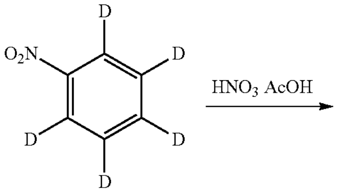

2-l

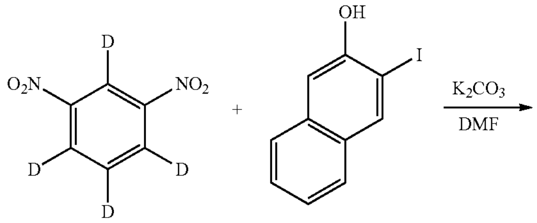

2-k 2-j

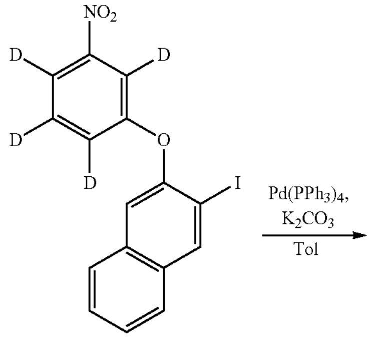

2-j

-continued

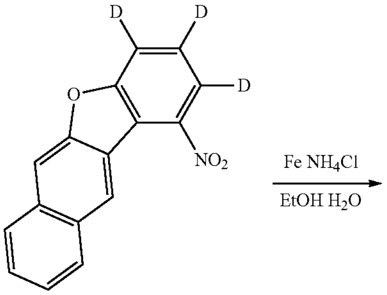

2-h

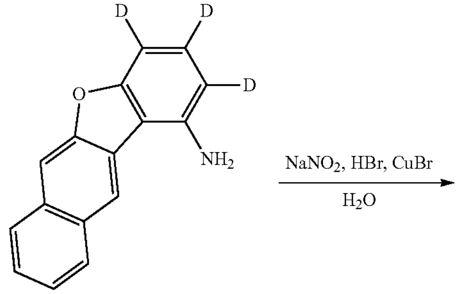

2-g

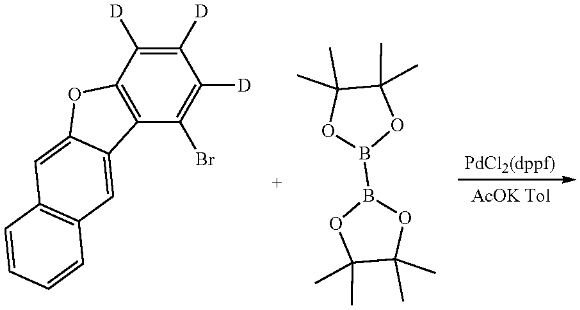

2-f

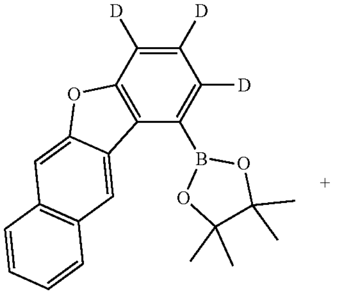

2-e

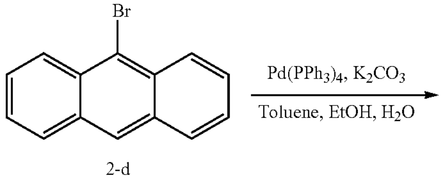

2-d

-continued

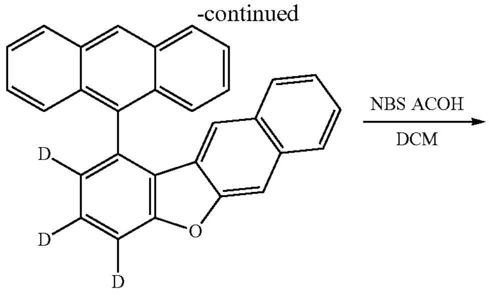

2-c

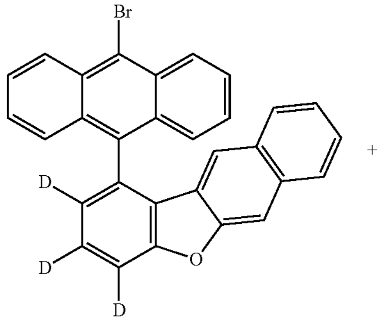

2-a

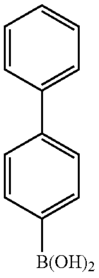

2-b

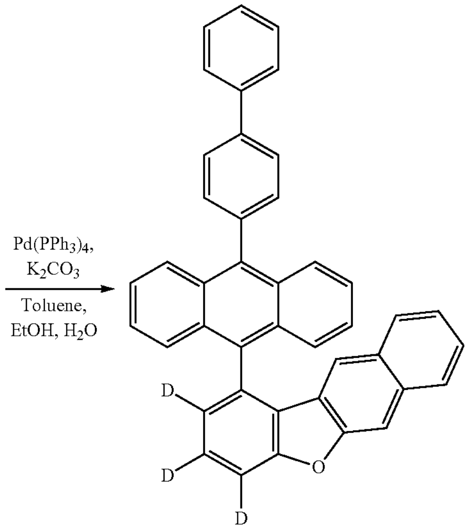

H-2

The same method as the synthesis for A-4 was used, except that A-5 was replaced with 2-n (0.78 g, 10 mmol) to obtain Compound 2-m (0.58 g, 69%).

In a 100 mL reaction flask, 2-m (0.84 g, 10 mmol) and 5 mL of acetic acid were added, the mixture was cooled to −10° C., 2 mL of concentrated nitric acid was slowly added, and the mixture was reacted at 0° C. for 2 h, poured into 30 mL of water, and extracted twice with 20 mL of dichloromethane, and the organic phases were combined, dried, concentrated under reduced pressure, and passed through a silica gel column to obtain 2-1 (0.65 g, 51%).

In a 100 mL reaction flask, 2-1 (1.28 g, 10 mmol) and 6 mL of acetic acid were added, the mixture was cooled to −10° C., 2 mL of concentrated nitric acid was slowly added, and the mixture was reacted at 0° C. for 2 h, poured into 30 mL of water, and extracted twice with 20 mL of dichloromethane, and the organic phases were combined, dried, concentrated under reduced pressure, and passed through a silica gel column to obtain Product 2-k (0.95 g, 55%).

In a 100 mL reaction flask, 2-k (1.72 g, 10 mmol), 17 mL of dimethylformamide, potassium carbonate (3.46 g, 25 mmol), and 2-j (2.70 g, 10 mmol) were added, warmed to 90° C., reacted for 12 h, cooled to room temperature, and poured into 100 mL of ice water. The aqueous phase was extracted with dichloromethane (2×30 mL), and the organic phases were combined, dried, concentrated under reduced pressure, and passed through a silica gel column to obtain 2-i (2.73 g, 69%).

In a 250 mL reaction flask, 32 mL of dimethylformamide, 2-i (3.95 g, 10 mmol), potassium carbonate (2.76 g, 20 mmol), and $Pd(PPh_3)_4$ (0.35 g, 0.3 mmol) were added in a nitrogen atmosphere, stirred at room temperature for 30 min, then reacted under reflux for 18 h, and cooled to room temperature. 100 mL of water was added, the mixture was stirred for 30 min, the aqueous phase was extracted with 100 mL of dichloromethane, and the organic phase was taken, dried with sodium sulfate, concentrated under reduced pressure, and passed through a silica gel column to obtain 2-h (1.41 g, 53%).

In a 250 mL reaction flask, 2-h (2.66 g, 10 mmol), 20 mL of water, 20 mL of ethanol, ammonium chloride (1.60 g, 30 mmol), and reduced iron powder (1.68 g, 30 mmol) were added, the mixture was reacted under reflux for 12 h, cooled to room temperature, filtered, and extracted twice by adding 40 mL of water and 40 mL of dichloromethane, and the organic phases were combined, dried with sodium sulfate, and concentrated under reduced pressure to obtain 2-g (1.51 g, 64%).

In a 100 mL reaction flask, 2-g (2.36 g, 10 mmol) and 6 mL of concentrated nitric acid were added at 0° C. to obtain a mixed solution, $NaNO_2$ (1.03 g, 15 mmol) was added to the mixed solution, and the mixed solution was reacted for 1 h. 6 mL of hydrobromic acid and a CuBr saturated solution (2.15 g, 15 mmol) were slowly added at controlled temperature, and the mixture was stirred for 1 h, then warmed to 70° C., and reacted for 2 d. The reaction solution was poured into 50 mL of a saturated sodium thiosulfate solution, and the mixture was adjusted to neutral. The aqueous phase was extracted with dichloromethane (2×50 mL), and the organic phases were combined, dried, concentrated, and passed through a silica gel column to obtain intermediate 2-f (1.38 g, 46%).

Referring to the synthesis method for 1-i, Intermediate B was replaced with 2-f (3.00 g, 10 mmol) to obtain 2-e (2.40 g, 69%).

Referring to the synthesis method for 1-g, 1-i was replaced with 2-e (3.47 g, 10 mmol) and 1-h with 2-d (2.57 g, 10 mmol) to obtain 2-c (2.82 g, 71%).

Referring to the synthesis method for 1-a, 1-c was replaced with 2-c (3.97 g, 10 mmol) to obtain 2-a (3.67 g, 77%).

Referring to the synthesis method for Compound H-1, 1-a was replaced with 2-a (4.76 g, 10 mmol) and 1-b with 2-b (1.98 g, 10 mmol) to obtain Compound H-2 (3.52 g, 64%), MS: m/z 549.22 [M+].

Example 3

This example provided Compound H-3, and the synthesis route therefor was as follows:

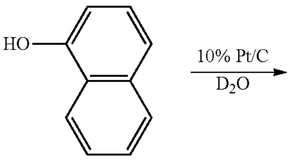

3-I

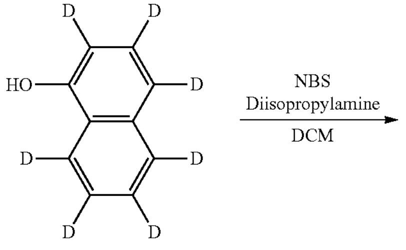

3-k

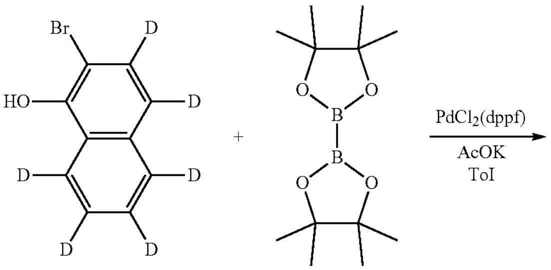

3-j

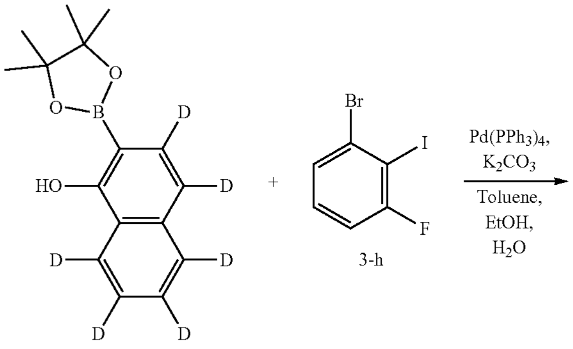

3-h 3-i

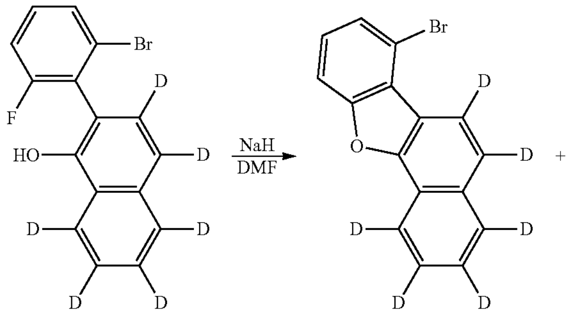

3-g 3-f

-continued

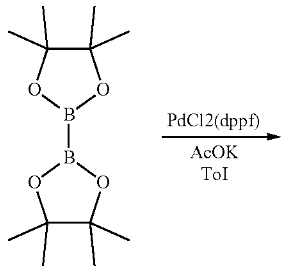

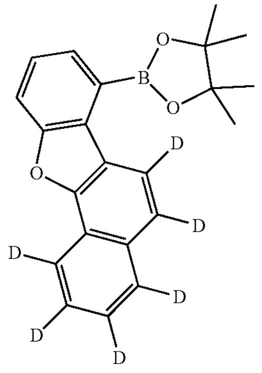

3-e

+

-continued

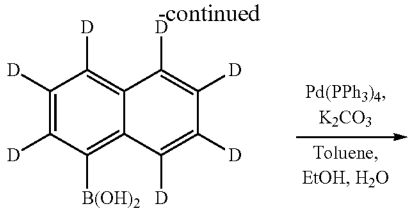

3-b

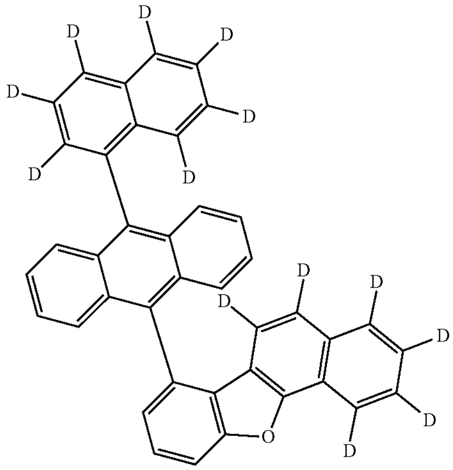

H-3

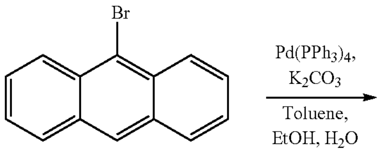

3-d

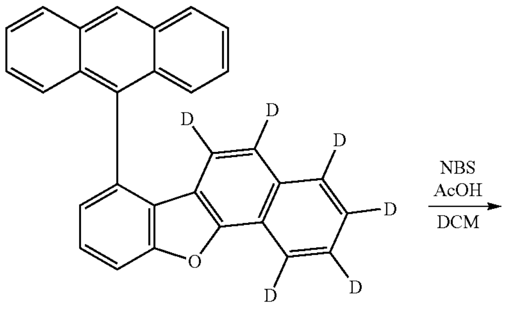

3-c

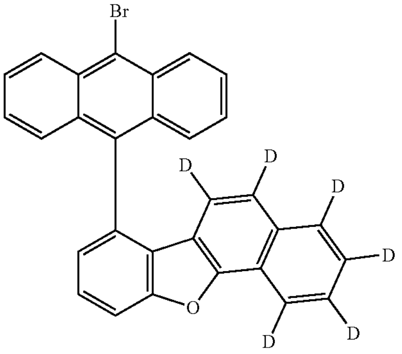

3-a

+

In a 100 mL reaction flask, 3-1 (1.44 g, 10 mmol) and 14 mL of $D_2O$ were added. In an argon atmosphere, the catalyst Pt/C (0.12 g, 0.06 mmol) was added, and the mixture was warmed to 180° C., reacted for 12 h, and cooled to room temperature, the catalyst Pt/C was filtered off, and distillation under reduced pressure was carried out to obtain 3-k (1.07 g, 71%).

In a 250 mL reaction flask, 3-k (1.51 g, 10 mmol), diisopropylamine (0.10 g, 1 mmol), and 30 mL of dichloromethane were added, N-bromosuccinimide (2.13 g, 12 mmol) was slowly added, and the mixture was warmed to 40° C., reacted for 12 h, and cooled to room temperature. The pH of the system was adjusted to weakly acidic 5 with a 1 mol/L hydrochloric acid solution. 20 mL of water was added, and the mixture was stirred and left to stand for liquid separation. The organic phase was taken. The aqueous phase was extracted with 20 mL of dichloromethane, and the organic phases were combined, dried with anhydrous sodium sulfate, concentrated under reduced pressure, and passed through a silica gel column to obtain 3-j (1.19 g, 52%).

Referring to the synthesis method for 1-i, Intermediate B was replaced with 3-j (2.29 g, 10 mmol) to obtain 3-i (1.96 g, 71%).

Referring to the synthesis method for 1-g, 1-i was replaced with 3-i (2.76 g, 10 mmol) and 1-h with 3-h (3.01 g, 10 mmol) to obtain 3-g (2.36 g, 73%).

Referring to the synthesis method for 1-f, 1-g was replaced with 3-g (3.23 g, 10 mmol) to obtain 3-f (1.27 g, 42%).

Referring to the synthesis method for 1-i, Intermediate B was replaced with 3-f (3.03 g, 10 mmol) to obtain 3-e (2.42 g, 69%).

Referring to the synthesis method for 1-g, 1-i was replaced with 3-e (3.50 g, 10 mmol) and 1-h with 3-d (2.57 g, 10 mmol) to obtain 3-c (2.88 g, 72%).

Referring to the synthesis method for 1-a, 1-c was replaced with 3-c (4.01 g, 10 mmol) to obtain 3-a (3.79 g, 79%).
Referring to the synthesis method for Compound H-1, 1-a was replaced with 3-a (4.79 g, 10 mmol) and 1-b with 3-b (1.79 g, 10 mmol) to obtain Compound H-3 (3.26 g, 62%), MS: m/z 533.71 [M+].
Example 4
This example provided Compound H-4, and the synthesis route therefor was as follows:
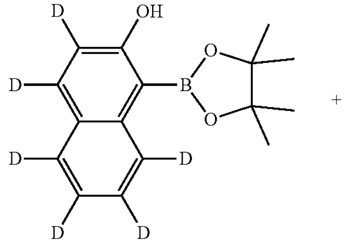
1-i
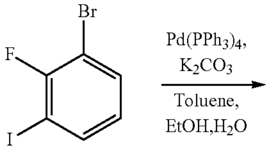
4-h
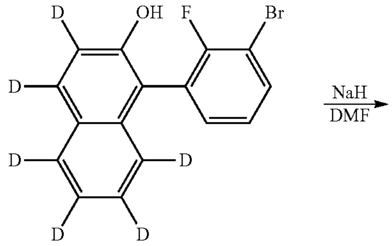
4-g
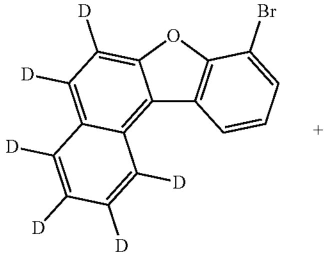
4-f
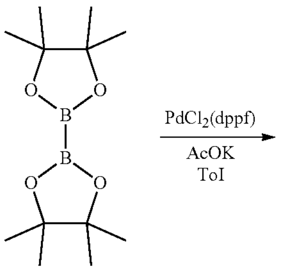
-continued
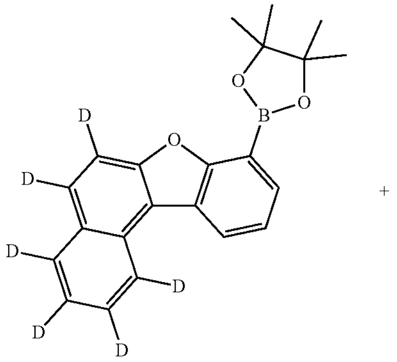
4-e
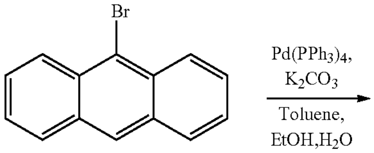
4-d
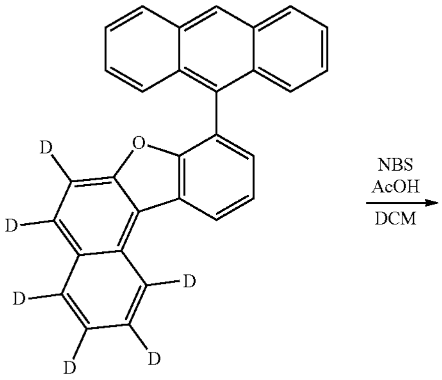
4-c
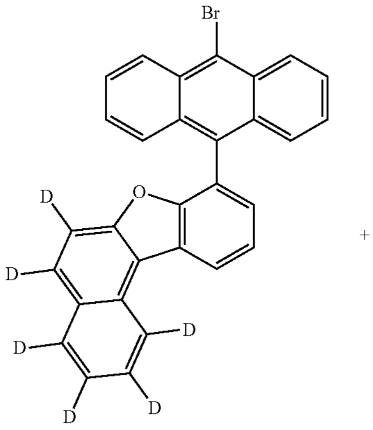
4-a
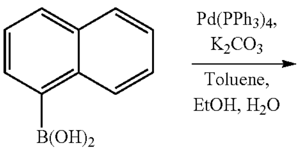
4-b -continued

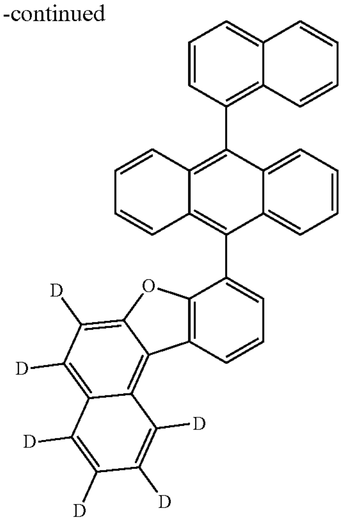

H-4

Referring to the synthesis method for 1-g, 1-h was replaced with 4-h (3.01 g, 10 mmol) to obtain 4-g (2.29 g, 71%);

referring to the synthesis method for 1-f, 1-g was replaced with 4-g (3.23 g, 10 mmol) to obtain 4-f (1.30 g, 43%);

referring to the synthesis method for 1-i, Intermediate B was replaced with 4-f (3.03 g, 10 mmol) to obtain 4-e (2.52 g, 72%);

referring to the synthesis method for 1-g, 1-i was replaced with 4-e (3.50 g, 10 mmol) and 1-h with 4-d (2.57 g, 10 mmol) to obtain 4-c (2.92 g, 73%);

referring to the synthesis method for 1-a, 1-c was replaced with 4-c (4.01 g, 10 mmol) to obtain 4-a (3.64 g, 76%); and referring to the synthesis method for Compound H-1, 1-a was replaced with 4-a (4.79 g, 10 mmol) and 1-b with 4-b (1.72 g, 10 mmol) to obtain Compound H-4 (3.37 g, 64%), MS: m/z 526.22 [M+].

Example 5

This example provided Compound H-5, and the synthesis route therefor was as follows:

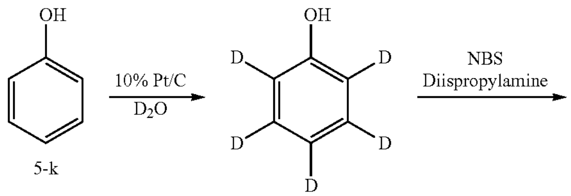

5-k 5-j

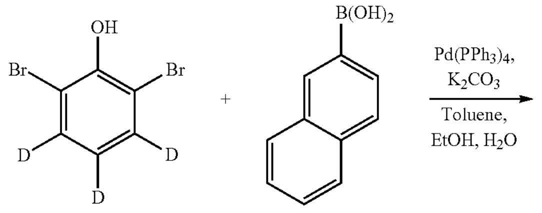

5-i 5-h

-continued

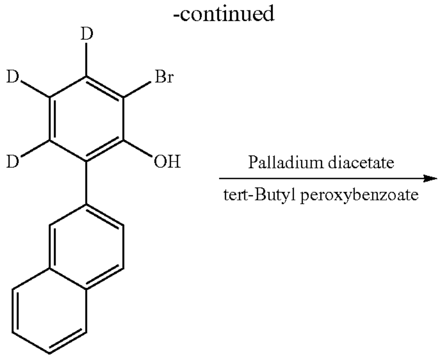

5-g

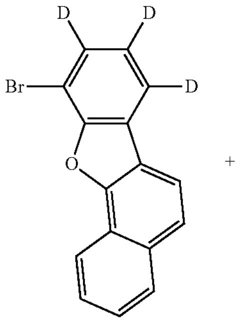

5-f

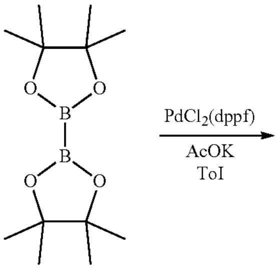

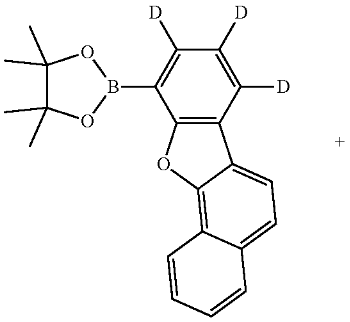

5-e

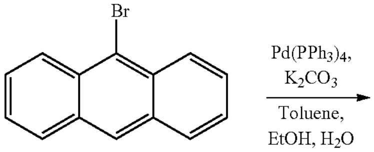

5-d

-continued

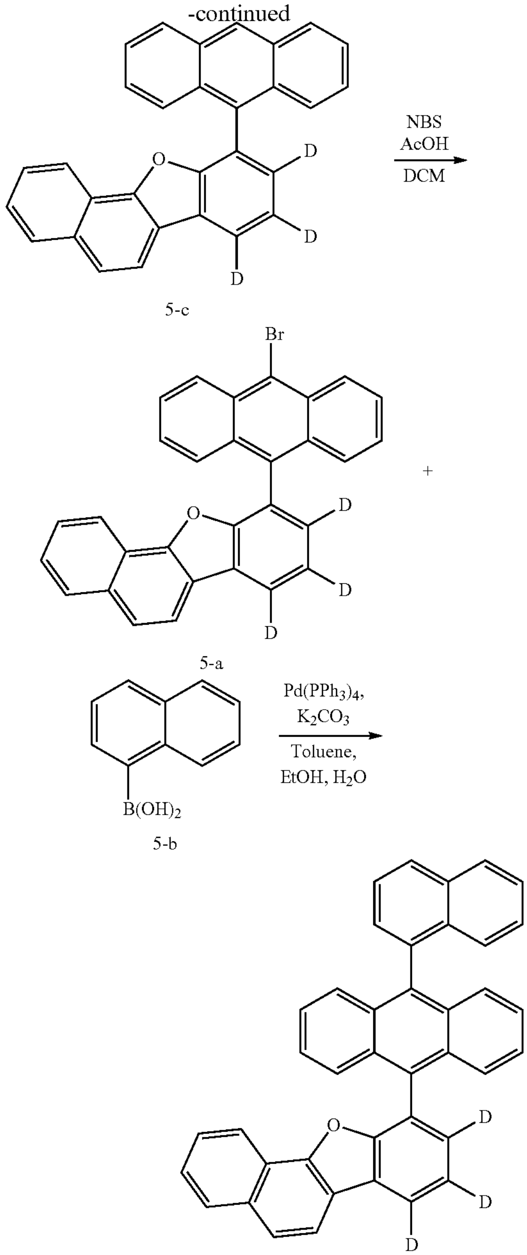

5-c 5-a 5-b

H-5

In a 100 mL reaction flask, Compound 5-k (0.94 g, 10 mmol) and 10 mL of $D_2O$ were added. In an argon atmosphere, the catalyst Pt/C (0.12 g, 0.06 mmol) was added, and the mixture was warmed to 180° C., reacted for 12 h, and cooled to room temperature, insolubles were filtered off, and distillation under reduced pressure was carried out to obtain 5-j (0.70 g, 71%).

In a 250 mL reaction flask, 5-j (0.99 g, 10 mmol), diisopropylamine (0.10 g, 1 mmol), and 30 mL of dichloromethane were added, N-bromosuccinimide (3.92 g, 22 mmol) was slowly added, and the mixture was warmed to 40° C., reacted for 12 h, and cooled to room temperature. The pH of the system was adjusted to 5 with a 1 mol/L hydrochloric acid solution. 20 mL of water was added, and the mixture was stirred and left to stand for liquid separation. The organic phase was taken. The aqueous phase was extracted with 20 mL of dichloromethane, and the organic phases were combined, dried with anhydrous sodium sulfate, concentrated under reduced pressure, and passed through a silica gel column to obtain 5-i (1.66 g, 65%).

Referring to the synthesis method for 1-g, 1-i was replaced with 5-i (2.55 g, 10 mmol) and 1-h with 5-h (1.72 g, 10 mmol) to obtain 5-g (2.21 g, 73%).

In a 250 mL reaction flask, 5-g (3.02 g, 10 mmol), 30 mL of dimethylformamide, 3-nitropyridine (2.48 g, 20 mmol), and tert-butyl peroxybenzoate (3.88 g, 20 mmol) were added under nitrogen protection, and palladium acetate (0.11 g, 0.5 mmol) was added. The mixture was warmed to flux, reacted for 36 h, cooled to room temperature, and poured into 100 mL of ice water. The aqueous phase was extracted with dichloromethane (3×50 mL), and the organic phases were combined, dried with anhydrous sodium sulfate, concentrated under reduced pressure to obtain 5-f (0.99 g, 33%).

Referring to the synthesis method for 1-i, Intermediate B was replaced with 5-f (3.00 g, 10 mmol) to obtain 5-e (2.47 g, 71%).

Referring to the synthesis method for 1-g, 1-i was replaced with 5-e (3.47 g, 10 mmol) and 1-h with 5-d (2.57 g, 10 mmol) to obtain 5-c (2.94 g, 74%).

Referring to the synthesis method for 1-a, 1-c was replaced with 5-c (3.97 g, 10 mmol) to obtain 5-a (3.72 g, 78%).

Referring to the method for Compound H-1, 1-a was replaced with 5-a (4.76 g, 10 mmol) and 1-b with 5-b (1.72 g, 10 mmol) to obtain Compound H-5 (3.19 g, 61%), MS: m/z 523.20 [M+].

Example 6

This example provided Compound H-6, and the synthesis route therefor was as follows:

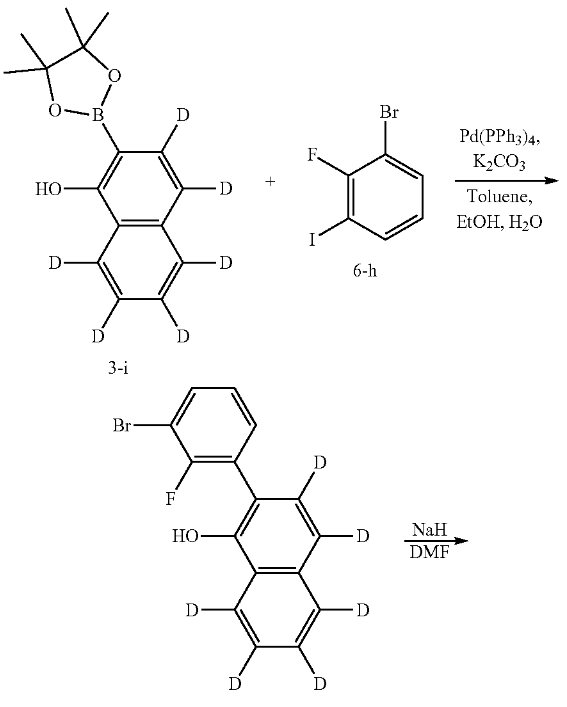

3-i 6-h 6-g

-continued

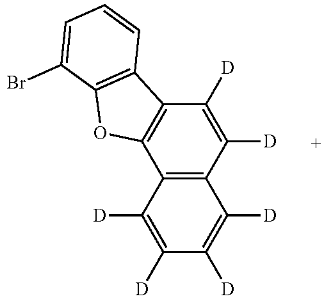

6-f

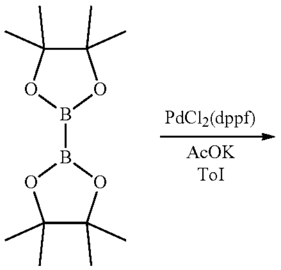

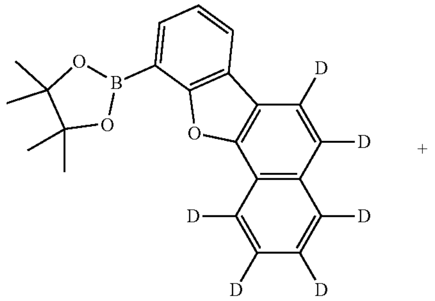

6-e

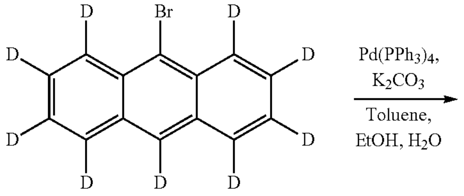

6-d

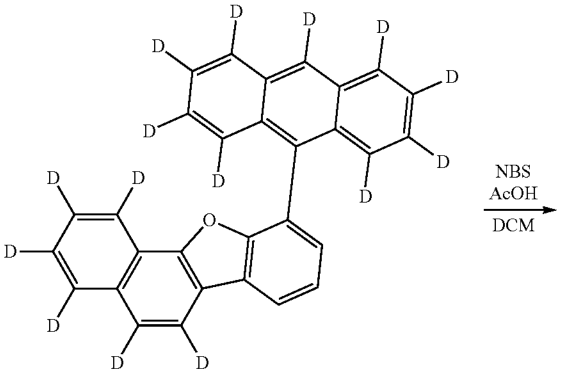

6-c

-continued

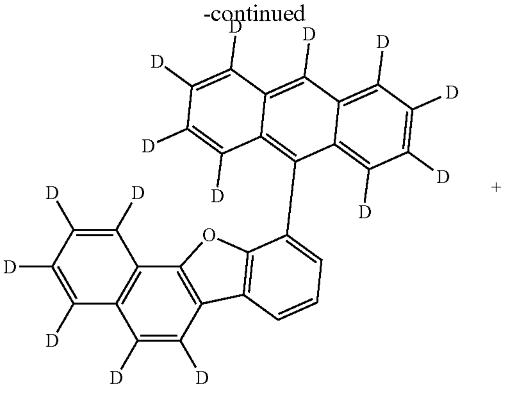

6-a

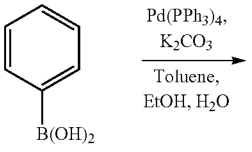

6-b

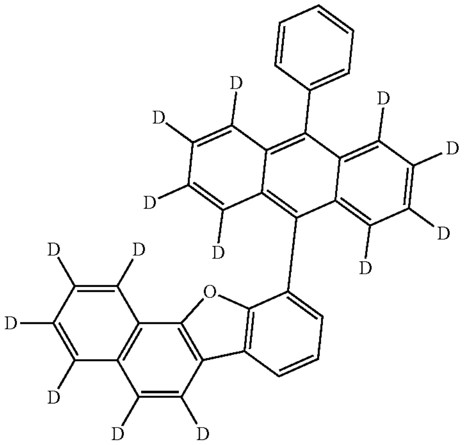

H-6

Referring to the synthesis method for 1-g, 1-i was replaced with 3-i (2.76 g, 10 mmol) and 1-h with 6-h (3.01 g, 10 mmol) to obtain 6-g (2.42 g, 75%).

Referring to the synthesis method for 1-f, 1-g was replaced with 6-g (3.23 g, 10 mmol) to obtain 6-f (1.30 g, 43%).

Referring to the synthesis method for 1-i, Intermediate B was replaced with 6-f (3.03 g, 10 mmol) to obtain 6-e (2.45 g, 70%).

Referring to the synthesis method for 1-g, 1-i was replaced with 6-e (3.50 g, 10 mmol) and 1-h with 6-d (2.66 g, 10 mmol) to obtain 6-c (2.92 g, 73%).

Referring to the synthesis method for 1-a, 1-c was replaced with 6-c (4.10 g, 10 mmol) to obtain 6-a (3.81 g, 78%).

Referring to the method for Compound H-1, 1-a was replaced with 6-a (4.88 g, 10 mmol) and 1-b with 6-b (1.22 g, 10 mmol) to obtain Compound H-6 (3.10 g, 64%), MS: m/z 484.66 [M+].

Example 7

This example provided Compound H-7, and the synthesis route therefor was as follows:

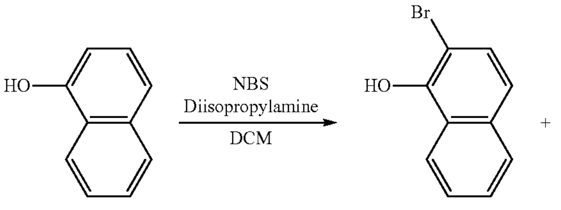
7-j 7-i
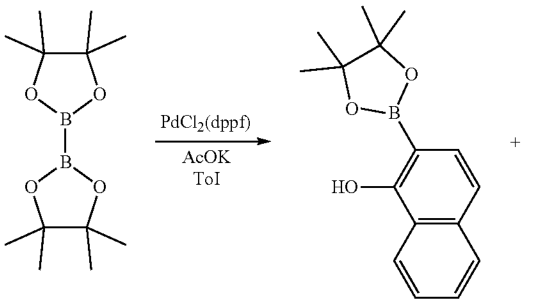
7-h
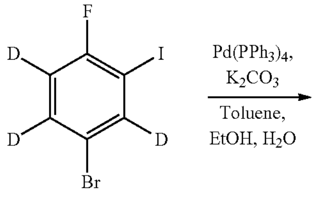
A
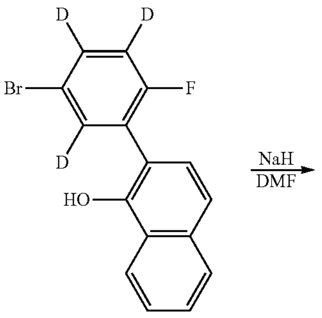
7-g
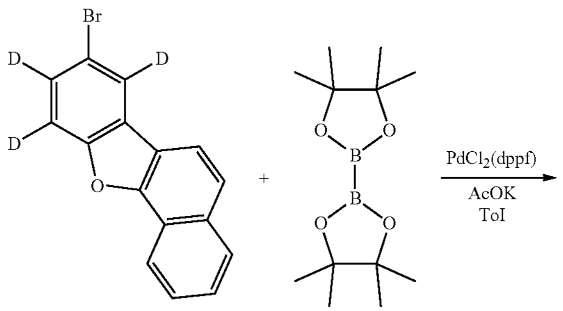
7-f
-continued
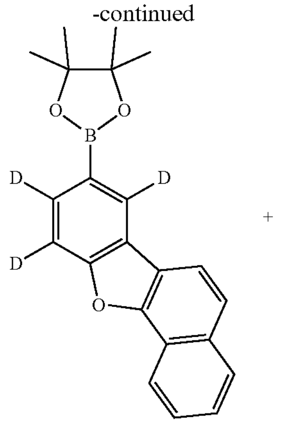
7-e
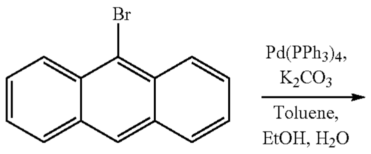
7-d
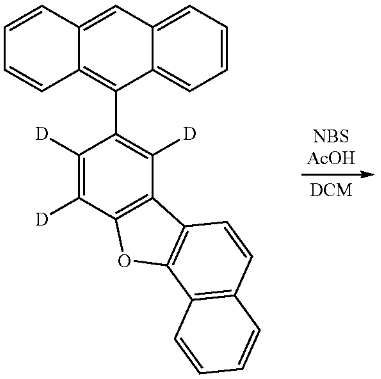
7-c
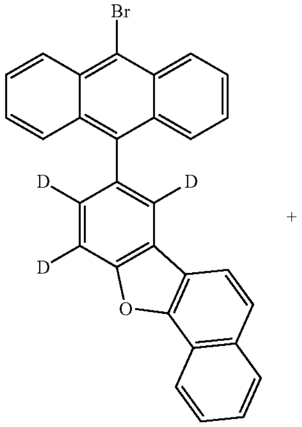
7-a
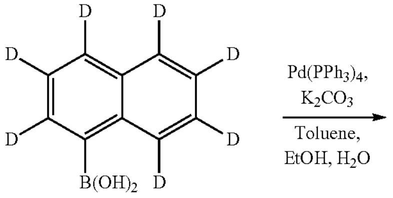
7-b -continued

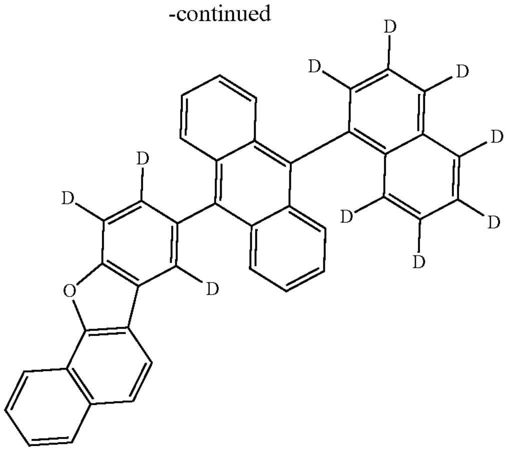

H-7

In a 250 mL reaction flask, 7-j (1.44 g, 10 mmol), diisopropylamine (0.10 g, 1 mmol), and 30 mL of dichloromethane were added, N-bromosuccinimide (2.13 g, 12 mmol) was slowly added, and the mixture was warmed to 40° C., reacted for 12 h, and cooled to room temperature. The pH of the system was adjusted to 5 with a 1 mol/L hydrochloric acid solution. 20 mL of water was added, and the mixture was stirred and left to stand for liquid separation. The organic phase was taken. The aqueous phase was extracted with 20 mL of dichloromethane, and the organic phases were combined, dried with anhydrous sodium sulfate, concentrated under reduced pressure, and passed through a silica gel column to obtain 7-i (1.20 g, 54%).

Referring to the synthesis method for 1-i, Intermediate B was replaced with 7-i (2.23 g, 10 mmol) to obtain 7-h (1.97 g, 73%).

Referring to the synthesis method for 1-g, 1-i was replaced with 7-h (2.70 g, 10 mmol) and 1-h with Intermediate A (3.04 g, 10 mmol) to obtain 7-g (2.37 g, 74%).

Referring to the synthesis method for 1-f, 1-g was replaced with 7-g (3.20 g, 10 mmol) to obtain 7-f (1.20 g, 40%).

Referring to the synthesis method for 1-i, Intermediate B was replaced with 7-f (3.00 g, 10 mmol) to obtain 7-e (2.50 g, 72%).

Referring to the synthesis method for 1-g, 1-i was replaced with 7-e (3.47 g, 10 mmol) and 1-h with 7-d (2.57 g, 10 mmol) to obtain 7-c (2.82 g, 71%).

Referring to the synthesis method for 1-a, 1-c was replaced with 7-c (3.97 g, 10 mmol) to obtain 7-a (3.62 g, 76%).

Referring to the synthesis method for Compound H-1, 1-a was replaced with 7-a (4.76 g, 10 mmol) and 1-b with 7-b (1.79 g, 10 mmol) to obtain Compound H-7 (3.40 g, 64%), MS: m/z 530.69 [M+].

Example 8

This example provided Compound H-8, and the synthesis route therefor was as follows:

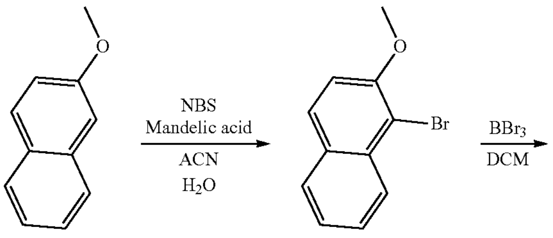

8-k 8-j

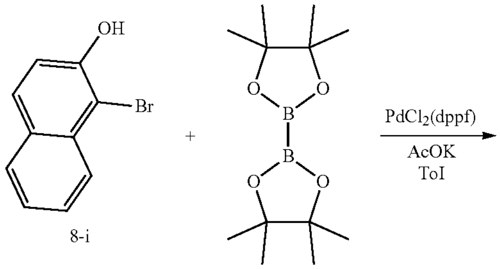

8-i

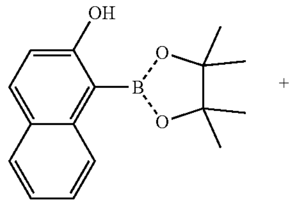

8-h

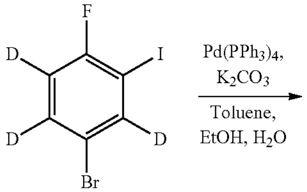

A

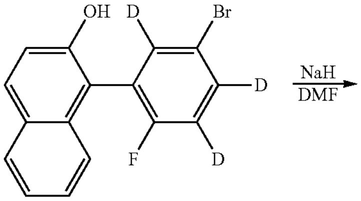

8-g

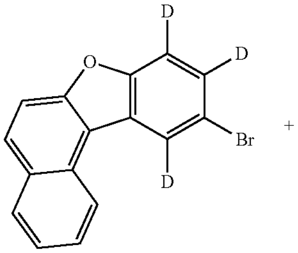

8-f

-continued

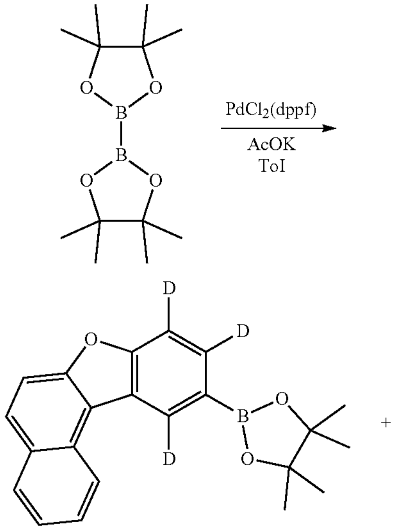

8-e

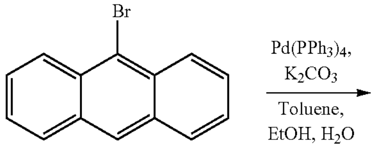

8-d

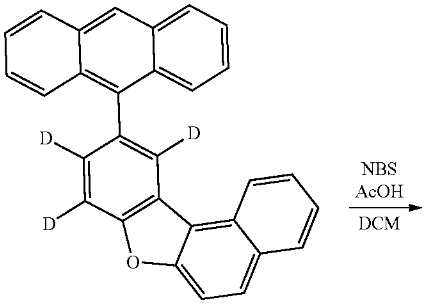

8-c

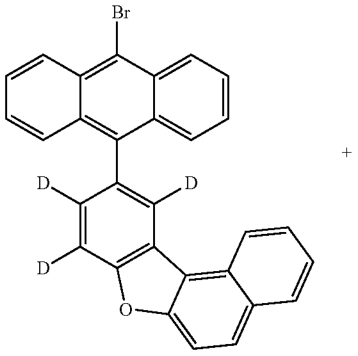

8-a

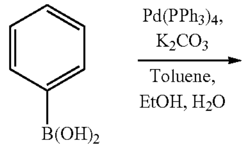

8-b

-continued

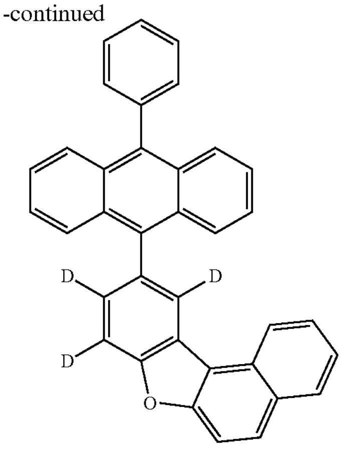

H-8

Referring to the synthesis method for Intermediate B-1, B-2 was replaced with 8-k (1.58 g, 10 mmol) to obtain Compound 8-j (1.52 g, 64%).

Referring to the synthesis method for Intermediate B, B-1 was replaced with 8-j (2.37 g, 10 mmol) to obtain Compound 8-i (1.67 g, 75%).

Referring to the synthesis method for 1-i, Intermediate B was replaced with 8-i (2.23 g, 10 mmol) to obtain Compound 8-h (1.97 g, 73%).

Referring to the synthesis method for 1-g, 1-i was replaced with 8-h (2.70 g, 10 mmol) and 1-h with Intermediate A (3.04 g, 10 mmol) to obtain Compound 8-g (2.27 g, 71%).

Referring to the synthesis method for 1-f, 1-g was replaced with 8-g (3.20 g, 10 mmol) to obtain Compound 8-f (1.29 g, 43%).

Referring to the synthesis method for 1-i, Intermediate B was replaced with 8-f (3.00 g, 10 mmol) to obtain Compound 8-e (2.47 g, 71%).

Referring to the synthesis method for 1-g, 1-i was replaced with 8-e (3.47 g, 10 mmol) and 1-h with 8-d (2.57 g, 10 mmol) to obtain Compound 8-c (2.94 g, 74%).

Referring to the synthesis method for 1-a, 1-c was replaced with 8-c (3.97 g, 10 mmol) to obtain Compound 8-a (3.72 g, 78%).

Referring to the synthesis method for Compound H-1, 1-a was replaced with 8-a (4.76 g, 10 mmol) and 1-b with 8-b (1.22 g, 10 mmol) to obtain Compound H-8 (2.94 g, 62%), MS: m/z 473.19 [M+].

Example 9

This example provided Compound H-9, and the synthesis route therefor was as follows:

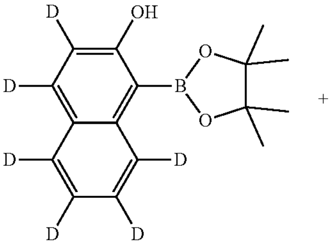

1-i

-continued
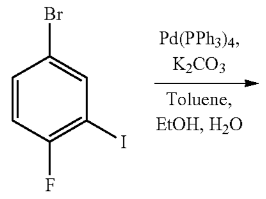
9-h
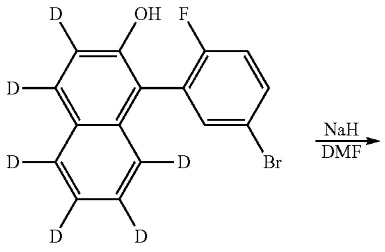
9-g
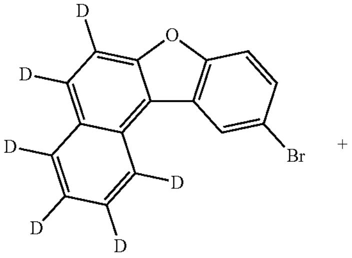
9-f
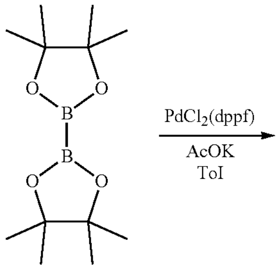
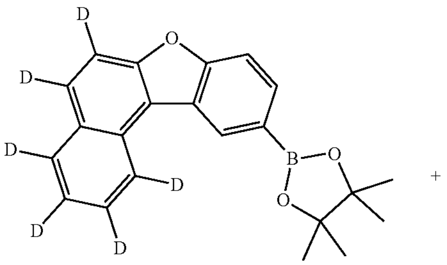
9-e
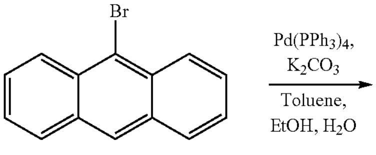
9-d
-continued
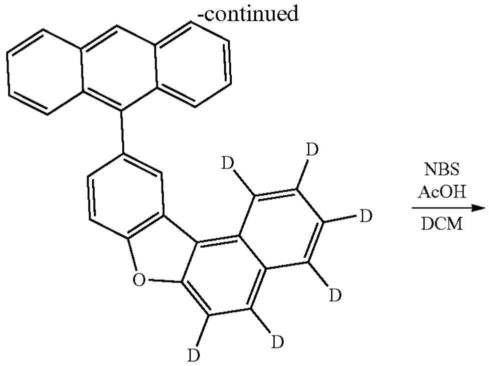
9-c
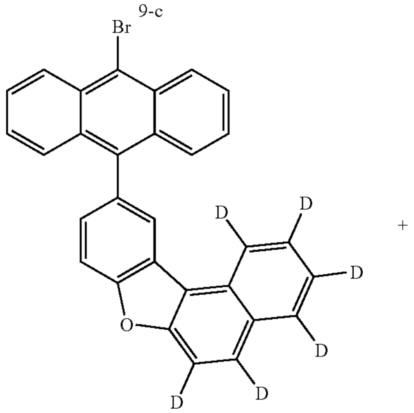
9-a
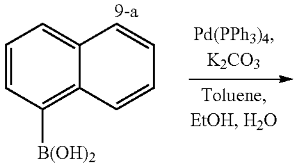
9-b
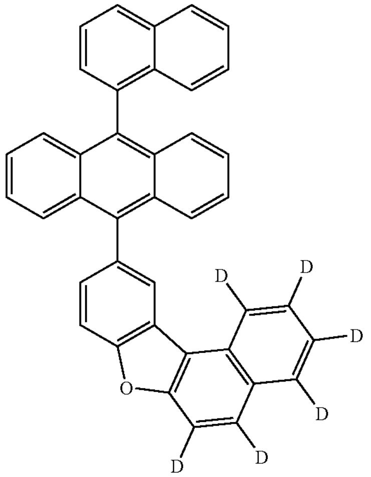
H-9
Referring to the synthesis method for 1-g, 1-h was replaced with 9-h (3.01 g, 10 mmol) to obtain Compound 9-g (2.39 g, 74%).
Referring to the synthesis method for 1-f, 1-g was replaced with 9-g (3.23 g, 10 mmol) to obtain Compound 9-f (1.18 g, 39%).
Referring to the synthesis method for 1-i, Intermediate B was replaced with 9-f (3.03 g, 10 mmol) to obtain Compound 9-e (2.59 g, 74%).

Referring to the synthesis method for 1-g, 1-i was replaced with 9-e (3.50 g, 10 mmol) and 1-h with 9-d (2.57 g, 10 mmol) to obtain Compound 9-c (2.84 g, 71%).

Referring to the synthesis method for 1-a, 1-c was replaced with 9-c (4.01 g, 10 mmol) to obtain Compound 9-a (3.69 g, 77%).

Referring to the synthesis method for Compound H-1, 1-a was replaced with 9-a (4.79 g, 10 mmol) and 1-b with 9-b (1.72 g, 10 mmol) to obtain Compound H-9 (3.32 g, 63%), MS: m/z 526.22 [M+].

Example 10

This example provided Compound H-10, and the synthesis route therefor was as follows:

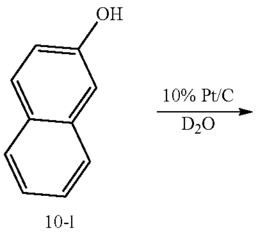

10-l

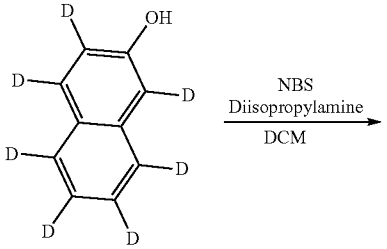

10-k

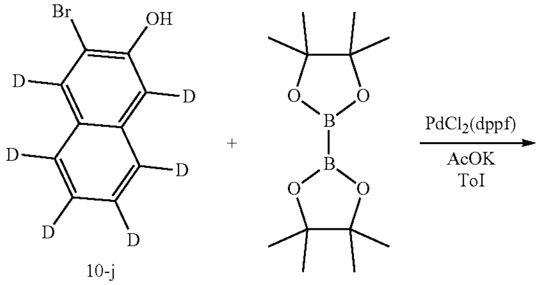

10-j

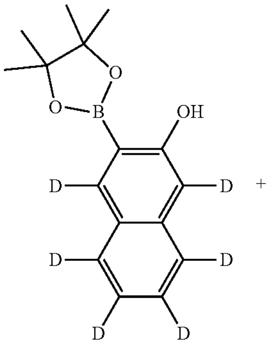

10-i

-continued

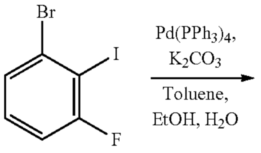

10-h

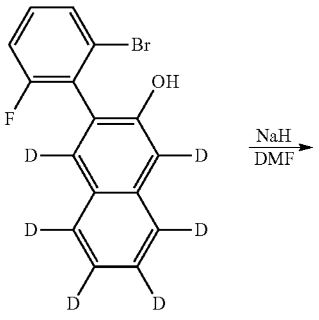

10-g

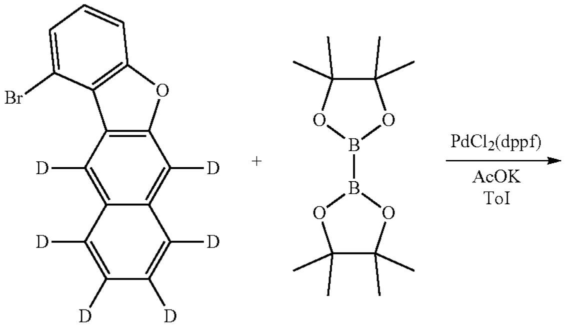

10-f

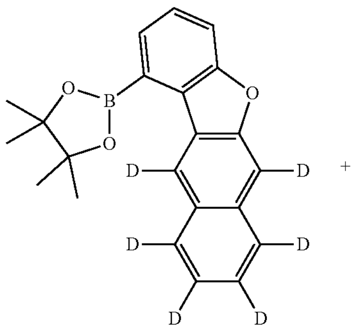

10-e

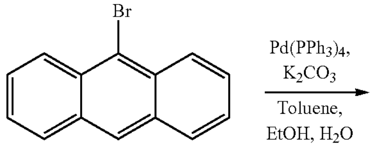

10-d

-continued

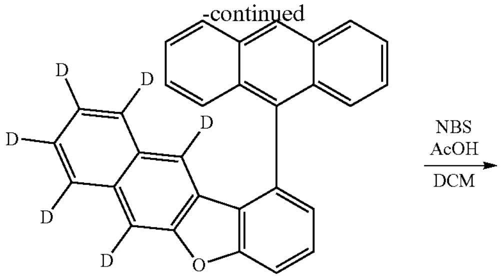

10-c

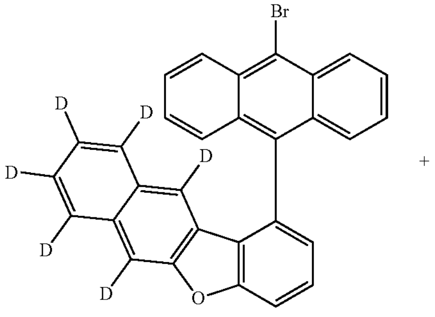

10-a

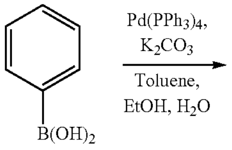

10-b

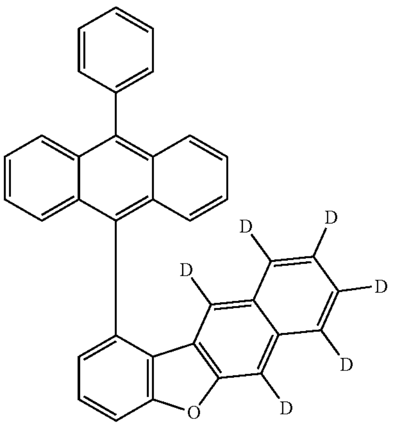

H-10

Referring to the synthesis method for 3-k, 3-1 was replaced with 10-1 (1.44 g, 10 mmol) to obtain Compound 10-k (1.03 g, 68%).

Referring to the synthesis method for 3-j, 3-k was replaced with 10-k (1.51 g, 10 mmol) to obtain Compound 10-j (1.26 g, 55%).

Referring to the synthesis method for 1-i, Intermediate B was replaced with 10-j (2.29 g, 10 mmol) to obtain Compound 10-i (2.02 g, 73%).

Referring to the synthesis method for 1-g, 1-i was replaced with 10-i (2.76 g, 10 mmol) and 1-h with 10-h (3.01 g, 10 mmol) to obtain Compound 10-g (2.39 g, 74%).

Referring to the synthesis method for 1-f, 1-g was replaced with 10-g (3.23 g, 10 mmol) to obtain Compound 10-f (1.21 g, 40%).

Referring to the synthesis method for 1-i, Intermediate B was replaced with 10-f (3.03 g, 10 mmol) to obtain Compound 10-e (2.38 g, 68%).

Referring to the synthesis method for 1-g, 1-i was replaced with 10-e (3.50 g, 10 mmol) and 1-h with 10-d (2.57 g, 10 mmol) to obtain Compound 10-c (2.96 g, 74%).

Referring to the synthesis method for 1-a, 1-c was replaced with 10-c (4.01 g, 10 mmol) to obtain Compound 10-a (3.84 g, 80%).

Referring to the synthesis method for Compound H-1, 1-a was replaced with 10-a (4.79 g, 10 mmol) and 1-b with 10-b (1.22 g, 10 mmol) to obtain Compound H-10 (3.00 g, 63%), MS: m/z 476.20 [M+].

Example 11

This example provided Compound H-11, and the synthesis route therefor was as follows:

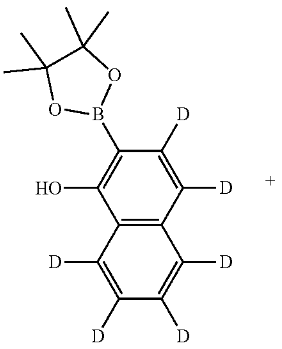

3-i

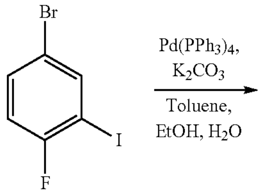

11-h

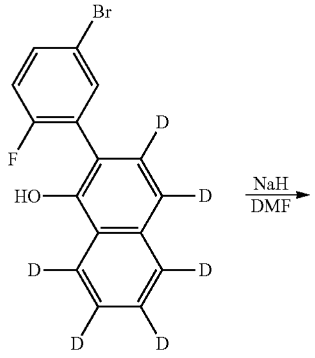

11-g

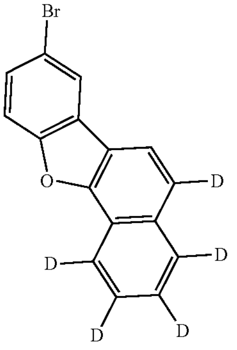

11-f

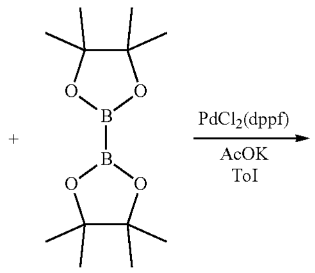

-continued

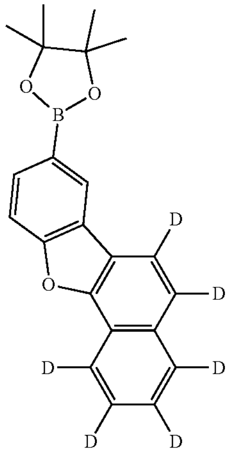

11-e

+

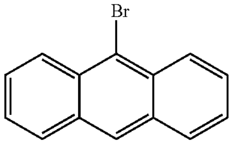

11-d

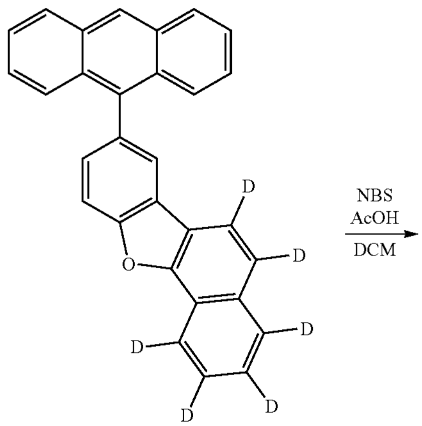

13-c

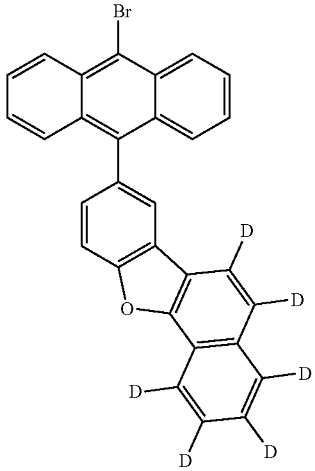

11-a

+

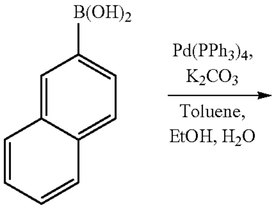

11-b

-continued

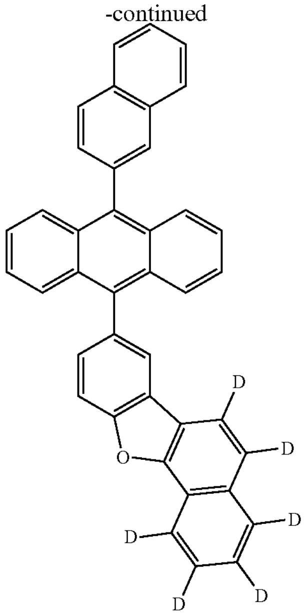

H-11

Referring to the synthesis method for 1-g, 1-i was replaced with 3-i (2.76 g, 10 mmol) and 1-h with 11-h (3.01 g, 10 mmol) to obtain Compound 6-g (2.39 g, 74%).

Referring to the synthesis method for 1-f, 1-g was replaced with 11-g (3.23 g, 10 mmol) to obtain Compound 11-f (1.33 g, 44%).

Referring to the synthesis method for 1-i, Intermediate B was replaced with 11-f (3.03 g, 10 mmol) to obtain Compound 11-e (2.56 g, 73%).

Referring to the synthesis method for 1-g, 1-i was replaced with 11-e (3.50 g, 10 mmol) and 1-h with 11-d (2.57 g, 10 mmol) to obtain Compound 11-c (2.84 g, 71%).

Referring to the synthesis method for 1-a, 1-c was replaced with 11-c (4.01 g, 10 mmol) to obtain Compound 11-a (3.64 g, 76%).

Referring to the synthesis method for Compound H-1, 1-a was replaced with 11-a (4.79 g, 10 mmol) and 1-b with 11-b (1.72 g, 10 mmol) to obtain Compound H-11 (3.42 g, 65%), MS: m/z 526.22 [M+].

Example 12

This example provided Compound H-12, and the synthesis route therefor was as follows:

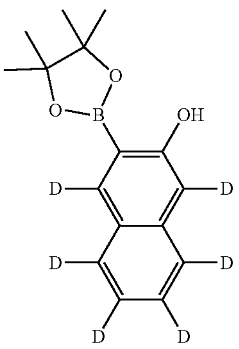

+

10-i

-continued
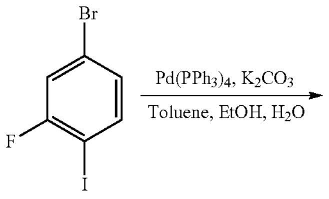
12-h
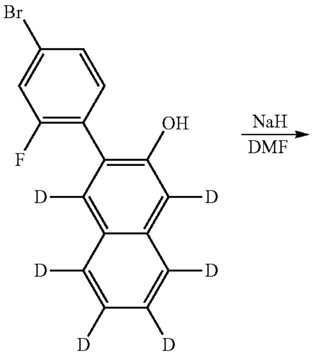
12-g
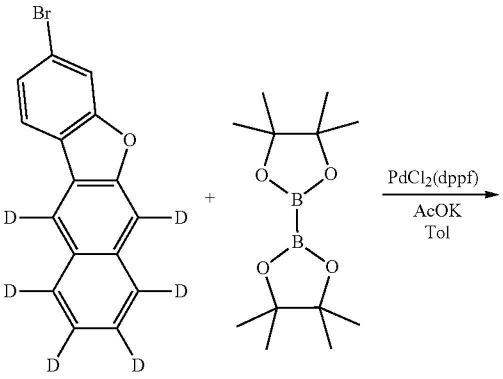
12-f
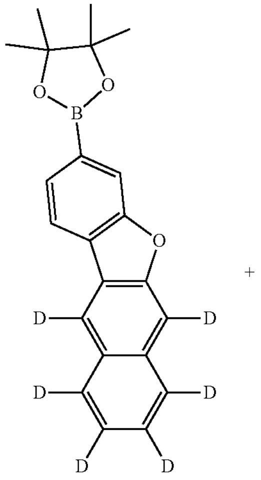
12-e
-continued
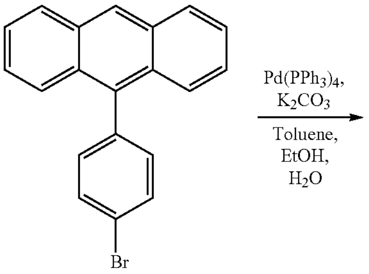
12-d
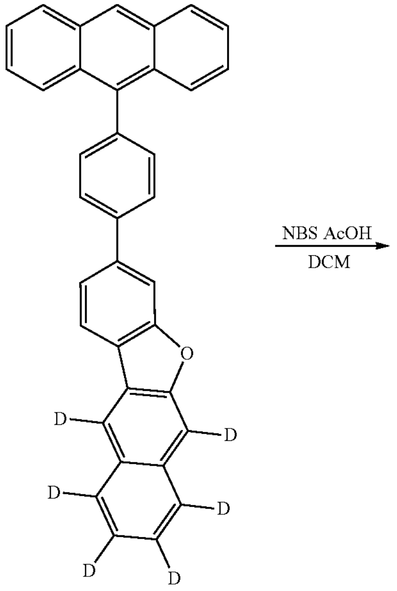
12-c
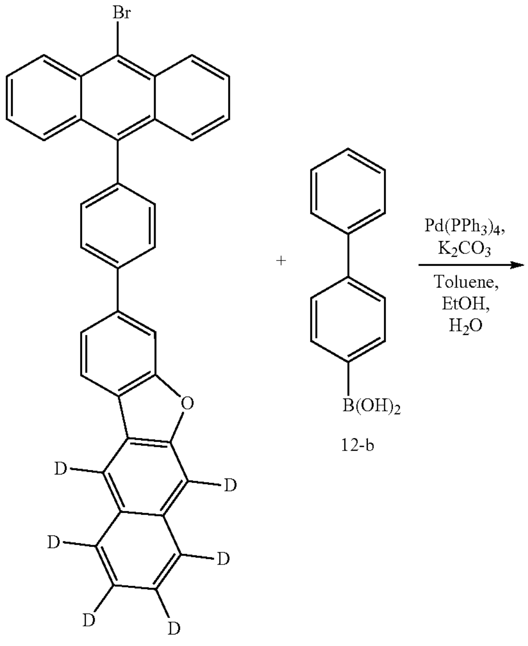
12-b
12-a -continued

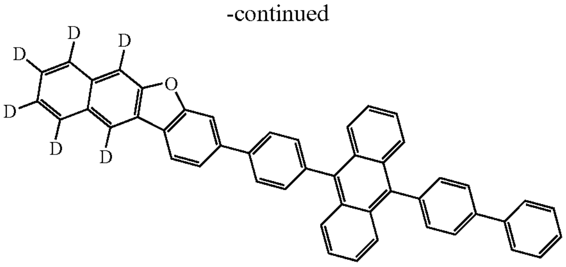

H-12

Referring to the synthesis method for 1-g, 1-i was replaced with 10-i (2.76 g, 10 mmol) and 1-h with 12-h (3.01 g, 10 mmol) to obtain Compound 12-g (2.42 g, 75%).

Referring to the synthesis method for 1-f, 1-g was replaced with 12-g (3.23 g, 10 mmol) to obtain Compound 12-f (1.39 g, 46%).

Referring to the synthesis method for 1-i, Intermediate B was replaced with 12-f (3.03 g, 10 mmol) to obtain Compound 12-e (2.52 g, 72%).

Referring to the synthesis method for 1-g, 1-i was replaced with 12-e (3.50 g, 10 mmol) and 1-h with 12-d (3.33 g, 10 mmol) to obtain Compound 12-c (3.43 g, 72%).

Referring to the synthesis method for 1-a, 1-c was replaced with 12-c (4.76 g, 10 mmol) to obtain Compound 12-a (4.33 g, 78%).

Referring to the synthesis method for Compound H-1, 1-a was replaced with 12-a (5.56 g, 10 mmol) and 1-b with 12-b (1.98 g, 10 mmol) to obtain Compound H-12 (3.84 g, 61%), MS: m/z 628.27 [M+].

Example 13

This example provided Compound H-13, and the synthesis route therefor was as follows:

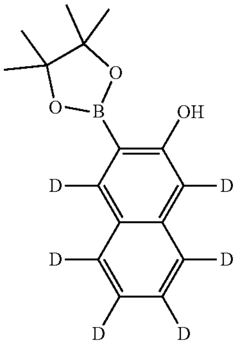

10-i

+

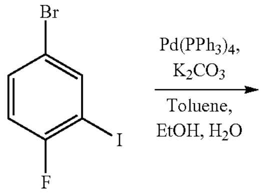

13-h

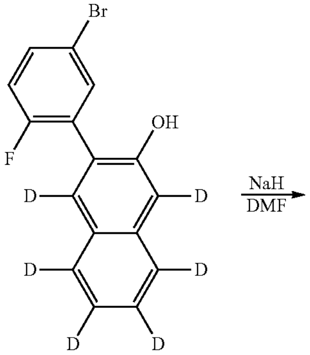

13-g

-continued

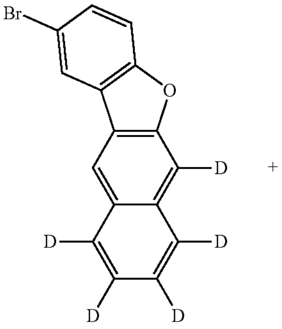

13-f

+

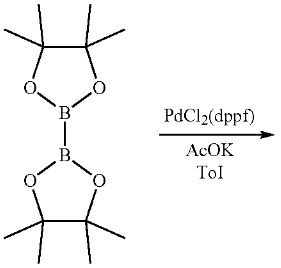

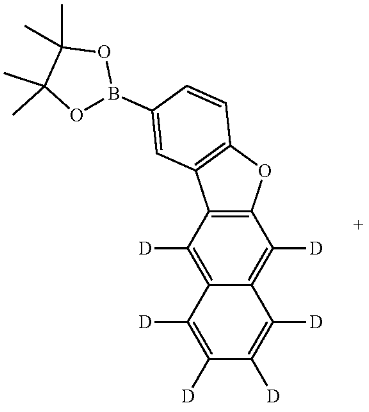

13-e

+

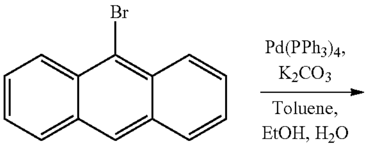

13-d

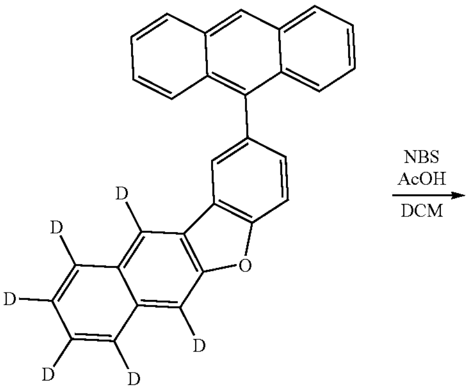

13-c

-continued

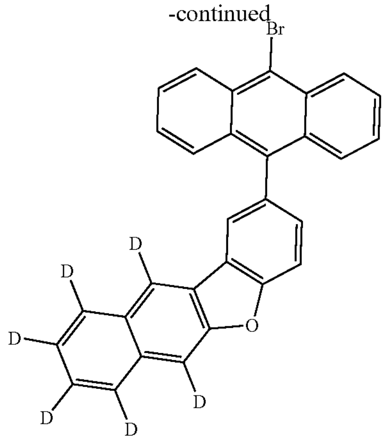

+

13-a

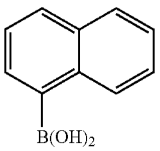

13-b $Pd(PPh_3)_4$,
$K_2CO_3$
Toluene,
EtOH, $H_2O$

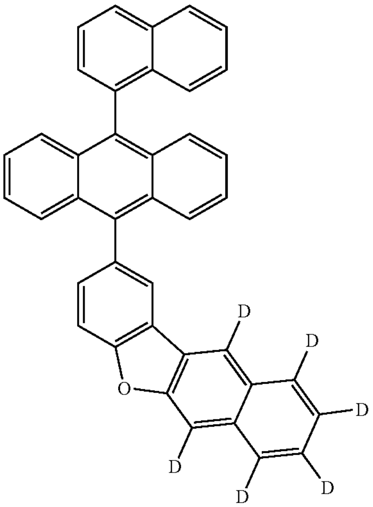

H-13

Referring to the synthesis method for 1-g, 1-i was replaced with 10-i (2.76 g, 10 mmol) and 1-h with 13-h (3.01 g, 10 mmol) to obtain Compound 13-g (2.36 g, 73%).

Referring to the synthesis method for 1-f, 1-g was replaced with 13-g (3.23 g, 10 mmol) to obtain Compound 13-f (1.27 g, 42%).

Referring to the synthesis method for 1-i, Intermediate B was replaced with 13-f (3.03 g, 10 mmol) to obtain Compound 13-e (2.49 g, 71%).

Referring to the synthesis method for 1-g, 1-i was replaced with 13-e (3.50 g, 10 mmol) and 1-h with 13-d (2.57 g, 10 mmol) to obtain Compound 13-c (2.92 g, 73%).

Referring to the synthesis method for 1-a, 1-c was replaced with 13-c (4.01 g, 10 mmol) to obtain Compound 13-a (3.69 g, 77%).

Referring to the synthesis method for Compound H-1, 1-a was replaced with 13-a (4.79 g, 10 mmol) and 1-b with 13-b (1.72 g, 10 mmol) to obtain Compound H-13 (3.37 g, 64%), MS: m/z 526.22 [M+].

Example 14

This example provided Compound H-14, and the synthesis route therefor was as follows:

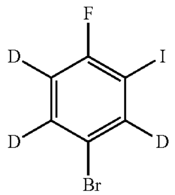

A

+

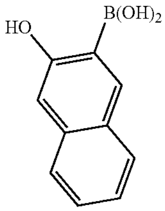

14-h $Pd(PPh_3)_4$,
$K_2CO_3$
Toluene,
EtOH, $H_2O$

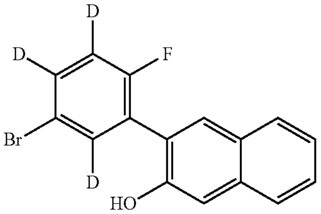

14-g

NaH
DMF

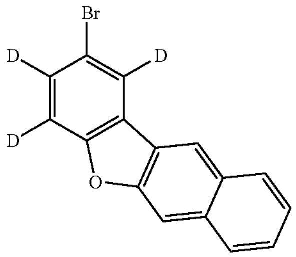

14-f

+

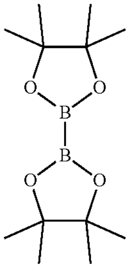

$PdCl_2(dppf)$
AcOK
Tol

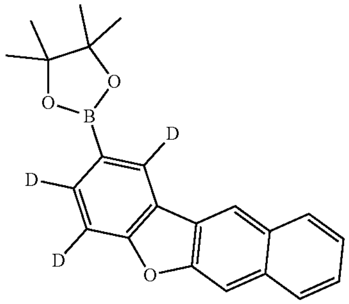

14-e

+

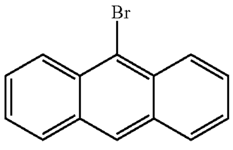

14-d $Pd(PPh_3)_4$,
$K_2CO_3$
Toluene,
EtOH, $H_2O$

-continued

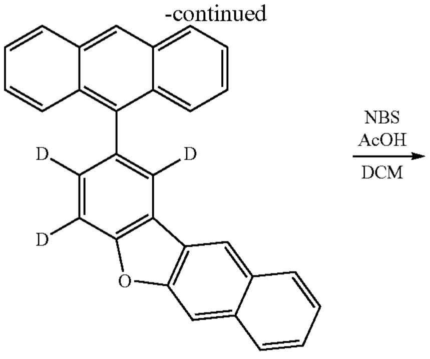

14-c

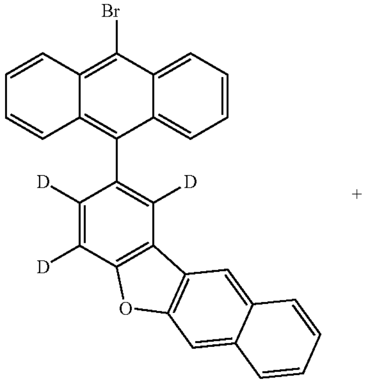

14-a

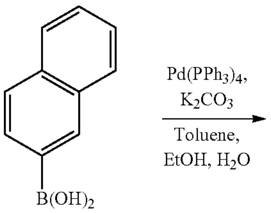

14-b

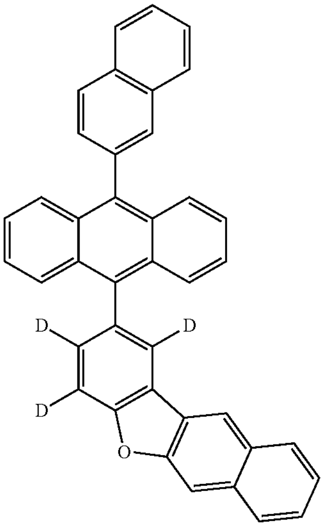

H-14

Referring to the synthesis method for 1-g, 1-i was replaced with 14-h (1.88 g, 10 mmol) and 1-h with Intermediate A (3.04 g, 10 mmol) to obtain Compound 14-g (2.31 g, 72%).

Referring to the synthesis method for 1-f, 1-g was replaced with 14-g (3.20 g, 10 mmol) to obtain Compound 14-f (1.23 g, 41%).

Referring to the synthesis method for 1-i, Intermediate B was replaced with 14-f (3.00 g, 10 mmol) to obtain Compound 14-e (2.53 g, 73%).

Referring to the synthesis method for 1-g, 1-i was replaced with 14-e (3.47 g, 10 mmol) and 1-h with 14-d (2.57 g, 10 mmol) to obtain Compound 14-c (2.82 g, 71%).

Referring to the synthesis method for 1-a, 1-c was replaced with 14-c (3.97 g, 10 mmol) to obtain Compound 14-a (3.81 g, 80%).

Referring to the synthesis method for Compound H-1, 1-a was replaced with 14-a (4.76 g, 10 mmol) and 1-b with 14-b (1.72 g, 10 mmol) to obtain Compound H-14 (3.14 g, 60%), MS: m/z 523.20 [M+].

Example 15

This example provided Compound H-15, and the synthesis route therefor was as follows:

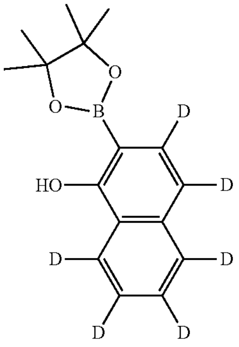

3-i

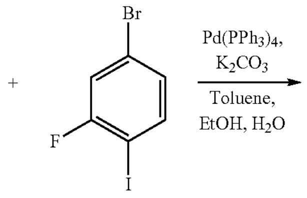

15-h

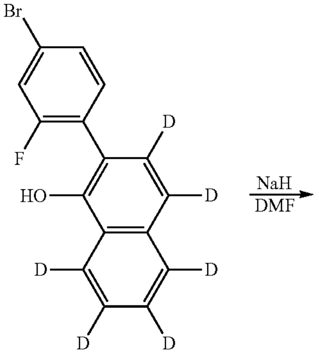

15-g

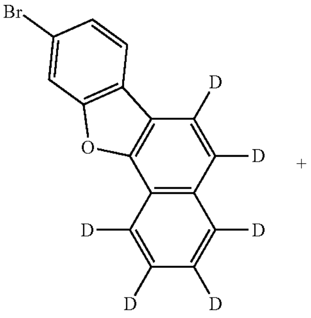

15-f

-continued

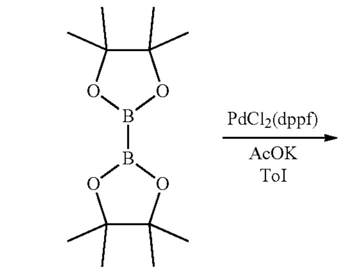

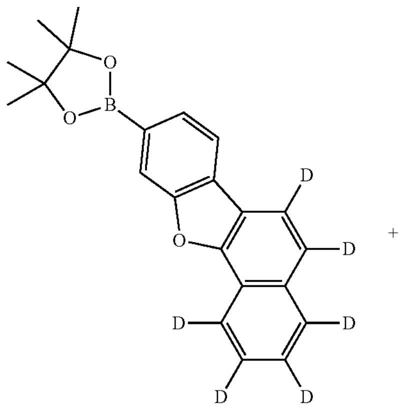

15-e

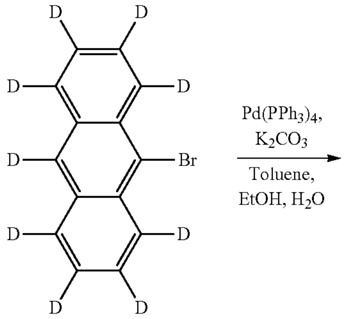

15-d

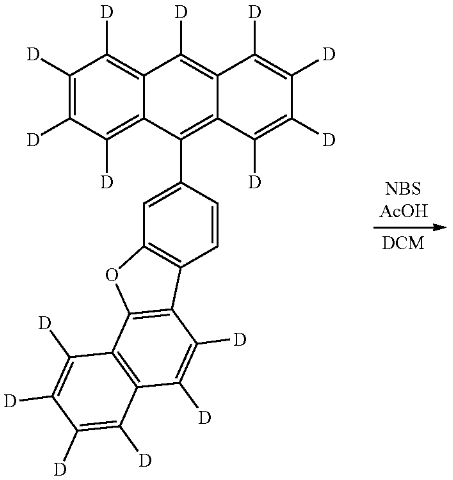

15-c

-continued

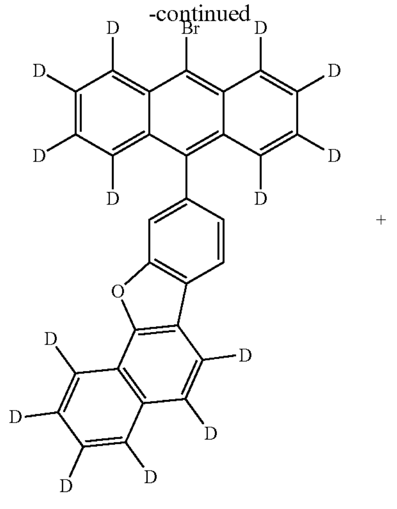

15-a

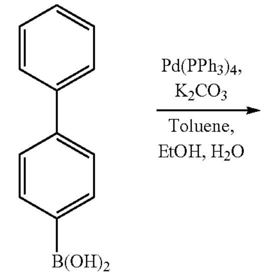

15-b

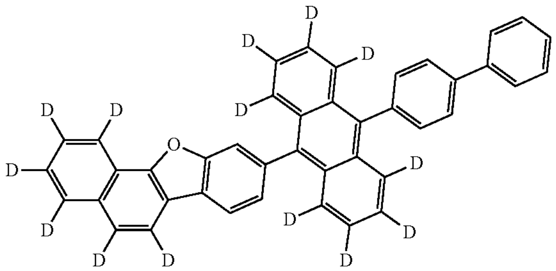

H-15

Referring to the synthesis method for 1-g, 1-i was replaced with 3-i (2.76 g, 10 mmol) and 1-h with 15-h (3.01 g, 10 mmol) to obtain Compound 15-g (2.29 g, 71%).

Referring to the synthesis method for 1-f, 1-g was replaced with 15-g (3.23 g, 10 mmol) to obtain Compound 15-f (1.27 g, 42%).

Referring to the synthesis method for 1-i, Intermediate B was replaced with 15-f (3.03 g, 10 mmol) to obtain Compound 15-e (2.45 g, 70%).

Referring to the synthesis method for 1-g, 1-i was replaced with 15-e (3.50 g, 10 mmol) and 1-h with 15-d (2, 66 g, 10 mmol) to obtain Compound 15-c (2.992 g, 73%).

Referring to the synthesis method for 1-a, 1-c was replaced with 15-c (4.1001 g, 10 mmol) to obtain Compound 15-a (3, 85 g, 79%).

Referring to the synthesis method for Compound H-1, 1-a was replaced with 15-a (4, 87 g, 10 mmol) and 1-b with 15-b (1.98 g, 10 mmol) to obtain Compound H-15 (3, 48 g, 62%), MS: m/z 560.75 [M+].

Example 16

This example provided Compound H-16, and the synthesis route therefor was as follows:

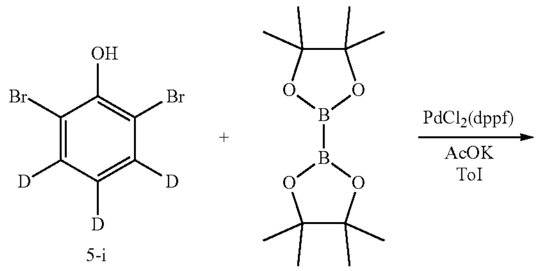
5-i
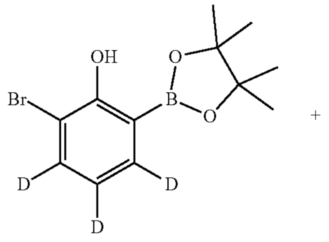
16-i
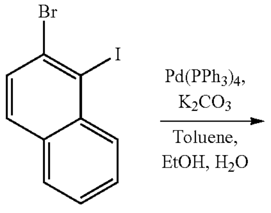
16-h
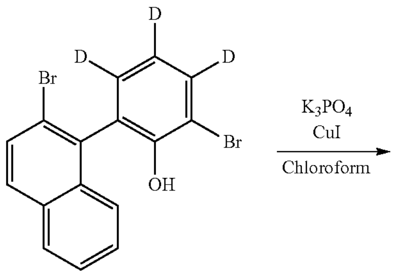
16-g
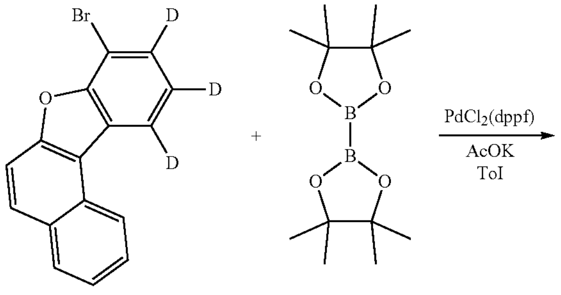
16-f
-continued
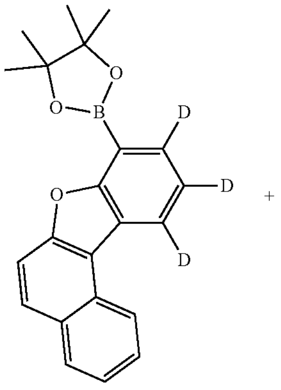
16-e
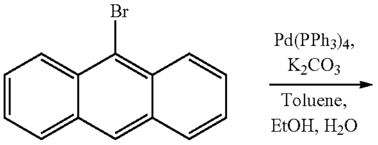
16-d
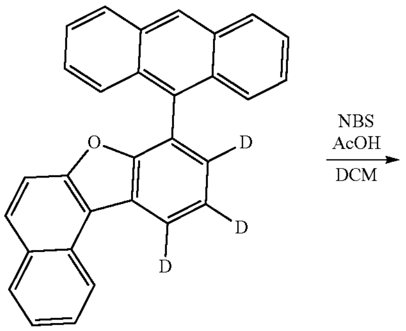
16-c
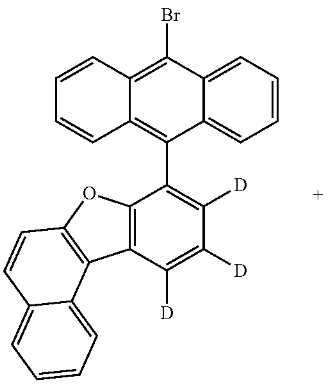
16-a
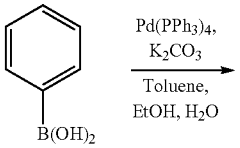
16-b -continued

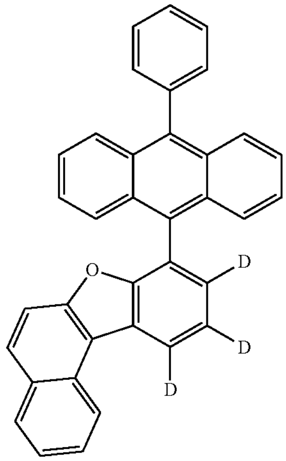

H-16

Referring to the synthesis method for 1-i, Intermediate B was replaced with 5-i (2.55 g, 10 mmol) to obtain Compound 16-i (2.23 g, 74%).

Referring to the synthesis method for 1-g, 1-i was replaced with 16-i (3.02 g, 10 mmol) and 1-h with 16-h (3.33 g, 10 mmol) to obtain Compound 16-g (2.74 g, 72%).

In a 250 mL reaction flask, 16-g (3.81 g, 10 mmol), 40 mL of chloroform, tripotassium phosphate (4.25 g, 20 mmol), and cuprous iodide (2.85 g, 15 mmol) were added, warmed to reflux, reacted for 12 h, and cooled to room temperature. 40 mL of water was added, and the mixture was stirred and left to stand for liquid separation. The organic phase was taken, the aqueous phase was extracted with dichloromethane (30 mL*2), and the organic phases were combined, dried, concentrated under reduced pressure, and passed through a silica gel column to obtain 16-f (1.41 g, 47%).

Referring to the synthesis method for 1-i, Intermediate B was replaced with 16-f (3.00 g, 10 mmol) to obtain Compound 16-e (2.47 g, 71%).

Referring to the synthesis method for 1-g, 1-i was replaced with 16-e (3.47 g, 10 mmol) and 1-h with 16-d (2.57 g, 10 mmol) to obtain Compound 16-c (2.98 g, 75%).

Referring to the synthesis method for 1-a, 1-c was replaced with 16-c (3.97 g, 10 mmol) to obtain Compound 16-a (3.72 g, 78%).

Referring to the method for Compound H-1, 1-a was replaced with 16-a (4.76 g, 10 mmol) and 1-b with 16-b (1.22 g, 10 mmol) to obtain Compound H-16 (2.98 g, 63%), MS: m/z 473.19 [M+].

Example 17

This example provided Compound H-17, and the synthesis route therefor was as follows:

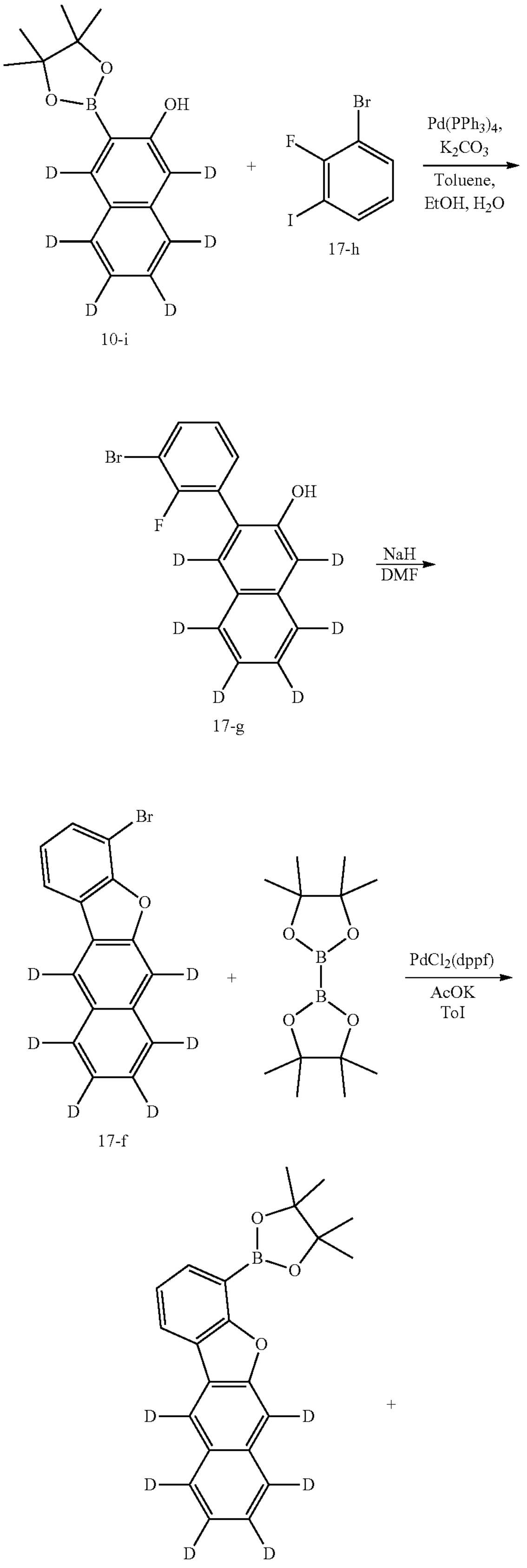

10-i
17-h
17-g
17-f
17-e

-continued

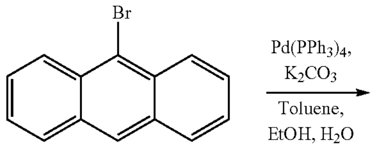

17-d

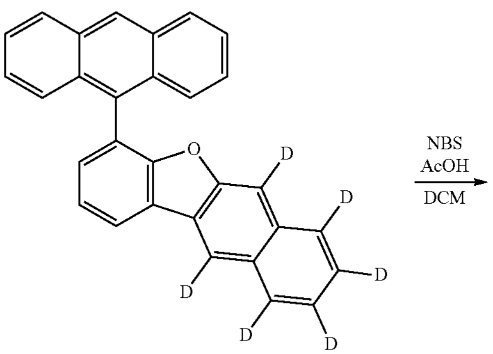

17-c

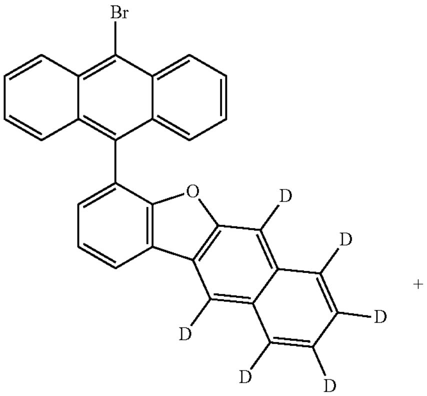

17-a

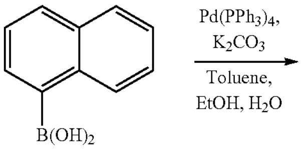

17-b

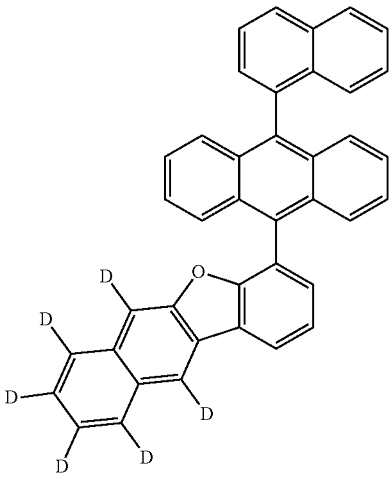

H-17

Referring to the synthesis method for 1-g, 1-i was replaced with 10-i (2.76 g, 10 mmol) and 1-h with 17-h (3.01 g, 10 mmol) to obtain Compound 17-g (2.36 g, 73%).

Referring to the synthesis method for 1-f, 1-g was replaced with 17-g (3.23 g, 10 mmol) to obtain Compound 17-f (1.33 g, 44%).

Referring to the synthesis method for 1-i, Intermediate B was replaced with 17-f (3.03 g, 10 mmol) to obtain Compound 17-e (2.49 g, 71%).

Referring to the synthesis method for 1-g, 1-i was replaced with 17-e (3.50 g, 10 mmol) and 1-h with 17-d (2.57 g, 10 mmol) to obtain Compound 17-c (2.96 g, 74%).

Referring to the synthesis method for 1-a, 1-c was replaced with 17-c (4.01 g, 10 mmol) to obtain Compound 17-a (3.69 g, 77%).

Referring to the synthesis method for Compound H-1, 1-a was replaced with 17-a (4.79 g, 10 mmol) and 1-b with 17-b (1.72 g, 10 mmol) to obtain Compound H-17 (3.21 g, 61%), MS: m/z 526.22 [M+].

Example 18

This example provided Compound H-18, and the synthesis route therefor was as follows:

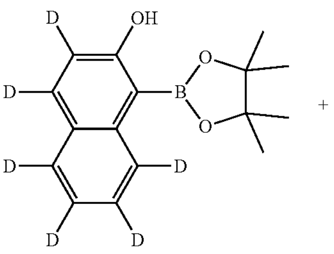

1-i

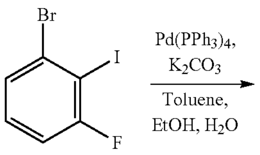

18-h

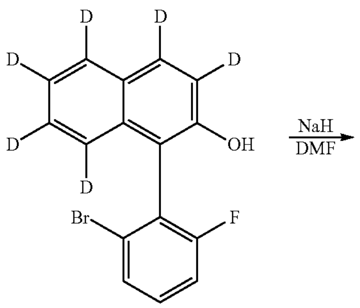

18-g

-continued

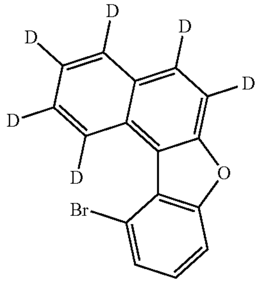

18-f

+

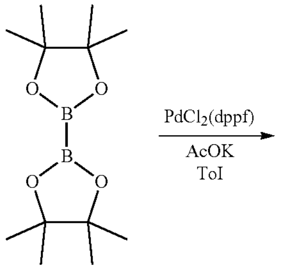

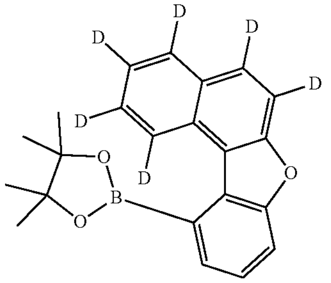

18-e

+

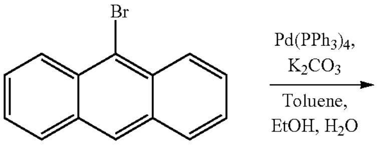

18-d

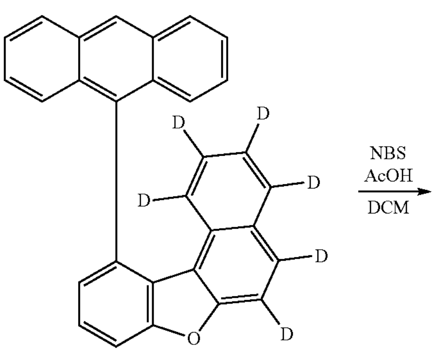

18-c

-continued

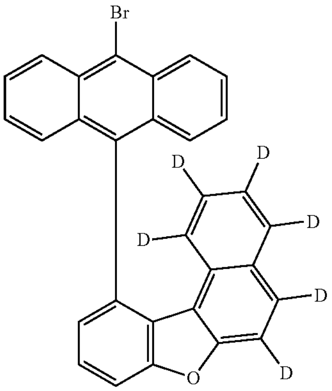

18-a

+

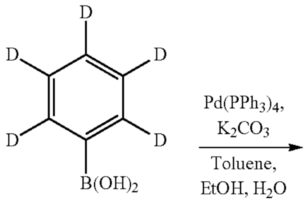

18-b

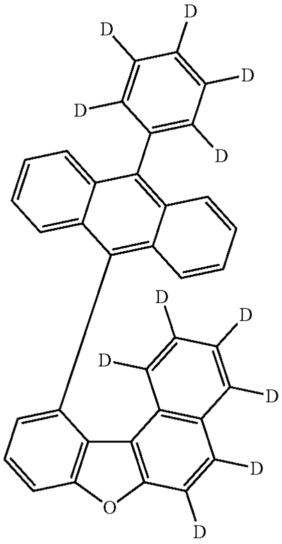

H-18

Referring to the synthesis method for 1-g, 1-h was replaced with 18-h (3.01 g, 10 mmol) to obtain Compound 18-g (2.29 g, 71%).

Referring to the synthesis method for 1-f, 1-g was replaced with 18-g (3.23 g, 10 mmol) to obtain Compound 18-f (1.21 g, 40%).

Referring to the synthesis method for 1-i, Intermediate B was replaced with 18-f (3.03 g, 10 mmol) to obtain Compound 18-e (2.56 g, 73%).

Referring to the synthesis method for 1-g, 1-i was replaced with 18-e (3.50 g, 10 mmol) and 1-h with 18-d (2.57 g, 10 mmol) to obtain Compound 18-c (2.88 g, 72%).

Referring to the synthesis method for 1-a, 1-c was replaced with 18-c (4.01 g, 10 mmol) to obtain Compound 18-a (3.79 g, 78%).

Referring to the synthesis method for Compound H-1, 1-a was replaced with 18-a (4.79 g, 10 mmol) and 1-b with 18-b (1.27 g, 10 mmol) to obtain Compound H-18 (3.13 g, 65%), MS: m/z 481.64 [M+].

Example 19

This example provided Compound H-19, and the synthesis route therefor was as follows:

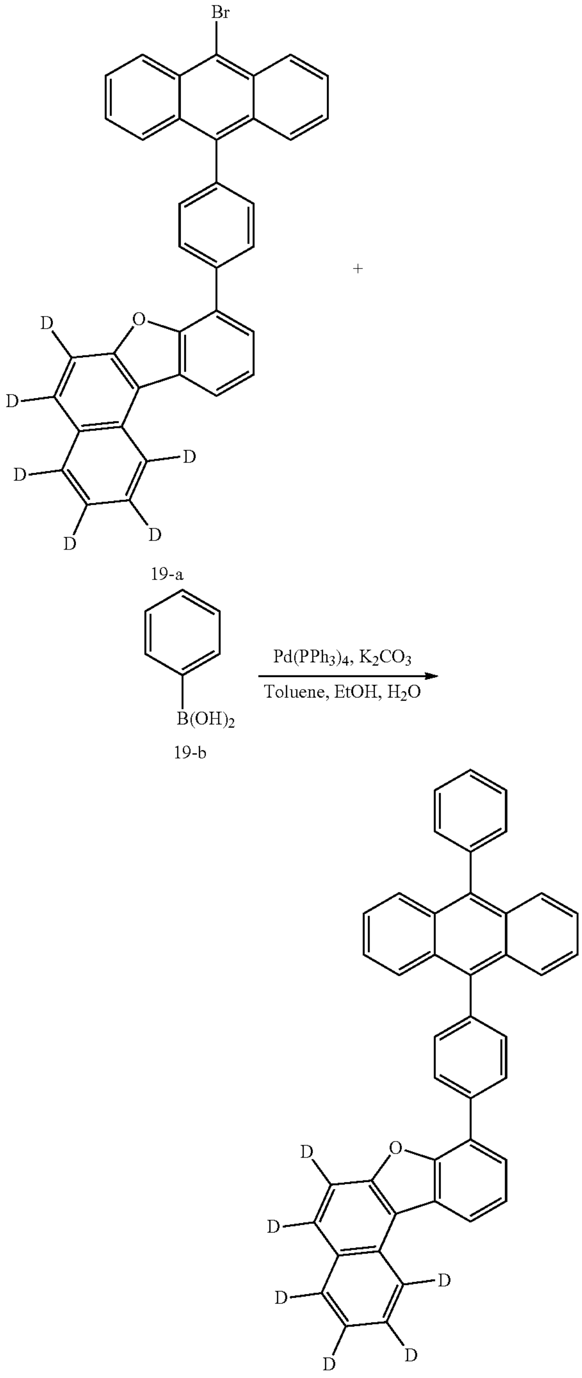

19-a
19-b
H-19

The same method as in Example 1 was used, except that 1-a was replaced with 19-a (5.56 g, 10 mmol) and 1-b with 19-b (1.22 g, 10 mmol) to obtain Compound H-19 (3.37 g, 61%), MS: m/z 552.24 [M+].

Example 20

This example provided Compound H-20, and the synthesis route therefor was as follows:

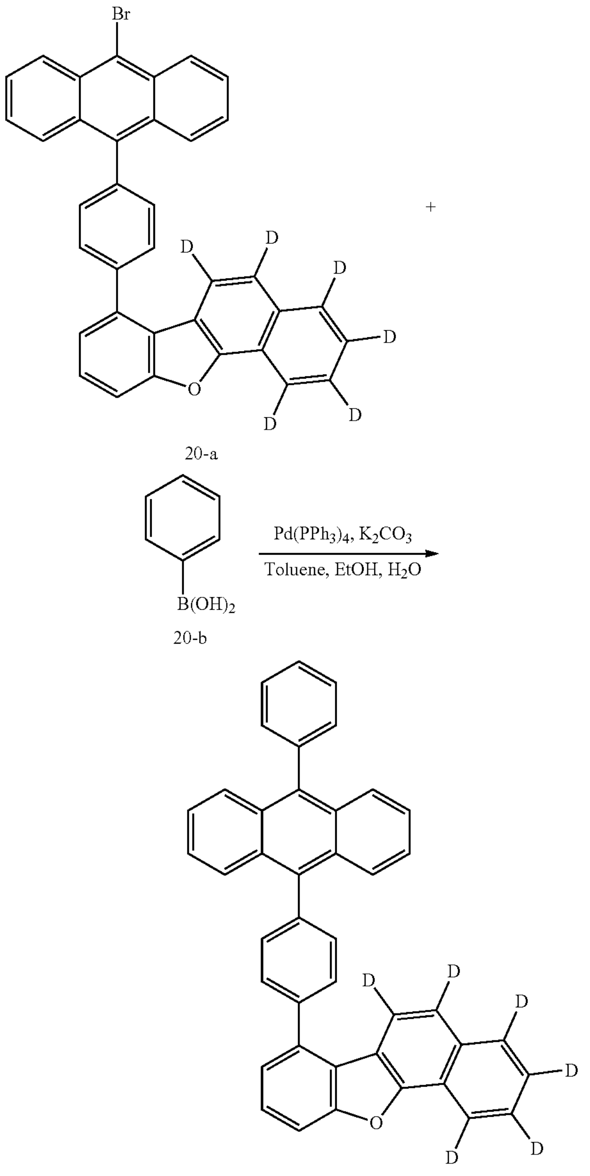

20-a
20-b
H-20

The same method as in Example 1 was used, except that 1-a was replaced with 20-a (5.56 g, 10 mmol) and 1-b with 20-b (1.22 g, 10 mmol) to obtain Compound H-20 (3.48 g, 63%), MS: m/z 552.24 [M+].

Example 21

This example provided Compound H-21, and the synthesis route therefor was as follows:

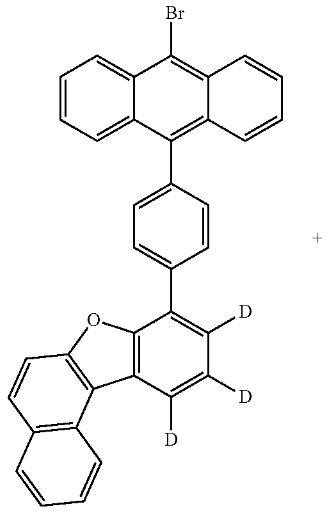

21-a

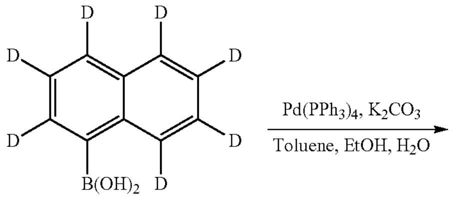

21-b

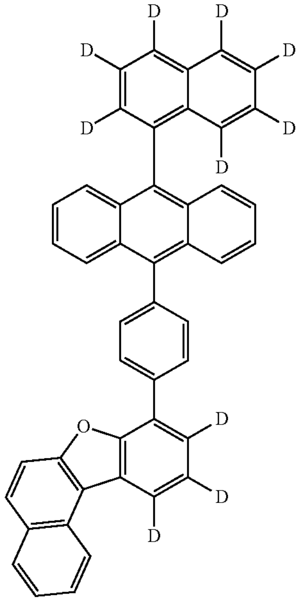

H-21

The same method as in Example 1 was used, except that 1-a was replaced with 21-a (5.52 g, 10 mmol) and 1-b with 21-b (1, 79 g, 10 mmol) to obtain Compound H-21 (3, 88 g, 64%), MS: m/z 606.79 [M+].

Example 22

This example provided Compound H-22, and the synthesis route therefor was as follows:

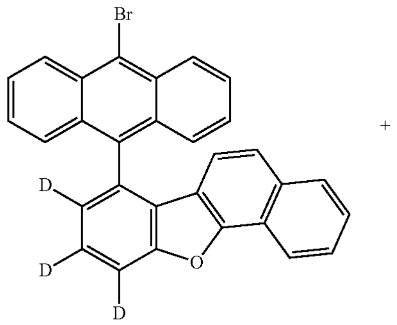

22-a

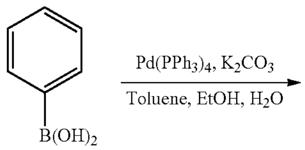

22-b

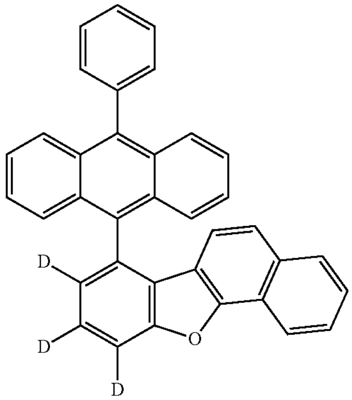

H-22

The same method as in Example 1 was used, except that 1-a was replaced with 22-a (4.76 g, 10 mmol) and 1-b with 22-b (1.22 g, 10 mmol) to obtain Compound H-22 (2.94 g, 62%), MS: m/z 473.19 [M+].

Example 23

This example provided Compound H-23, and the synthesis route therefor was as follows:

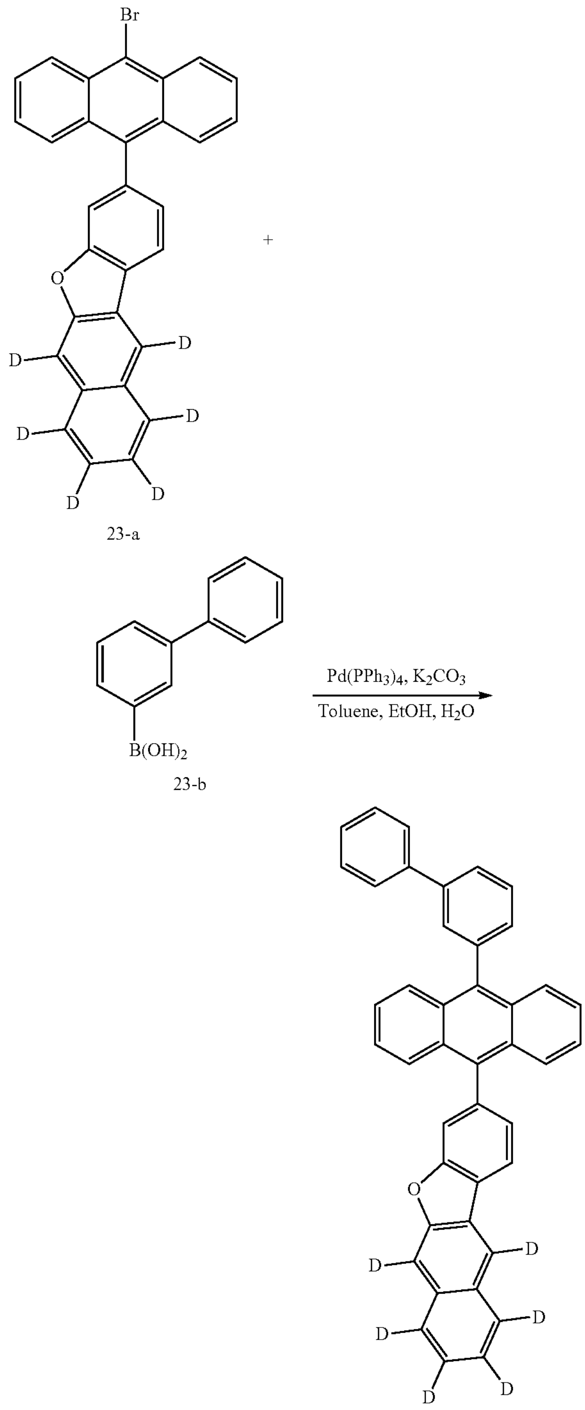

23-a 23-b

H-23

The same method as in Example 1 was used, except that 1-a was replaced with 23-a (4.79 g, 10 mmol) and 1-b with 23-b (1.98 g, 10 mmol) to obtain Compound H-23 (3.54 g, 64%), MS: m/z 552.24 [M+].

Example 24

This example provided Compound H-24, and the synthesis route therefor was as follows:

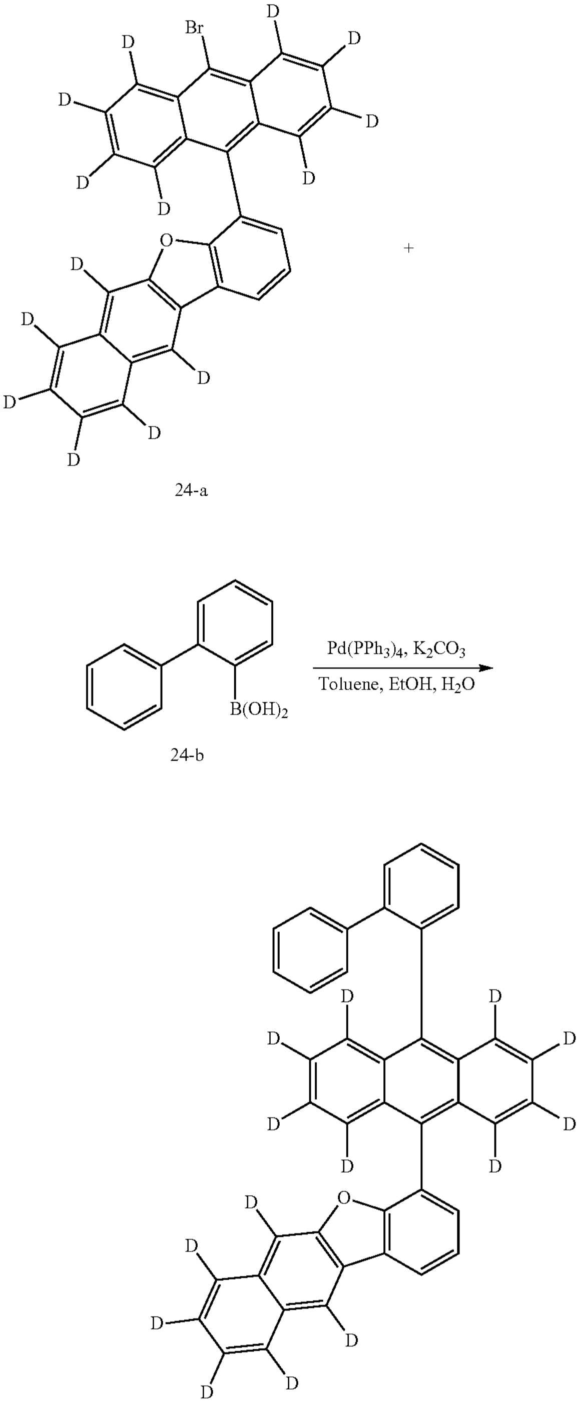

24-a 24-b

H-24

The same method as in Example 1 was used, except that 1-a was replaced with 24-a (4, 87 g, 10 mmol) and 1-b with 24-b (1.98 g, 10 mmol) to obtain Compound H-24 (3.53 g, 63%), MS: m/z 560.75 [M+].

Example 25

This example provided Compound H-25, and the synthesis route therefor was as follows:

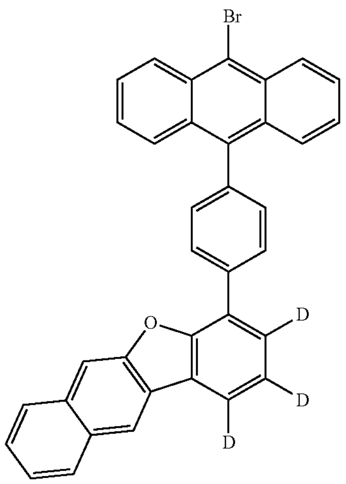

25-a

+

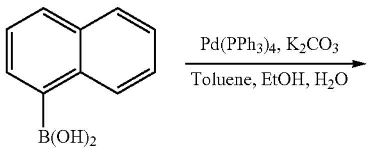

25-b

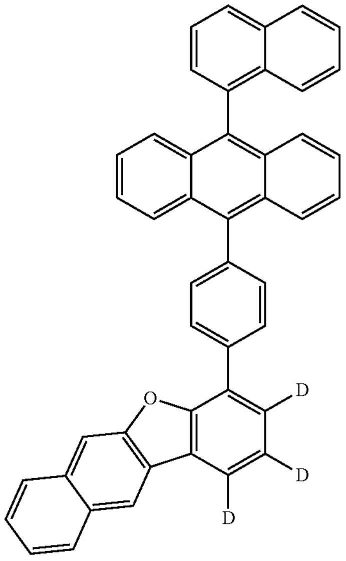

H-25

The same method as in Example 1 was used, except that 1-a was replaced with 25-a (5.52 g, 10 mmol) and 1-b with 25-b (1.72 g, 10 mmol) to obtain Compound H-25 (3.72 g, 62%), MS: m/z 599.23 [M+].

Example 26

This example provided Compound H-26, and the synthesis route therefor was as follows:

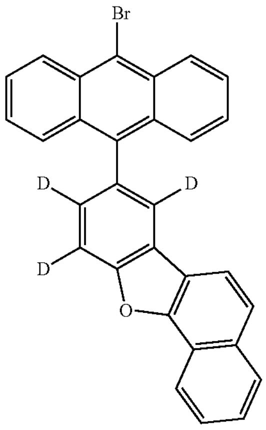

26-a

+

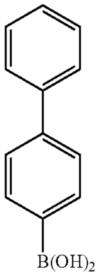

26-b

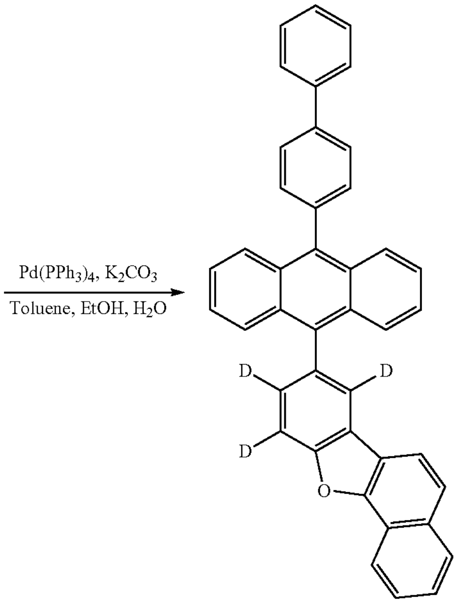

H-26

The same method as in Example 1 was used, except that 1-a was replaced with 26-a (4.76 g, 10 mmol) and 1-b with 26-b (1.98 g, 10 mmol) to obtain Compound H-26 (3.30 g, 60%), MS: m/z 549.22 [M+].

Example 27

This example provided Compound H-27, and the synthesis route therefor was as follows:

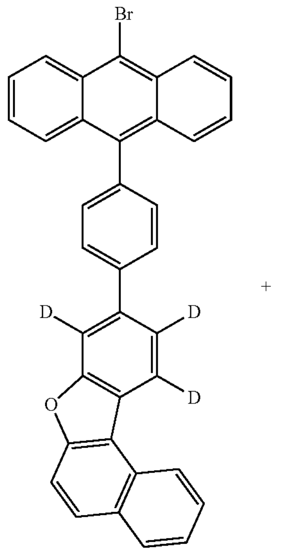

27-a

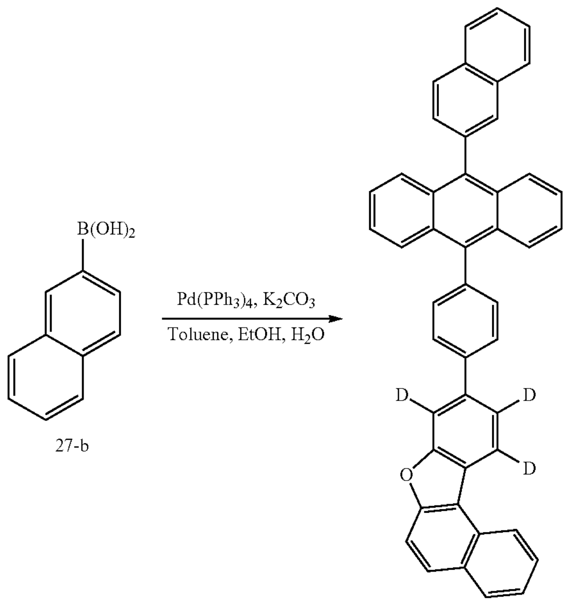

27-b

H-27

The same method as in Example 1 was used, except that 1-a was replaced with 27-a (5.52 g, 10 mmol) and 1-b with 27-b (1.72 g, 10 mmol) to obtain Compound H-27 (3.78 g, 63%), MS: m/z 599.23 [M+].

Example 28

This example provided Compound H-28, and the synthesis route therefor was as follows:

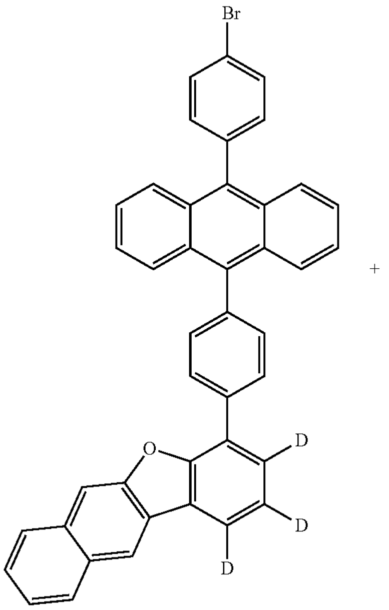

28-a

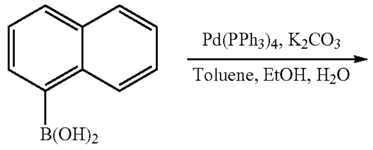

28-b

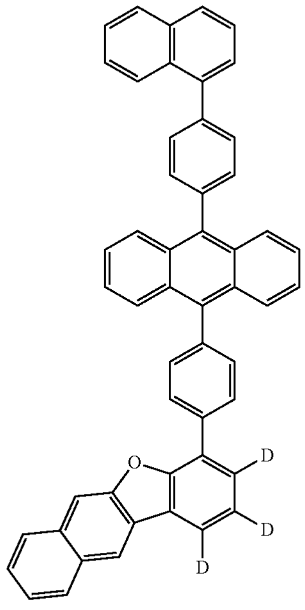

H-28

The same method as in Example 1 was used, except that 1-a was replaced with 28-a (6.29 g, 10 mmol) and 1-b with 28-b (1.72 g, 10 mmol) to obtain Compound H-28 (4.19 g, 62%), MS: m/z 675.26 [M+].

Example 29

This example provided Compound H-29, and the synthesis route therefor was as follows:

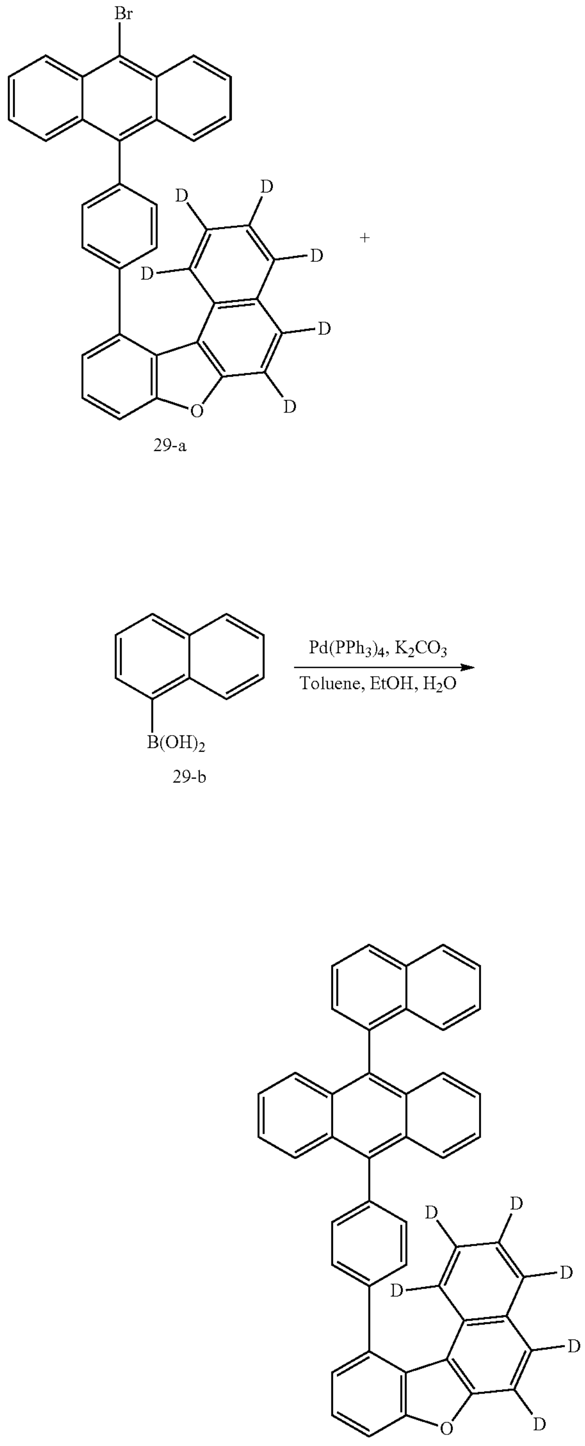

29-a 29-b

H-29

The same method as in Example 1 was used, except that 1-a was replaced with 29-a (5.56 g, 10 mmol) and 1-b with 29-b (1.72 g, 10 mmol) to obtain Compound H-29 (3.98 g, 66%), MS: m/z 602.25 [M+].

Example 30

This example provided Compound H-30, and the synthesis route therefor was as follows:

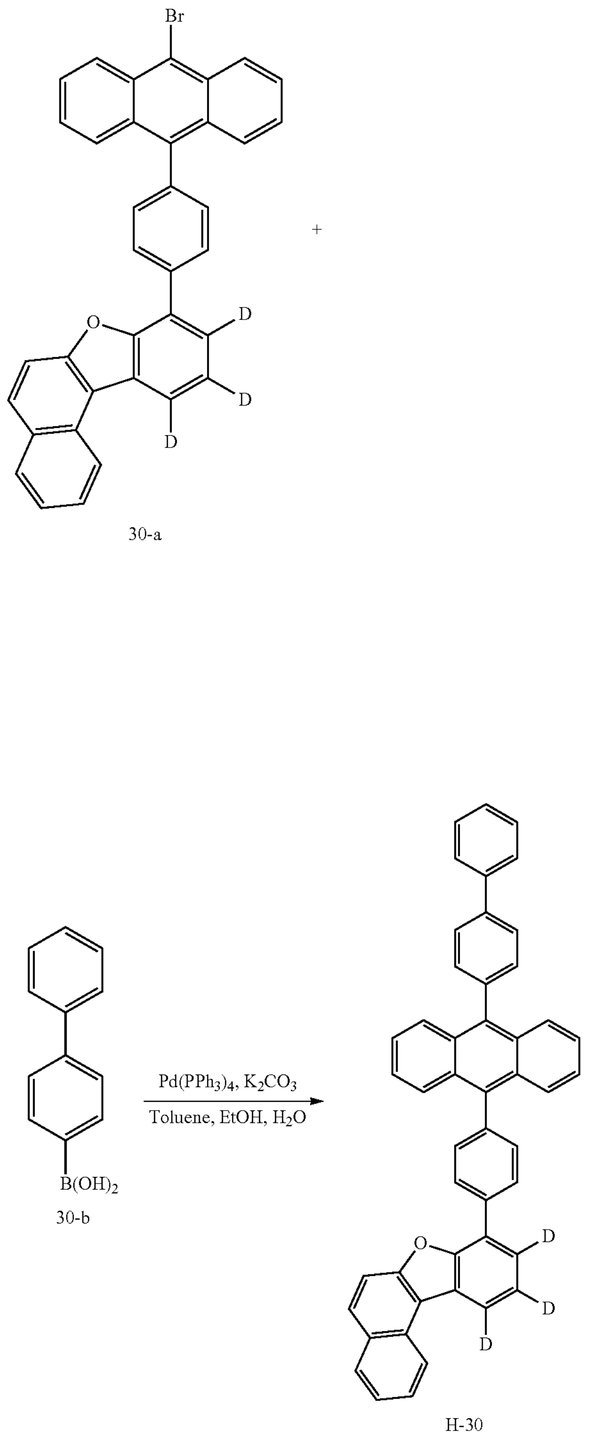

30-a 30-b

H-30

The same method as in Example 1 was used, except that 1-a was replaced with 30-a (5.52 g, 10 mmol) and 1-b with 30-b (1.98 g, 10 mmol) to obtain Compound H-30 (3.94 g, 63%), MS: m/z 625.25 [M+].

Example 31

This example provided Compound H-31, and the synthesis route therefor was as follows:

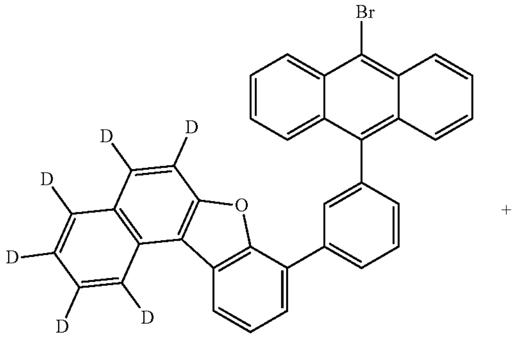

31-a

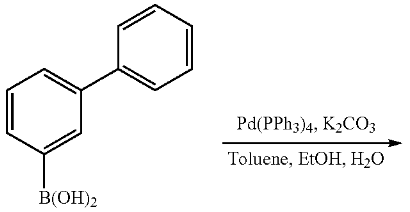

31-b

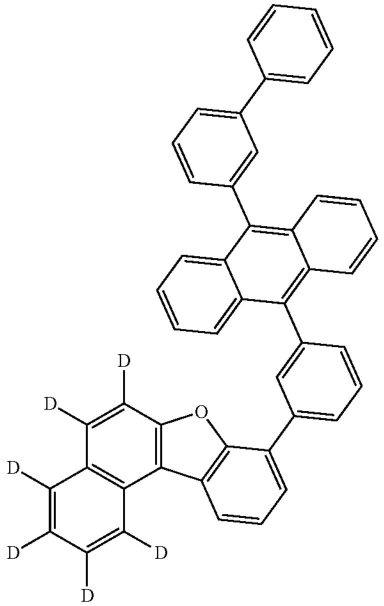

H-31

The same method as in Example 1 was used, except that 1-a was replaced with 31-a (5.56 g, 10 mmol) and 1-b with 31-b (1.98 g, 10 mmol) to obtain Compound H-31 (3.90 g, 62%), MS: m/z 628.27 [M+].

Example 32

This example provided Compound H-32, and the synthesis route therefor was as follows:

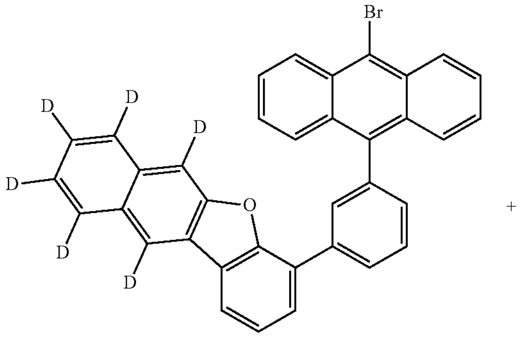

32-a

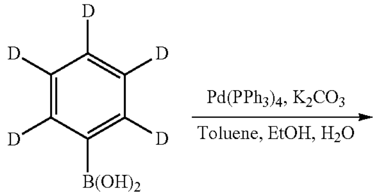

32-b

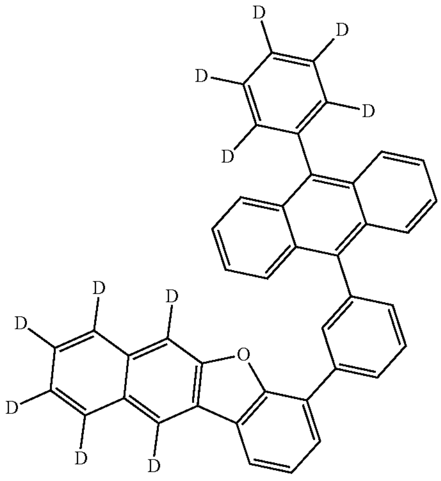

H-32

The same method as in Example 1 was used, except that 1-a was replaced with 32-a (5.56 g, 10 mmol) and 1-b with 32-b (1.27 g, 10 mmol) to obtain Compound H-32 (3.57 g, 64%), MS: m/z 557.74 [M+].

Example 33

This example provided Compound H-33, and the synthesis route therefor was as follows:

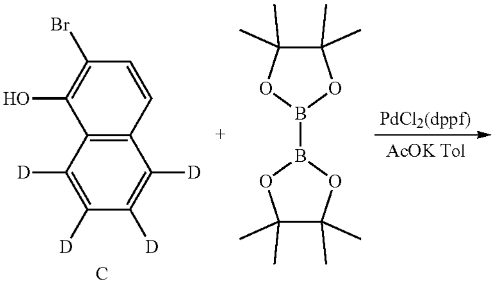

C

-continued

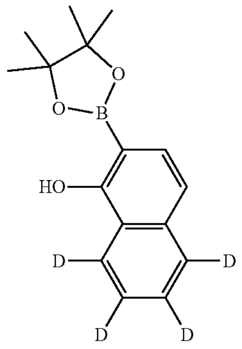

+

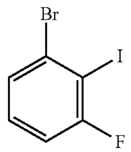

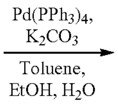

33-i 33-h

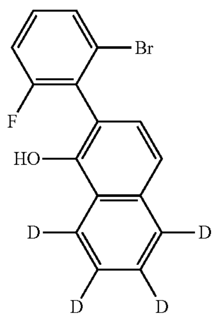

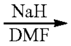

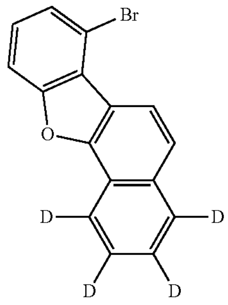

+

33-g 33-f

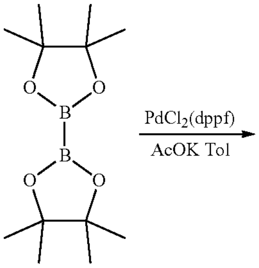

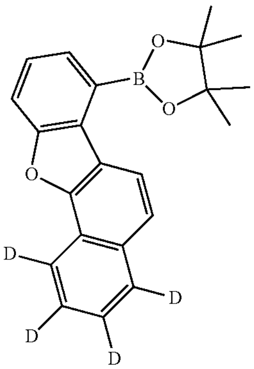

+

33-e

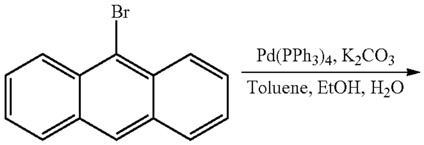

33-d

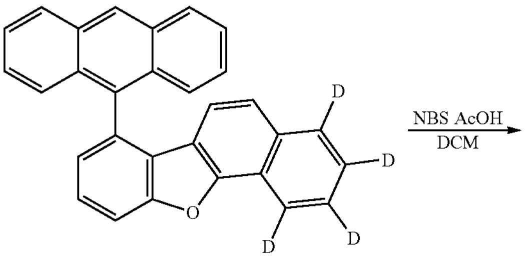

33-c

-continued

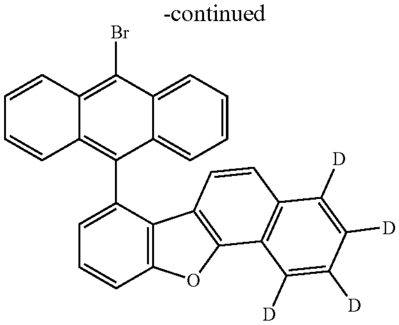

+

33-a

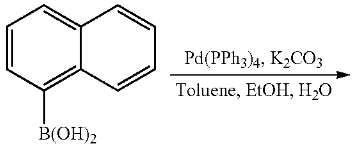

33-b

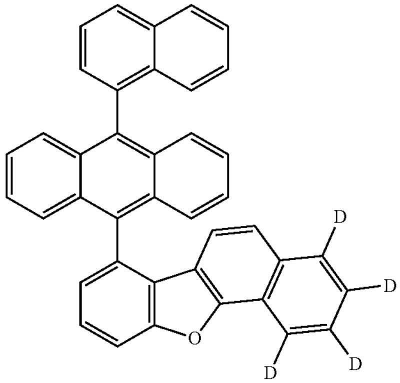

H-33

Referring to the synthesis method for 1-i, Intermediate B was replaced with C (2.27 g, 10 mmol) to obtain Compound 33-i (1.97 g, 72%).

Referring to the synthesis method for 1-g, 1-i was replaced with 33-i (2.74 g, 10 mmol) and 1-h with 33-h (3.01 g, 10 mmol) to obtain Compound 33-g (2.38 g, 74%).

Referring to the synthesis method for 1-f, 1-g was replaced with 33-g (3.21 g, 10 mmol) to obtain Compound 33-f (1.29 g, 43%).

Referring to the synthesis method for 1-i, Intermediate B was replaced with 33-f (3.01 g, 10 mmol) to obtain Compound 33-e (2.44 g, 70%).

Referring to the synthesis method for 1-g, 1-i was replaced with 33-e (3.48 g, 10 mmol) and 1-h with 33-d (2.57 g, 10 mmol) to obtain Compound 33-c (2.87 g, 72%).

Referring to the synthesis method for 1-a, 1-c was replaced with 33-c (3.99 g, 10 mmol) to obtain Compound 33-a (3.58 g, 75%).

Referring to the synthesis method for Compound H-1, 1-a was replaced with 33-a (4.77 g, 10 mmol) and 1-b with 33-b (1.72 g, 10 mmol) to obtain Compound H-33 (3.15 g, 60%), MS: m/z 524.66 [M+].

Example 34

This example provided Compound H-34, and the synthesis route therefor was as follows:

-continued
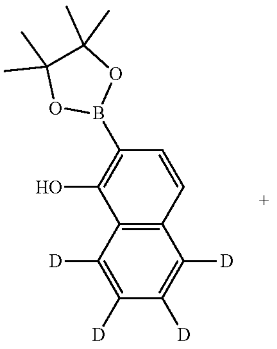
33-i
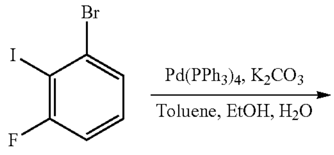
34-h
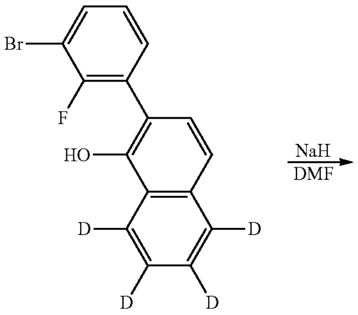
34-g
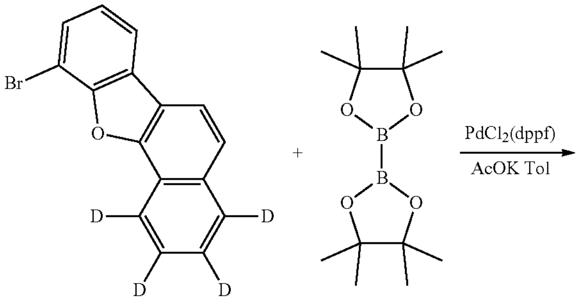
34-f
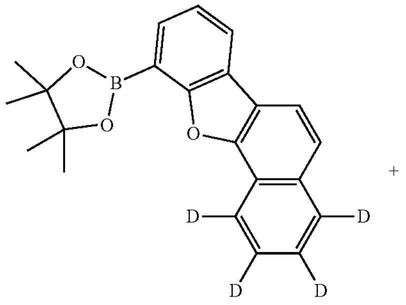
34-e
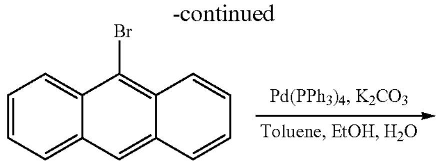
34-d
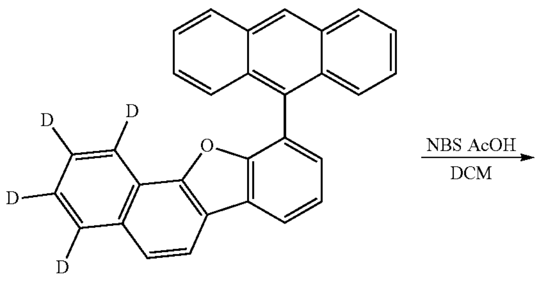
34-c
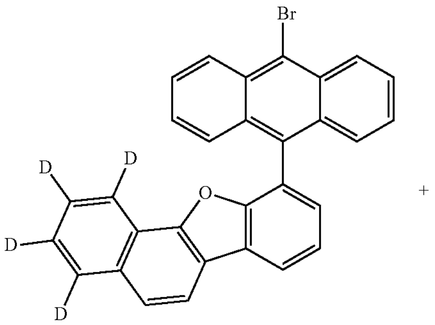
34-a
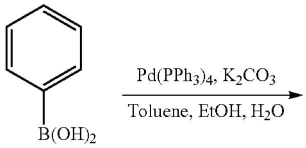
34-b
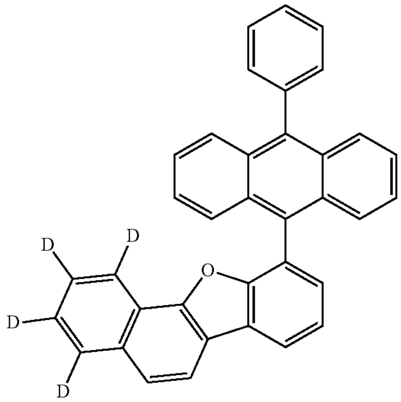
H-34
Referring to the synthesis method for 1-g, 1-i was replaced with 33-i (2.76 g, 10 mmol) and 1-h with 34-h (3.01 g, 10 mmol) to obtain Compound 34-g (2.25 g, 70%).
Referring to the synthesis method for 1-f, 1-g was replaced with 34-g (3.21 g, 10 mmol) to obtain Compound 34-f (1.20 g, 40%).
Referring to the synthesis method for 1-i, Intermediate B was replaced with 34-f (3.01 g, 10 mmol) to obtain Compound 34-e (2.44 g, 70%).

Referring to the synthesis method for 1-g, 1-i was replaced with 34-e (3.48 g, 10 mmol), 1-h was replaced with 34-d (2.57 g, 10 mmol) to obtain Compound 34-c (2.79 g, 70%).

Referring to the synthesis method for 1-a, 1-c was replaced with 34-c (3.99 g, 10 mmol) to obtain Compound 34-a (3.82 g, 80%).

Referring to the synthesis method for Compound H-1, 1-a was replaced with 34-a (4.77 g, 10 mmol) and 1-b with 34-b (1.22 g, 10 mmol) to obtain Compound H-34 (2.85 g, 60%), MS: m/z 474.60 [M+].

Comparative Example 1

This comparative example provided Compound BH-1 that had been experimented in the research process, and the specific structural formula thereof was:

BH-1

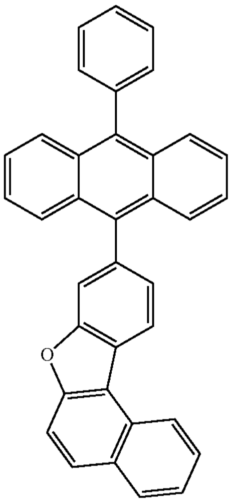

Comparative Example 2

This comparative example provided Compound BH-2 that had been experimented in the research process, and the specific structural formula thereof was:

BH-2

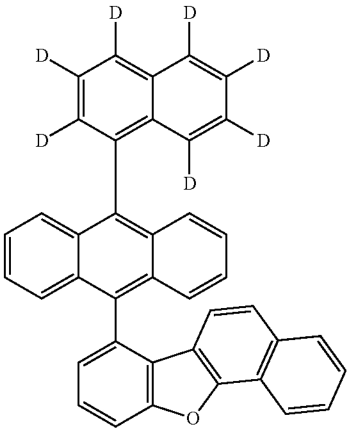

Comparative Example 3

This comparative example provided Compound BH-3 that had been experimented in the research process, and the specific structural formula thereof was:

BH-3

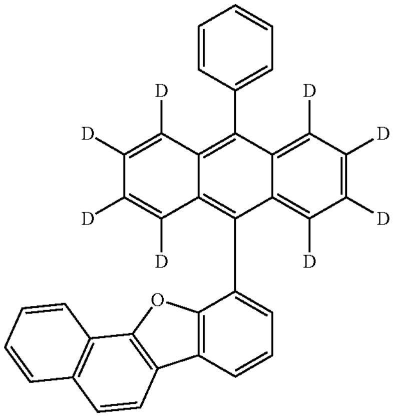

Comparative Example 4

This comparative example provided Compound BH-4 that had been experimented in the research process, and the specific structural formula thereof was:

BH-4

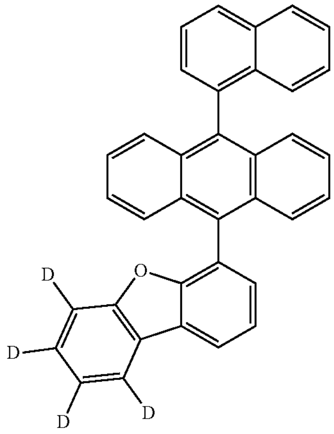

Comparative Example 5

This comparative example provided Compound BH-5 that had been experimented in the research process, and the specific structural formula thereof was:

BH-5

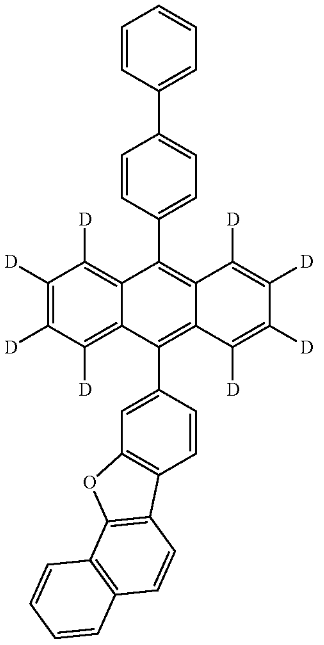

Comparative Example 6

This comparative example provided Compound BH-6 that had been experimented in the research process, and the specific structural formula thereof was:

BH-6

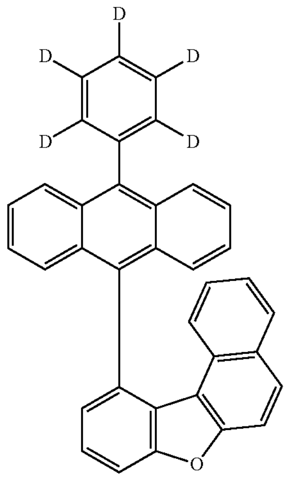

Comparative Example 7

This comparative example provided Compound BH-7 that had been experimented in the research process, and the specific structural formula thereof was:

BH-7

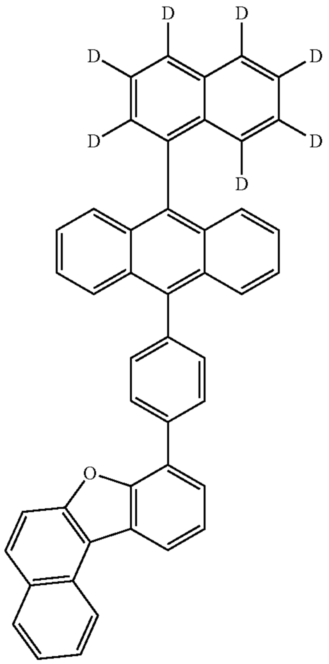

Comparative Example 8

This comparative example provided Compound BH-8 that had been experimented in the research process, and the specific structural formula thereof was:

BH-8

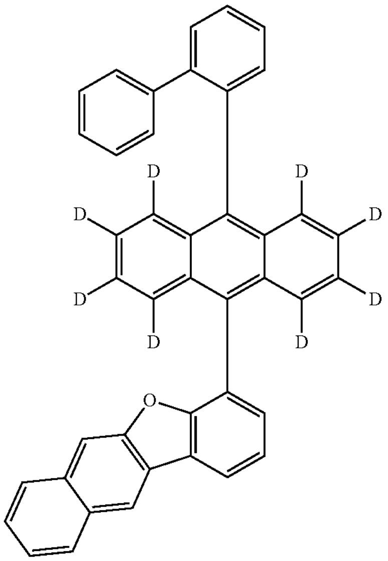

Comparative Example 9

This comparative example provided Compound BH-9 that had been experimented in the research process, and the specific structural formula thereof was:

BH-9

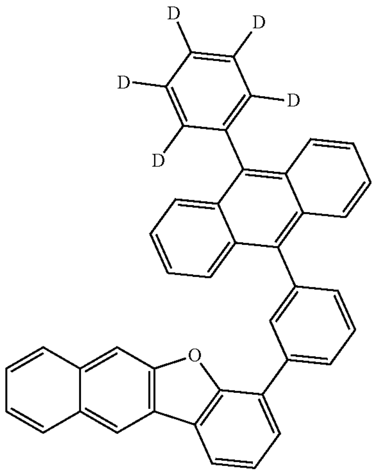

Evaluation of Performance of Compounds

In order to demonstrate that the compounds provided by the present invention had higher stability, geometric optimization and vibration analysis (Opt+freq) were carried out on the molecular structures of the compounds provided by Examples 1 to 34 and Comparative Examples 1 to 4, respectively, by means of Gaussian 16 A.03 software based on density functional theory (DFT) calculation method (the basis set level was b3lyp-d3/6-31G(d) and the charge number was 0). The structures of the compounds provided by Examples 1 to 34 and Comparative Examples 1 to 4 in the ground state were obtained, respectively, as the basis for subsequent calculation. On the optimized ground-state structures, based on the density functional theory (DFT) calculation method (the basis set level was b3lyp-d3/6-31G(d), and the charge number was −1), the carbon-oxygen bond in the furan ring of the molecules in the anionic state was subjected to Relaxed scan, and the bond length of carbon-oxygen bond was set to increase by 0.1 A at a time. The energy barrier of carbon-oxygen bond during fracture was calculated and regarded as the BDE of the chemical bond in the anionic state. The specific calculation results were as shown in Table 1.

TABLE 1

| Host material | BDE in anionic state (eV) |
|---|---|
| H-1 | 1.745 |
| H-2 | 1.778 |
| H-3 | 1.799 |
| H-4 | 1.752 |
| H-5 | 1.771 |
| H-6 | 1.773 |
| H-7 | 1.755 |
| H-8 | 1.790 |
| H-9 | 1.788 |
| H-10 | 1.773 |
| H-11 | 1.751 |
| H-12 | 1.793 |
| H-13 | 1.764 |
| H-14 | 1.774 |
| H-15 | 1.769 |
| H-16 | 1.769 |
| H-17 | 1.793 |
| H-18 | 1.777 |

TABLE 1-continued

| Host material | BDE in anionic state (eV) |
|---|---|
| H-19 | 1.764 |
| H-20 | 1.780 |
| H-21 | 1.790 |
| H-22 | 1.796 |
| H-23 | 1.793 |
| H-24 | 1.794 |
| H-25 | 1.753 |
| H-26 | 1.756 |
| H-27 | 1.782 |
| H-28 | 1.759 |
| H-29 | 1.775 |
| H-30 | 1.762 |
| H-31 | 1.771 |
| H-32 | 1.780 |
| H-33 | 1.756 |
| H-34 | 1.769 |
| BH-1 | 1.726 |
| BH-2 | 1.727 |
| BH-3 | 1.725 |
| BH-4 | 1.721 |
| BH-5 | 1.719 |
| BH-6 | 1.723 |
| BH-7 | 1.713 |
| BH-8 | 1.716 |
| BH-9 | 1.718 |

As could be seen from the data in Table 1, the BDE of the carbon-oxygen bond in the compounds provided by the present invention was >1.745 eV in the anionic state, whereas the BDE of the compound of the comparative examples was <1.727 eV, indicating that the compounds provided by the present invention had higher stability. In the compounds provided by the present invention, by means of the benzonaphthofuran structure instead of dibenzofuran, the conjugated length of 71 electron cloud was prolonged. When the molecule was converted into the anionic state after accepting electrons, the negative charges could be effectively dispersed on the benzonaphthofuran moiety, avoiding instability due to excessively high local energy caused by uneven distribution of the negative charges.

Device Example 1

This example provided a blue-light organic electroluminescent device, the preparation method of which was as follows: firstly, on an ITO layer (anode) formed on a substrate, HT-1 and p-dopant-1 (at a mass ratio of HT-1 to p-dopant-1 of 97:3) were deposited in vacuo to a thickness of 10 nm to form a hole injection layer; secondly, on the above hole injection layer, HT-1 was deposited in vacuo to a thickness of 120 nm to form a hole transport layer; thirdly, on the above hole transport layer, B prime-1 was deposited in vacuo to a thickness of 5 nm to form a luminescent auxiliary layer; again, on the above luminescent auxiliary layer, a composition of a host material and a doping material was in vacuo to a thickness of 20 nm to form a luminescent layer, wherein H-1 provided in Example 1 was used as a host material compound, BD-1 was used as a doping material compound, and the mass ratio of the host material compound to the doping material compound was 98:2; next, on the above luminescent layer, HBL-1 was deposited in vacuo to a thickness of 5 nm to form a hole blocking layer; a mixture of ET-1 and Liq (at a mass ratio of ET-1 to Liq of 1:1) was deposited in vacuo to a thickness of 30 nm to form an electron transport layer; then, on the above electron transport layer, LiF was deposited to a thickness of 0.2 nm to form an electron injection layer; and finally, on the above electron injection layer, aluminum (Al) was deposited to a thickness of 150 nm to form a cathode, thereby preparing a blue-light organic electroluminescent device.

The molecular structural formulas of the materials of the layers other than the host material compound in the luminescent layer were as follows:

p-dopant-1

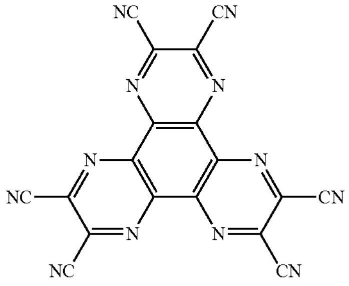

HT-1

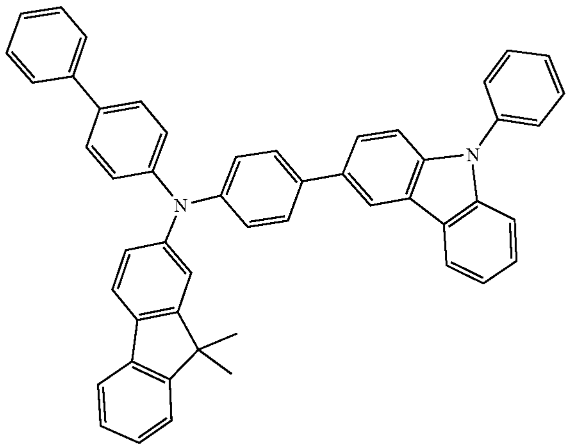

B prime-1

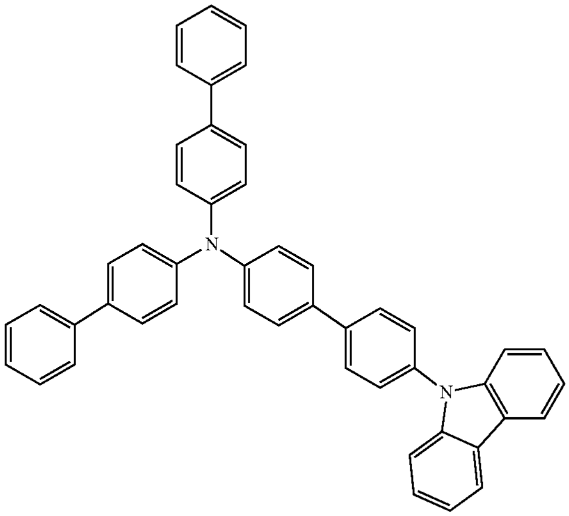

-continued

HBL-1

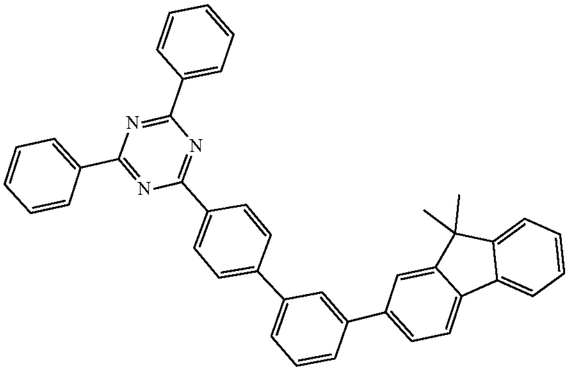

ET-1

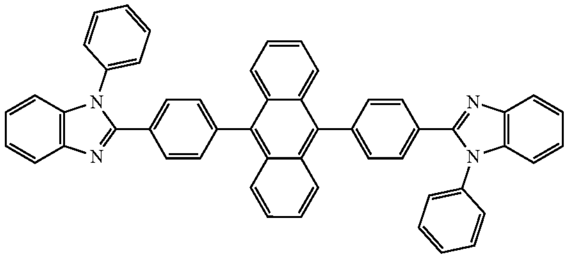

Liq

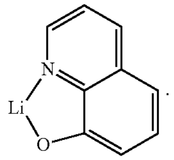

The doping material could be selected from, but not limited to, the following structures:

BD-1

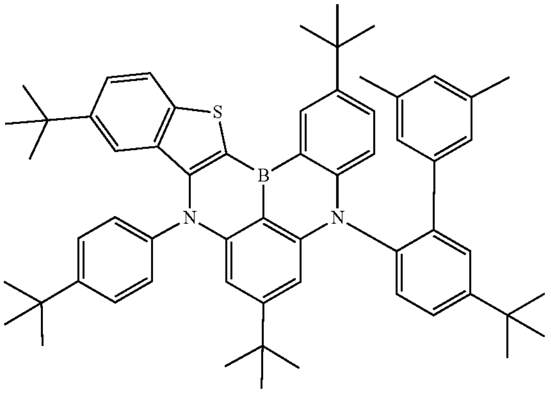

-continued

BD-2

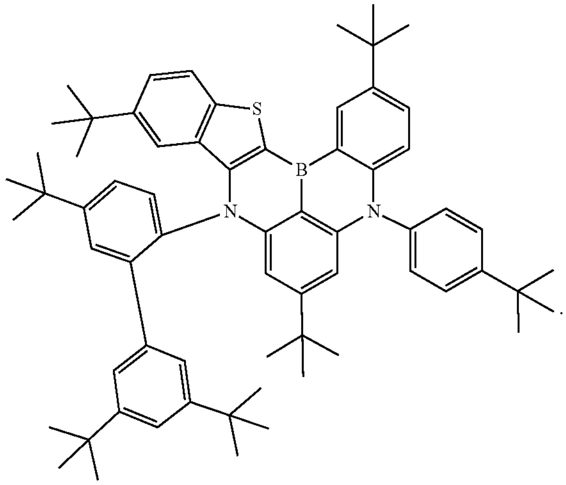

The electrode preparation method and the deposition method for each functional layer in this example were both conventional methods in the art, such as vacuum thermal evaporation or ink-jet printing. No more unnecessary repetition would be given here.

Device Examples 2-35

The method was the same as that in Device Example 1, except that the host material compound and the doping material compound in the luminescent layer were replaced with the combinations in Table 2 separately.

TABLE 2

Comparison table of host material compounds and doping material compounds in device examples

| Device Example | Compound of host material | Compound of doping material |
|---|---|---|
| Device Example 2 | H-2 | BD-1 |
| Device Example 3 | H-3 | BD-1 |
| Device Example 4 | H-4 | BD-1 |
| Device Example 5 | H-5 | BD-1 |
| Device Example 6 | H-6 | BD-1 |
| Device Example 7 | H-7 | BD-1 |
| Device Example 8 | H-8 | BD-1 |
| Device Example 9 | H-9 | BD-1 |
| Device Example 10 | H-10 | BD-1 |
| Device Example 11 | H-11 | BD-1 |
| Device Example 12 | H-12 | BD-1 |
| Device Example 13 | H-13 | BD-1 |
| Device Example 14 | H-14 | BD-1 |
| Device Example 15 | H-15 | BD-1 |
| Device Example 16 | H-16 | BD-1 |
| Device Example 17 | H-17 | BD-1 |
| Device Example 18 | H-18 | BD-1 |
| Device Example 19 | H-19 | BD-1 |
| Device Example 20 | H-20 | BD-1 |
| Device Example 21 | H-21 | BD-1 |
| Device Example 22 | H-22 | BD-1 |
| Device Example 23 | H-23 | BD-1 |
| Device Example 24 | H-24 | BD-1 |
| Device Example 25 | H-25 | BD-1 |
| Device Example 26 | H-26 | BD-1 |
| Device Example 27 | H-27 | BD-1 |
| Device Example 28 | H-28 | BD-1 |
| Device Example 29 | H-29 | BD-1 |
| Device Example 30 | H-30 | BD-1 |
| Device Example 31 | H-31 | BD-1 |
| Device Example 32 | H-32 | BD-1 |
| Device Example 33 | H-33 | BD-1 |
| Device Example 34 | H-34 | BD-1 |
| Device Example 35 | H-1 | BD-2 |

Comparative Device Examples 1-10

The method was the same as that in Device Example 1, except that the host material compound and the doping material compound in the material of the luminescent layer were replaced with the combinations in Table 3 separately.

TABLE 3

Comparison table of host material compounds and doping material compounds in comparative device examples

| Comparative Example | Device | Compound of host material | Compound of doping material |
|---|---|---|---|
| Comparative Example 1 | Device | BH-1 | BD-1 |
| Comparative Example 2 | Device | BH-2 | BD-1 |
| Comparative Example 3 | Device | BH-3 | BD-1 |
| Comparative Example 4 | Device | BH-4 | BD-1 |
| Comparative Example 5 | Device | BH-5 | BD-1 |
| Comparative Example 6 | Device | BH-6 | BD-1 |

TABLE 3-continued

Comparison table of host material compounds and doping material compounds in comparative device examples

| Comparative Example | Device | Compound of host material | Compound of doping material |
|---|---|---|---|
| Comparative Example 7 | Device | BH-7 | BD-1 |
| Comparative Example 8 | Device | BH-8 | BD-1 |
| Comparative Example 9 | Device | BH-9 | BD-1 |
| Comparative Example 10 | Device | BH-1 | BD-2 |

Device Performance Effect Example 1

The organic electroluminescent devices provided by Device Examples 1-35 and Comparative Device Examples 1-10 were tested by standard methods. In this regard, the organic electroluminescent devices were measured at a current density of J=10 mA/cm$^2$ for the driving voltage, brightness, electroluminescent current efficiency (measured as cd/A), and external quantum efficiency (EQE, measured by percentage), calculated, as a function of luminous density, from the current/voltage/luminous density characteristic curves (IVL characteristic curves) showing Lambertian emission characteristics, luminous spectrum. The lifetime LT was defined as the time for the brightness to decrease from the initial luminous brightness $L_0$ to a specific proportion $L_1$, during working at a constant current J; The expressions J=50 mA/cm$^2$ and $L_1$=90% meant that during working at 50 mA/cm$^2$, the luminous brightness decreased to 90% of the initial value $L_0$ thereof after the time LT. Similarly, the expressions J=20 mA/cm$^2$ and $L_1$=80% meant that during working at 20 mA/cm$^2$, the luminous brightness decreased to 80% of the initial value $L_0$ thereof after the time LT.

The test instruments and methods for testing the performance of the above OLED devices were as follows:

the brightness was tested by means of spectrum scanner PhotoResearch PR-635;

the current density and turn-on voltage were tested by digital SourceMeter Keithley 2400; and lifetime test: LT-96ch lifetime test device was used.

The performance test results of the above devices were listed in Table 4.

TABLE 4

Performance test results of blue-light devices

| Device No. | Vop (V) | EQE (%) | @J = 20 mA/cm$^2$ LT95 (h) | Color |
|---|---|---|---|---|
| Device Example 1 | 3.64 | 6.39 | 163 | Blue |
| Device Example 2 | 3.76 | 6.45 | 166 | Blue |
| Device Example 3 | 3.64 | 6.25 | 177 | Blue |
| Device Example 4 | 3.74 | 6.49 | 163 | Blue |
| Device Example 5 | 3.69 | 6.27 | 164 | Blue |
| Device Example 6 | 3.68 | 6.3 | 183 | Blue |
| Device Example 7 | 3.68 | 6.34 | 177 | Blue |
| Device Example 8 | 3.61 | 6.21 | 170 | Blue |
| Device Example 9 | 3.65 | 6.21 | 161 | Blue |
| Device Example 10 | 3.69 | 6.25 | 189 | Blue |
| Device Example 11 | 3.69 | 6.26 | 163 | Blue |
| Device Example 12 | 3.89 | 6.73 | 150 | Blue |
| Device Example 13 | 3.63 | 6.37 | 181 | Blue |
| Device Example 14 | 3.61 | 6.36 | 193 | Blue |
| Device Example 15 | 3.79 | 6.35 | 182 | Blue |

TABLE 4-continued

Performance test results of blue-light devices

| Device No. | Vop (V) | EQE (%) | @J = 20 mA/cm$^2$ LT95 (h) | Color |
|---|---|---|---|---|
| Device Example 16 | 3.69 | 6.25 | 169 | Blue |
| Device Example 17 | 3.64 | 6.34 | 167 | Blue |
| Device Example 18 | 3.88 | 6.77 | 176 | Blue |
| Device Example 19 | 3.83 | 6.72 | 165 | Blue |
| Device Example 20 | 3.89 | 6.82 | 170 | Blue |
| Device Example 21 | 3.75 | 6.32 | 176 | Blue |
| Device Example 22 | 3.69 | 6.38 | 170 | Blue |
| Device Example 23 | 3.85 | 6.59 | 167 | Blue |
| Device Example 24 | 3.83 | 6.42 | 184 | Blue |
| Device Example 25 | 3.77 | 6.43 | 168 | Blue |
| Device Example 26 | 3.71 | 6.46 | 161 | Blue |
| Device Example 27 | 3.75 | 6.4 | 167 | Blue |
| Device Example 28 | 3.88 | 6.72 | 161 | Blue |
| Device Example 29 | 3.83 | 6.69 | 169 | Blue |
| Device Example 30 | 3.88 | 6.83 | 163 | Blue |
| Device Example 31 | 3.99 | 6.29 | 169 | Blue |
| Device Example 32 | 3.81 | 6.57 | 180 | Blue |
| Device Example 33 | 3.62 | 6.32 | 159 | Blue |
| Device Example 34 | 3.62 | 6.34 | 160 | Blue |
| Device Example 35 | 3.62 | 6.39 | 162 | Blue |
| Comparative Device Example 1 | 3.68 | 6.3 | 87 | Blue |
| Comparative Device Example 2 | 3.64 | 6.32 | 105 | Blue |
| Comparative Device Example 3 | 3.67 | 6.29 | 114 | Blue |
| Comparative Device Example 4 | 3.79 | 6.32 | 121 | Blue |
| Comparative Device Example 5 | 3.84 | 6.8 | 116 | Blue |
| Comparative Device Example 6 | 3.89 | 6.81 | 104 | Blue |
| Comparative Device Example 7 | 3.75 | 6.36 | 109 | Blue |
| Comparative Device Example 8 | 3.84 | 6.55 | 114 | Blue |
| Comparative Device Example 9 | 3.83 | 6.59 | 103 | Blue |
| Comparative Device Example 10 | 3.69 | 6.3 | 94 | Blue |

From the device performance test results in Table 4 above, it could be seen that compared with the comparative device examples, the lifetime of the organic electroluminescent devices provided by the present invention was significantly increased. In the present invention, it had been unexpectedly found during the research that the benzonaphthofuran moiety had a relatively good planarity, and only by means of deuteration at some sites on the benzonaphthofuran structure, the vibration of carbon-hydrogen bonds could be significantly reduced, and the stability of the benzonaphthofuran could be enhanced. In the present invention, by means of rational deuteration at some sites on the benzonaphthofuran structure, the bond dissociation energy could be improved in the weakest part, the stability of the compound was significantly improved, and the deuteration cost was reduced. When the organic compound provided by the present invention was used as a host material in a luminescent layer of a blue organic electroluminescent device, the host material in the luminescent layer could prolong the lifetime of the blue organic electroluminescent device and overcame the defects in the prior art.

The above description is only preferred embodiments of the present invention, and the scope of protection of the present invention is not limited thereto. Any changes, substitutions, etc. readily conceivable to any of those familiar with the technical field within the technical scope of the disclosure of the present invention should be included in the scope of protection of the present invention. Therefore, for the scope of protection of the present invention, the scope of protection of the claims shall prevail.

The invention claimed is:

1. A long-lifetime organic electroluminescent compound, characterized in that the general structural formula of the organic electroluminescent compound is shown as Formula I:

I

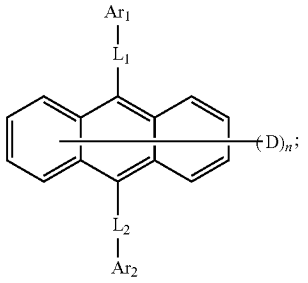

wherein D is deuterium and n is an integer selected from 0 to 8;

$Ar_1$ is selected from any one of phenyl, biphenyl, naphthyl, perinaphthenyl, benzonaphthofuranyl, dinaphthofuranyl, methylnaphthalene, ethylbenzene, deuterated phenyl, and deuterated naphthyl;

$L_1$ and $L_2$ are selected from a single bond and a substituted or unsubstituted arylene group with a carbon atom number of 6 to 30;

when any one of $L_1$, $L_2$, and $Ar_1$ has substituents, the number of the substituents on the $L_1$, $L_2$, and $Ar_1$ may be one or more, and each of the substituents is independently selected from any one of deuterium, an alkyl group with a carbon atom number of 1 to 30, a haloalkyl group with a carbon atom number of 1 to 30, a cycloalkyl group with a carbon atom number of 3 to 30, an aryl group with a carbon atom number of 6 to 30, and a fused aryl group with a carbon atom number of 10 to 30; and $Ar_2$ is selected from structures shown in Formula II-111:

II-111

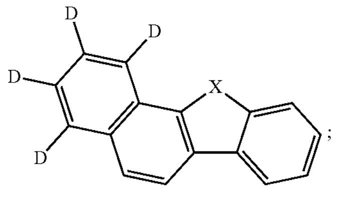

any site on the structure shown in Formula II-111 can be bonded to $L_2$ of Formula I; and X is selected from O.

2. The organic electroluminescent compound according to claim 1, characterized in that $L_1$ and $L_2$ are selected from any one of a single bond, deuterated or non-deuterated phenylene, and deuterated or non-deuterated biphenylene.

3. The organic electroluminescent compound according to claim 1, characterized in that the organic electroluminescent compound is selected from any one of the following structures:

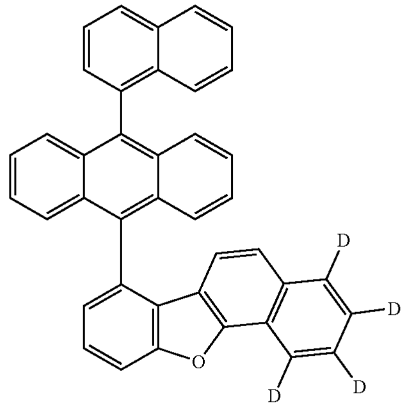

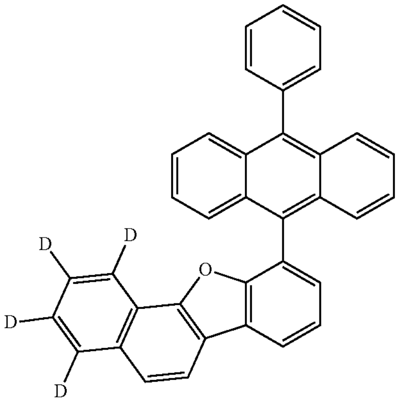

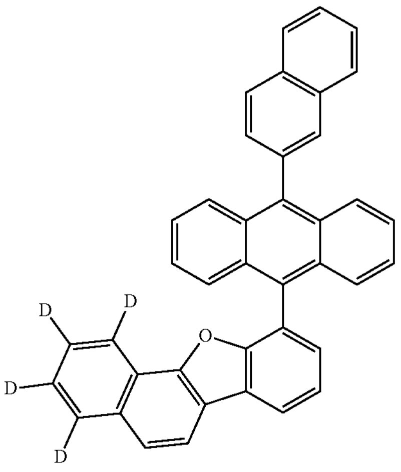

-continued
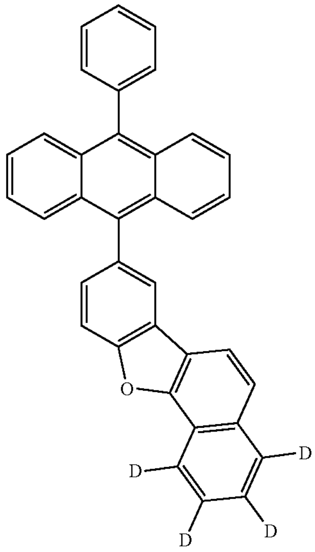
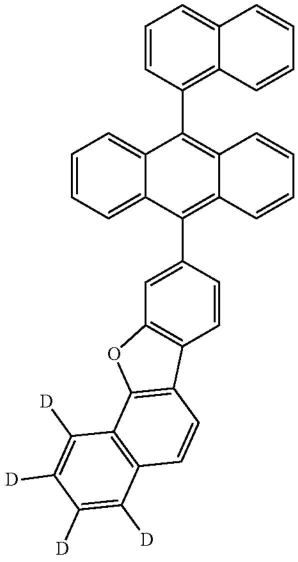
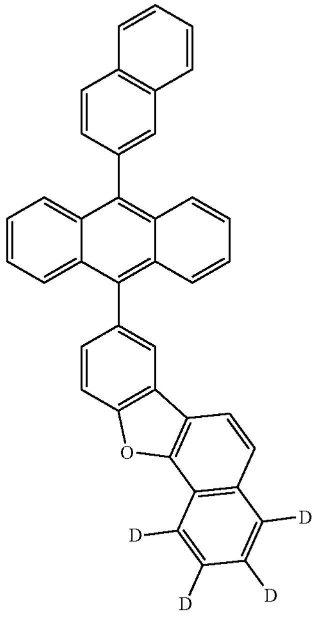
-continued
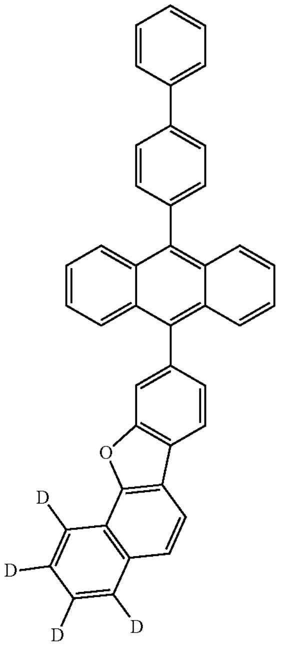
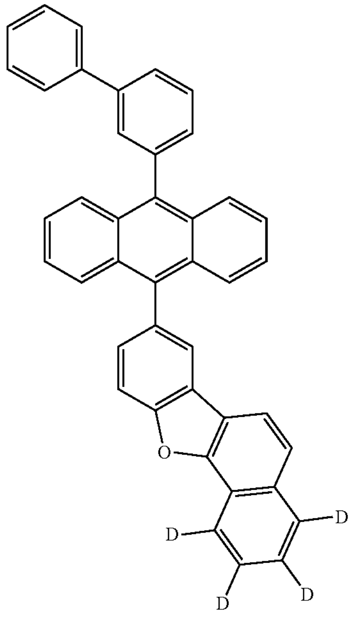
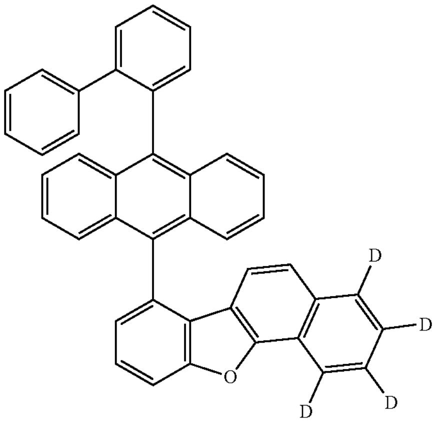

-continued
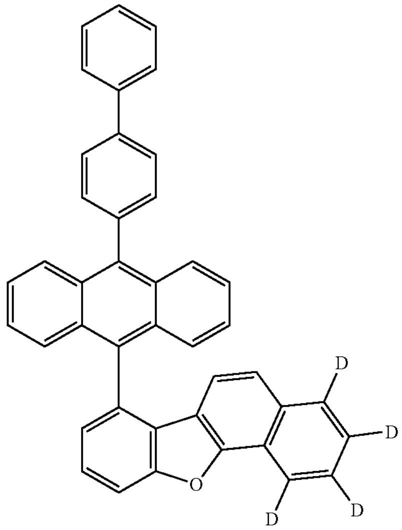
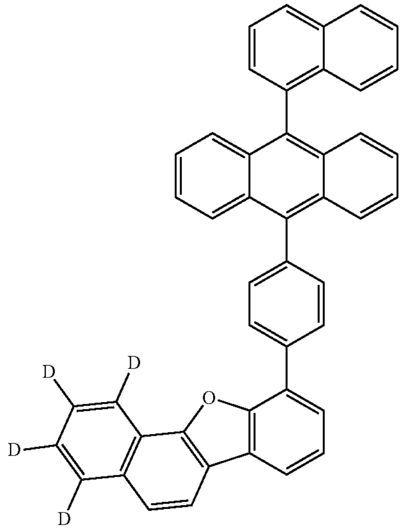
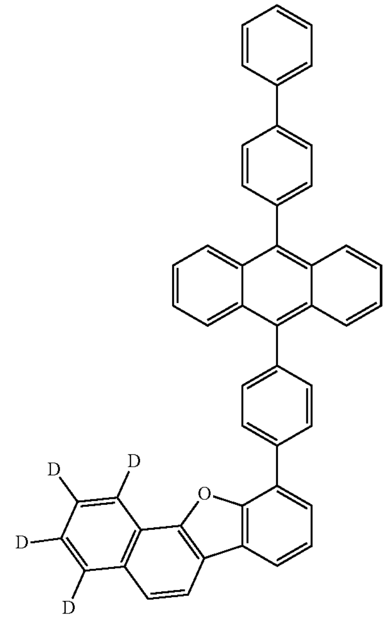
-continued
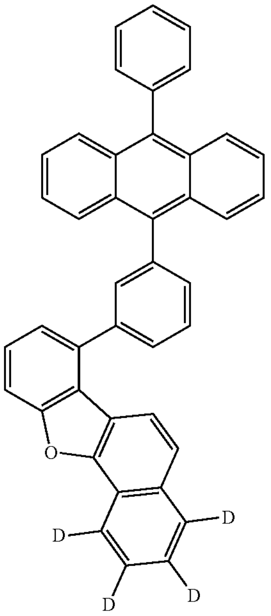
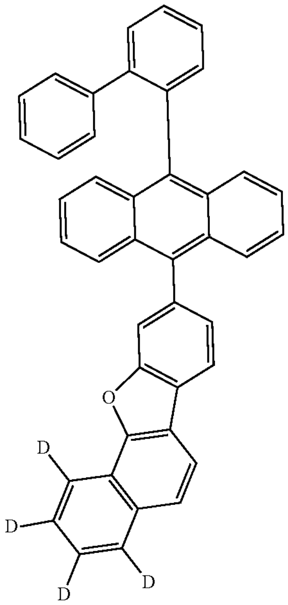

-continued
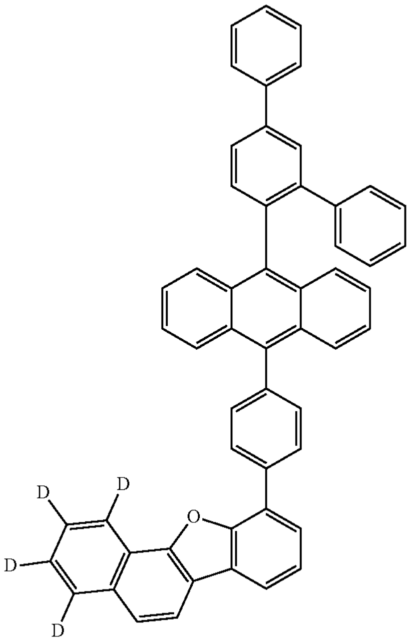
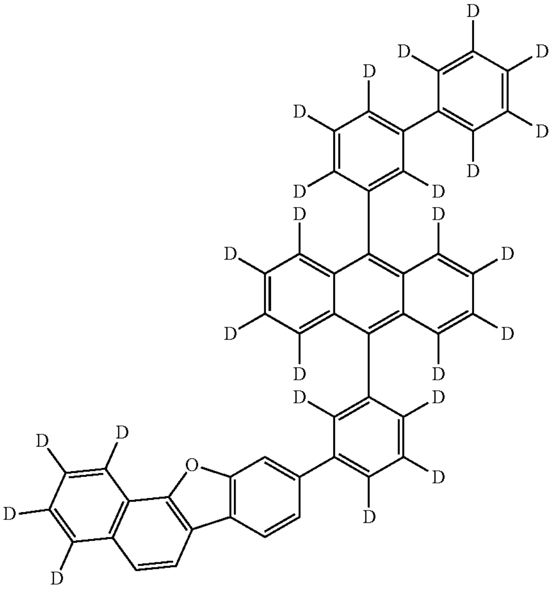
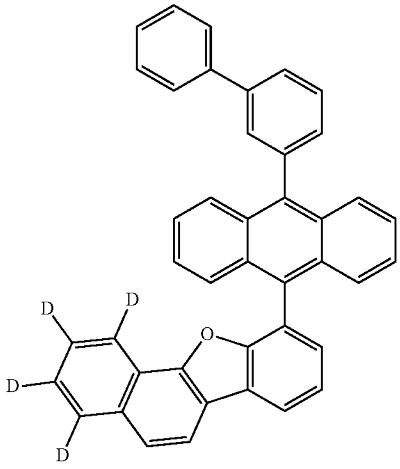
-continued
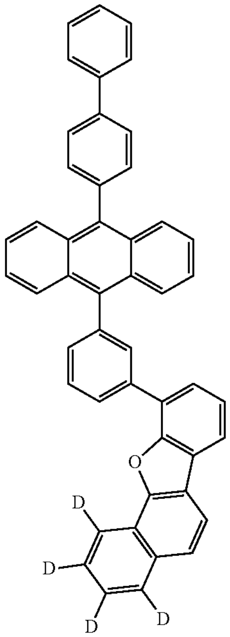
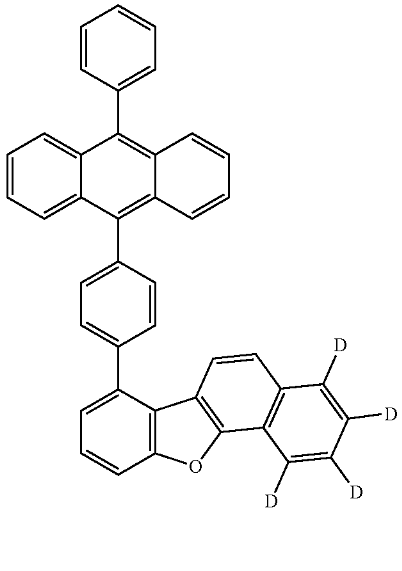

-continued
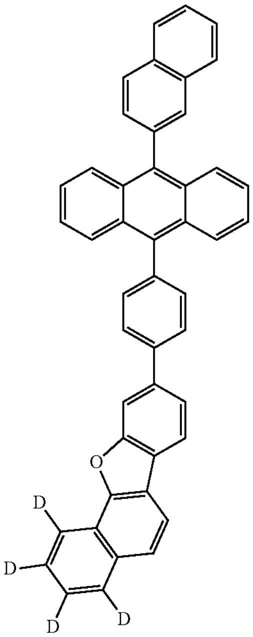
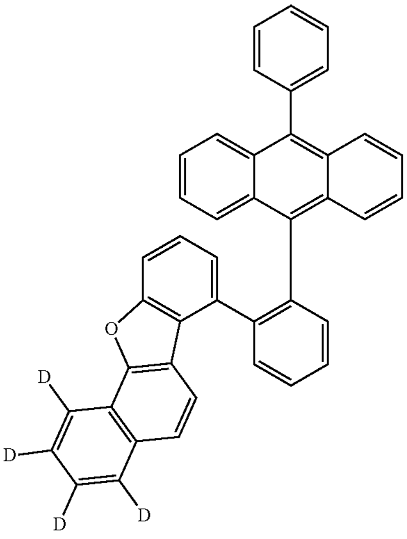
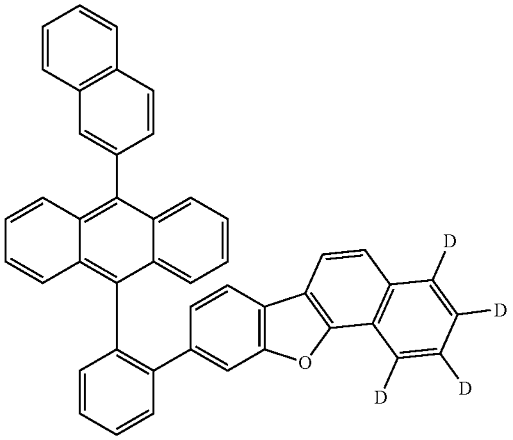
-continued
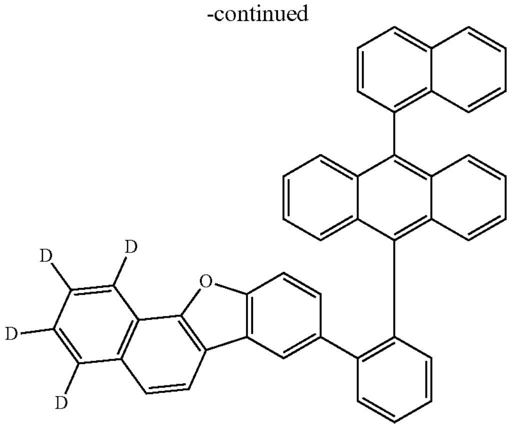
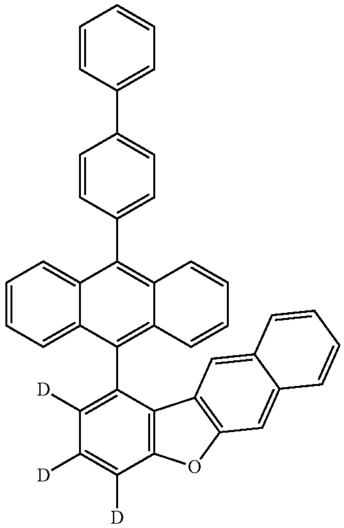
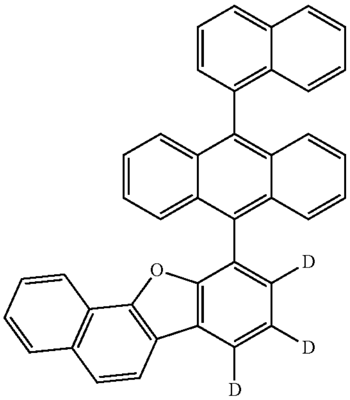

-continued
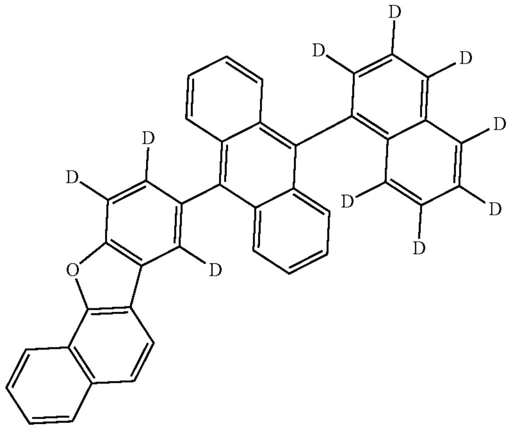
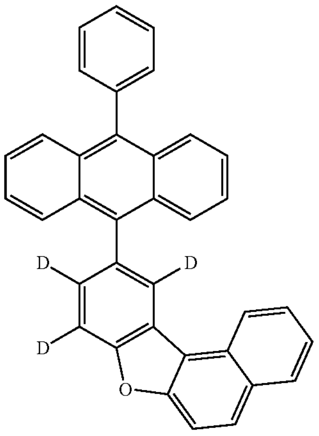
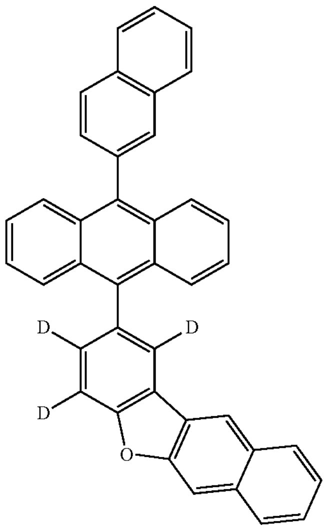
-continued
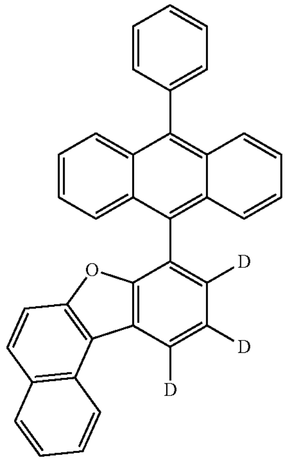
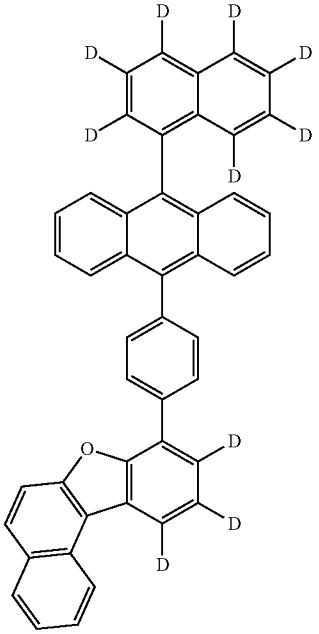
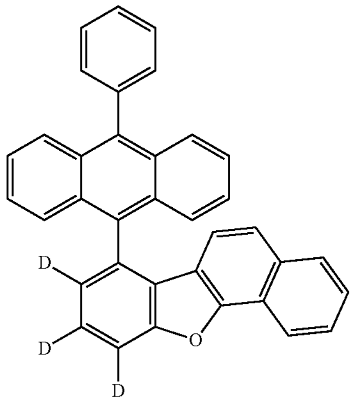

-continued

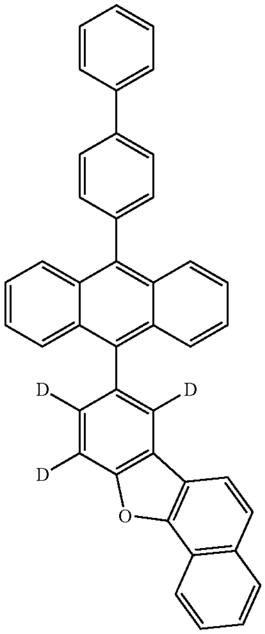

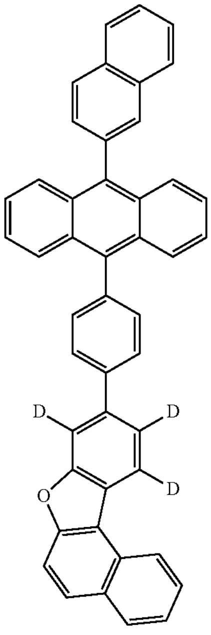

-continued

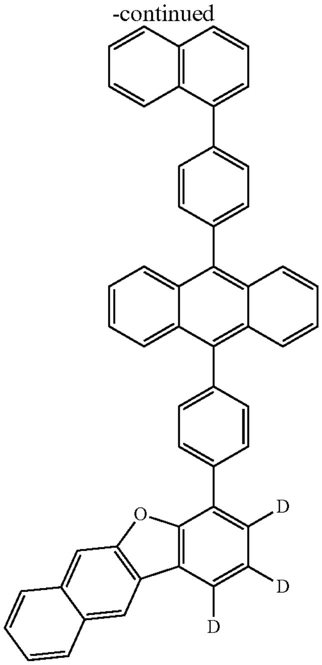

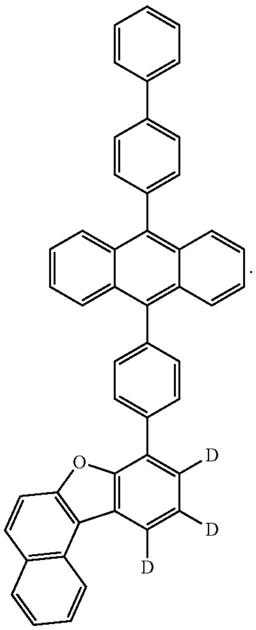

4. An organic electroluminescent device, characterized by comprising sequentially a first electrode disposed on a substrate plate, a second electrode disposed opposite to the first electrode, and one or more organic functional layers disposed between the first electrode and the second electrode, wherein the organic functional layer comprises a luminescent layer comprising one or more organic electroluminescent compounds according to claim 1.

5. The organic electroluminescent device according to claim 4, characterized in that the luminescent layer comprises a host material and a doping material, wherein the host material comprises one or more organic electroluminescent compounds according to claim 1.

* * * * *